United States Patent
Cho et al.

(10) Patent No.: US 8,901,645 B2
(45) Date of Patent: Dec. 2, 2014

(54) SEMICONDUCTOR DEVICES INCLUDING BIT LINE CONTACT PLUG AND PERIPHERAL TRANSITOR

(71) Applicants: Sung-Il Cho, Seoul (KR); Nam-Gun Kim, Seoul (KR); Jin-Young Kim, Hwaseong-si (KR); Hyun-Chul Yoon, Seongnam-si (KR); Bong-Soo Kim, Seongnam-si (KR); Kwan-Sik Cho, Hwaseong-si (KR)

(72) Inventors: Sung-Il Cho, Seoul (KR); Nam-Gun Kim, Seoul (KR); Jin-Young Kim, Hwaseong-si (KR); Hyun-Chul Yoon, Seongnam-si (KR); Bong-Soo Kim, Seongnam-si (KR); Kwan-Sik Cho, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/864,347

(22) Filed: Apr. 17, 2013

(65) Prior Publication Data

US 2013/0228856 A1  Sep. 5, 2013

Related U.S. Application Data

(63) Continuation of application No. 13/072,907, filed on Mar. 28, 2011, now Pat. No. 8,461,687.

(30) Foreign Application Priority Data

Apr. 6, 2010 (KR) .......... 10-2010-0031560
Apr. 6, 2010 (KR) .......... 10-2010-0031562
Apr. 6, 2010 (KR) .......... 10-2010-0031564

(51) Int. Cl.
*H01L 29/66* (2006.01)
*H01L 29/78* (2006.01)
*H01L 29/423* (2006.01)
*H01L 27/108* (2006.01)

(52) U.S. Cl.
CPC ...... *H01L 29/7827* (2013.01); *H01L 29/42324* (2013.01); *H01L 27/10873* (2013.01); *H01L 27/10876* (2013.01); *H01L 27/10885* (2013.01); *H01L 27/10888* (2013.01); *H01L 27/10894* (2013.01); *H01L 29/78* (2013.01)
USPC ........................................................ 257/329

(58) Field of Classification Search
CPC .................. H01L 27/10894; H01L 27/10888; H01L 27/10873; H01L 27/10885; H01L 27/10876; H01L 27/105; H01L 29/7827; H01L 29/78; H01L 29/42324
USPC .......................... 257/329, 773, E29.262, 316
See application file for complete search history.

(56) References Cited

U.S. PATENT DOCUMENTS 7,262,108 B2 * 8/2007 Park et al. ...................... 438/384
2008/0048333 A1  2/2008 Seo et al.

FOREIGN PATENT DOCUMENTS

JP  2008192681  8/2008

(Continued)

*Primary Examiner* — Nikolay Yushin
(74) *Attorney, Agent, or Firm* — Volentine & Whitt, PLLC

(57) ABSTRACT

A semiconductor device having a cell area and a peripheral area includes a semiconductor substrate, a cell insulating isolation region delimiting a cell active region of the semiconductor substrate in the cell area, a word line disposed within the semiconductor substrate in the cell area, a bit line contact plug disposed on the cell active region, a bit line disposed on the bit line contact plug, a peripheral insulating isolation region delimiting a peripheral active region of the semiconductor substrate in the peripheral area, and a peripheral transistor including a peripheral transistor lower electrode and a peripheral transistor upper electrode. The bit line contact plug is formed at the same level in the semiconductor device as the peripheral transistor lower electrode, and the bit line electrode is formed at the same level in the semiconductor device as the peripheral transistor upper electrode.

20 Claims, 182 Drawing Sheets

(56) References Cited

FOREIGN PATENT DOCUMENTS

| | | |
|---|---|---|
| KR | 1020010005108 A | 1/2001 |
| KR | 1020010027393 A | 4/2001 |
| KR | 1020040069515 A | 8/2004 |
| KR | 1020070075519 A | 7/2007 |
| KR | 1020080000831 A | 1/2008 |
| KR | 1020080084296 A | 9/2008 |
| KR | 1020080099482 A | 11/2008 |
| KR | 1020080114182 A | 12/2008 |
| KR | 1020090008636 A | 1/2009 |

* cited by examiner

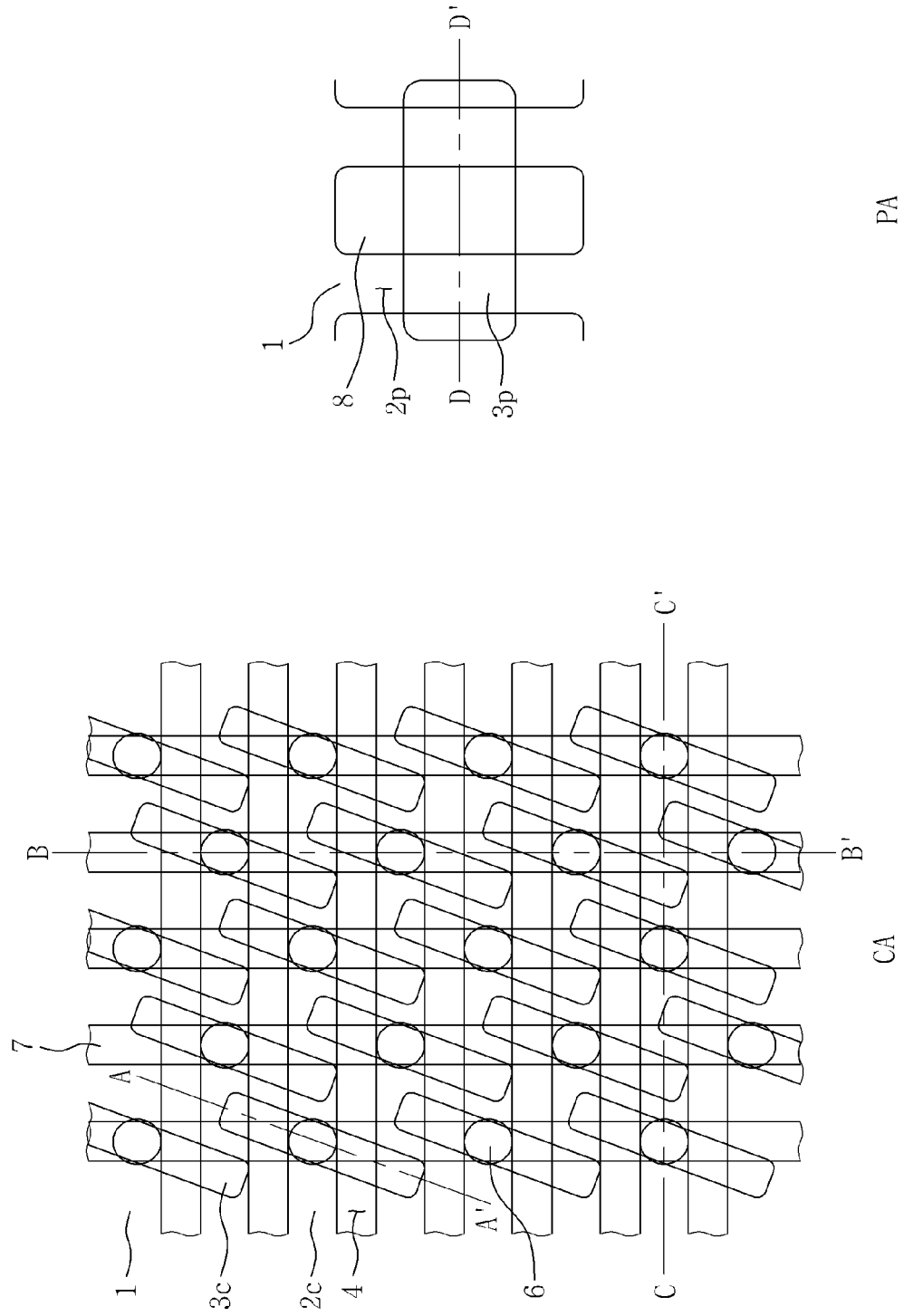

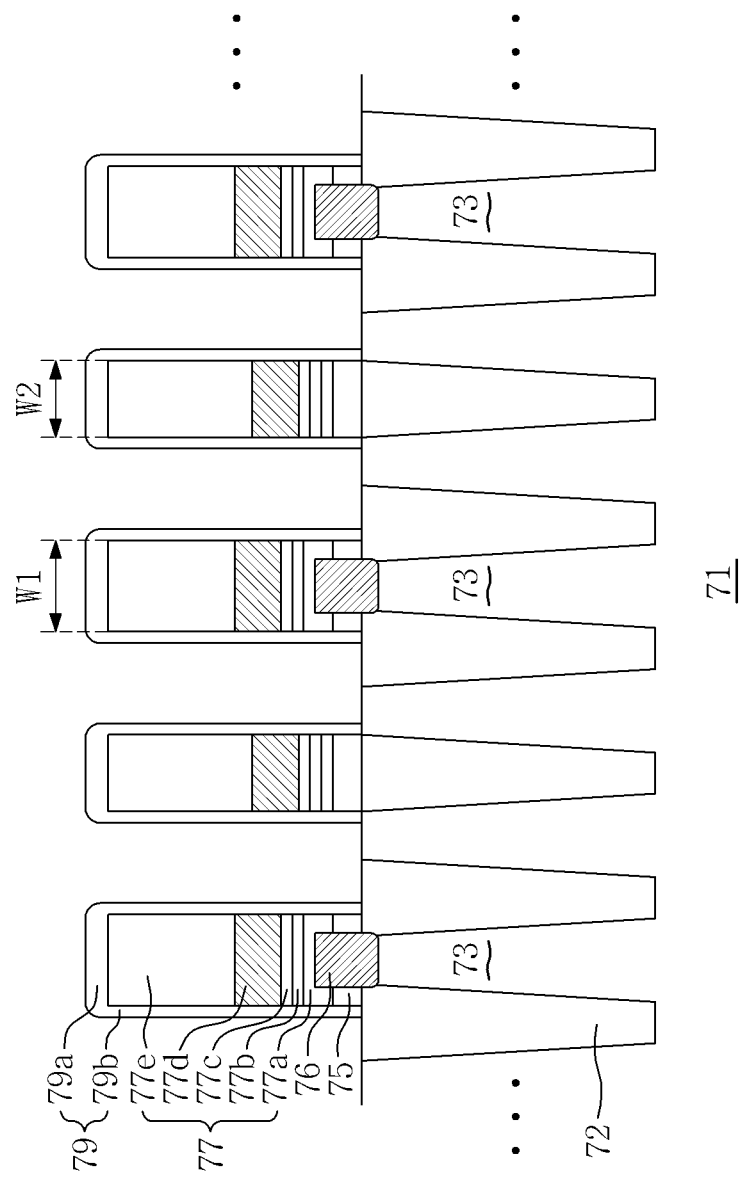

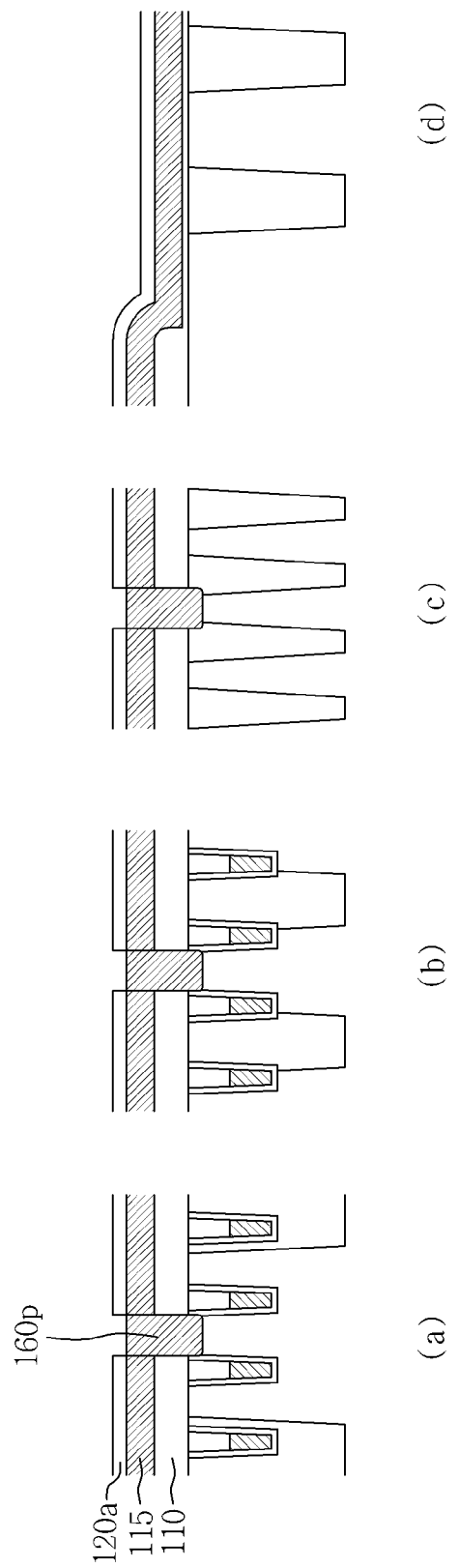

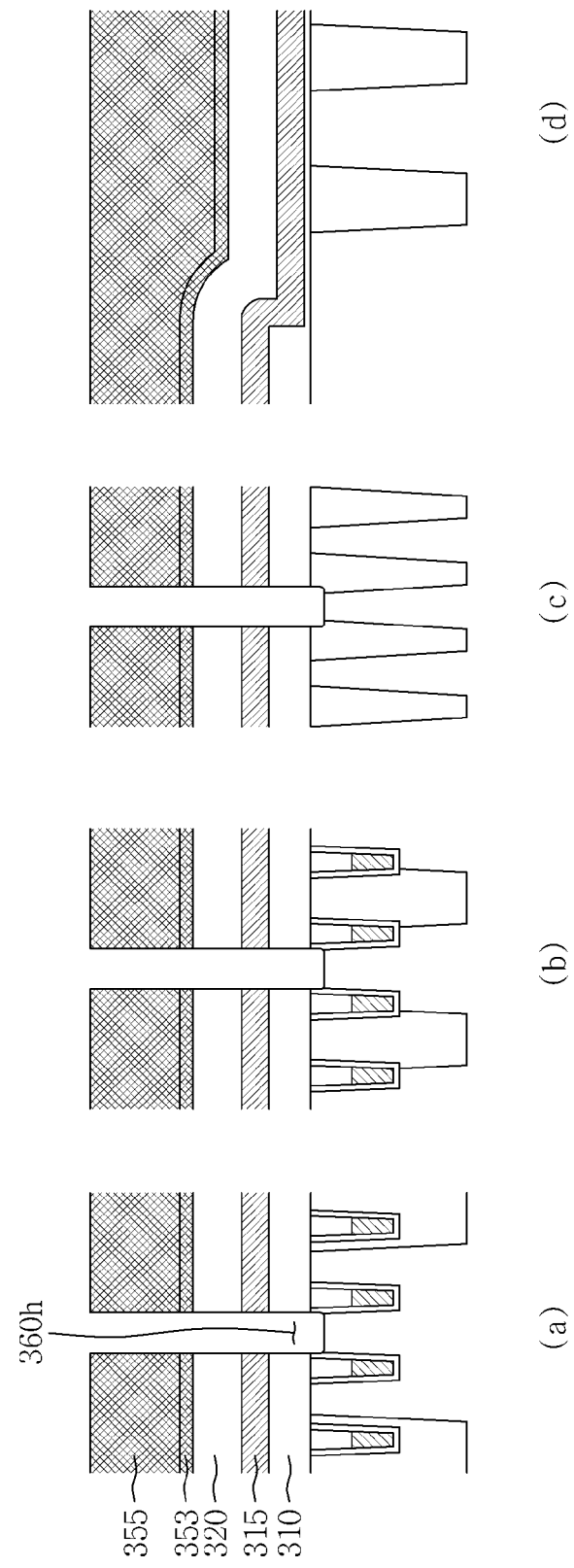

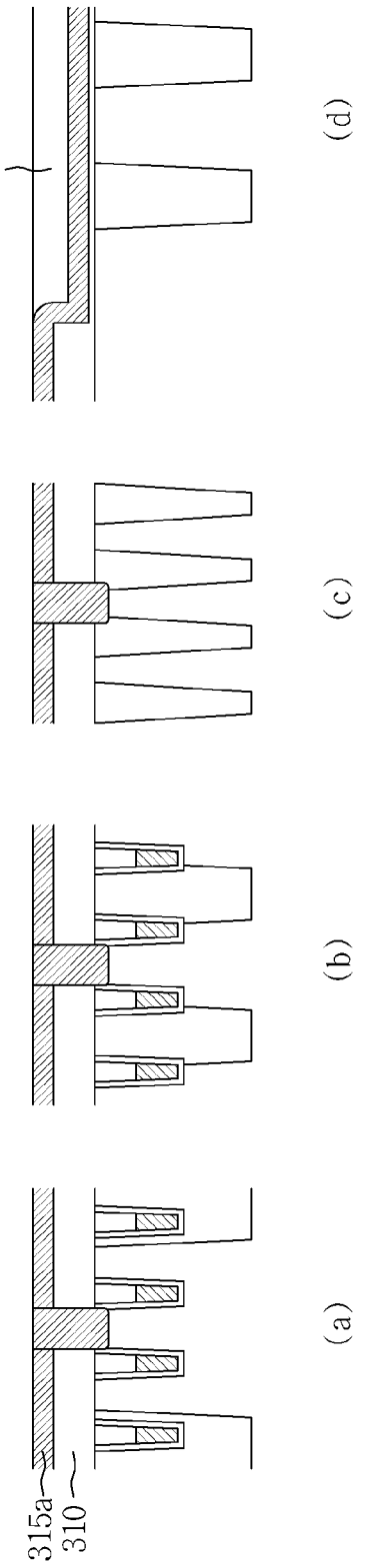

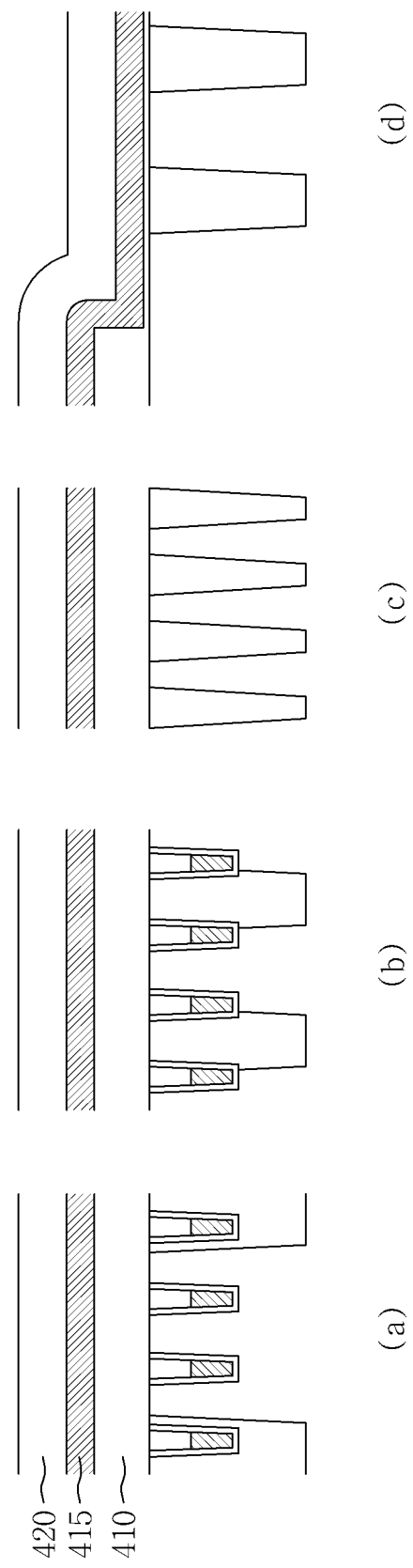

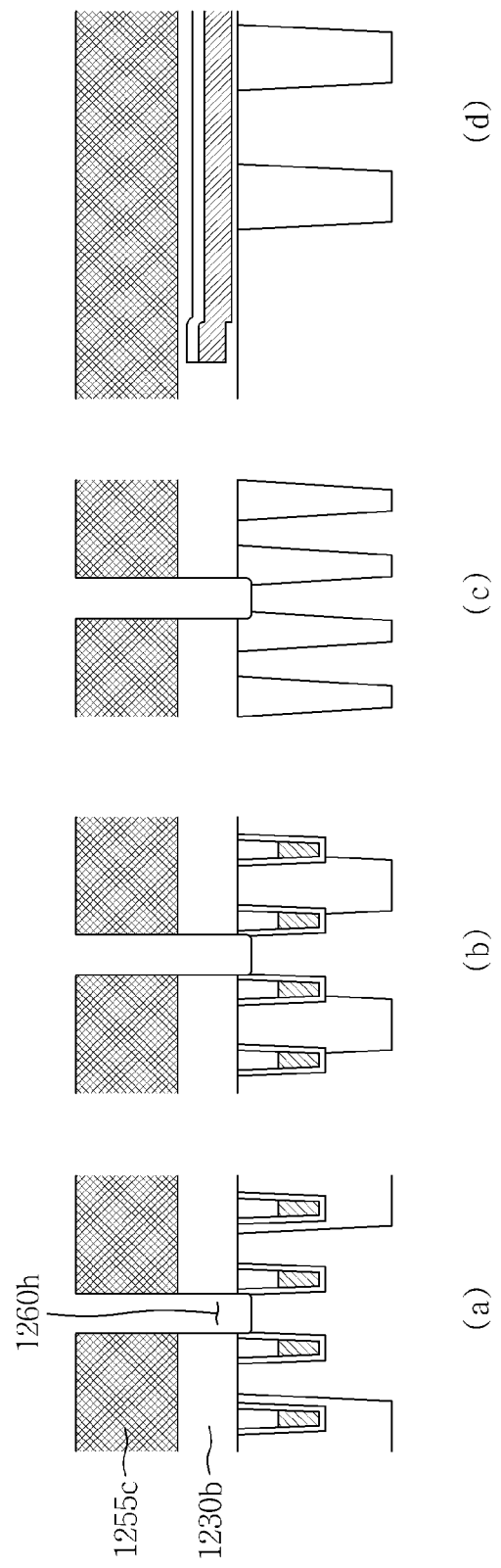

SEMICONDUCTOR DEVICES INCLUDING BIT LINE CONTACT PLUG AND PERIPHERAL TRANSITOR

PRIORITY STATEMENT

This application is a Continuation of application Ser. No. 13/072,907, filed Mar. 28, 2011, claims the benefits of priorities under 35 U.S.C. §119 from Korean Patent Applications Nos. 10-2010-0031560, 10-2010-0031562, and 10-2010-31564 filed on Apr. 6, 2010.

BACKGROUND

The inventive concepts relate to semiconductor devices having bit line contact plugs and buried channel array transistors, methods of fabricating the semiconductor devices, and to a semiconductor module, an electronic circuit board, and an electronic system including such semiconductor devices.

As semiconductor devices become more highly integrated, the architecture of semiconductor devices and processes of fabricating semiconductor devices are gradually becoming more elaborate and complicated. To meet the demand for highly integrated semiconductor devices, a buried word line structure, a buried channel array transistor, and 6F2 layout architecture have been suggested.

SUMMARY

According to the inventive concepts, there is provided an embodiment of a semiconductor device including a semiconductor substrate, a cell insulating isolation region, a word line, a bit line contact plug, a bit line, a peripheral insulating isolation region, and a peripheral transistor having electrodes disposed at the same levels in the semiconductor device as the bit line contact plug and electrode of the bit line, respectively. The cell insulating isolation region is disposed within the semiconductor substrate in a cell area of the semiconductor device, and delimits a cell active region of the semiconductor substrate in the cell area. The word line extends in the semiconductor substrate in the cell area of the semiconductor device. The bit line contact plug is disposed on the cell active region. The bit line is disposed on the bit line contact plug and comprises a bit line electrode. The peripheral insulating isolation region is disposed within the semiconductor substrate in a peripheral area of the semiconductor device, and delimits a peripheral active region of the semiconductor substrate in the peripheral area. The peripheral transistor has a lower electrode disposed on the peripheral active region of the semiconductor substrate and an upper electrode disposed on the lower electrode. The bit line contact plug occupies the same level in the semiconductor device as the lower electrode of the peripheral transistor. The bit line electrode occupies the same level in the semiconductor device as the upper electrode of the peripheral transistor.

According to the inventive concepts, there is provided a semiconductor module having a plurality of semiconductor devices at least one of which is a semiconductor device having the features described above, a module board to which the semiconductor devices are mounted, and module contact terminals disposed in parallel along one edge of the module board. The module contact terminals are electrically connected to the semiconductor devices, respectively.

According to the inventive concepts, there is provided an electronic system having a control unit, an input unit, an output unit, a storage unit, and a communication unit, wherein at least one of the units includes a semiconductor device having the features described above.

According to the inventive concepts, there is provided an embodiment of a semiconductor device including a cell insulating isolation region, a plurality of word lines, bit line contact plugs, first and second bit lines, a peripheral insulating isolation region, surface insulating layer, a peripheral transistor whose electrodes are disposed at the same levels in the semiconductor device as the bit line contact plugs and the electrodes of the bit lines, respectively. The cell insulating isolation region is provided within the semiconductor substrate in a cell area of the semiconductor device, and delimits cell active regions of the semiconductor substrate in the cell area. Thus, the cell insulating isolation region electrically isolates the cell active regions from one another. The word lines each extend in the semiconductor substrate in the cell area of the semiconductor device. The bit line contact plugs are disposed on the cell active regions, respectively. The bit lines each extend longitudinally on the semiconductor substrate in a first direction, with the first and second bit lines alternately disposed in a second direction perpendicular to the first direction. The peripheral insulating isolation region extends within the semiconductor substrate in a peripheral area of the semiconductor device, and delimits a peripheral active region of the semiconductor substrate in the peripheral area. The surface insulating layer may be disposed over the semiconductor substrate and interposed between a first segment of the first bit line and the cell active region on which said one of the bit line contact plugs is disposed and between a second segment of the second bit line and the cell insulating isolation region The peripheral transistor has a lower electrode disposed on the peripheral active region of the semiconductor substrate, and an upper electrode disposed on the lower electrode. The first segment of the first bit line is vertically aligned with and disposed on one of the bit line contact plugs, and the corresponding the second segment of the second bit line closest to the first bit line in the second direction is vertically aligned with and disposed on the cell insulating isolation region. The bit line contact plug occupies the same level in the semiconductor device as the lower electrode of the peripheral transistor, and the bit line electrodes of the first and second bit lines occupy the same level in the semiconductor device as the upper electrode of the peripheral transistor.

According to the inventive concepts, there is provided an embodiment of a method of fabricating a semiconductor device in which a bit line contact plug and bit line electrode are formed at the same level in the semiconductor device as electrodes of a peripheral transistor, respectively. A cell insulating isolation is formed in a first portion of a semiconductor substrate constituting a cell area of the semiconductor device so as to delimit a cell active region. A word line is formed in the first portion of the semiconductor substrate constituting the cell area. The bit line contact plug is formed on the cell active region. A bit line is formed on the bit line contact plug. A peripheral insulating isolation region is formed in a second portion of the semiconductor substrate constituting a peripheral area of the semiconductor device so as to delimit a peripheral active region. A peripheral transistor, comprising the peripheral transistor lower electrode and peripheral transistor upper electrode, is formed on the second portion of the semiconductor substrate constituting the peripheral area. The bit line contact plug and the lower electrode of the peripheral transistor are formed at the same level in the semiconductor device. The bit line electrode and the upper electrode of the peripheral transistor are also formed at the same level in the semiconductor device.

According to the inventive concepts, there is provided an embodiment of a method of fabricating a semiconductor device in which, through the use of a patterning process, a lower electrode of a peripheral transistor is formed at the same level in the semiconductor device as a bit line contact plug. A word line is formed in a first portion of a semiconductor substrate constituting a cell area of the semiconductor device. A first insulating layer is formed over the first portion of the semiconductor substrate corresponding to the cell area of the semiconductor device and over a second portion of the semiconductor substrate corresponding to the peripheral area of the semiconductor device. The first insulating layer is formed to be thicker on the first portion of the semiconductor substrate constituting the cell area than on the second portion of the semiconductor substrate constituting the peripheral area. A first electrode layer is formed on the first insulating layer in the peripheral area. A bit line contact plug is formed to extend through the first insulating layer in the cell area, and so as to be electrically conductively connected to the semiconductor substrate. A barrier layer is formed over the first insulating layer, the bit line contact plug, and the first electrode layer. A second electrode layer is formed over the barrier layer. A bit line is formed in the cell area and a peripheral transistor is formed in the peripheral area, including by patterning the second electrode layer and the barrier layer.

According to the inventive concepts, there is provided an embodiment of a method of fabricating a semiconductor device in which an electrode of a peripheral transistor is formed at the same level in the semiconductor device as a bit line contact plug, and a bit line and an upper portion of a peripheral transistor are formed by common processing of a semiconductor substrate. A trench is formed in a first portion of the semiconductor substrate constituting a cell area and in a second portion of the semiconductor substrate constituting a peripheral area of the semiconductor device. Then the trench in the cell area and in the peripheral area is filled with insulating material, to thereby form a trench type of cell insulating isolation region delimiting a cell active region in the cell area, and a trench type of peripheral insulating isolation region delimiting a peripheral active region in the peripheral area. A buried word line that crosses the cell active region and the cell insulating isolation region is formed. Peripheral transistor insulation is formed on the semiconductor substrate in the peripheral area, and surface insulating layer covering sidewalls of the bit line contact plug is formed on the semiconductor substrate in the cell area. A lower electrode of a peripheral transistor is formed on the peripheral transistor insulating layer, and the bit line contact plug is formed on the cell active region, by processes wherein the lower electrode and the bit line contact plug are completed at the same time and are formed at the same level in the semiconductor device. A surface insulating layer covering sidewalls of the bit line contact plug and the peripheral transistor lower electrode are formed. Then, a bit line is formed on the bit line contact plug, and simultaneously an upper portion of the peripheral transistor is formed on the peripheral transistor lower electrode.

BRIEF DESCRIPTION OF THE DRAWINGS

The inventive concepts will be better understood from the following detailed description of embodiments thereof made below with reference to the accompanying drawings. It should be understood that the drawings may exaggerate various aspects of the embodiments for clarity.

FIG. 1A is a schematic diagram of the layout of embodiments of semiconductor devices in accordance with the inventive concepts;

FIGS. 3A to 3C are each a longitudinal sectional view taken along line C-C' in FIG. 1A, and each illustrating a region of a respective embodiment of a semiconductor device where several bit line contact plugs are provided, in accordance with the inventive concepts;

FIGS. 4A to 4L are each a sectional view and together illustrate an embodiment of a method of fabricating a semiconductor device in accordance with the inventive concepts, wherein regions (a), (b), (c) and (d) in each of the figures are regions along lines A-A', B-B', C-C', and D-D' in FIG. 1A, respectively;

FIGS. 6A to 6I are each a sectional view and together illustrate an embodiment of a method of fabricating a semiconductor device in accordance with the inventive concepts, wherein regions (a), (b), (c) and (d) in each of the figures are regions along lines A-A', B-B', C-C', and D-D' in FIG. 1A, respectively;

FIGS. 7A to 7E are each a sectional view and together illustrate an embodiment of a method of fabricating a semiconductor device in accordance with the inventive concepts, wherein regions (a), (b), (c) and (d) in each of the figures are regions along lines A-A', B-B', C-C', and D-D' in FIG. 1A, respectively;

FIGS. 15A to 15J are each a sectional view and together illustrate an embodiment of a method of fabricating a semiconductor device in accordance with the inventive concepts, wherein regions (a), (b), (c) and (d) in each of the figures are regions along lines A-A', B-B', C-C', and D-D' in FIG. 1A, respectively;

DETAILED DESCRIPTION OF THE PREFERRED EMBODIMENTS

Figure 1B:
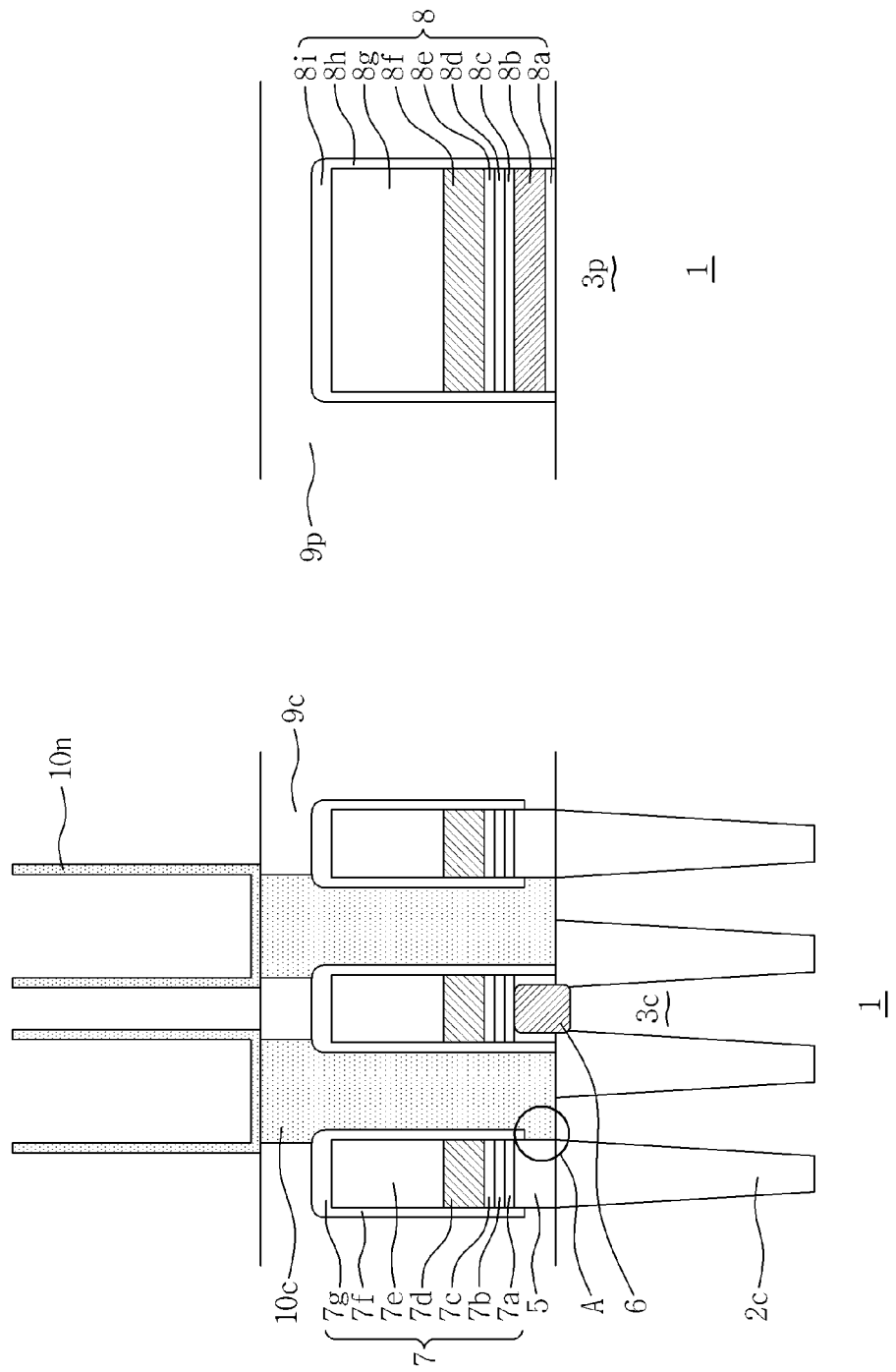
FIG. 1B is a sectional view of an embodiment of a semiconductor device in accordance with the inventive concepts.

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices and intermediate structures fabricated during the course of their manufacture are schematic. Also, when like numerals appear in the drawings, such numerals are used to designate like elements.

Furthermore, spatially relative terms, such as "upper," and "lower" are used to describe an element's and/or feature's relationship to another element(s) and/or feature(s) as illustrated in the figures. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can assume orientations different than those illustrated in the drawings when in use.

It will also be understood that when an element or layer is referred to as being "on" or "connected to" another element or layer, it can be directly on or directly connected to the other element or layer or intervening elements or layers may be present. In contrast, when an element or layer is referred to as being "directly on" or "directly connected to" another element or layer, there are no intervening elements or layers present. The same holds true for an element or layer described as being interposed "between" two features.

It will be understood that although the terms first, second, third etc. are used herein to describe various elements, regions, layers, etc., these elements, regions, and/or layers are not limited by these terms. These terms are only used to distinguish one element, layer or region from another.

Furthermore, spatially relative terms, such as "upper," and "lower" are used to describe an element's and/or feature's relationship to another element(s) and/or feature(s) as illustrated in the figures. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can assume orientations different than those illustrated in the drawings when in use. In addition, the term "surface" as used alone or as preceded by "upper", "top" or "bottom" generally refers to a surface of a layer or feature that is the uppermost or bottommost surface of that layer or feature in the orientation depicted, as would be clear from the drawings and context of the written description. The term "similar" is used to mean the same or substantially same. Also, the term "the same level" (in the semiconductor device) will be readily understood by those skilled in the art of semiconductor device architecture, as mainly referring to "coplanar" when used to described surfaces or as mainly referring to "occupying the same layer" when used to described features. With respect to the latter, two features described as being disposed at or occupying "the same level" in the semiconductor device may mean that the upper surfaces of the features are substantially coplanar and that the lower surfaces of the features are also substantially coplanar, although slight deviations are possible and still allow for the features to be considered as occupying the same level in the semiconductor device.

An example of a layout of semiconductor devices in accordance with the inventive concepts will now be described with reference to FIG. 1A and FIG. 1B.

Referring first to FIG. 1A, semiconductor devices according to the inventive concepts have a cell area CA and peripheral area PA. The cell area CA may include a cell insulating isolation region 2c (or regions such as when considered in section as shown in the drawing), cell active regions 3c, and word lines 4 in a semiconductor substrate 1. The cell area CA may further include bit lines 7 and bit line contact plugs 6 above/on the semiconductor substrate 1. The peripheral area PA includes a peripheral insulating isolation region 2p and a peripheral active region 3p in the semiconductor substrate 1. The peripheral area PA also includes a peripheral transistor 8 above/on the semiconductor substrate 1.

The cell area CA may include a plurality of regularly arranged cell transistors and/or a plurality of cell capacitors. The peripheral area PA may include a plurality of peripheral transistors such as CMOS transistors which may compose logic circuits. The cell active regions 3c may be bar-shaped, i.e., may be elongate. Both of the word lines 4 and the bit lines 7 may obliquely cross the cell active regions 3c.

The cell active regions 3c may be conductive regions formed by injecting impurity ions into the semiconductor substrate 1. For example, exposed regions between the word lines 4 may be source regions or drain regions.

The cell insulating isolation regions 2c may be shallow trench isolation (STI) may regions formed between the cell active regions 3c.

The word lines 4 may be of a buried type meaning that the word lines 4 are buried in the semiconductor substrate 1. Accordingly, the word lines 4 may cross the cell active regions 3c and the cell insulating isolation regions 2c. Furthermore, the word lines 4 may be formed in portions of the cell active regions 3c and the cell insulating isolation regions 2c.

The bit lines 7 may cross the word lines 4 at right angles. The bit lines 7 may be formed above the semiconductor substrate 1. The bit lines 7 may each be electrically and/or physically connected to several of the cell active regions 3c through a plurality of the bit line contact plugs 6, respectively. To this end, the bit line contact plugs 6 may be vertically aligned with central portions of the cell active regions 3c. The layout of the peripheral region PA is shown simplified for the sake of brevity.

Referring to FIG. 1B, the bit line 7 may include bit line conductive layers 7a, 7b and 7c at a lower part, a bit line metal layer 7d at a middle part, a bit line capping layer 7e at an upper part, bit line side wrapping layers 7f at side parts and a bit line upper wrapping layer 7g at an uppermost part.

The peripheral transistor 8 may include a peripheral transistor insulating layer 8a, a peripheral transistor lower electrode 8b, peripheral transistor conductive layers 8c, 8d, and 8e, a peripheral transistor upper electrode 8f, a peripheral transistor capping layer 8g, peripheral transistor side wrapping layers 8h, and a peripheral transistor upper wrapping layer 8i. As shown in FIG. 1B, the semiconductor device may further include interlayer dielectric layers 9c and 9p, storage node contact plugs 10c, and storage nodes 10n, which are omitted in FIG. 1A.

The bit line conductive layers 7a, 7b and 7c may be spaced apart from a surface of the semiconductor substrate 1 with a height of the surface insulating layer 5 and/or the bit line contact plug 6.

Portions of the bit line side wrapping layers 7f adjacent to the surface of the semiconductor substrate 1 may be removed. Accordingly, contacting areas between the storage node contact plugs 10c and the cell active region 3 of the semiconductor substrate 1 may be expanded. The bit line contact plug 6 may extend into the semiconductor substrate 1. In other words, the bottom of the bit line contact plug 6 may be situated lower than the surface of the semiconductor substrate 1.

The bit line contact plug 6 may be partially or completely surrounded by surface insulating layer 5. The surface insulating layer 5 may comprise silicon oxide, silicon nitride or silicon oxynitride. The surface insulating layer 5 may be formed between the semiconductor substrate 1 and the bit line 7. That is, the semiconductor substrate 1 and the bit line 7 may be spaced apart from each other by the surface insulating layer 5. These elements will be described in more detail later.

Other examples of the embodiment of a semiconductor device according to the inventive concepts will be described in FIGS. 2A to 2F. In these figures, region (d) also includes a core area of the semiconductor device. The core area, at the left side of region (d), is an area surrounding the cell area CA and is located between the cell area CA and peripheral area PA. Although the core area and the peripheral area PA may be significantly spaced apart from each other, the areas are shown adjacent to each other for ease of illustration and description. The core area may have various shapes all within the scope of the inventive concepts.

Figure 2A:
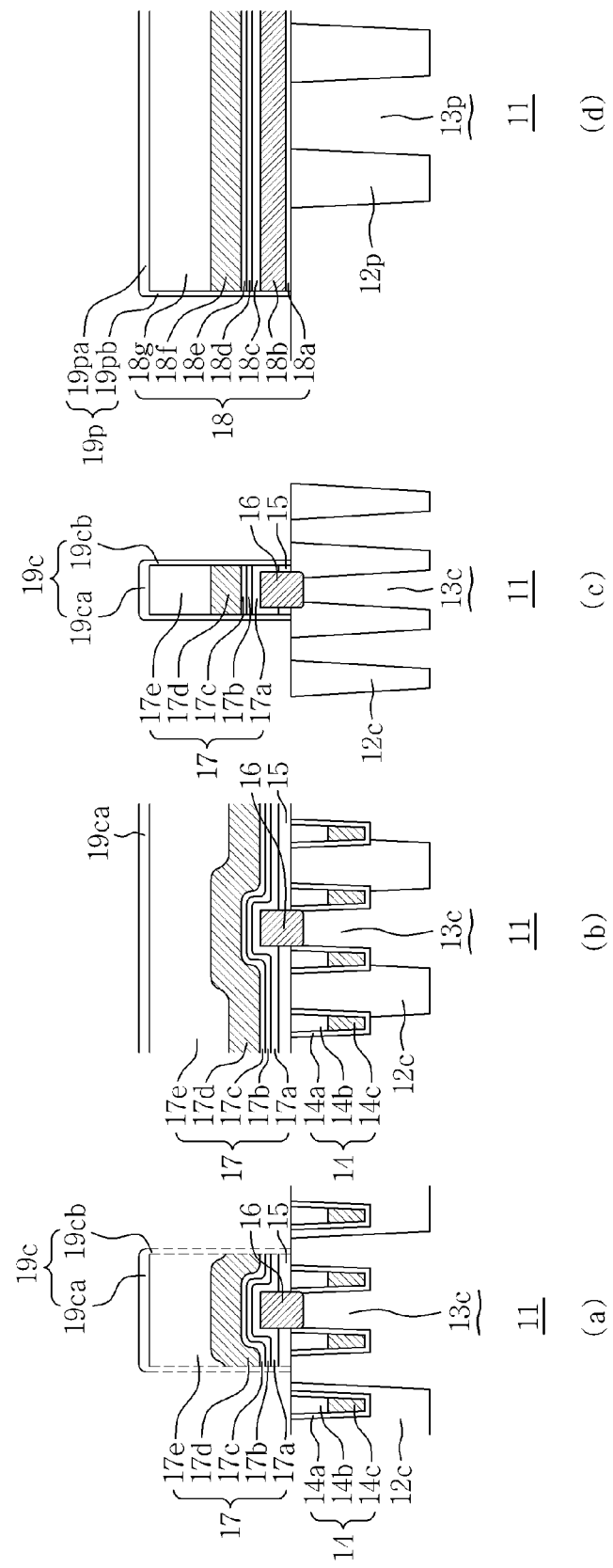
FIGS. 2A to 2F are each a sectional view of a respective embodiment of semiconductor device, in accordance with the inventive concepts, with regions (a), (b), (c) and (d) in each of the figures being regions along lines A-A', B-B', C-C' and D-D' of FIG. 1A, respectively.

Referring to FIG. 2A, this example of a semiconductor device in accordance with the inventive concepts includes cell insulating isolation regions 12c, cell active regions 13c, and word lines 14 all formed in a semiconductor substrate 11, and a bit line 17, a bit line contact plug 16 and a surface insulating layer 15 all formed above/on the semiconductor substrate 11, in a cell area CA. The semiconductor device also includes peripheral insulating isolation regions 12p and a peripheral active region 13p formed in the semiconductor substrate 11, and a peripheral transistor 18 formed on the semiconductor substrate 11, in a peripheral area PA.

The cell insulating isolation regions 12c and the peripheral insulating isolation region 12p may be STI regions, and sizes of the cell insulating isolation regions 12c may be variously established according to characteristics of the semiconductor device.

The cell active regions 13c and the peripheral active region 13p may be portions of the semiconductor substrate 11, and may include well regions injected with impurities.

The word lines 14 may each include a word line insulating layer 14a, a word line capping layer 14b, and a word line electrode 14c. The word line insulating layer 14a may comprise an oxide material such as silicon oxide, hafnium oxide or another oxide material. The word line capping layer 14b may comprise an insulating material such as silicon oxide, silicon nitride or silicon oxynitride. The word line electrode 14c may comprise doped silicon, metals, metal silicides, or metal compounds. The elements 14a, 14b, and 14c of the word lines 14 are illustrated as simply shaped so that the inventive concepts may be easily understood but may have various other shapes.

The bit line contact plug 16 may be formed in a pillar shape or a mesa shape. The bit line contact plug 16 may electrically and/or physically connect the cell active region 13c to the bit line 17. The bit line contact plug 16 may comprise doped silicon, metals, metal silicides, or metal compounds. The bit line contact plug 16 may be formed to a first width in the word line 14 extending direction and a second width in the bit line 17 extending direction. The first width and the second width may be different from each other. For example, the first width may be smaller than the second width. That is, the bit line contact plug 16 may have the shape of a circle, an oval or a rectangle in plan.

The bit line contact plug 16 may be partially or completely surrounded by the surface insulating layer 15. The surface insulating layer 15 may comprise silicon oxide, silicon nitride or silicon oxynitride. The surface insulating layer 15 may be formed between the semiconductor substrate 11 and the bit line 17. That is, the semiconductor substrate 11 and the bit line 17 may be spaced apart from each other by the surface insulating layer 15.

The bit line 17 may include a lower bit line metal silicide layer 17a, a bit line barrier layer 17b, an upper bit line metal silicide layer 17c, a bit line electrode 17d, and a bit line capping layer 17e. When the bit line contact plug 16 is of doped silicon and the bit line electrode 17d includes a metal, the lower bit line metal silicide layer 17a may be of a metal to form a metal silicide layer or a metal silicide. The lower bit line metal silicide layer 17a may be a metal layer at portions not in contact with the bit line contact plug 16. Accordingly, the lower bit line metal silicide layer 17a may be a material layer including both a metal silicide and a metal. The bit line barrier layer 17b may comprise titanium nitride (TiN). The upper bit line metal silicide layer 17c may comprise a metal silicide or a metal nitride. The bit line electrode 17d may include the same metal as the upper bit line metal silicide layer 17c. For example, when the upper bit line metal silicide layer 17c includes tungsten (W), the bit line electrode 17d may also include tungsten (W). The bit line capping layer 17e may be of an insulating material such as silicon nitride or silicon oxynitride.

The bit line 17 may be surrounded by the bit line wrapping layer 19c. The bit line wrapping layer 19c may include a bit line upper wrapping layer 19ca and a bit line side wrapping layer 19cb. The bit line side wrapping layer 19cb may be formed into spacer shapes. In the spacer shapes, it may be understood that the lowermost width is larger than the uppermost width of the bit line side wrapping layer 19cb. The bit line wrapping layer 19c may comprise silicon oxide, silicon nitride, or silicon oxynitride. The bit line wrapping layer 19c may also be formed on sidewalls of the surface insulating layer 15.

The peripheral transistor 18 may include a peripheral transistor insulating layer 18a, a peripheral transistor lower electrode 18b, a peripheral transistor lower metal silicide layer 18c, a peripheral transistor barrier layer 18d, a peripheral transistor upper metal silicide layer 18e, a peripheral transistor upper electrode 18f, and a peripheral transistor capping layer 18g.

The peripheral transistor insulating layer 18a may be of the same material as the surface insulating layer 15. The peripheral transistor lower electrode 18b may comprise doped silicon. The peripheral transistor lower electrode 18b may be formed to occupy the same or similar level as the bit line contact plug 16. The peripheral transistor lower metal silicide layer 18c, the peripheral transistor barrier layer 18d, and the peripheral transistor upper metal silicide layer 18e may be of the same materials and/or may have the same widths as the lower bit line metal silicide layer 17a, the bit line barrier layer 17b, and the upper bit line metal silicide layer 17c, respectively. The peripheral transistor upper electrode 18f may be of the same material and/or may have the same width as the bit line electrode 17d. The peripheral transistor capping layer 18g may be of the same material and/or may have the same width as the bit line capping layer 17e.

The peripheral transistor 18 may be surrounded by a peripheral transistor wrapping layer 19p. The peripheral transistor wrapping layer 19p may include a peripheral transistor upper wrapping layer 19pa and a peripheral transistor side wrapping layer 19pb. The peripheral transistor side wrapping layer 19pb may also be formed in the spacer shape. The peripheral transistor wrapping layer 19p may be of the same material and/or may have the same or similar structure as the bit line wrapping layer 19c. A similar structure may include a similar thickness or a thickness difference of less than dozens of Å. For example, the thickness difference of the structures is less than 100 Å in an example of this embodiment. The thickness difference may be over 100 Å due to process conditions imposing a heavy burden from a loading effect. Accordingly, the numerical limitations are not absolute. The elements of the similar structures may be formed by the same processes during the fabricating of the semiconductor device. Furthermore, it will be understood that similar thicknesses refer to thicknesses that differ only within a range of errors due basically only to process variables. The error ranges may be numerical ranges in consideration of process variations, loading effects, and/or local peculiarities. Conventionally, acceptable error ranges are within ±10% of target values.

In an example of this embodiment, the top surface of the bit line contact plug 16 may be formed to a higher level than the top surface of the surface insulating layer 15. In other words, the bit line contact plug 16 may protrude from the top surface of the surface insulating layer 15.

Figure 2B:
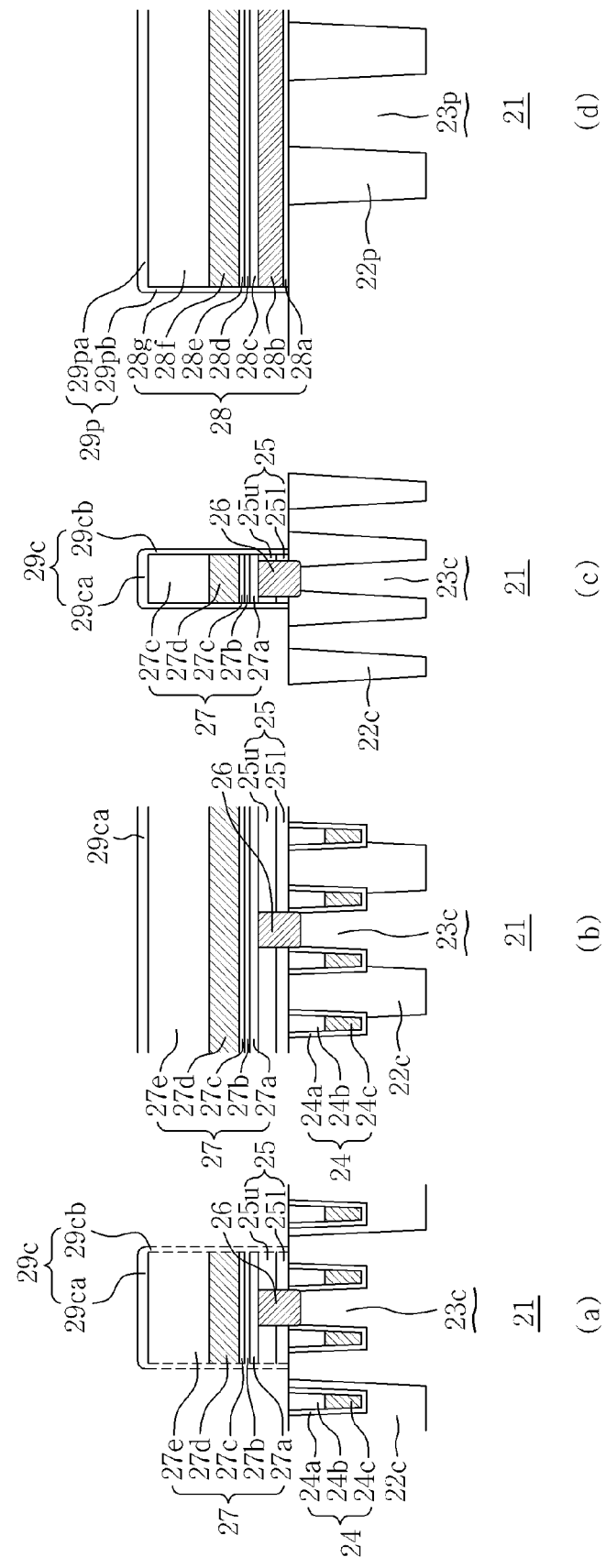

Referring to FIG. 2B, this embodiment of a semiconductor device in accordance with the inventive concepts includes cell insulating isolation regions 22c, cell active regions 23c, and word lines 24 all formed in a semiconductor substrate 21, and a bit line 27, a bit line contact plug 26 and a surface insulating layer 25 all formed above/on the semiconductor substrate 21, in a cell area CA. The semiconductor device also includes peripheral insulating isolation regions 22p and a peripheral active region 23p all formed in the semiconductor substrate 21, and a peripheral transistor 28 formed on the semiconductor substrate 21, in a peripheral area PA.

The elements shown in FIG. 2B can be understood by referring to the elements having similar reference numerals shown in FIG. 2A. In the example embodiment, the surface insulating layer 25 may be formed as lamina or multi layers. For example, the surface insulating layer 25 may include a lower surface insulating layer 25l and an upper surface insulating layer 25u. The lower surface insulating layer 25l and the upper surface insulating layer 25u may be of materials having a different etch selectivity from each other, e.g., silicon oxide and silicon nitride. An example of this embodiment in which both the lower surface insulating layer 25l and the upper surface insulating layer 25u are silicon oxide will be described in more detail later. Top surfaces of the bit line contact plug 26 and the surface insulating layer 25 may be disposed at a similar level. That is, the bit line contact plug 26 and the surface insulating layer 25 may be formed simultaneously, e.g., using the same etching step and/or CMP process.

Figure 2C:
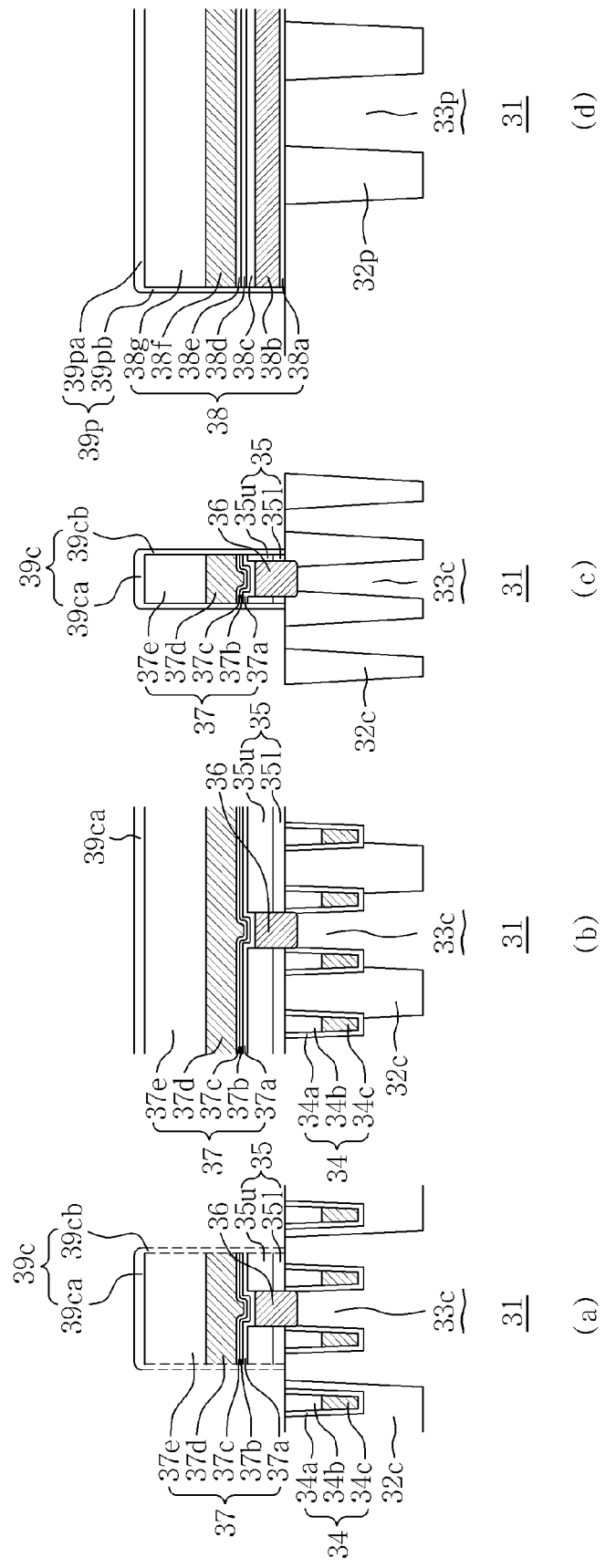

Referring to FIG. 2C, this embodiment of a semiconductor device in accordance with the inventive concepts includes cell insulating isolation regions 32c, cell active regions 33c, and word lines 34 all formed in a semiconductor substrate 31, and a bit line 37, a bit line contact plug 36 and a surface insulating layer 35 all formed above/on the semiconductor substrate 31, in a cell area CA. The semiconductor device also includes peripheral insulating isolation regions 32P and a peripheral active region 33P formed in the semiconductor substrate 31, and a peripheral transistor 38 formed on the semiconductor substrate 31, in a peripheral area PA.

The elements shown in FIG. 2C can be understood by referring to the elements having similar reference numerals shown in FIGS. 2A and 2B. The surface insulating layer 35 may also be constituted by lamina or multi layers. That is, the surface insulating layer 35 may include a lower surface insulating layer 35l and an upper surface insulating layer 35u. A surface of the bit line contact plug 36 may be at a lower level than the surface of the surface insulating layer 35. The bit line contact plug 36 may be formed by using an etching process having an etching selectivity with the surface insulating layer 35 or a CMP process.

Figure 2D:
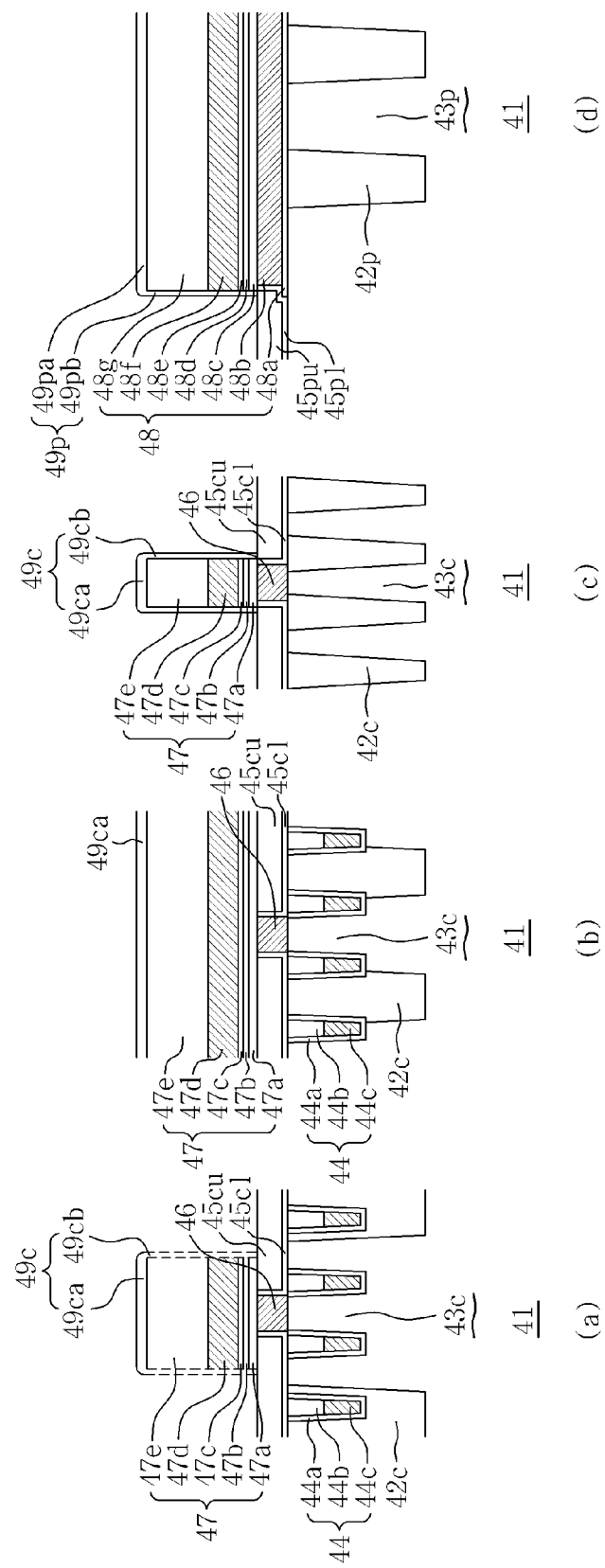

Referring to FIG. 2D, this embodiment of a semiconductor device in accordance with the inventive concepts includes cell insulating isolation regions 42c, cell active regions 43c, and word lines 44 all formed in a semiconductor substrate 41, and a bit line 47, a bit line contact plug 46 and a surface insulating layer 45 all formed above/on the semiconductor substrate 41, in a cell area CA. The semiconductor device also includes peripheral insulating isolation regions 42p and a peripheral active region 43p formed in the semiconductor substrate 41, and a peripheral transistor 48 formed on the semiconductor substrate 41, in a peripheral area PA.

The elements shown in FIG. 2D can be understood by referring to the elements having similar reference numerals shown in FIGS. 2A to 2C. The cell surface insulating layer 45c may also be constituted by lamina or multi layers. That is, the cell surface insulating layer 45c may include a lower cell surface insulating layer 45c1 and an upper cell surface insulating layer 45cu. The lower cell surface insulating layer 45c1 may be formed on a surface of the semiconductor substrate 41 and sidewalls of the bit line plug 46. The surface of the bit line contact plug 46 and the surface of the cell surface insulating layer 45c may be situated at similar levels. The bit line wrapping layer 49c may be formed on the cell surface insulating layer 45c. The cell surface insulating layer 45c may extend onto the peripheral area PA and be formed into a peripheral surface insulating layer 45p. The peripheral surface insulating layer 45p may include a lower surface insulating layer 45p1 and an upper peripheral surface insulating layer 45pu. A peripheral transistor wrapping layer 49p may be formed on the peripheral surface insulating layer 45p. The lower peripheral surface insulating layer 45p1 may be formed on a peripheral transistor insulating layer 48a and/or sidewalls of the peripheral transistor lower electrode 48b.

Figure 2E:
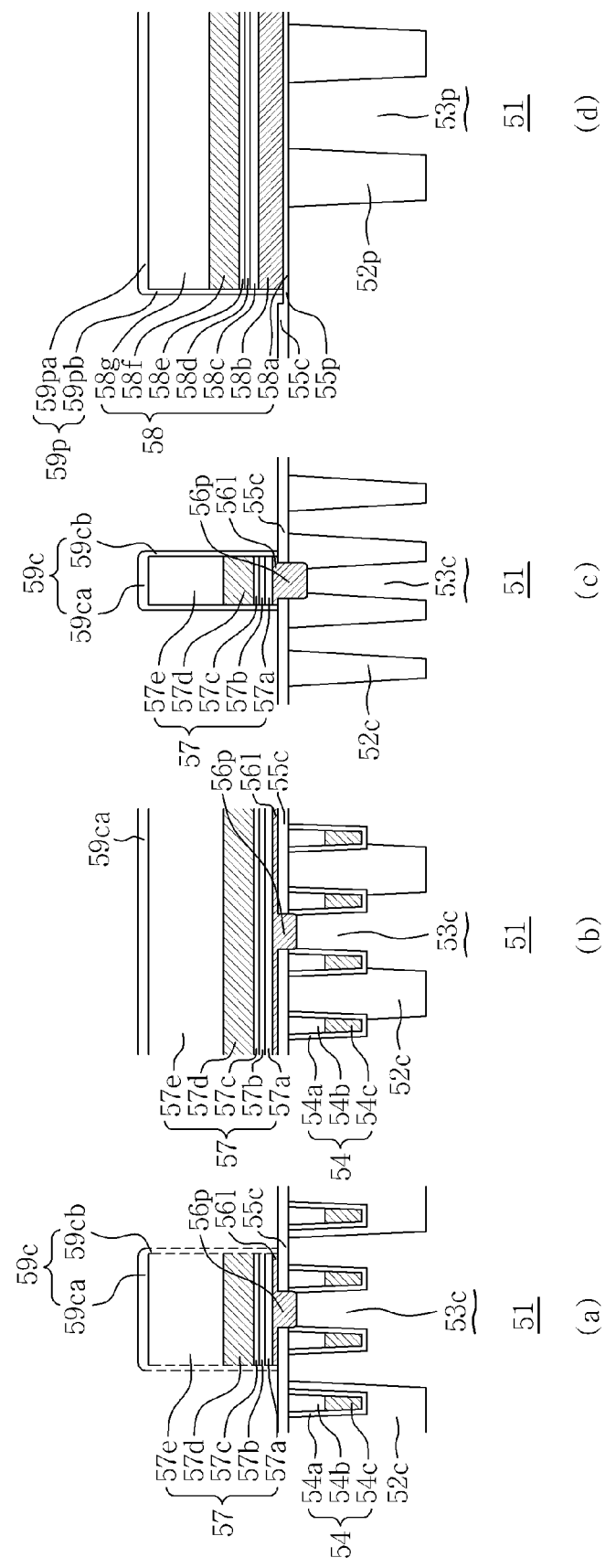

Referring to FIG. 2E, this embodiment of a semiconductor device in accordance with the inventive concepts includes cell insulating isolation regions 52c, cell active regions 53c, and word lines 54 all formed in a semiconductor substrate 51, and a bit line 57 and a bit line contact plug 56p formed above/on the semiconductor substrate 51, in a cell area CA. The semiconductor device also includes peripheral insulating isolation regions 52p and a peripheral active region 53p formed in the semiconductor substrate 51, and a peripheral transistor 58 formed on the semiconductor substrate 51, in a peripheral area PA.

The elements shown in FIG. 2E can be understood by referring to the elements having similar reference numerals shown in FIGS. 2A to 2D. A cell surface insulating layer 55c may be formed on the cell area CA and a peripheral surface insulating layer 55p may be formed on the peripheral area PA. The cell surface insulating layer 55c and the peripheral surface insulating layer 55p may have different thicknesses from each other. A line type contact pad 561 may be formed between the bit line 57 and the bit line contact plug 56p. The line type contact pad 561 may be of the same material as the bit line contact plug 56p. For example, the line type contact pad 561 may comprise silicon or a silicide. The line type contact pad 561 may have the same shape as the bit line 57 in plan.

Figure 2F:
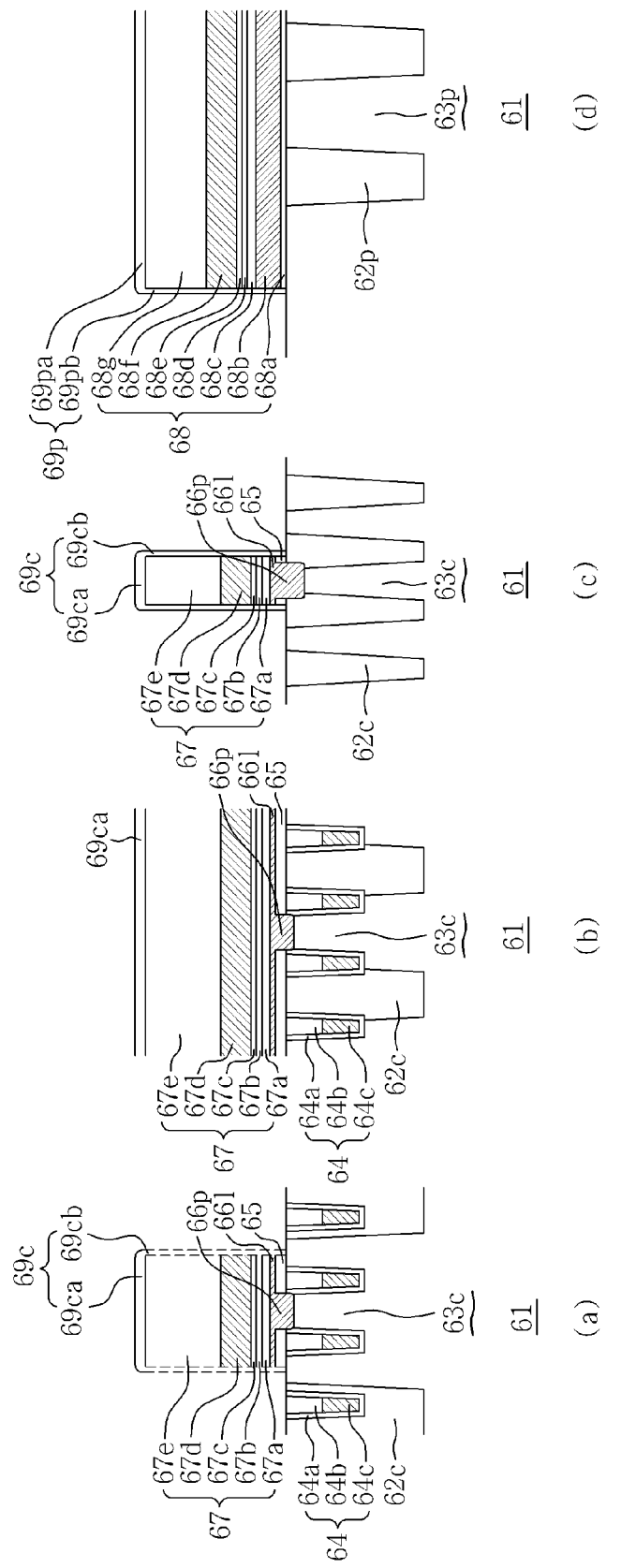

Referring to FIG. 2F, this embodiment of a semiconductor device in accordance with the inventive concept includes cell insulating isolation regions 62c, cell active regions 63c and word lines 64 all formed in a semiconductor substrate 61, and a bit line 67, a bit line contact plug 66p and a surface insulating layer 65 all formed above/on the semiconductor substrate 61, in the cell area CA. The semiconductor device also includes peripheral insulating isolation regions 62p and a peripheral active region 63p formed in the semiconductor substrate 61, and a peripheral transistor 68 formed on the semiconductor surface 61, in the peripheral area PA.

The elements shown in FIG. 2F can be understood by referring to the elements having similar reference numerals shown in FIGS. 2A to 2E. A line type contact pad 661 may be formed between the bit line 67 and the bit line contact plug 66p. The line type contact pad 661 may be of the same material as the bit line contact plug 66p. The line type contact pad 661 may comprise silicon or a silicide. The line type contact pad 661 may have the same shape as the bit line 67 in plan.

As shown in FIGS. 2A to 2F, the bit line contact plugs 16, 26, 36, 46, 56p, and 66p may protrude only from or may be recessed in the bottom of the bit lines 17, 27, 37, 47, 57, and 67. For example, the bit line contact plugs 16, 26, 36, 46, 56p, and 66p may protrude only or may be recessed in the lower bit line metal silicide layers 17a, 27a, 37a, 47a, 57a, and 67a. Either of these characteristics can be employed in the various examples of embodiments described herein.

Figure 3B:
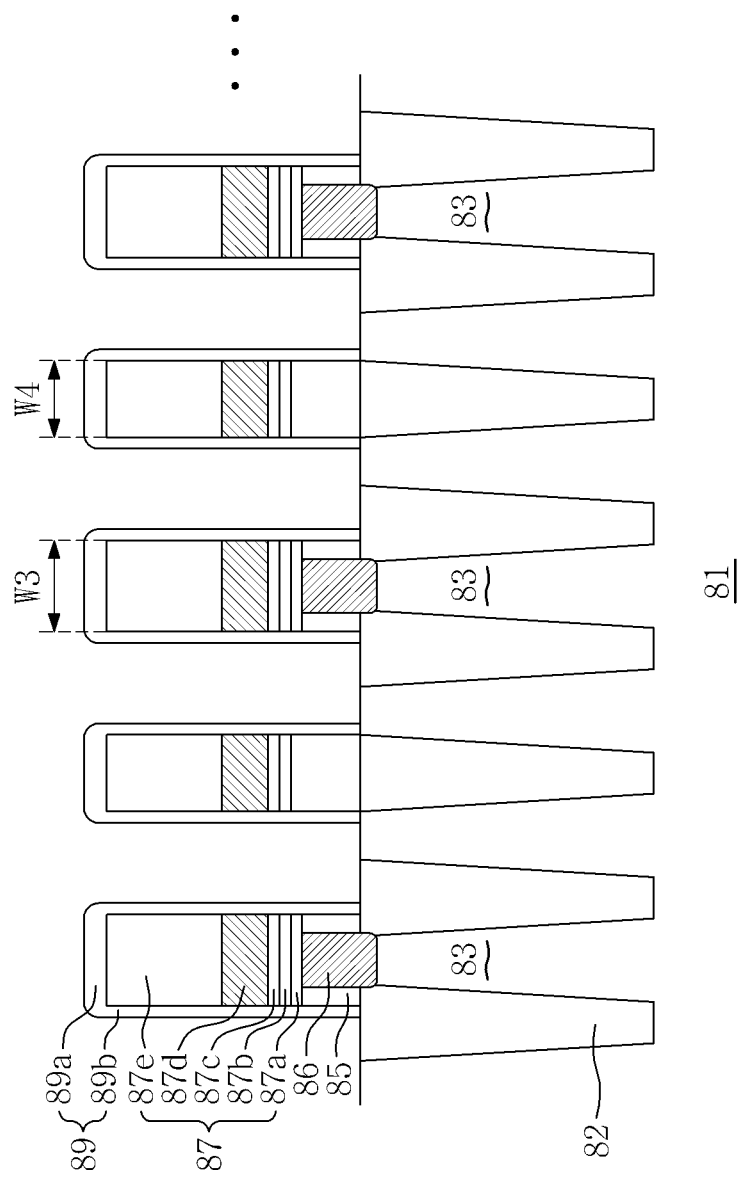
Figure 3C:
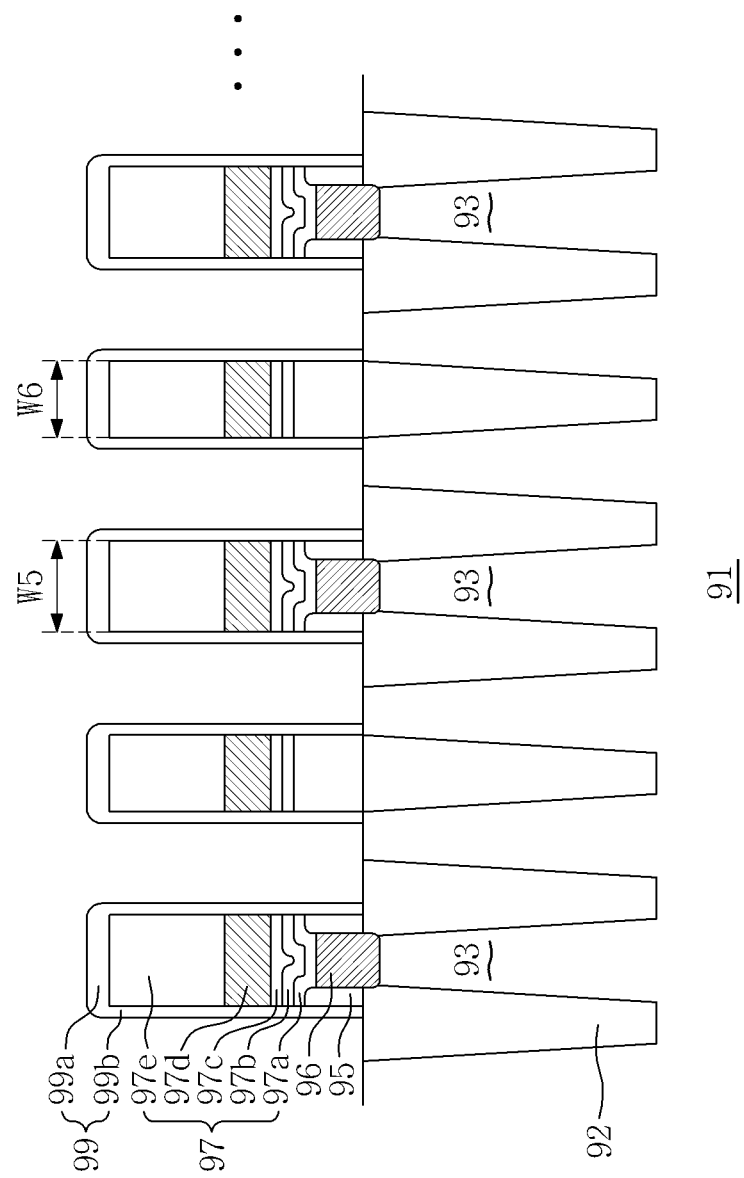

FIGS. 3A to 3C each illustrate a region of a respective embodiment of a semiconductor device, in accordance with the inventive concepts, where several of the bit line contact plugs are provided.

Referring to FIG. 3A, this embodiment of a semiconductor device includes insulating isolation regions 72 and active regions 73 in a semiconductor substrate 71, and bit line contact plugs 76 and bit lines 77 above/on the semiconductor substrate 71. The elements shown in FIG. 3A can be understood by referring to the elements having similar reference numerals shown in FIGS. 2A to 2F. The bit lines 77 may each include a lower bit line metal silicide layer 77a, a bit line barrier layer 77b, an upper bit line metal silicide layer 77c, and a bit line electrode 77d.

Some of the bit lines 77 are aligned with the contact plugs 76, respectively, whereas others of the bit lines 77 are not aligned with a contact plug 76. The bit lines 77 aligned with the contact plugs 76 have a first width W1 and the bit lines 77 not aligned with a contact plug 76 have a second width W2. The first width W1 is greater than the second width W2. That is, according to the inventive concepts, the bit lines 77 aligned with the bit line contact plugs 76 have expanded widths. FIG.

3A shows bit line contact plugs 76 each having the same structure as the bit line contact plug 16 shown in FIG. 2A. However, as will be clear from the description below, this aspect of the inventive concept can be applied to bit line contact plugs having the structures shown in FIGS. 2B to 2F.

Referring to FIG. 3B, for example, this embodiment of a semiconductor device in accordance with the inventive concept includes insulating isolation regions 82 and active regions 83 in a semiconductor substrate 81, and bit line contact plugs 86 and bit lines 87 above/on the semiconductor substrate 81. The elements shown in FIG. 3B can be understood by referring to the elements having similar reference numerals shown in FIGS. 2A to 2F.

In this embodiment, each bit line 87 aligned with a bit line contact plugs 86 has a width W3 greater than the width W4 of each bit line 87 that is not aligned with a bit line contact plug. That is, again, according to the inventive concepts, the bit lines 87 aligned with the bit line contact plugs 86 have expanded widths. FIG. 3B shows bit line contact plugs 86 each having the same structure as the contact plug 26 shown in FIG. 2B.

And referring to FIG. 3C, for example, this embodiment of a semiconductor device in accordance with the inventive concepts includes insulating isolation regions 92 and active regions 93 in a semiconductor substrate 91, and bit line contact plugs 96 and bit lines 97 above/on the semiconductor substrate 91. The elements shown in FIG. 3C can be understood by referring to the elements having similar reference numerals shown in FIGS. 2A to 2F.

In this embodiment, each bit line 97 aligned with bit line contact plugs 96 has a width W5 greater than the width W6 of each bit line 97 that is not aligned with a bit line contact plug 96. That is, again, according to the inventive concepts, the bit lines 97 that are aligned with the bit line contact plugs 96 have expanded widths. FIG. 3C shows bit line contact plugs 96 each having the same structure as the bit line contact plug 36 shown in FIG. 2C.

Embodiments of methods of fabricating semiconductor devices in accordance with the inventive concepts will now be described with reference to FIGS. 4A-L, 5A-G, ... 24A-I. In these figures, as is clear from the description of the drawings above, regions (a), (b), and (c) are regions, respectively, of the cell area CA of the semiconductor device. Furthermore, the left side of region (d) is a region of the core area and the right side of region (d) is a region of the peripheral area of the semiconductor device.

Embodiment 1

Figure 4A:
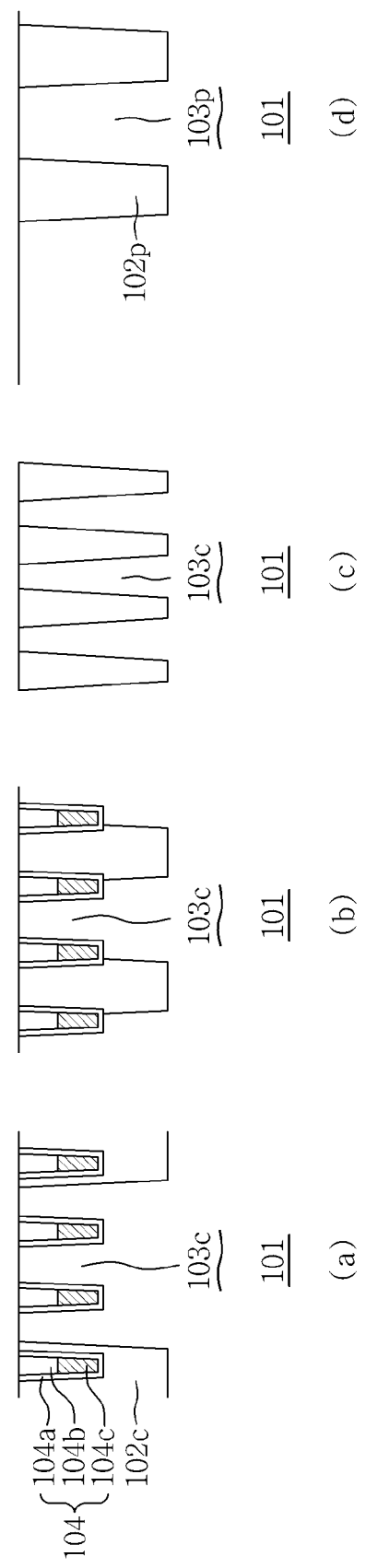

Referring to FIG. 4A, cell insulating isolation regions 102c defining cell active regions 103c, and word lines 104 may be formed in a portion of a semiconductor substrate 101 corresponding to a cell area CA of the final semiconductor device, and peripheral insulating isolation regions 102p defining peripheral active regions 103p may be formed in a portion of the semiconductor substrate 101 corresponding to a peripheral area PA of the final semiconductor device. The cell insulating isolation regions 102c, the peripheral insulating isolation regions 102p, and the word lines 104 may be understood by referring to FIG. 2A. The semiconductor substrate 101, the surfaces of the cell insulating isolation regions 102c, the peripheral insulating isolation regions 102p, and the word lines 104 do not have to be formed at the same level. However, the same surface levels are illustrated for ease of description.

Figure 4B:
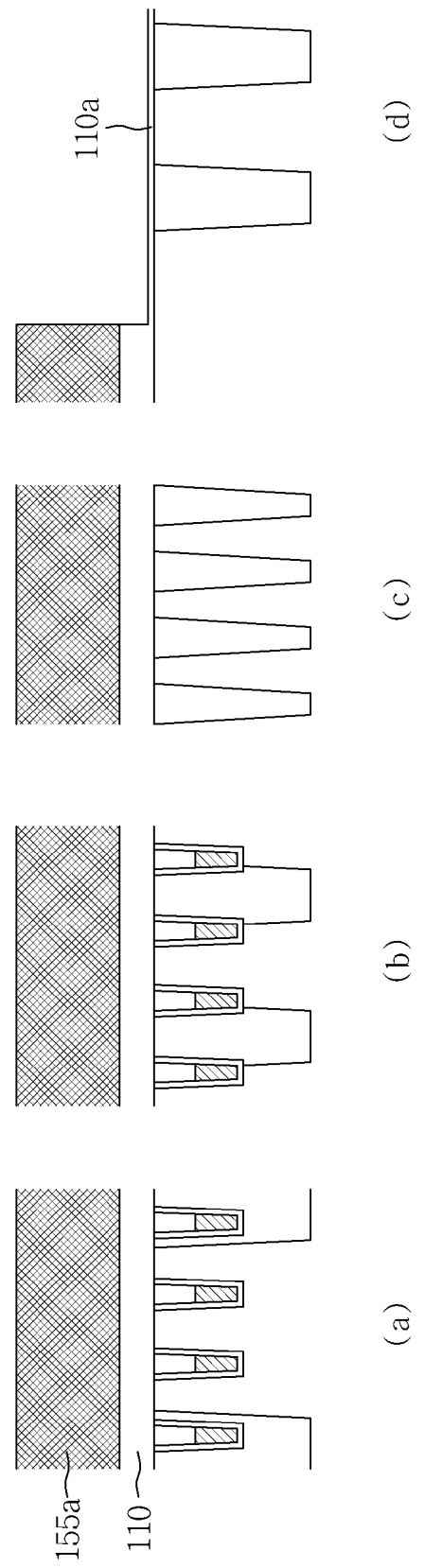

Referring to FIG. 4B, a first insulating layer 110 may be entirely formed on a surface of the semiconductor substrate 101, and a first photoresist pattern 155a exposing the first insulating layer 110 on the peripheral area PA may be formed on the first insulating layer 110. In succession, in the peripheral area PA, an exposed portion of the first insulating layer 110 may be partially removed and formed into a peripheral transistor insulating layer 110a. In an example of this embodiment, the first insulating layer 110 is formed of thermal silicon oxide using thermal deposition methods and to a thickness of about 500 Å. The thermal deposition methods may be performed in a range of about 600° C. to 1000° C. The peripheral transistor insulating layer 110a may be variously formed in compliance with standards of semiconductor devices. In the example, the peripheral transistor insulating layer 110a is formed to a thickness of about 50 Å. Then, the photoresist pattern 155a may be removed.

Figure 4C:
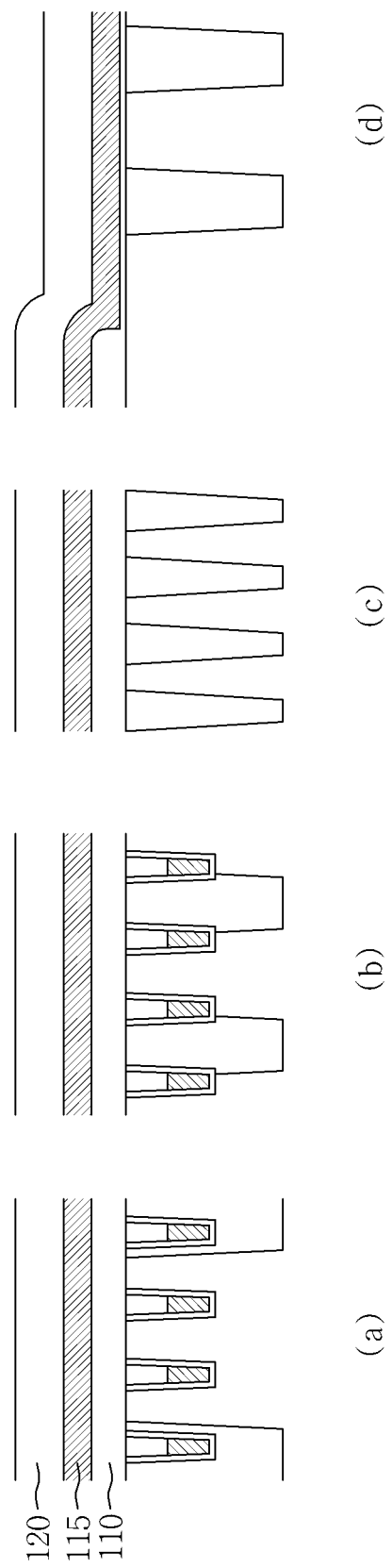

Referring FIG. 4C, a first silicon layer 115 and a second insulating layer 120 may be entirely formed. The first silicon layer 115 may be formed to a thickness of about 400 Å. About 100 Å of an upper portion of the first silicon layer 115 may include carbon. Even if there are no descriptions relating to carbon in the examples of embodiments of the inventive concepts, it should be understood that any silicon layers may include carbon in their upper portions. Specifically, any silicon layers to be formed in gate electrodes of the peripheral transistor in the peripheral area PA may include a carbon-containing layer and a non carbon-containing layer. The first silicon layer 115 including carbon will be described in more detail later.

In any case, the first silicon layer 115 may be used to form a gate electrode of the peripheral transistor in the peripheral area PA. Accordingly, an ion injecting process may be performed to make the first silicon layer 115 conductive. For example, N-type impurities may be injected in a step of forming the first silicon layer 115 and P-type impurities may be injected after the step of forming the first silicon layer 115. The process of injecting P-type impurities may include forming an ion injecting mask pattern to expose areas of the first silicon layer 115 to be injected with P-type impurities and injecting the P-type impurities into the exposed areas using the ion injecting mask pattern. Even if the ion injecting process is not mentioned in the description of other embodiments, the ion injecting process can be applied to such embodiments.

The second insulating layer 120 may be formed to a thickness of about 700 Å using silicate insulating materials such as tetraethyl orthosilicate (TEOS).

Figure 4D:
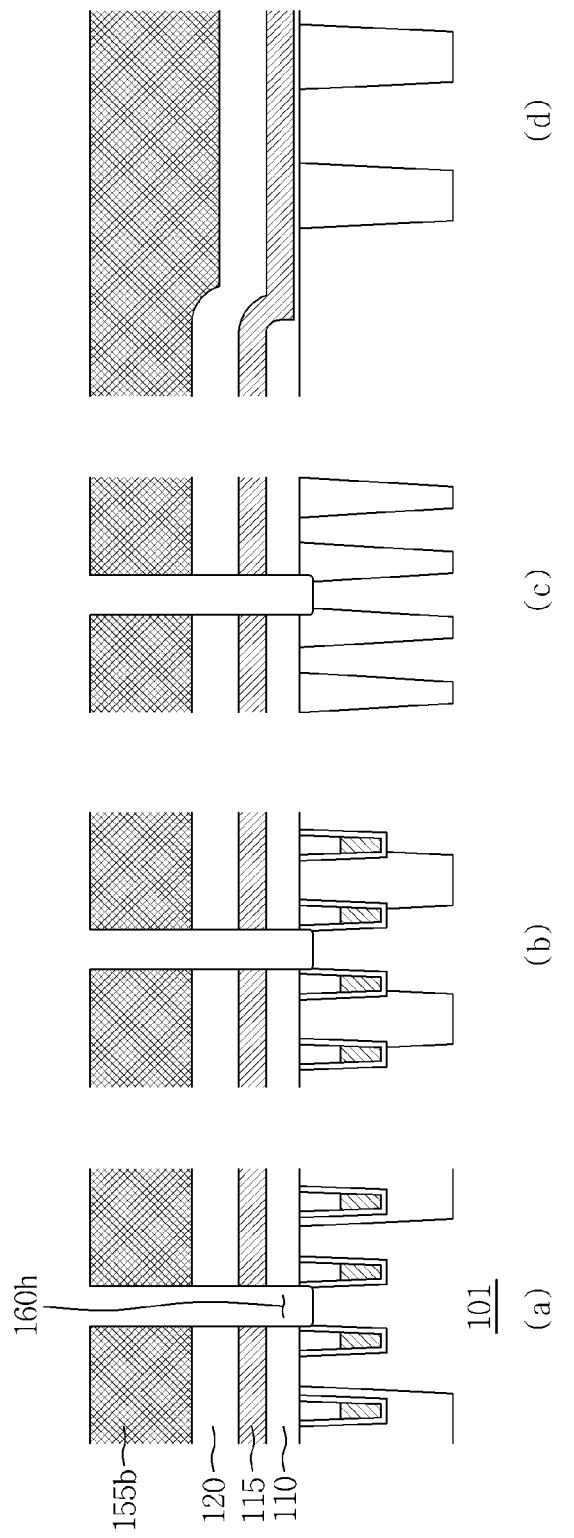

Referring to FIG. 4D, a bit line contact hole 160h may be formed. Forming the bit line contact hole 160h may include entirely forming a second photoresist pattern 155b on the second insulating layer 120 and patterning the second insulating layer 120, the first silicon layer 115, and the first insulating layer 110 using the second photoresist pattern 155b as a patterning mask. As shown in FIG. 4D, the bottom of the bit line contact hole 160h may be formed beneath the surface of the semiconductor substrate 101. In addition, an SOH layer may be included between the second photoresist pattern 155b and the second insulating layer 120. The SOH may include organic resin such as that of a photoresist. The SOH can improve a planarization property, etching resistance property, anti-reflection property, etc. of a photoresist. In embodiments according to the inventive concepts, any photoresist pattern may include an SOH layer. The SOH layer may be removed by the same methods as methods of removing any photoresist. Successively, the second photoresist pattern may be removed. A silicon treatment process may be performed before removing the second photoresist pattern 155b. The silicon treatment process may make a silicon surface in good condition by lightly etching or cleaning the exposed surface of the semiconductor substrate. In general, during the silicon treatment process, a material to be treated may be slightly removed, for example, less than about 100 Å. The silicon treatment process may be performed after forming a contact hole in other embodiments. After removing the second photoresist pattern 155b, an ozone strip process to remove by-products, residues of the second photoresist pattern 155b and the SOH and/or other materials may be performed. The ozone strip process may be performed in a plasma chamber using ozone plasma. Then, a cleaning process to remove any native oxides and/or any contaminating substances may be performed. For example, the cleaning process may include a wet cleaning process for about 10 seconds using an SC-1 solution and/or for about 180 seconds using a diluted fluoric acid solution. The SC-1 solution may include hydrogen peroxide ($H_2O_2$), ammonia ($NH_4OH$), and de-ionized water in various ratios and the diluted fluoric acid solution may include fluoric acid and water in various ratios.

Figure 4E:
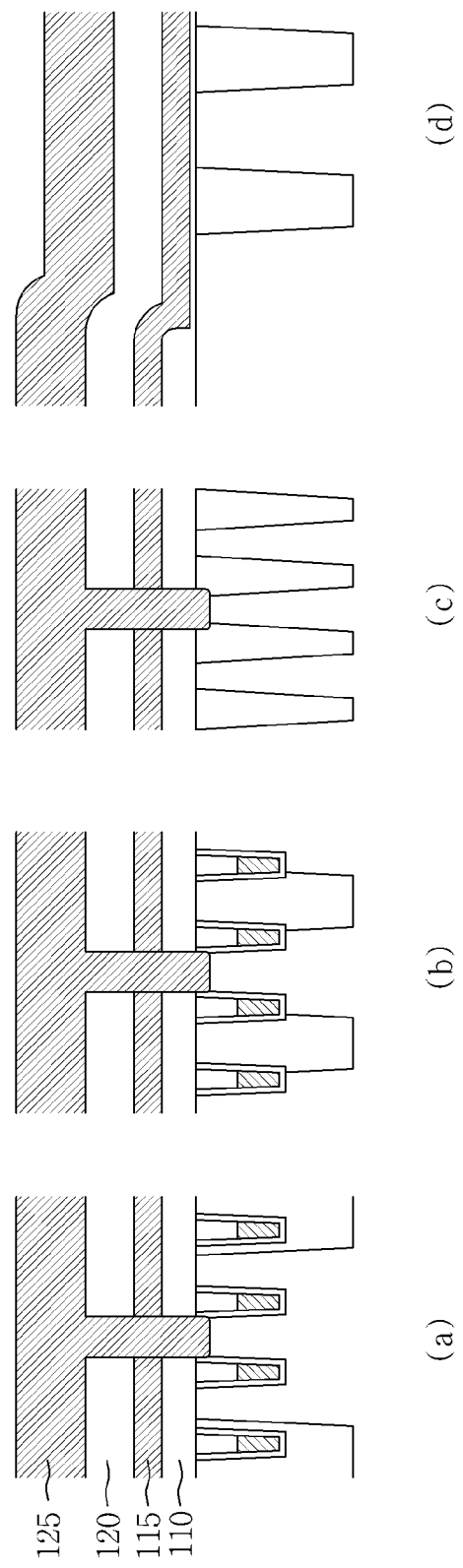

Referring to FIG. 4E, a second silicon layer 125 may be formed to a thickness of about 1000 Å to completely fill the bit line contact hole 160h.

Referring to FIG. 4F, a CMP process or etch back process may be performed to form the second silicon layer 125 into a bit line contact plug 160p. Simultaneously, the overall thickness of the second insulating layer 120 may be thinned and the second insulating layer 120 may be formed into a second thinned insulating layer 120a. An upper surface of the bit line contact plug 160p may be formed level with or lower than a surface of the second thinned insulating layer 120a.

Figure 4G:
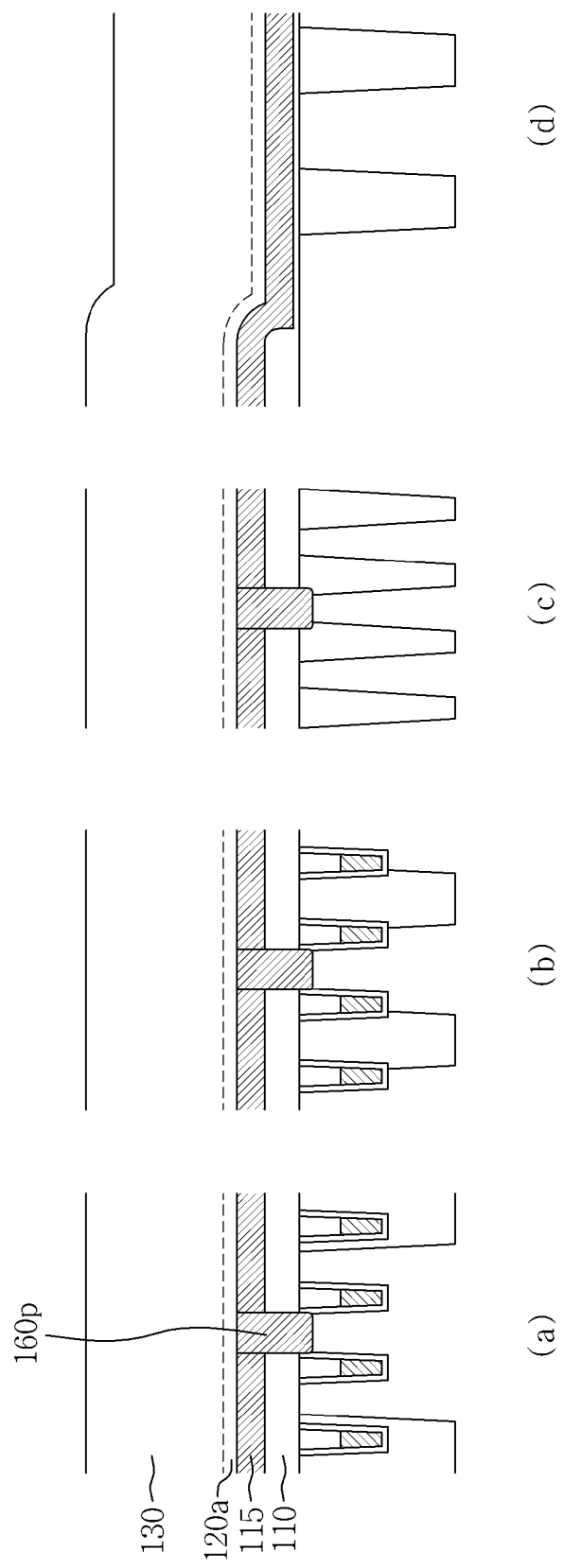

Referring to FIG. 4G, a third insulating layer 130 may be entirely formed. The third insulating layer 130 may be formed of silicon oxide to a thickness of about 2000 Å. In the case in which the third insulating layer 130 is of the same material as the underlying layer, i.e., the second thinned insulating layer 120a, an interface between the second thinned insulating layer 120a and the third insulating layer 130 is practically indiscernable. Thus, such an interface will be illustrated using broken lines. That is, it can be said, that once the third insulating layer 130 is realized, any discernable interface between the layers 130 and 120a "no longer exists". When the second thinned insulating layer 120a and the third insulating layer 130 are formed of different materials, a discernable interface will of course exist.

Figure 4H:
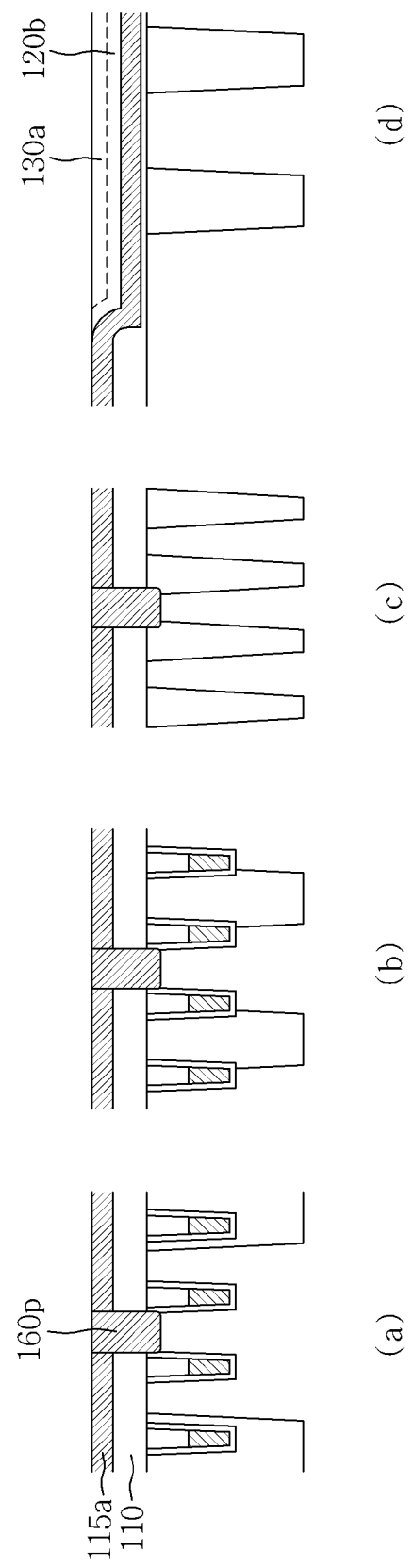

Referring to FIG. 4H, surfaces of the bit line contact plug 160p and the first silicon layer 115 may be exposed by entirely removing the third insulating layer 130 using a CMP method and an etch back method. A first planarized silicon layer 115a may be formed in the cell area CA and a third planarized insulating layer 130a may remain in the peripheral area PA. Specifically, a top surface level of the first planarized silicon layer 115a in the cell area CA and a top surface level of the third planarized insulating layer 130a in the peripheral area PA may be similar to each other. As a result of the process, the first planarized silicon layer 115a may be thinner than the first silicon layer 115. The second thinned insulating layer 120a may be formed into a second thinned peripheral insulating layer 120b in the peripheral area PA.

Figure 4I:
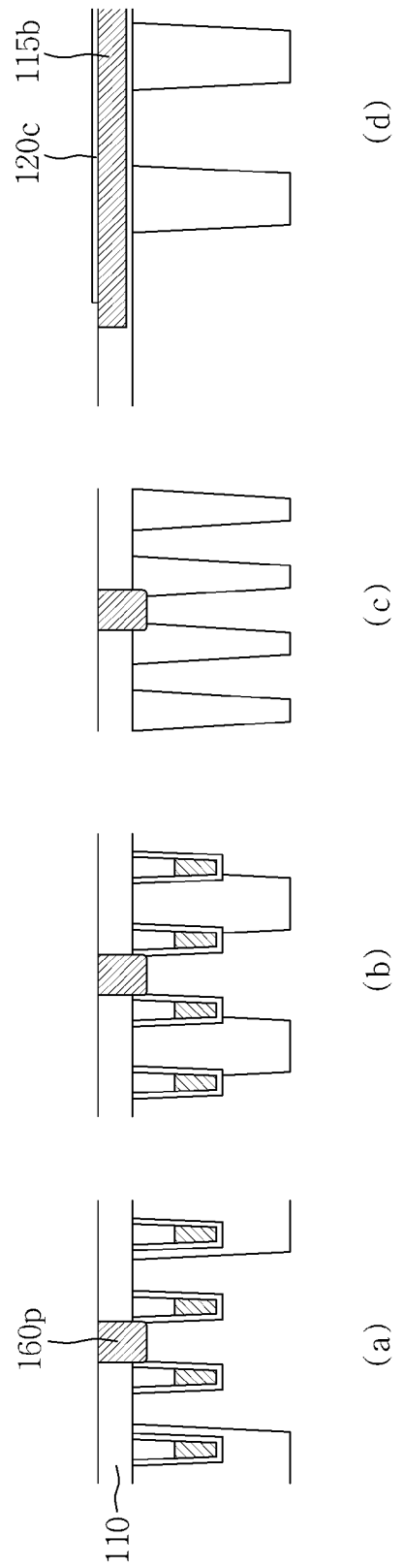

Referring to FIG. 4I, a first peripheral silicon layer 115b may be formed by removing an upper portion of the bit line contact plug 160p and the first planarized silicon layer 115a in the cell area CA. A second twice-thinned peripheral insulating layer 120c may be formed by removing about 100 Å of an upper portion of the second thinned peripheral insulating layer 120b in the peripheral area PA. The top surface of the bit line contact plug 160p may be lower than the top surface of the first insulating layer 110 in the cell area CA. In FIG. 4I, the top surface level of the bit line contact plug 160p and the top surface level of the first insulating layer 110 are shown coplanar simply for ease of description and understanding.

Figure 4J:
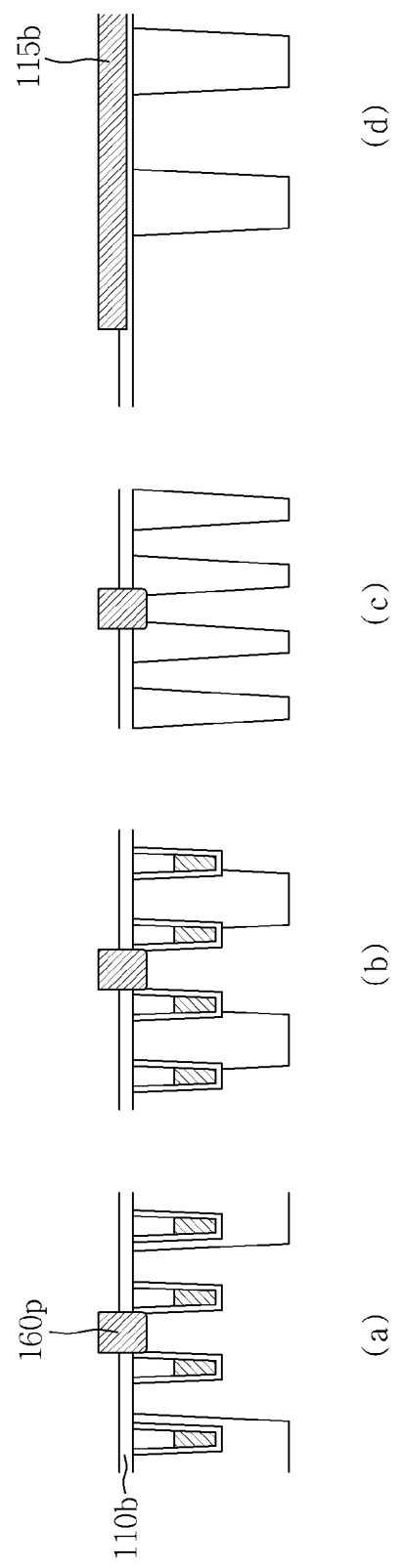

Referring to FIG. 4J, by removing portions of the first insulating layer 110 and the second thinned peripheral insulating layer 120c using a wet etching method, a first thinned cell insulating layer 110b may be formed in the cell area CA and the first peripheral silicon layer 115b may be exposed in the peripheral area PA. In the results of performing the process, the bit line contact plug 160p may protrude from the top of the first thinned cell insulating layer 110b in the cell area CA. The first peripheral silicon layer 115b may protrude from the top of the first thinned cell insulating layer 110b in the peripheral area PA. In the process, the process recipes may be optimized such that the top surface of the bit line contact plug 160p may be level with or lower than the surface of the first thinned cell insulating layer 110b. The optimized process will be described in other example embodiments. In addition, a removed amount of the first insulating layer 110 or a height difference between the surface of the first insulating layer 110 and the top surface of the bit line contact plug 160p may be adjusted to about 200 Å.

Figure 4K:
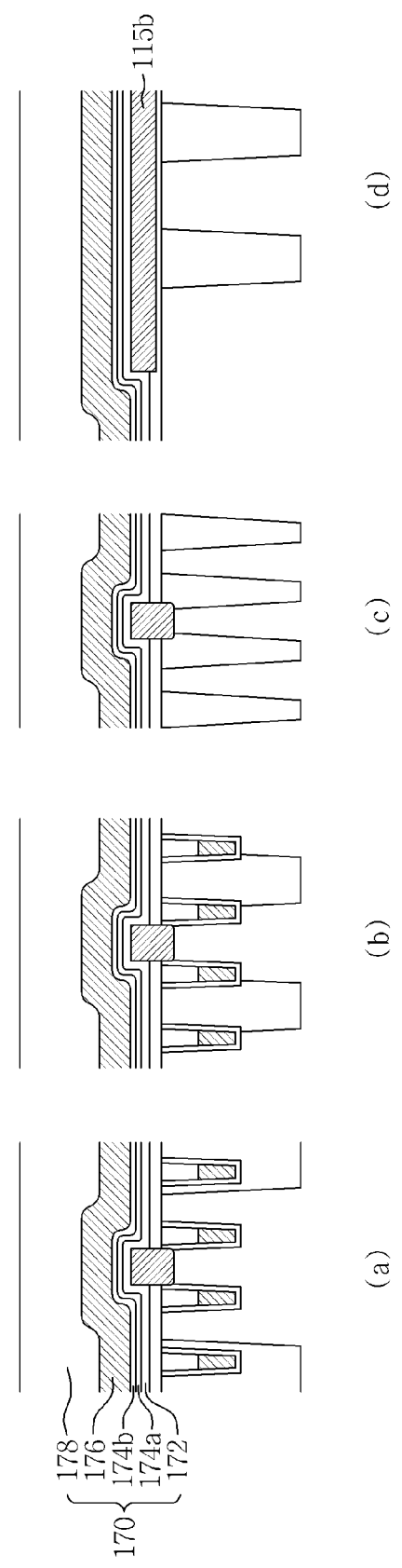

Referring to FIG. 4K, an interconnection layer 170 may be formed. The interconnection layer 170 may include a lower metal layer 172, a barrier layer 174a, an upper metal layer 174b, an interconnection electrode layer 176 and an interconnection capping layer 178. The lower metal layer 172 may be formed into a metal silicide layer by silicidation reacting on the bit line contact plug 160p and the first peripheral silicon layer 115b. That is, the lower metal layer 172 may be a metallic layer for forming a metal silicide layer. The lower metal layer may be formed to a thickness of about 80 Å. The barrier layer 174a may comprise a titanium nitride (TiN) layer. The upper metal layer 174b may comprise a metal silicide layer or a metallic layer for forming the metal silicide layer. The total thickness of the barrier layer 174a and the upper metal layer 174b may be about 100 Å. In any of the embodiments, the upper metal layer 174b may be omitted.

The interconnection electrode layer 176 may be formed into a bit line in the cell area CA and a gate metal electrode corresponding to an upper electrode of a peripheral transistor in the peripheral area PA. The interconnection electrode layer 176 may comprise at least one of tungsten (W), copper (Cu), cobalt (Co), nickel (Ni), ruthenium (Ru), iridium (Ir), or other metals. The interconnection electrode layer 176 may be formed to a thickness of about 500 Å. The interconnection capping layer 178 may comprise a layer of silicon nitride having a thickness of about 1300 Å. The above thicknesses are not absolute but relative in accordance with the disclosed embodiment.

Figure 4L:
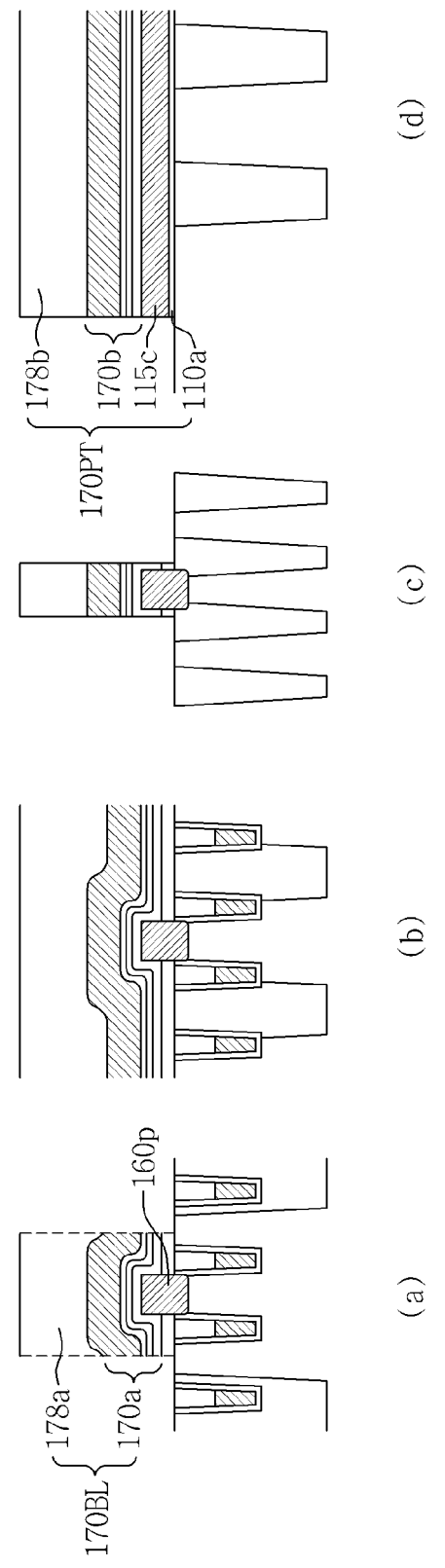

Referring to FIG. 4L, by performing a patterning process, a bit line pattern 170BL may be formed in the cell area CA and a peripheral transistor pattern 170PT may be formed in the peripheral area PA. Broken lines in FIG. 4L illustrate the obliqueness of the bit line pattern 170BL (as shown in FIG. 1a). The patterning process may include a photolithography process and an etching process. Then, by performing a process to form a wrapping layer, any one of the semiconductor devices illustrated in FIGS. 2A to 3C may be fabricated. In succession, an interlayer dielectric layer covering the bit line pattern 170BL and the peripheral transistor pattern 170PT, and storage contacts may be further formed. In this way, any one of the semiconductor devices shown in FIGS. 2A to 3C may be fabricated.

Embodiment 2

Figure 5A:
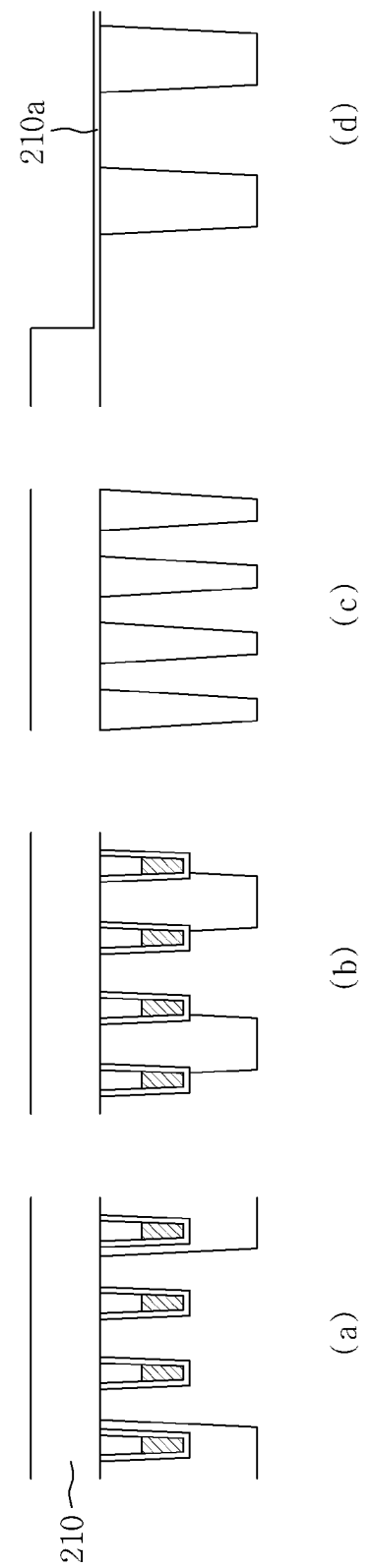
FIGS. 5A to 5G are each a sectional view and together illustrate an embodiment of a method of fabricating a semiconductor device in accordance with the inventive concepts, wherein regions (a), (b), (c) and (d) in each of the figures are regions along lines A-A', B-B', C-C', and D-D' in FIG. 1A, respectively.

Referring to FIG. 5A, by performing the processes shown in FIGS. 4A and 4B, a first cell insulating layer 210 may be formed to a thickness of about 1000 Å and a first peripheral insulating layer 210a to a thickness of about 50 Å.

Figure 5B:
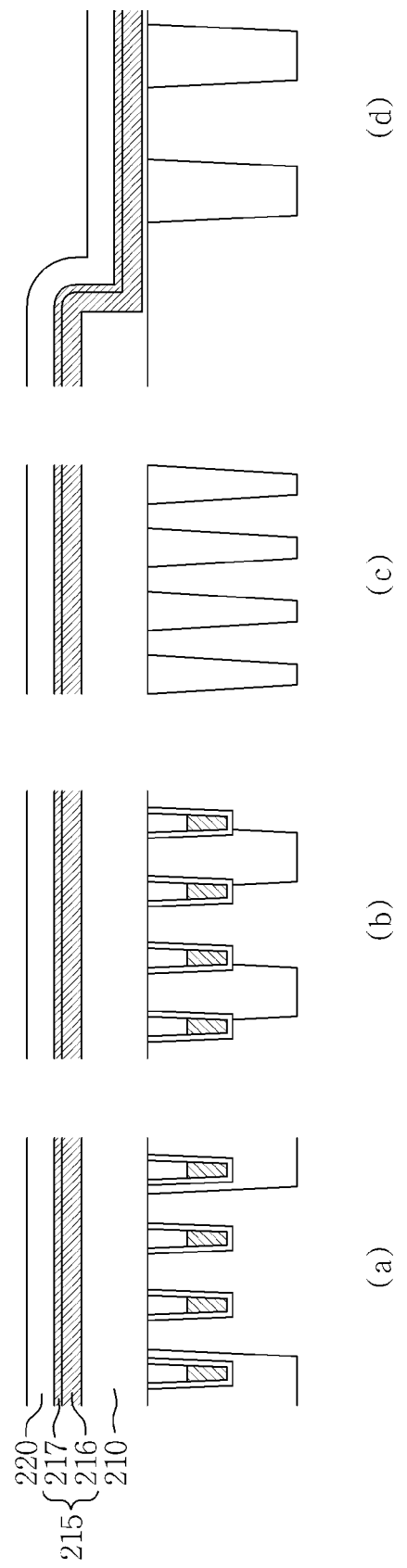

Referring to FIG. 5B, a first silicon layer 215 and a second insulating layer 220 may be entirely formed. The first silicon layer 215 may include a first lower silicon layer 216 not containing carbon and a first upper silicon layer 217 containing carbon. When a portion of the first silicon layer 215 includes carbon, etching resistance of the first silicon layer 215 can be improved. The first upper silicon layer 217 containing carbon may be formed by supplying carbon ions during any process for forming the first silicon layer 215, or by injecting carbon into the first silicon layer 215 using diffusion methods or implantation methods after forming the first silicon layer 215. The first lower silicon layer 216 may be formed to a thickness of about 300 Å and the first upper silicon layer 217 may be formed to a thickness of about 100 Å. When the first silicon layer 215 in the peripheral area PA is a gate electrode of a PMOS transistor, a process of injecting P-type impurities may be performed before forming the second insulating layer 220. The second insulating layer 220 may be formed of silicon nitride to a thickness similar to that of the first silicon layer 215.

Figure 5C:
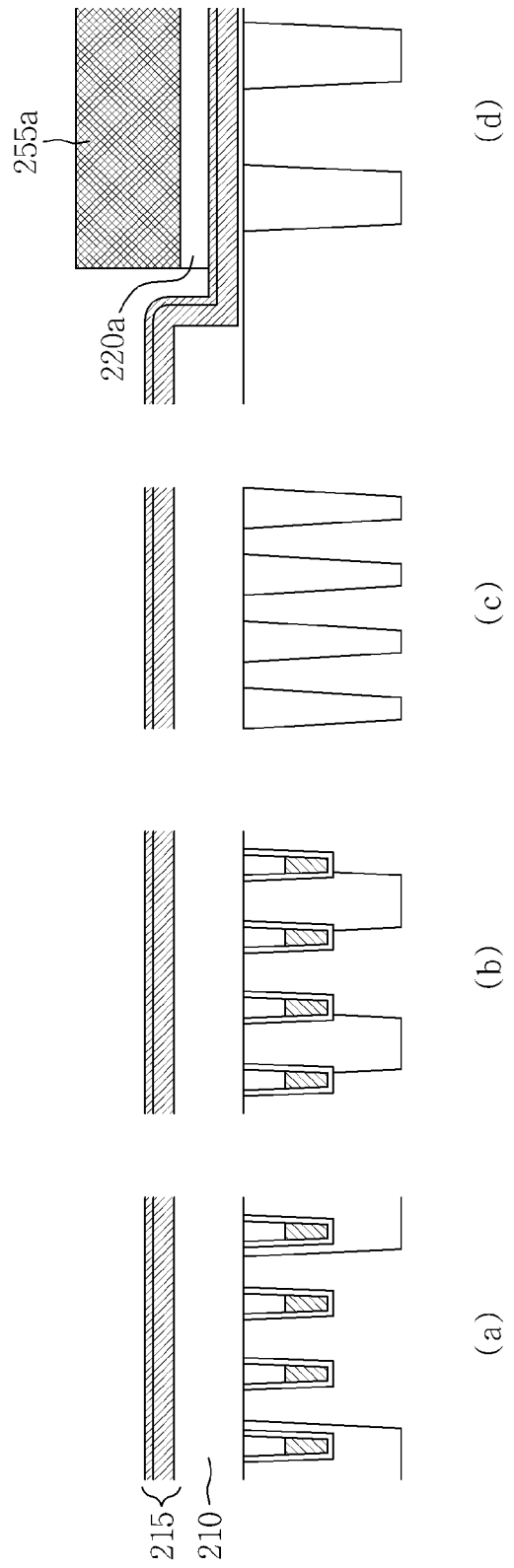

Referring to FIG. 5C, a first photoresist pattern 255a exposing the cell area CA and covering a portion of the peripheral area PA may be formed. A second peripheral insulating layer 220a in the cell area CA may be formed by selectively removing exposed portions of the second insulating layer 220 using the first photoresist pattern 255a as a patterning mask. The first silicon layer 215 may be exposed in the cell area CA. A wet etching process using phosphoric acid ($H_3PO_4$) may be used to selectively remove the exposed portion of the second insulating layer 220. Then, the first photoresist pattern 255a may be removed.

Figure 5D:
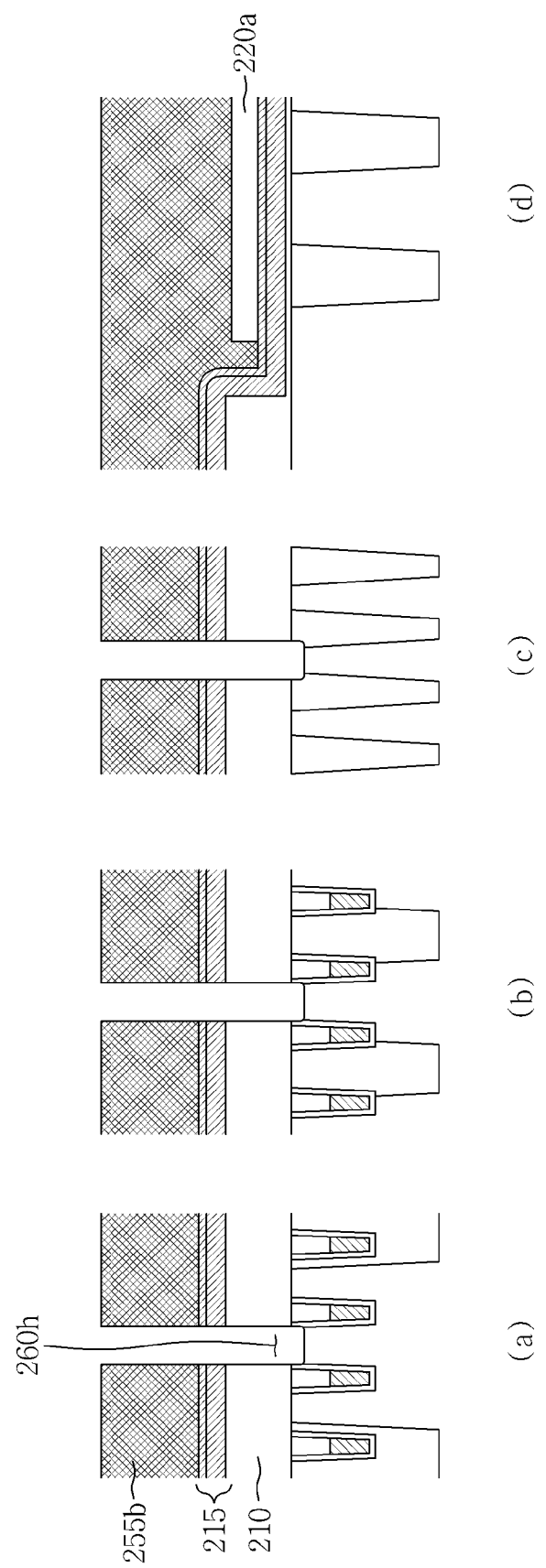

Referring to FIG. 5D, a bit line contact hole 260h may be formed by forming a second photoresist pattern 255b entirely on the first silicon layer 215 and the second peripheral insulating layer 220a, and selectively removing portions of the first silicon layer 215, the first insulating layer 210, and the semiconductor substrate 201. Then, a silicon treatment process, removal of the second photoresist pattern 255b, an ozone treatment process, and/or a cleaning process may be performed.

Figure 5E:
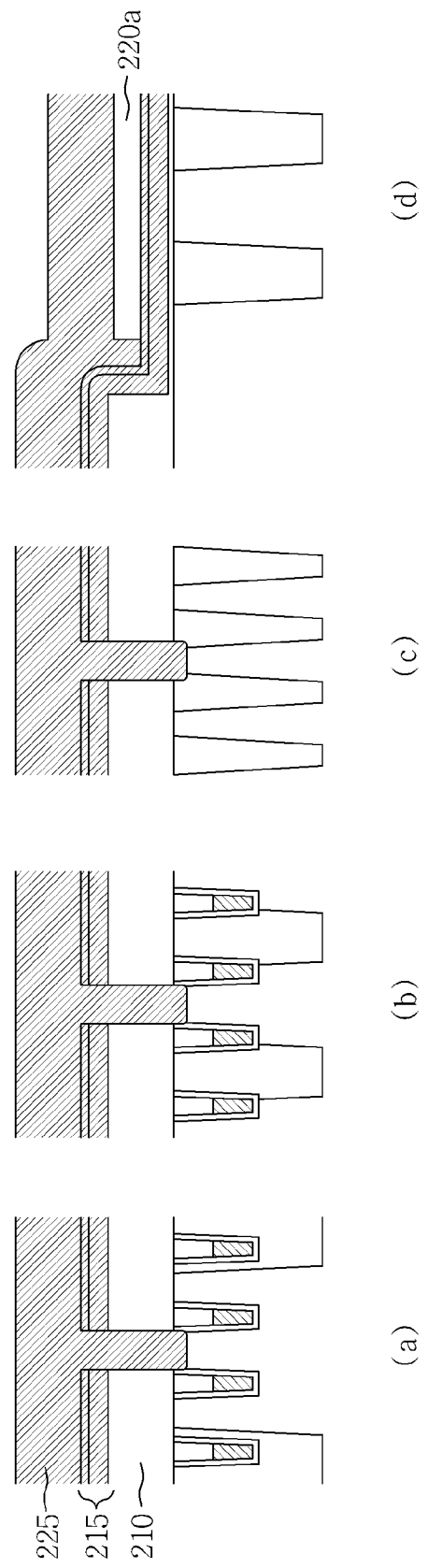

Referring FIG. 5E, a second silicon layer 225 may be entirely formed to a sufficient thickness to fill the bit line contact hole 260h. For example, the second silicon layer 225 may be formed to a thickness of about 1000 Å from a top surface of the first silicon layer 215 or the second peripheral insulating layer 220a.

Figure 5F:
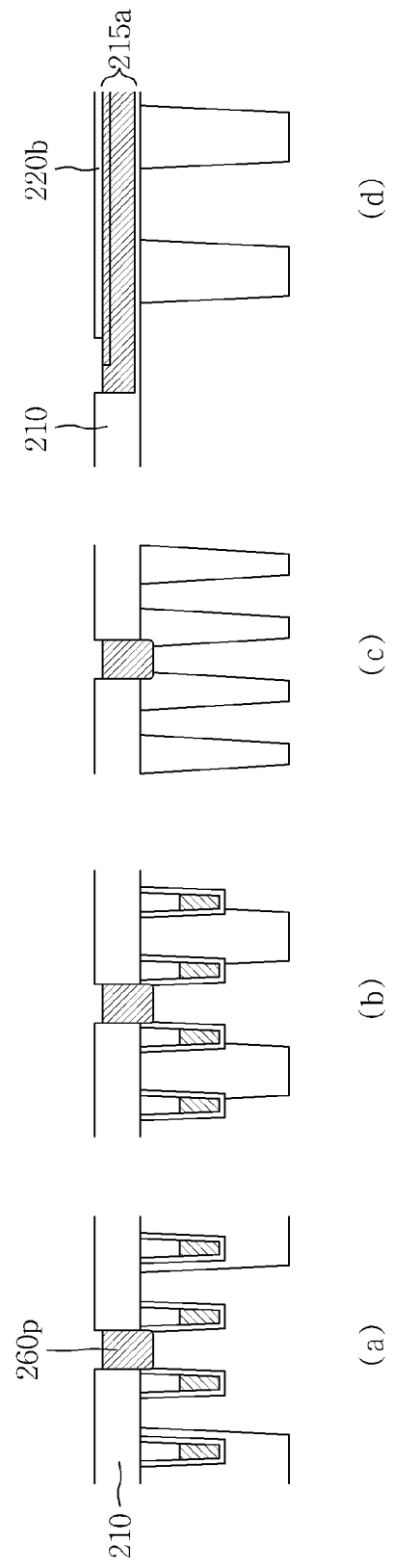

Referring to FIG. 5F, by planarizing the second silicon layer 225 using a CMP process and/or an etch back process, a bit line contact plug 260p may be formed in the cell area CA and a second thinned peripheral insulating layer 220b and a first peripheral silicon layer 215a for a gate electrode of a peripheral transistor may be formed in the peripheral area PA. Here, top surfaces of the bit line contact plug 260p and the first peripheral silicon layer 215a may be level with or lower than a top surface of the first insulating layer 210.

Figure 5G:
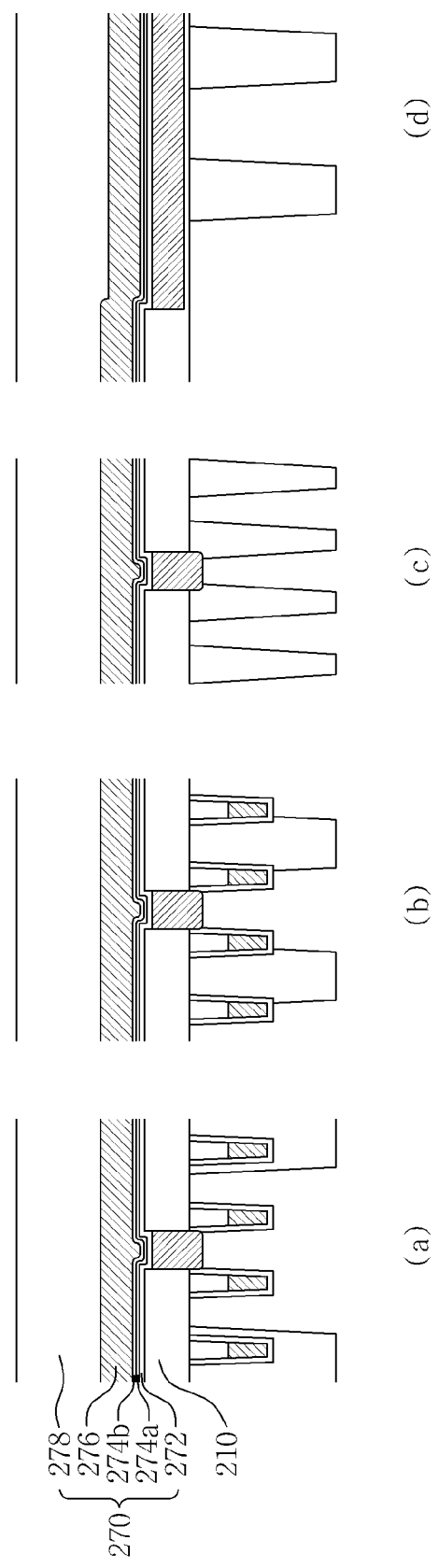

Referring to FIG. 5G, an interconnection layer 270 may be formed as shown in FIG. 4K. In an example of this embodiment, in which the top surface of the bit line contact plug 260p is lower than the top surface of the first insulating layer 210, elements of the interconnection layer 270 may have recessed or curved shapes. Then, by performing the processes of FIGS. 4K and 4L, interconnection layers may be formed. In this way, any one of the semiconductor devices shown in FIGS. 2A to 3C may be fabricated.

Embodiment 3

Figure 6A:
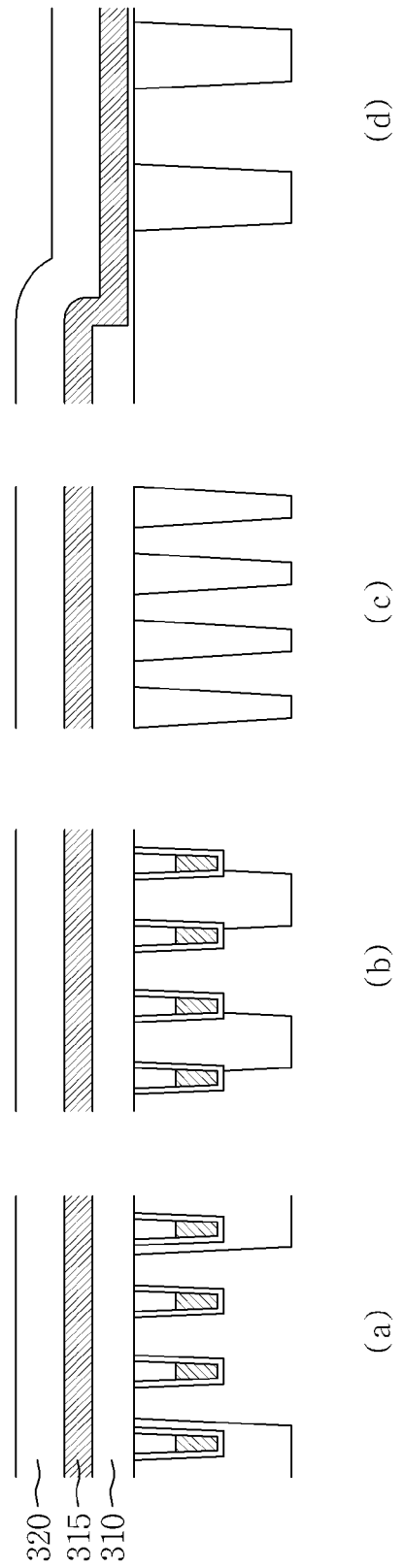

Referring to FIG. 6A, by performing any processes shown in FIGS. 4A and 4B, a first insulating layer 310, a first silicon layer 315, and a second insulating layer 320 may be formed. The first insulating layer 310 may be formed of silicon oxide to a thickness of about 600 Å. The first silicon layer 315 may be formed to a thickness of about 400 Å and include a carbon-containing layer. The second insulating layer 320 may be formed to a thickness of about 700 Å using silicon oxide, e.g., TEOS.

Referring to FIG. 6B, a bit line contact hole 360h may be formed by forming a photoresist pattern 355 on the second insulating layer 320 and patterning the second insulating layer 320, the first silicon layer 315, and the first insulating layer 310 using the photoresist pattern 355 as a patterning mask. An SOH layer 353 may be formed between the photoresist pattern 355 and the second insulating layer 320. FIG. 6B illustrates one shape of the SOH layer 353. Then, a silicon treatment process, a removing process to remove the photoresist pattern 355 and the SOH layer 353, an ozone treatment process and/or a cleaning process may be performed.

Figure 6C:
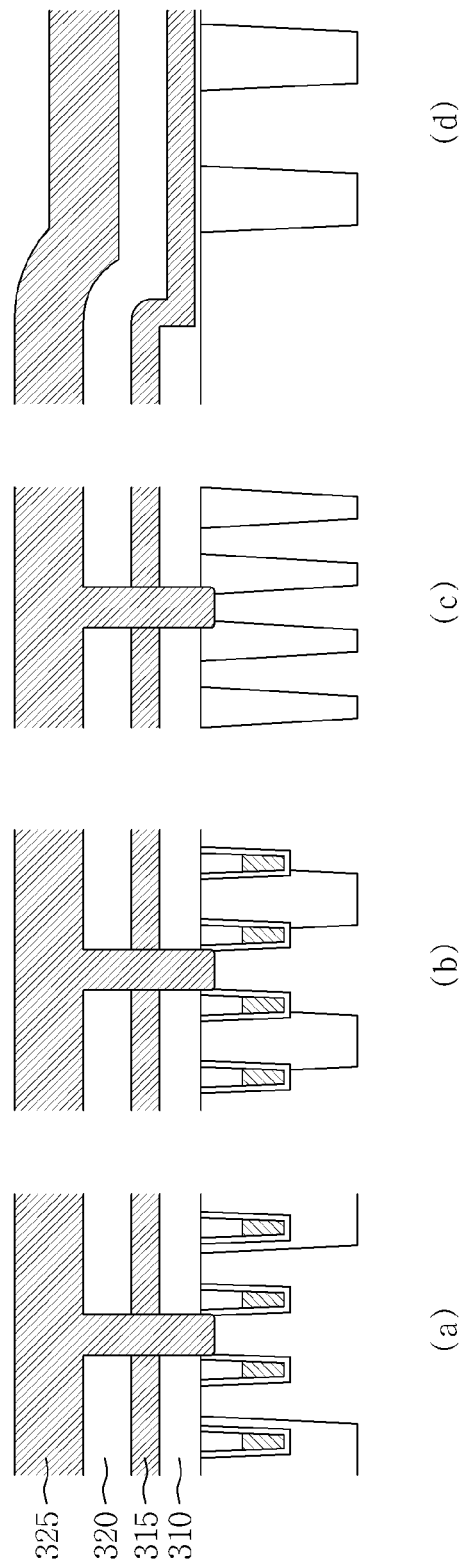

Referring to FIG. 6C, a second silicon layer 325 may be formed to a thickness of about 1000 Å to sufficiently fill the bit line contact hole 360h.

Figure 6D:
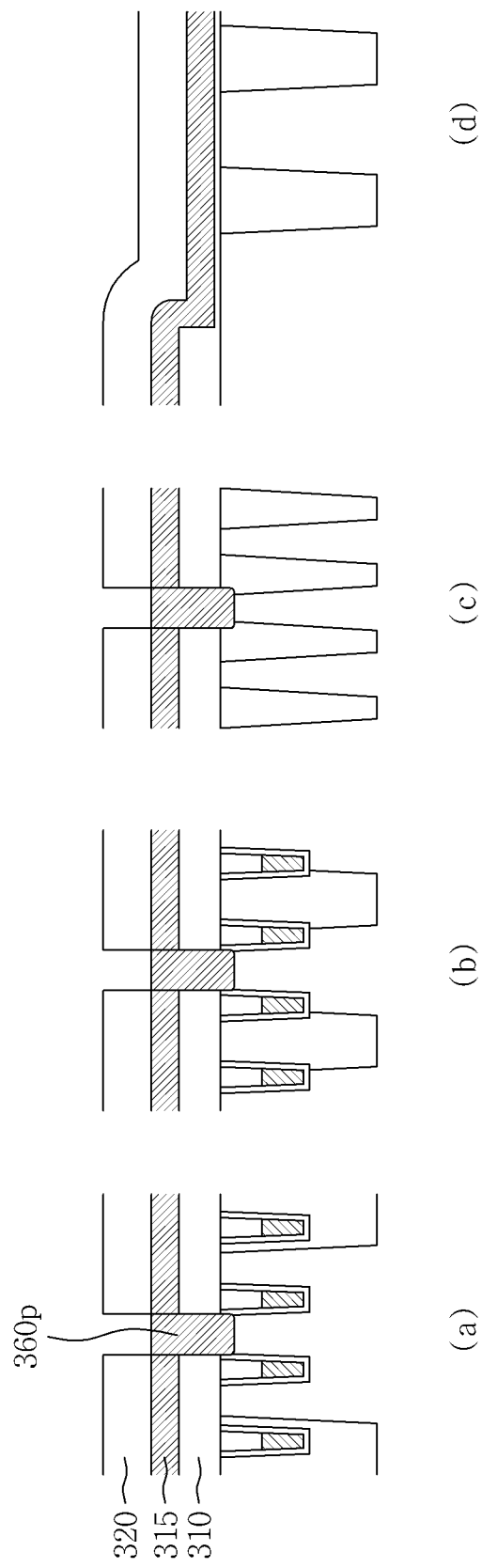

Referring to FIG. 6D, a bit line contact plug 360p may be formed by planarizing the second silicon layer 325 using a CMP process and/or etch back process. As a result of the process, the top surface of the second insulating layer 320 may be exposed. Top surfaces of the bit line contact plug 360p and the first silicon layer 315 do not have to be at the same level. However, the same surface levels are illustrated so that the inventive concepts may be easily understood.

Figure 6E:
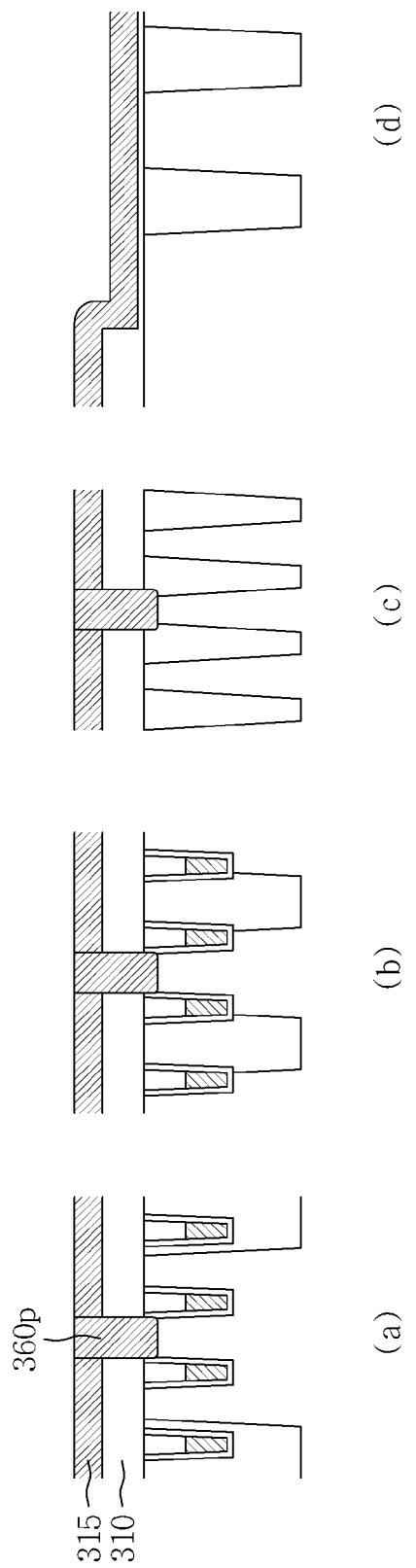

Referring to FIG. 6E, the top surface of the first silicon layer 315 may be exposed by removing the second insulating layer 320 using an etch back process and/or wet etching processes.

Figure 6F:
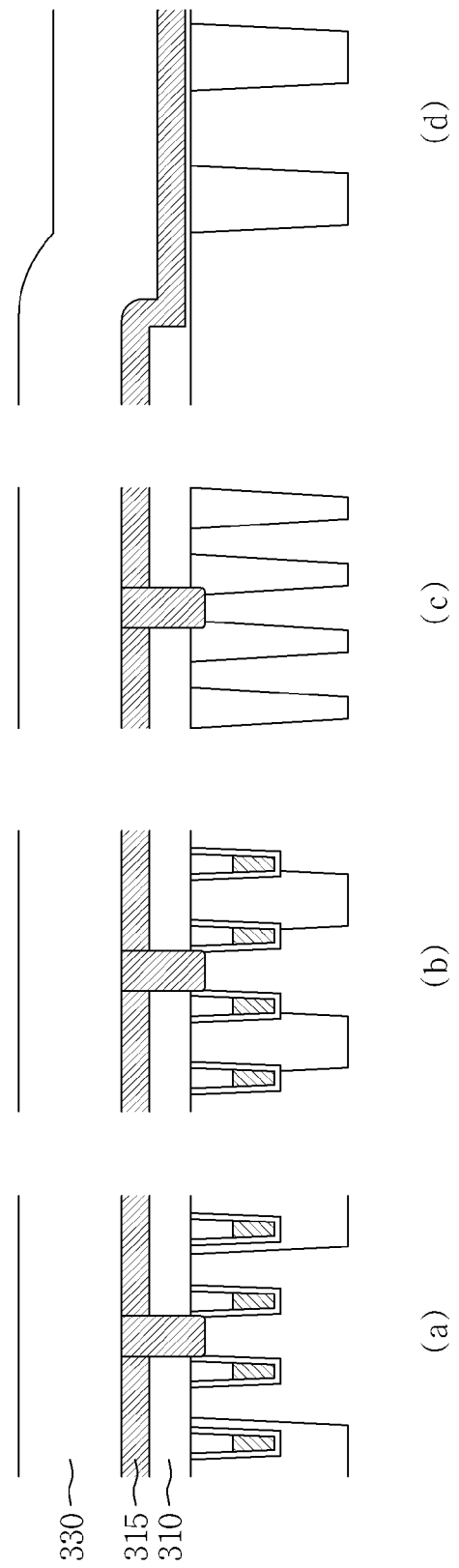

Referring to FIG. 6F, a second insulating layer 330 may be formed of silicon nitride to a thickness of about 2000 Å.

Referring to FIG. 6G, the third insulating layer 330 may be planarized and/or removed using CMP and/or etch back processes. In the results of the process, the first silicon layer 315 may be exposed in the cell area CA and the third peripheral insulating layer 330a may remain in the peripheral area PA. The first silicon layer 315 may be formed into a first thinned silicon layer 315a by partially removing the top surface of the first silicon layer 315. The first thinned silicon layer 315 may be situated at a level similar to that of the third peripheral insulating layer 330a.

Figure 6H:
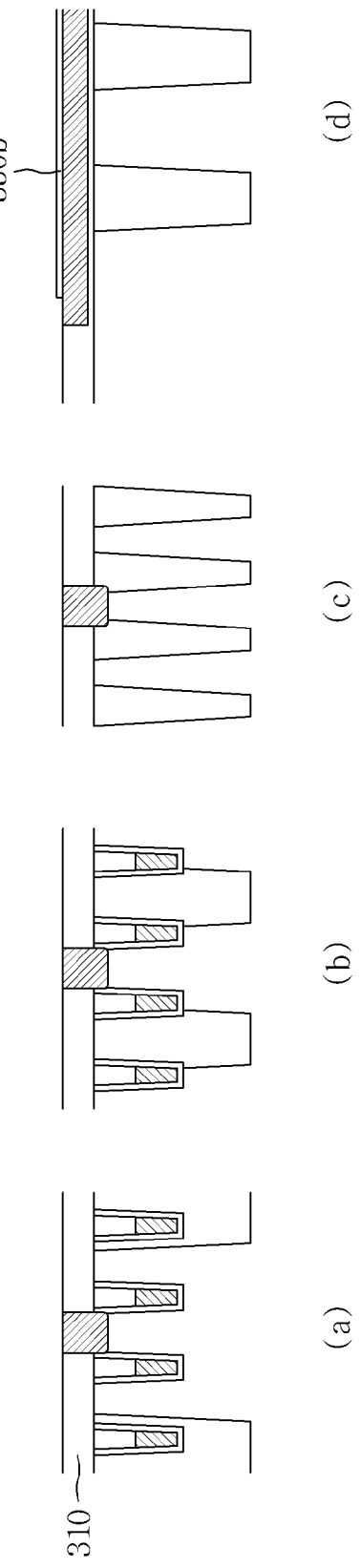

Referring to FIG. 6H, the first insulating layer 310 may be exposed after removing the first thinned silicon layer 315a using CMP and/or etch back processes. In the results of the process, an upper portion of the first insulating layer 310 may be partially removed. That is, the first insulating layer 310 may be lightly thinned overall. The third thinned peripheral insulating layer 330b may remain in the peripheral area PA.

Figure 6I:
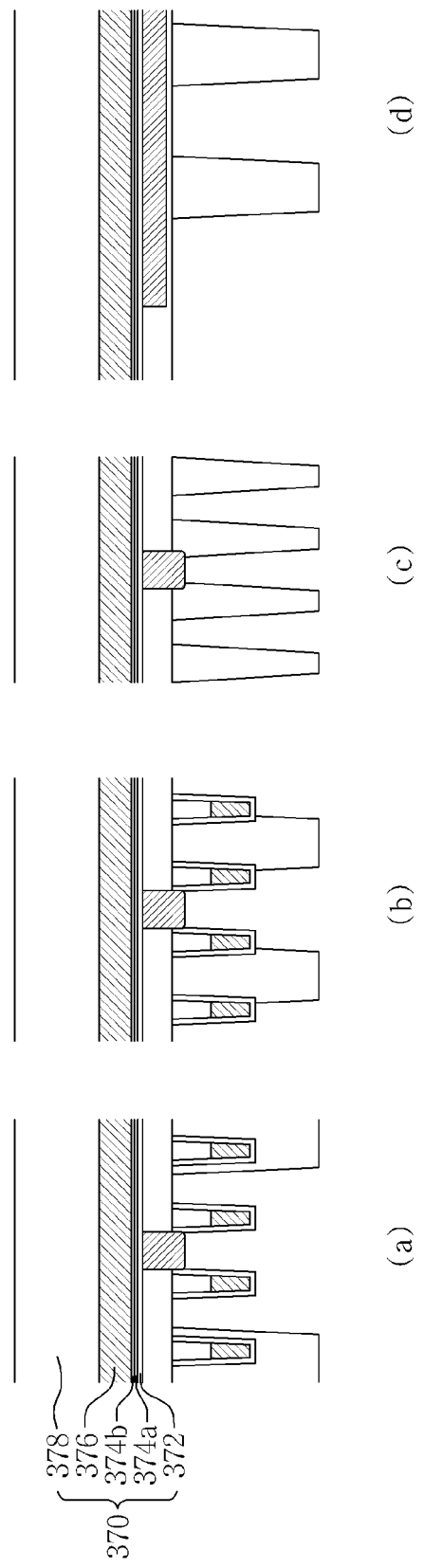

Referring to FIG. 6I, an interconnection layer 370 may be formed by removing the third thinned peripheral insulating layer 330b remaining in the peripheral area PA. The processes for forming the interconnection layer 370 and subsequent processes may be understood by referring to the foregoing descriptions of the other embodiments. Then, the processes shown in FIG. 4L may be performed. In this way, any one of the semiconductor devices shown in FIGS. 2A to 3C may be fabricated.

Embodiment 4

Referring to FIG. 7A, a first insulating layer 410, a first silicon layer 415, and a second insulating layer may be formed by performing the processes shown in FIGS. 4A and 4B. The first insulating layer may be formed to a thickness of about 800 Å and include thermal silicon oxide formed under a temperature of 600° C. to 1000° C. The first silicon layer 415 may be formed to a thickness of about 400 Å and include a carbon-containing layer. The second insulating layer 420 may be formed to a thickness of about 700 Å and include silicon nitride.

Figure 7B:
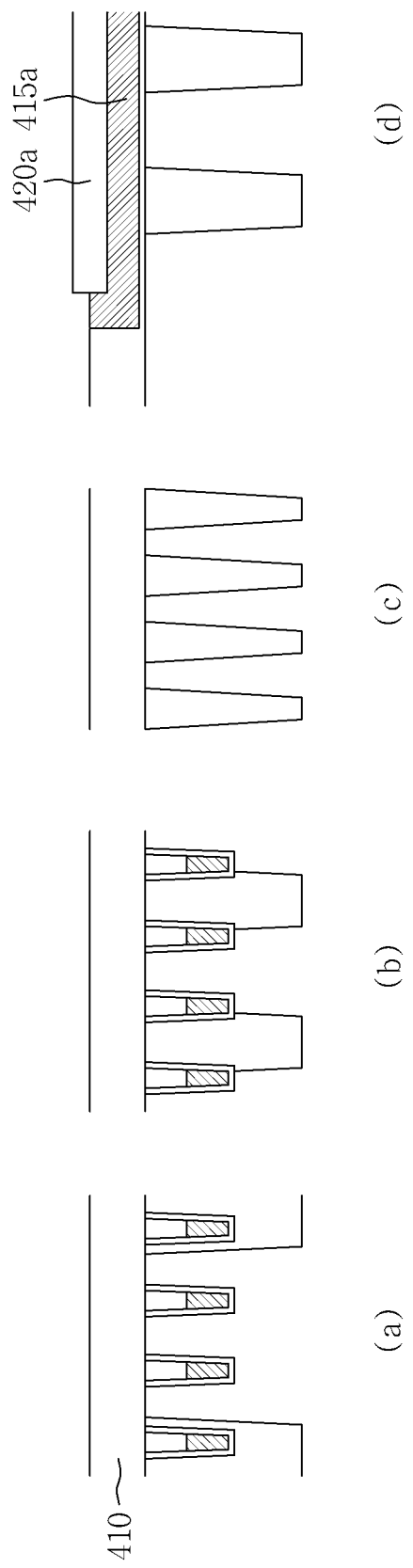

Referring to FIG. 7B, by removing the second insulating layer 420 and the first silicon layer 415 using CMP and/or etch back processes, the first insulating layer 410 may be exposed in the cell area CA, and the first peripheral silicon layer 415a and the second peripheral insulating layer 420a may remain in the peripheral area PA. Top surfaces of the first peripheral silicon layer 415a and the first insulating layer 410 do not have to be formed at the same level. However, the surfaces are illustrated as formed at the same level for ease of description.

Figure 7C:
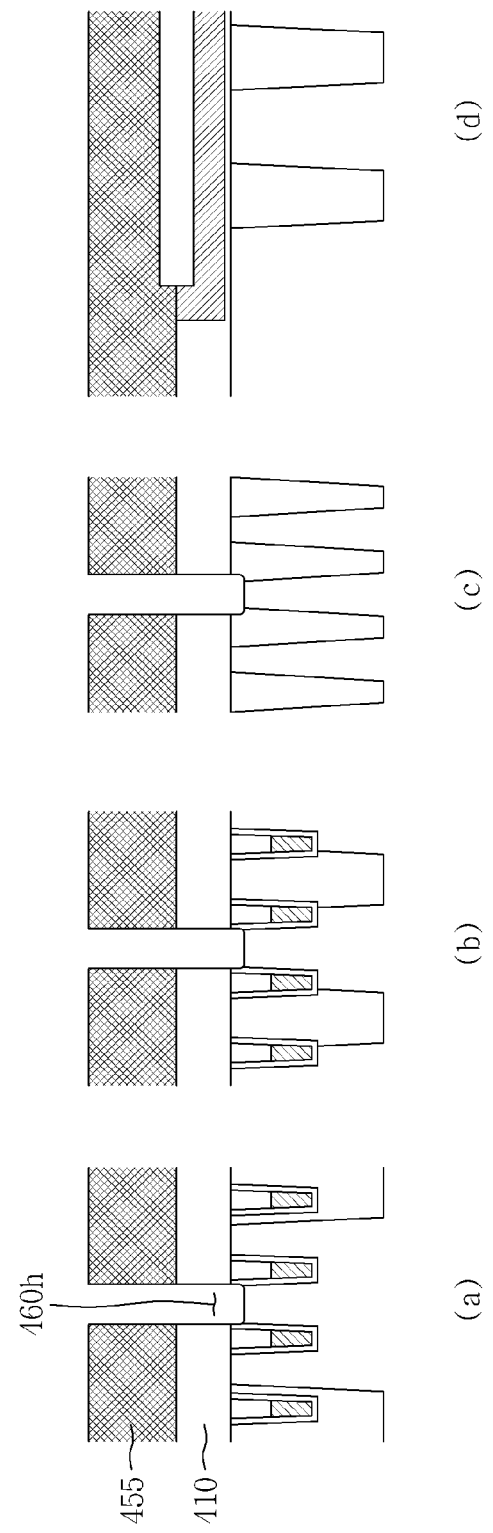

Referring to FIG. 7C, a bit line contact hole 460h may be formed by forming a photoresist pattern 455 and patterning the first insulating layer 410 using the photoresist pattern 455 as a patterning mask. In an example of this embodiment, the photoresist pattern 455 includes an SOH layer. Then, a silicon treatment process, a removing process to remove the photoresist pattern 455, an ozone treatment process, and/or a cleaning process may be performed.

Figure 7D:
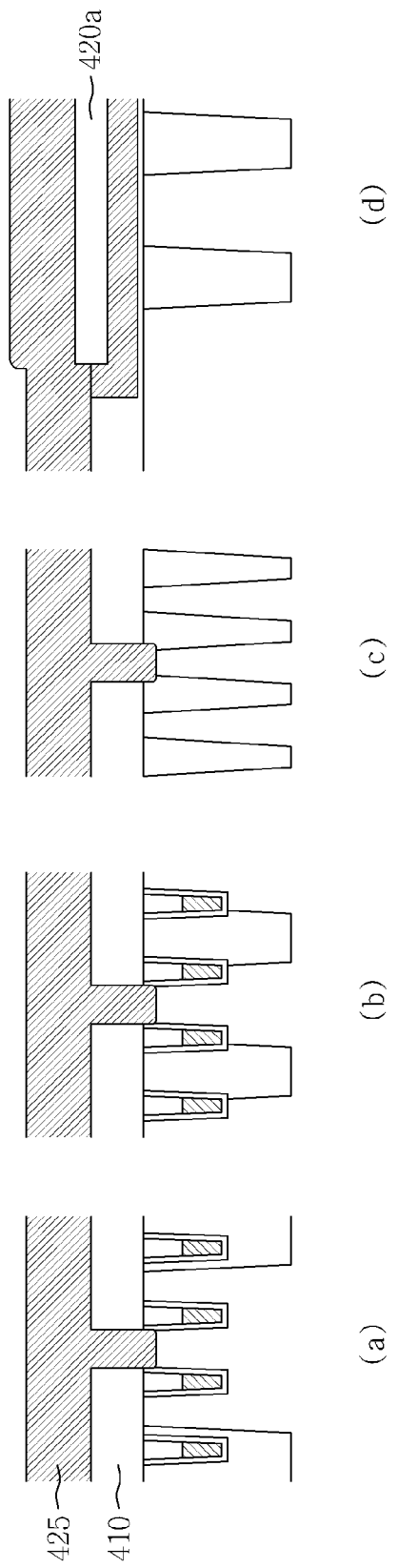

Referring to FIG. 7D, a second silicon layer 425 may be formed to a thickness of about 1000 Å to fill the bit line contact hole 460h.

Figure 7E:
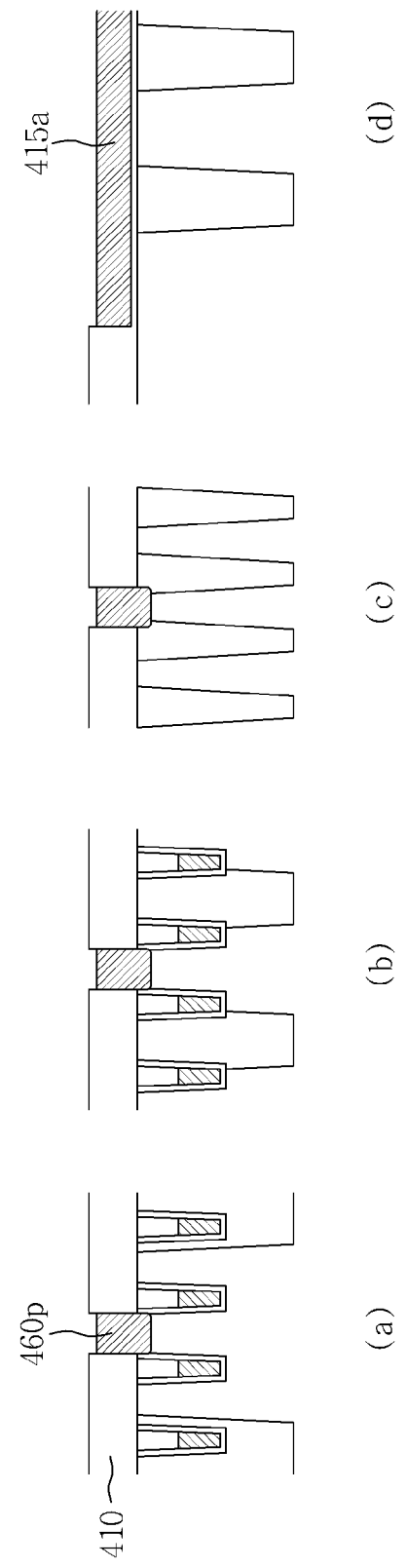

Referring to FIG. 7E, a bit line contact plug 460p may be formed by partially removing the second silicon layer 425 using CMP and/or etch back processes. As a result of these or subsequent processes, the second peripheral insulating layer 420a may be completely removed and the first peripheral silicon layer 415a to be formed as a gate electrode of peripheral transistors may remain in portions of the peripheral area PA. A top surface of the bit line contact plug 460p may be level with or lower than the top surface of the first insulating layer 410. A top surface of the first peripheral silicon layer 415a remaining in the peripheral area PA may also be level with or lower than the top surface of the first insulating layer 410. Then, by performing the processes shown in FIGS. 4K, 4L, 5G and 6I, interconnection layers may be formed. In this way, any one of the semiconductor devices shown in FIGS. 2A to 3C may be fabricated.

Embodiment 5

Figure 8A:
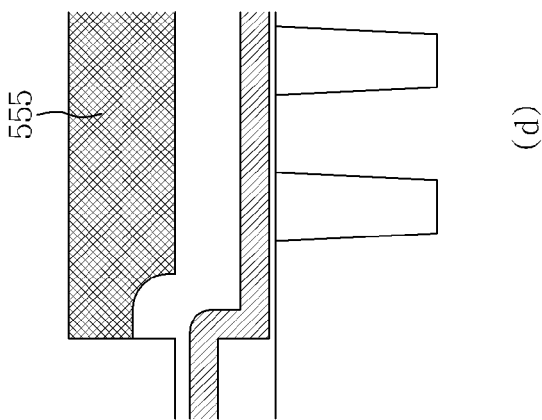
FIGS. 8A to 8B are each a sectional view and together illustrate an embodiment of a method of fabricating a semiconductor device in accordance with the inventive concepts, wherein regions (a), (b), (c) and (d) in each of the figures are regions along lines A-A', B-B', C-C', and D-D' in FIG. 1A, respectively.
Figure 8A:
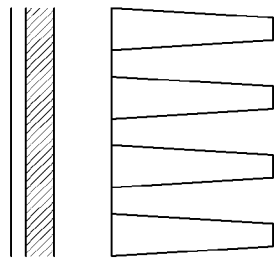
Figure 8A:
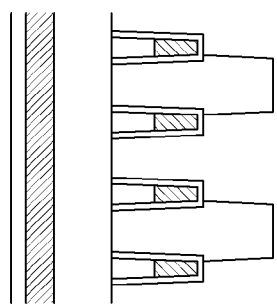
Figure 8A:
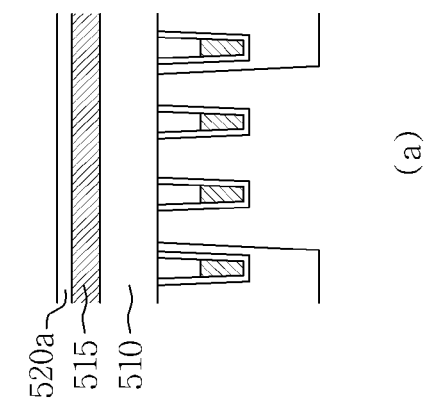

Referring to FIG. 8A, a first insulating layer 510, a first silicon layer 515, and a second insulating layer may be formed by performing the processes shown in FIGS. 4A, 4B, and 7A. A photoresist pattern 555 exposing the cell area CA may be entirely formed. Successively, a second thinned insulating layer 520a may be formed by removing the exposed portions of the second insulating layer in the cell area CA. Then, the photoresist pattern 555 may be removed.

Figure 8B:
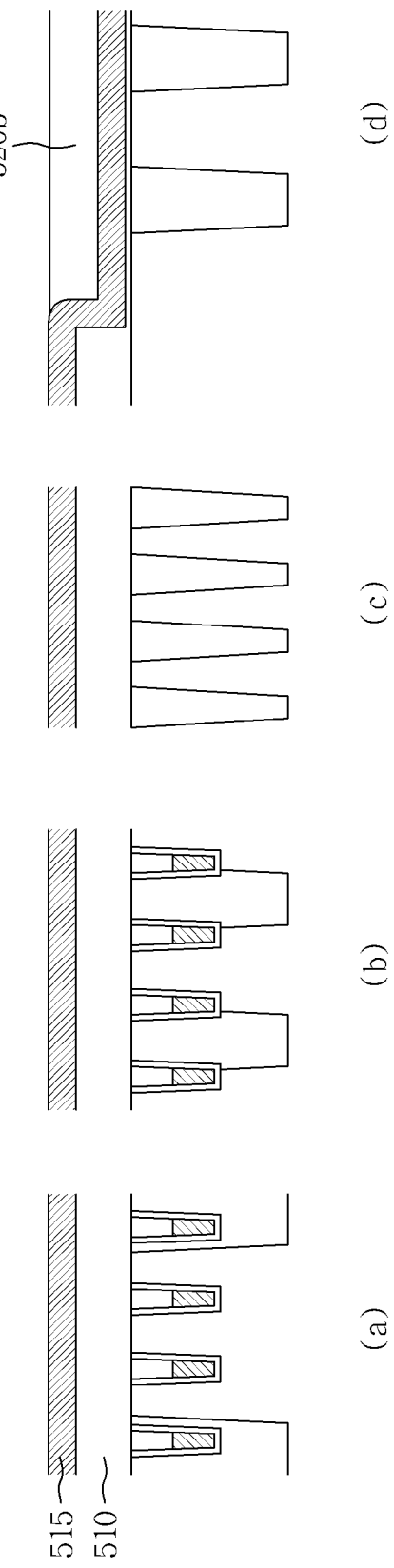

Referring to the FIG. 8B, a second peripheral insulating layer 520b may remain in the peripheral area PA by removing the second thinned insulating layer 520a using a CMP process. The first silicon layer 515 may be entirely exposed in the cell area CA. Then, the first silicon layer 515 may be partially removed using a CMP and/or etch back process and formed into a shape similar to that shown in FIG. 7B. Processes similar to those shown in FIGS. 7B to 7E may be subsequently performed.

Embodiment 6

Figure 9A:
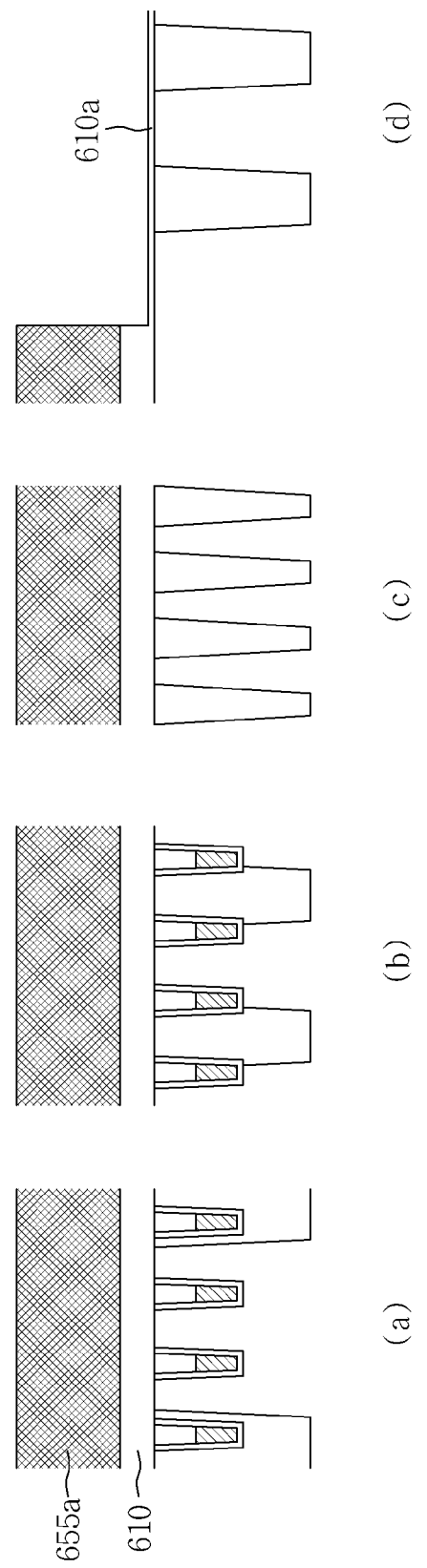
FIGS. 9A to 9E are each a sectional view and together illustrate an embodiment of a method of fabricating a semiconductor device in accordance with the inventive concepts, wherein regions (a), (b), (c) and (d) in each of the figures are regions along lines A-A', B-B', C-C', and D-D' in FIG. 1A, respectively.

Referring to FIG. 9A, after performing any processes shown in FIG. 4A, a first insulating layer 610 may be entirely formed. A first photoresist pattern 655a that exposes portions of the peripheral area PA may be formed on the first insulating layer 610. A peripheral transistor insulating layer 610a may be formed by partially removing the first insulating layer 610 in the peripheral area PA using the first photoresist pattern as a patterning mask. The first insulating layer 610 may be formed of silicon oxide to a thickness of about 500 Å. Then, the first photoresist pattern 655a may be removed.

Figure 9B:
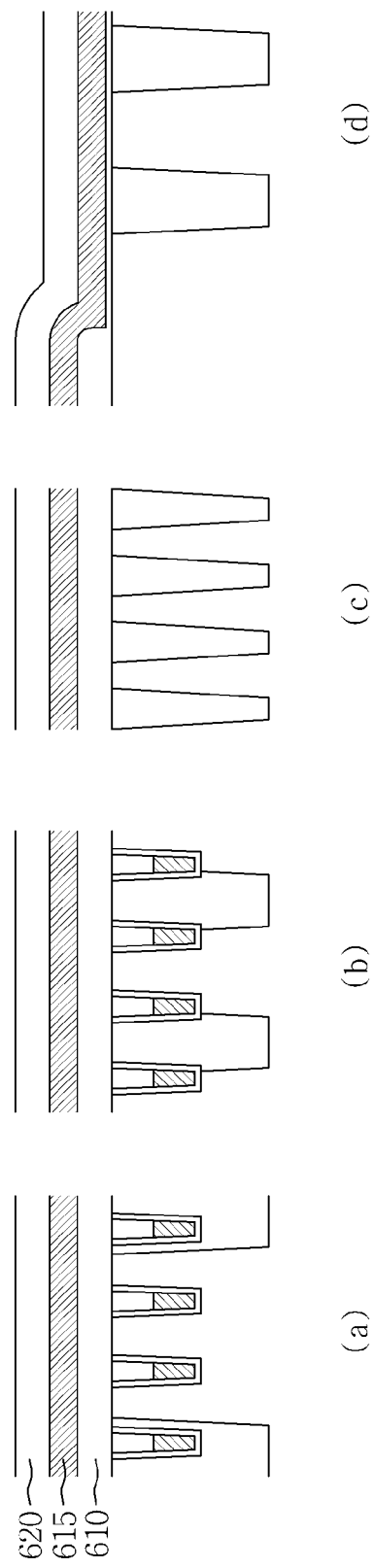

Referring to FIG. 9B, a first silicon layer 615 and a second insulating layer 620 may be entirely formed. The first silicon layer 615 may be formed to a thickness of about 400 Å and the second insulating layer 620 may be formed of silicon nitride to a thickness of about 500 Å.

Figure 9C:
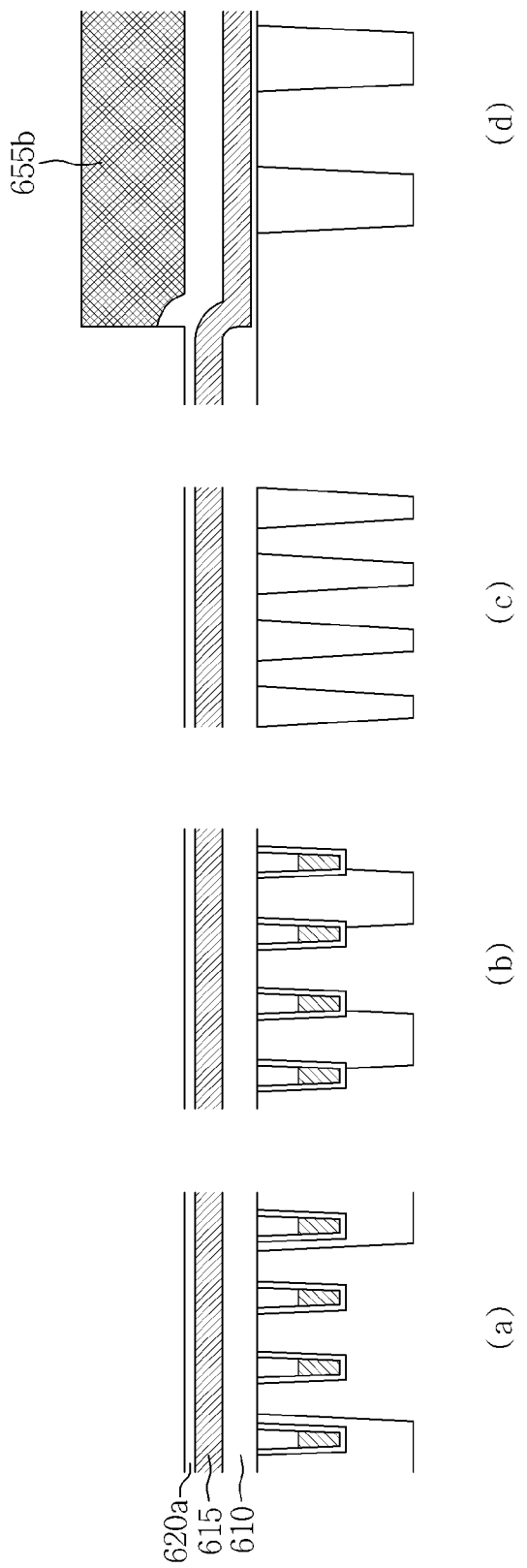

Referring to FIG. 9C, a second photoresist pattern 655b exposing the second insulating layer 620 in the cell area CA may be entirely formed. In succession, the exposed portion of the second insulating layer 620 may be removed using the second photoresist pattern 655b as an etching mask and formed into a second thinned insulating layer 620a. Then, the second photoresist pattern 655b may be removed.

Figure 9D:
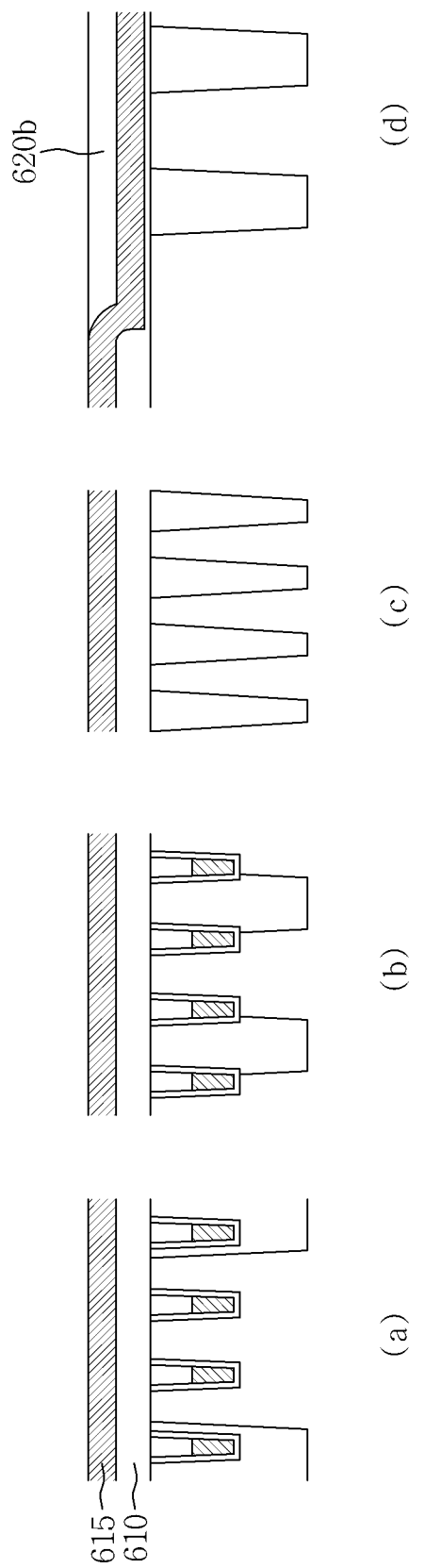

Referring to FIG. 9D, the first silicon layer 615 may be exposed by completely removing the second thinned insulating layer 620a using CMP and/or etch back processes in the cell area CA. As a result, the second peripheral insulating layer 620b may remain in the peripheral area PA. Also, the top surface of the first silicon layer 615 may be partially removed.

Figure 9E:
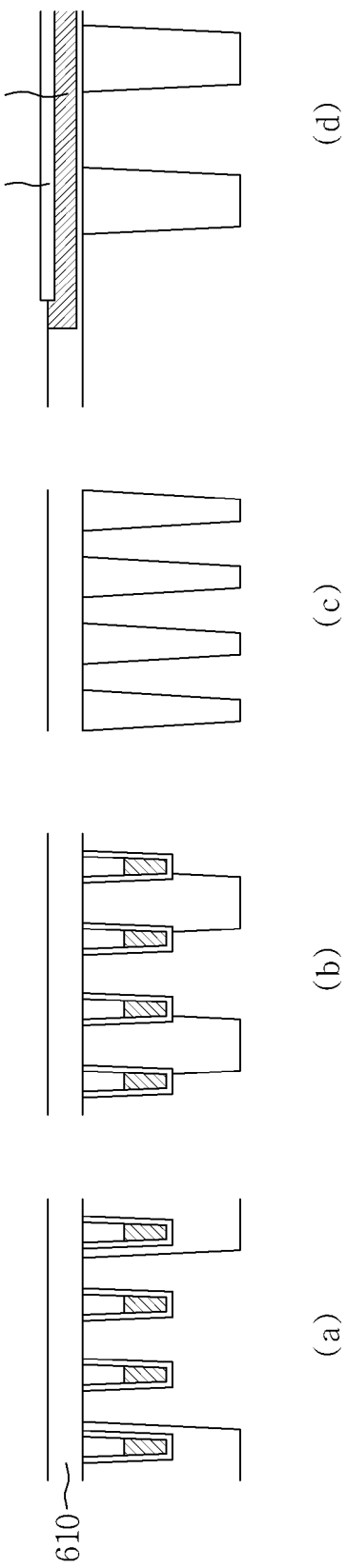

Referring to FIG. 9E, the first insulating layer 610 may be exposed by removing the first silicon layer 615 exposed in the cell area CA. As a result, a second twice-thinned peripheral insulating layer 620c and a first peripheral silicon layer 615a may remain in the peripheral area PA. In this embodiment, the thickness of the second twice-thinned peripheral insulating layer 620c remaining in the peripheral area PA may be variously formed in accordance with initial thicknesses of any layers and/or processes. Then, processes shown in FIG. 7C and beyond may be performed. Any of the semiconductor devices shown in FIGS. 2A to 3C may be completed by then performing the processes shown FIGS. 4K, 4L, 5G and 6I.

Embodiment 7

Figure 10A:
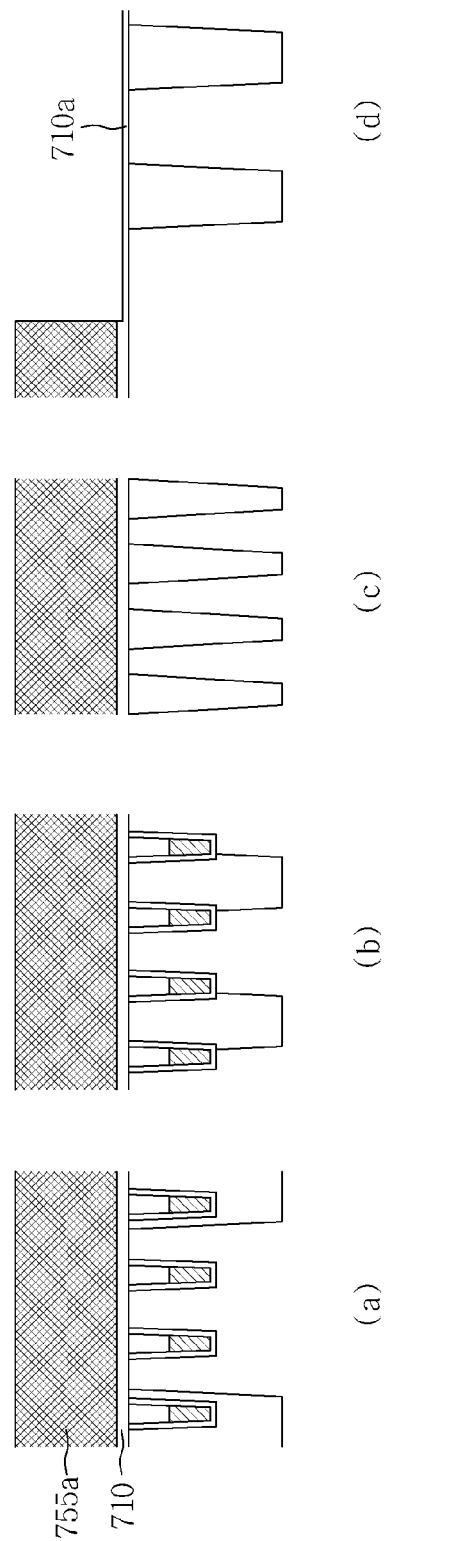
FIGS. 10A to 10I are each a sectional view and together illustrate an embodiment of a method of fabricating a semiconductor device in accordance with the inventive concepts, wherein regions (a), (b), (c) and (d) in each of the figures are regions along lines A-A', B-B', C-C', and D-D' in FIG. 1A, respectively.

Referring to FIG. 10A, the processes shown in FIG. 4A may be performed to form a first insulating layer 710, and a first photoresist pattern 755a exposing portions of the peripheral area PA. In succession, a peripheral transistor insulating layer 710a may be formed to a thickness of about 100 Å by patterning the first insulating layer 710 using the first photoresist pattern 755a as a patterning mask. Then, the first photoresist pattern 755a may be removed.

Figure 10B:
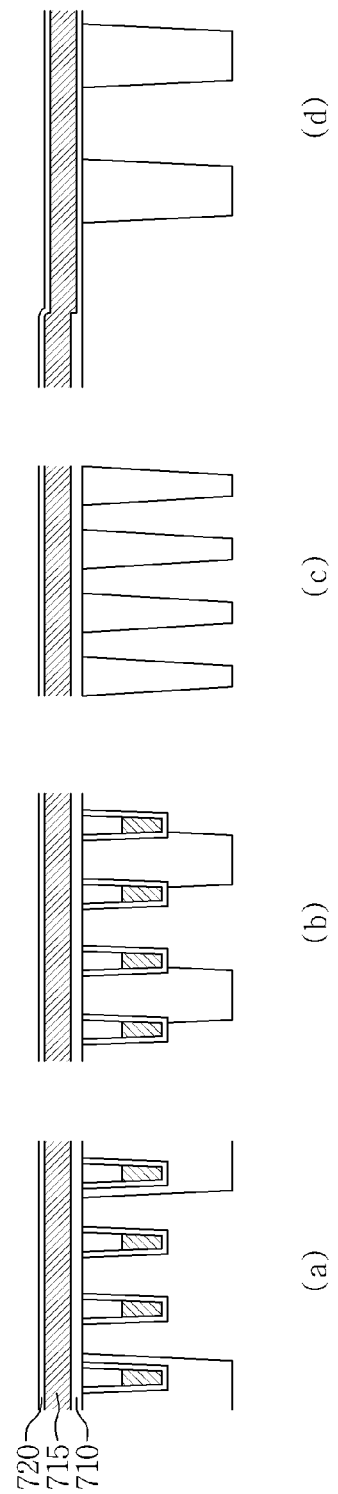

Referring to FIG. 10B, a first silicon layer 715 and a second insulating layer 720 may be entirely formed to a thickness of about 400 Å. The second insulating layer 720 may be formed of silicon oxide. Specifically, the second insulating layer 720 may be formed to a thickness of about 50 Å using an atomic layer deposition (ALD) method. Material layers formed by ALD can be relatively denser than material layers formed by other methods. Material layers formed by ALD may have higher etch resistance than material layers formed by other methods. Accordingly, the second insulating layer 720 can have an etch selectivity with respect to any insulating layer formed thereafter.

Figure 10C:
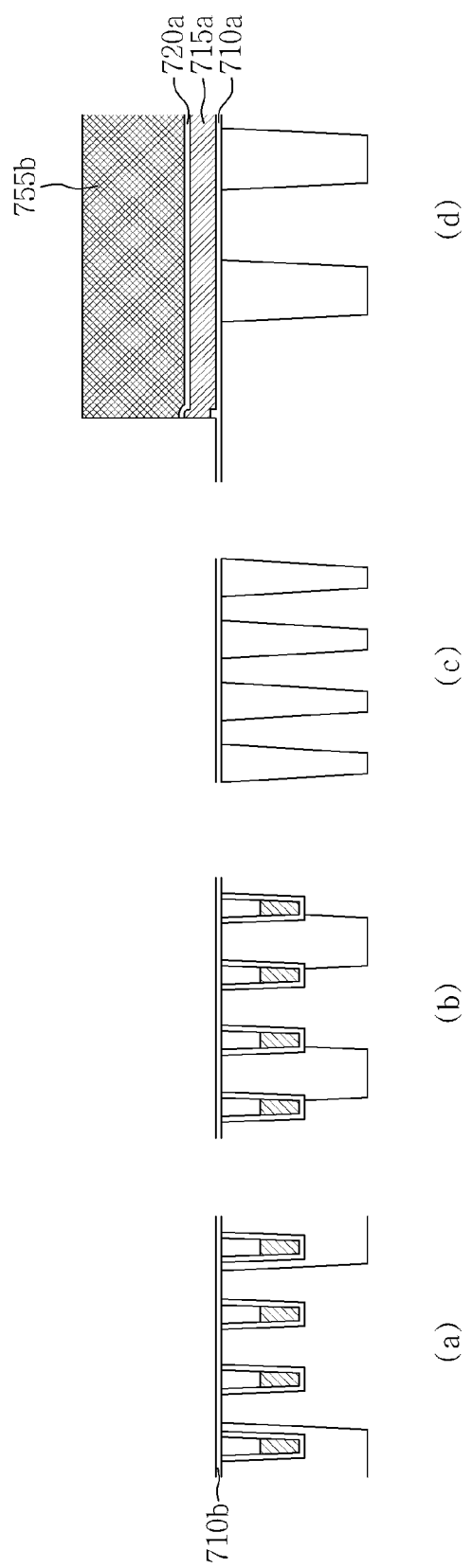

Referring to FIG. 10C, a second photoresist pattern 755b exposing the first insulating layer 710 in the cell area CA may be formed, and the exposed second insulating layer 720 and the first silicon layer 715 may be removed in the cell area CA. As a result, the first insulating layer 710 exposed in the cell area CA may be completely removed, may remain as a first thinned insulating layer 710b shown in the drawing, or may remain wholly. Then, the second photoresist pattern 755b may be removed. In any case, a first peripheral silicon layer 715a and a second peripheral insulating layer 720a may be formed only in the peripheral area PA.

Figure 10D:
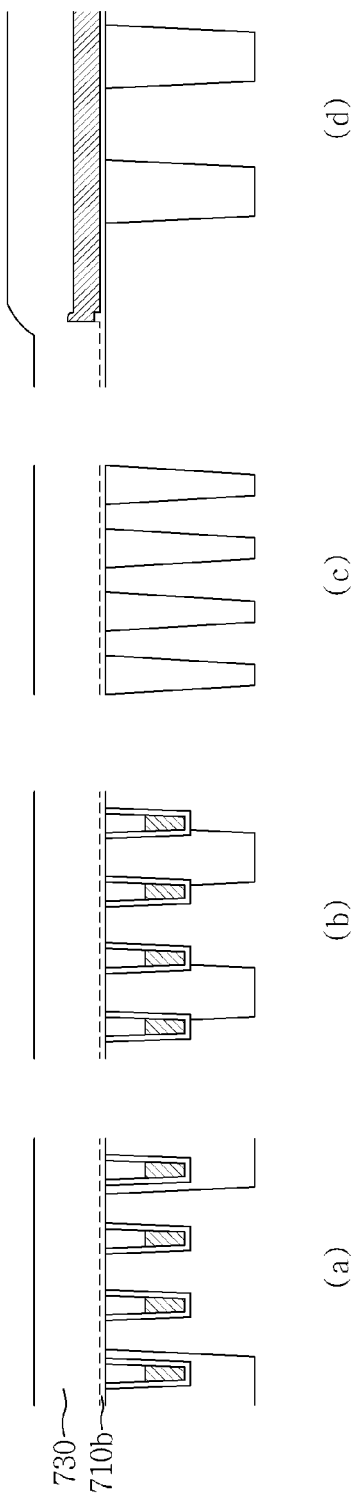

Referring to FIG. 10D, a third insulating layer 730 may be entirely formed to a thickness of about 1000 Å and include silicon oxide, e.g., TEOS. When the first thinned insulating layer 710b and the third insulating layer 730 are formed of the same material, an interface thereof may disappear. In the drawing, the resulting lack of an interface between the first thinned insulating layer 710b and the third insulating layer 730 is shown as broken lines. The broken lines will be omitted in drawings that follow FIG. 10D.

Figure 10E:
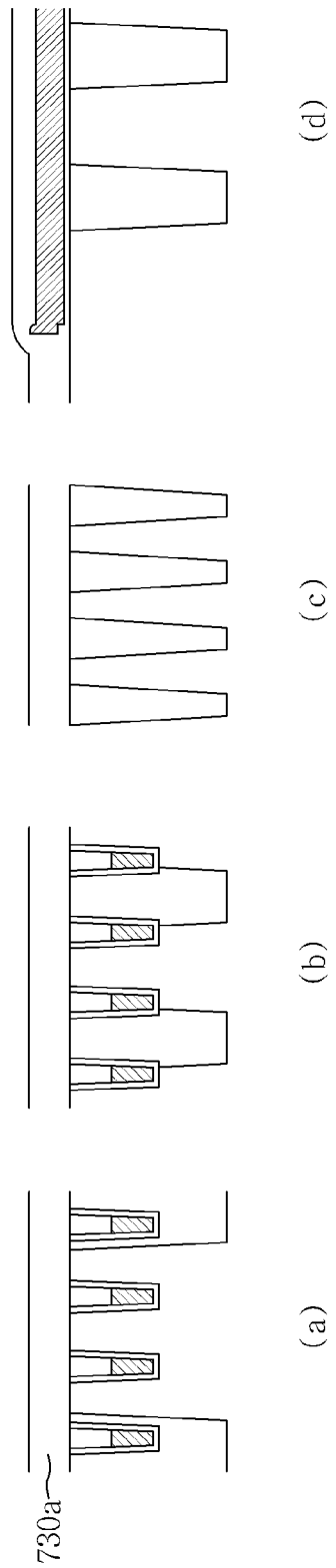

Referring to FIG. 10E, a third thinned insulating layer 730a may be formed by partially removing the third insulating layer 730 using a CMP process. As a result of the process, a height difference of the third thinned insulating layer 730a between the cell area CA and the peripheral area PA may be reduced. For example, removed amounts of the third insulating layer 730 may be about 500 Å in the cell area CA and 600 Å in the peripheral area PA.

Figure 10F:
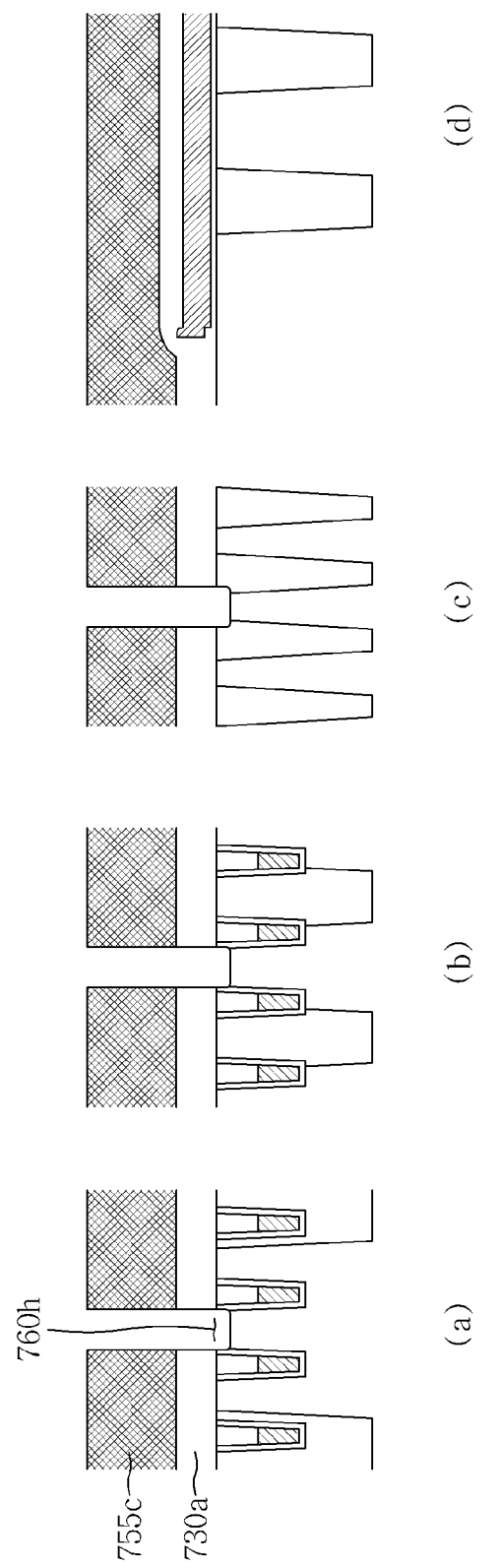

Referring to FIG. 10F, a third photoresist pattern 755c may be formed on the third thinned insulating layer 730a, and a bit line contact hole 760h may be formed by patterning the third thinned insulating layer 730a using the third photoresist pattern 755c as a patterning mask. Then, the third photoresist pattern 755c may be removed. Before or after removing the third photoresist pattern 755c, a silicon treatment process may be further performed. After removing the third photoresist pattern 755c, an ozone treatment process and/or a cleaning process may be performed.

Figure 10G:
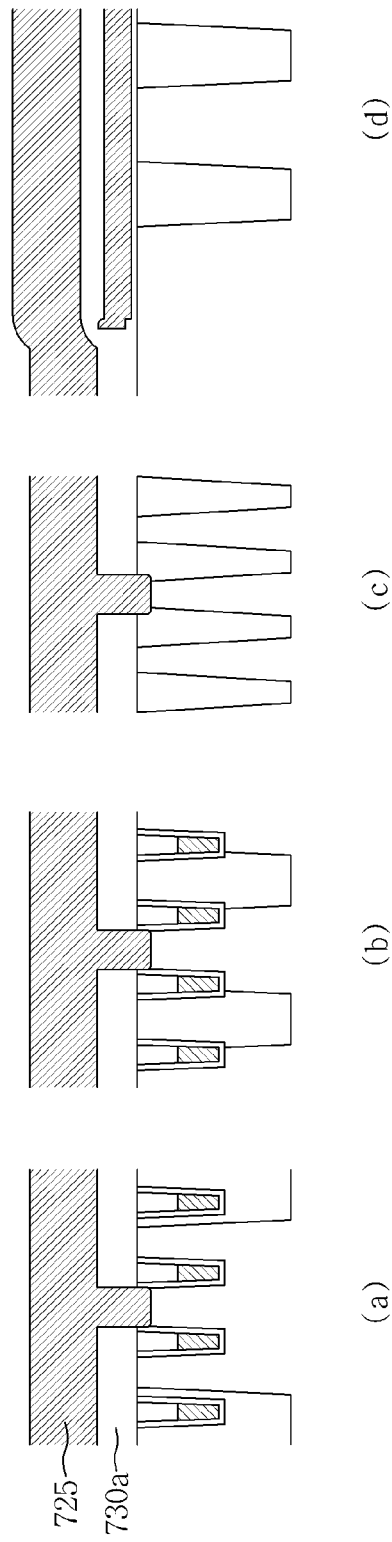

Referring to FIG. 10G, a second silicon layer 725 may be formed to a thickness of about 1000 Å to fill the bit line contact hole 760h.

Figure 10H:
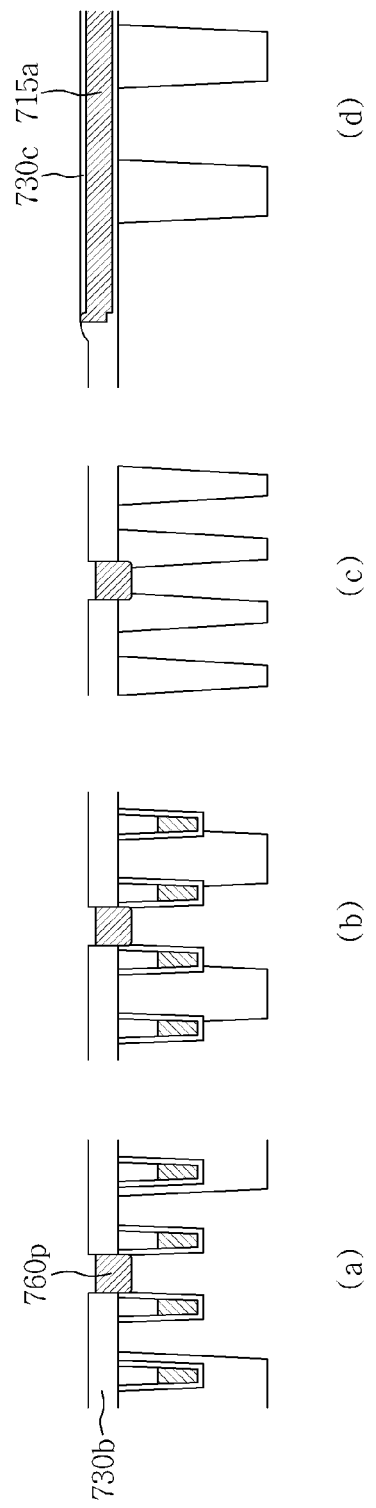

Referring to FIG. 10H, a bit line contact plug 760p may be formed by removing upper portions of the second silicon layer 725 and the third thinned insulating layer 730a using an etch back process. As a result of the process, a third twice-thinned insulating layer 730b may be formed. The third twice-thinned peripheral insulating layer 730c may remain on the first peripheral silicon layer 715a in the peripheral area PA. Top surfaces of the bit line contact plug 760p and the third twice-thinned insulating layer 730b may be situated at the same level. However, the top surface of the bit line contact plug 760p may be at a level higher or lower than that of the third twice-thinned insulating layer 730b. That is, the levels of the top surfaces of the bit line contact plug 760p and the third twice-thinned insulating layer 730b may vary in accordance with process recipes of the etch back process.

Figure 10I:
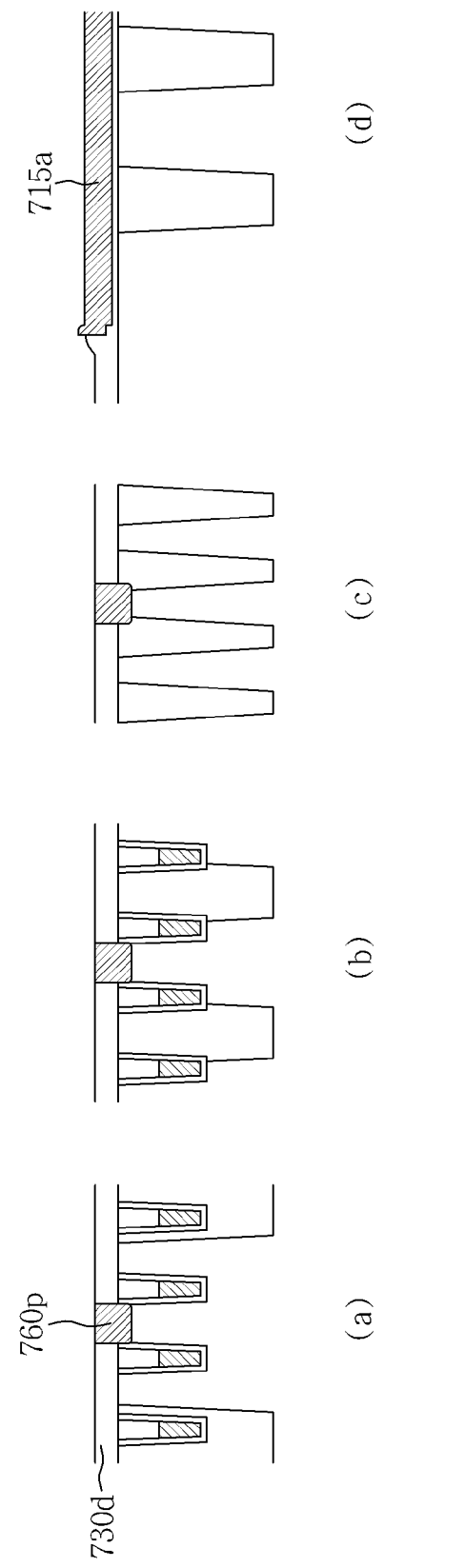

Referring to FIG. 10I, by performing a pre-cleaning process, the third twice-thinned insulating layer 730b may be formed into a third thrice-thinned insulating layer 730d and the third twice-thinned peripheral insulating layer 730c may be removed from the first twice-thinned peripheral silicon layer 715c. Then, interconnection layers and other elements may be formed by performing sequential processes shown in FIGS. 4K, 4L, 5G, and 6I. In this way, any one of the semiconductor devices shown in FIGS. 2A to 3C may be fabricated.

Embodiment 8

Figure 11A:
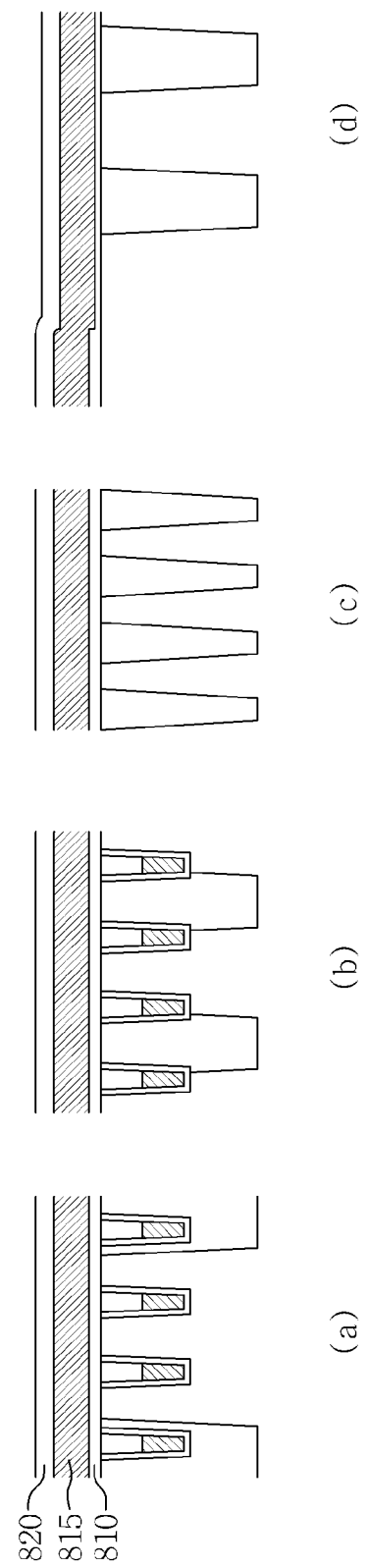
FIGS. 11A to 11J are each a sectional view and together illustrate an embodiment of a method of fabricating a semiconductor device in accordance with the inventive concepts, wherein regions (a), (b), (c) and (d) in each of the figures are regions along lines A-A', B-B', C-C', and D-D' in FIG. 1A, respectively.

Referring to FIG. 11A, by performing processes shown in FIG. 10A, a first insulating layer 810 may be formed. Then, a first silicon layer 815 and a second insulating layer 820 may be entirely formed on the first insulating layer 810. The first silicon layer 815 may be formed to a thickness of about 500 Å and the second insulating layer 820 may be formed of silicon oxide to a thickness of about 200 Å using an ALD process.

Figure 11B:
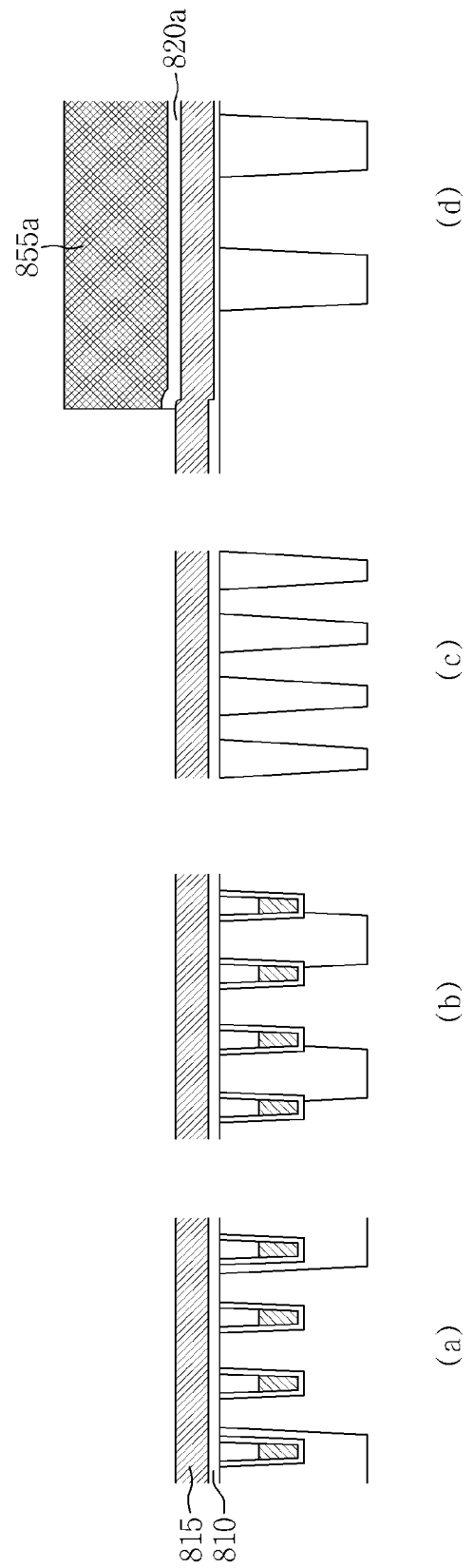

Referring to FIG. 11B, a first photoresist pattern 855a exposing the second insulating layer in the cell area CA may be formed, and exposed portions of the second insulating layer 820 may be removed using the first photoresist pattern 855a as an etching mask. Then, by removing the first photoresist pattern 855a, the first silicon layer 815 may be exposed in the cell area CA and a first peripheral insulating layer 820a may be formed in the peripheral area PA.

Figure 11C:
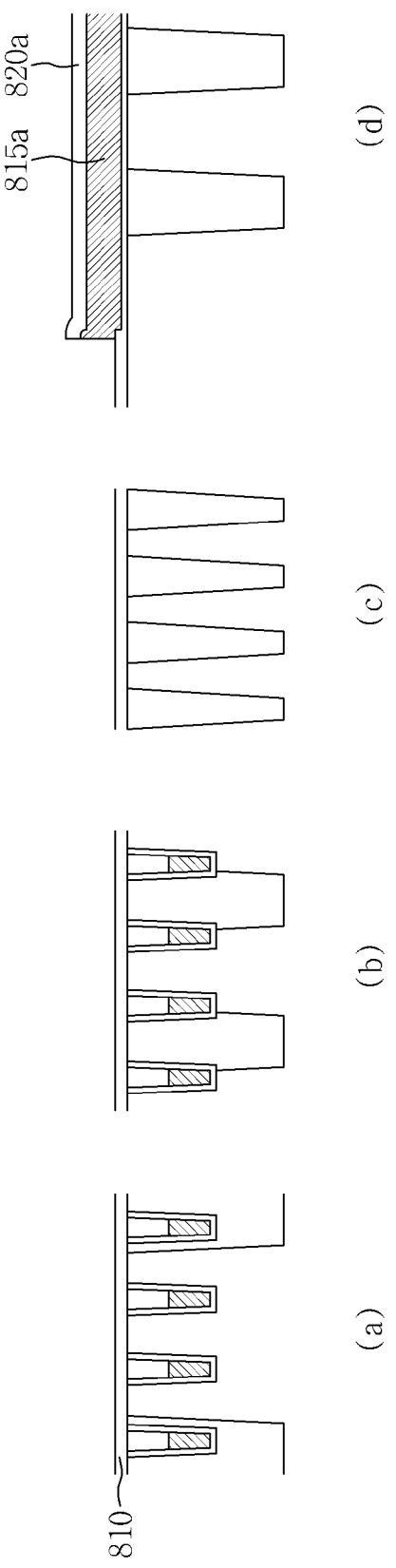

Referring to FIG. 11C, the exposed portions of the first silicon layer 815 may be removed using the second peripheral insulating layer 820a as an etching mask, the first silicon layer 810 may be exposed in the cell area CA and a first peripheral silicon layer 815a may be formed in the peripheral area PA.

Figure 11D:
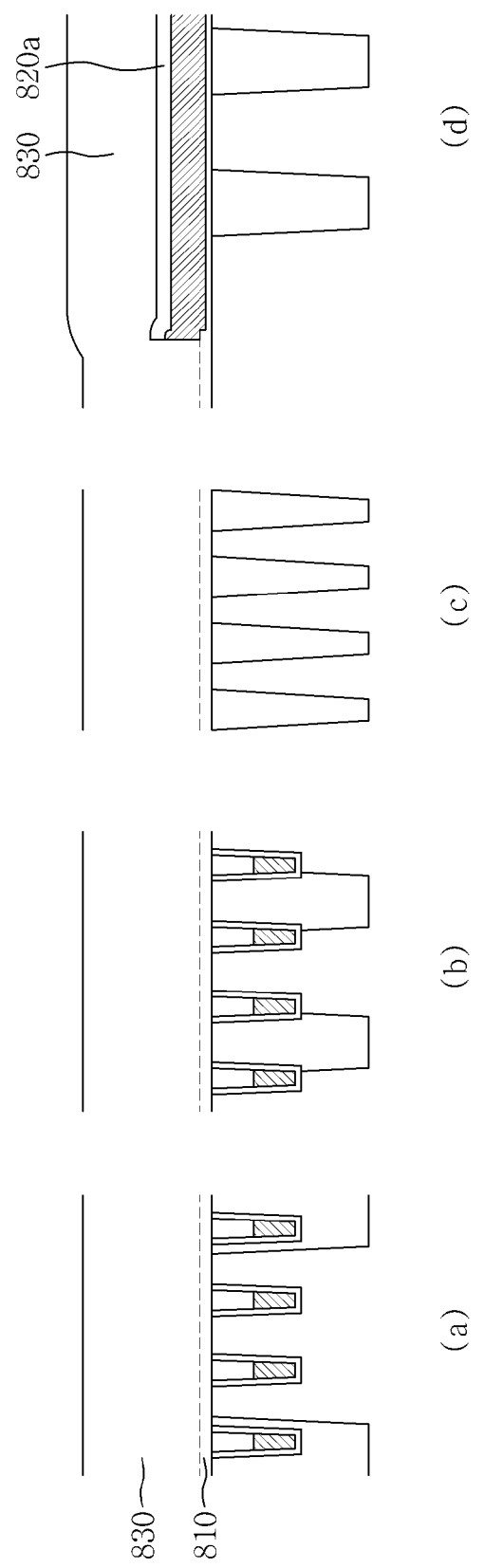

Referring to FIG. 11D, a third insulating layer 830 may be entirely formed to a thickness of about 1200 Å and may comprise silicon oxide, e.g., TEOS. When the first insulating layer 810 and the third insulating layer 830 are formed of the same material, an interface between the first insulating layer 810 and the third insulating layer 830 may disappear in the cell area CA and an interface between the second insulating layer 820a and the third insulating layer 830 may remain in the peripheral area PA. In the drawing, the interface of the first insulating layer 810 and the third insulating layer 830 is shown as broken lines to indicate that it no longer exists.

Figure 11E:
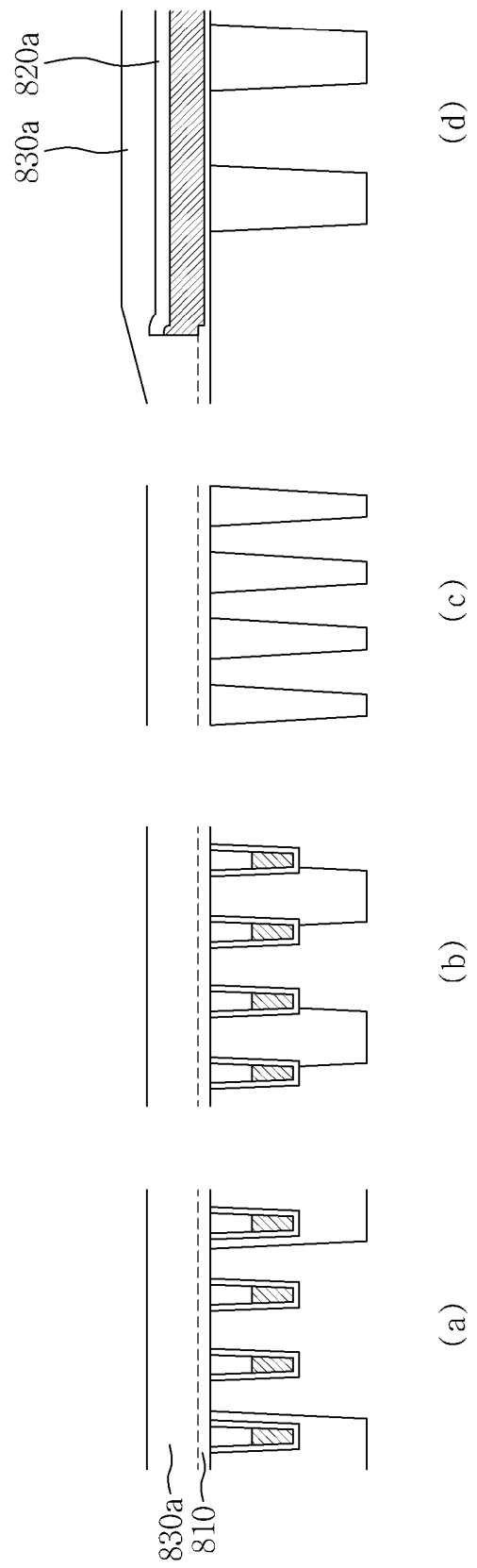

Referring to FIG. 11E, a third partially planarized insulating layer 830a may be formed by planarizing the third insulating layer 830 using a CMP process. A top surface level of the third partially planarized insulating layer 830a in the peripheral area PA may be higher than a top surface level of the third partially planarized insulating layer 830a in the cell area CA. As shown in the drawing, the top surface of the third partially planarized insulating layer 830a may slope in the core area, e.g., the area between the cell area CA and the peripheral area PA. Since elements in the drawing are shown as simplified, the slope is shown as steep, but the slope may be gentle in practice. As a result of the process, the third partially planarized insulating layer 830a may remain at a thickness of about 720 Å in the cell area CA, and about 620 Å in the peripheral area PA, for example. In addition, the third partially planarized insulating layer 830a may remain at a thickness of about 370 Å in a weak portion of the core area, for example, a corner area of the first peripheral silicon layer 815a. The remaining thicknesses may be the total thickness of the first insulating layer 810 and the second peripheral insulating layer 820a, and an average thickness in each area, respectively. The interface of the first insulating layer 810 and the third partially planarized insulating layer 830a will be omitted in the drawings that follow.

Figure 11F:
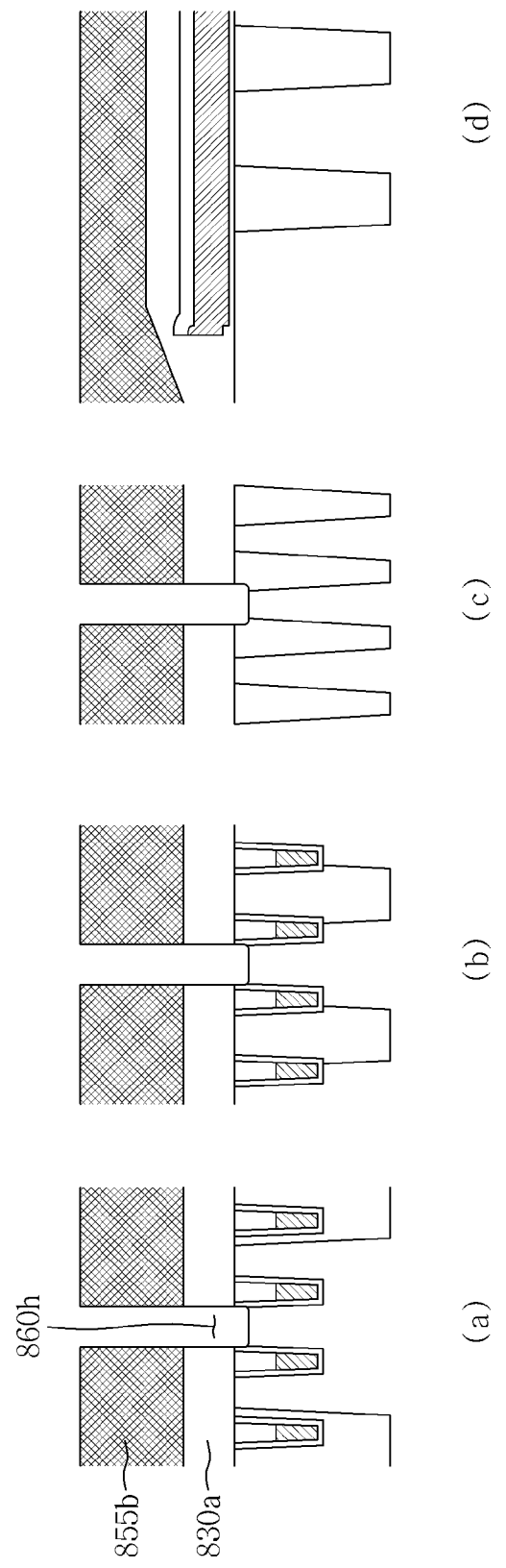

Referring to FIG. 11F, a bit line contact hole 860h may be formed by forming a second photoresist pattern 855b, and patterning the third partially planarized insulating layer 830a using the second photoresist pattern 855b as a patterning mask. In succession, the second photoresist pattern 855b may be removed. A silicon treatment process, an ozone treatment process, and a cleaning process may be performed before or after the second photoresist pattern 855b is removed. During the silicon treatment process and/or the cleaning process, a third thinned insulating layer 830b (shown in FIG. 11G) may be formed by removing an upper portion of the third partially planarized insulating layer 830a at a thickness of about 100 Å.

Figure 11G:
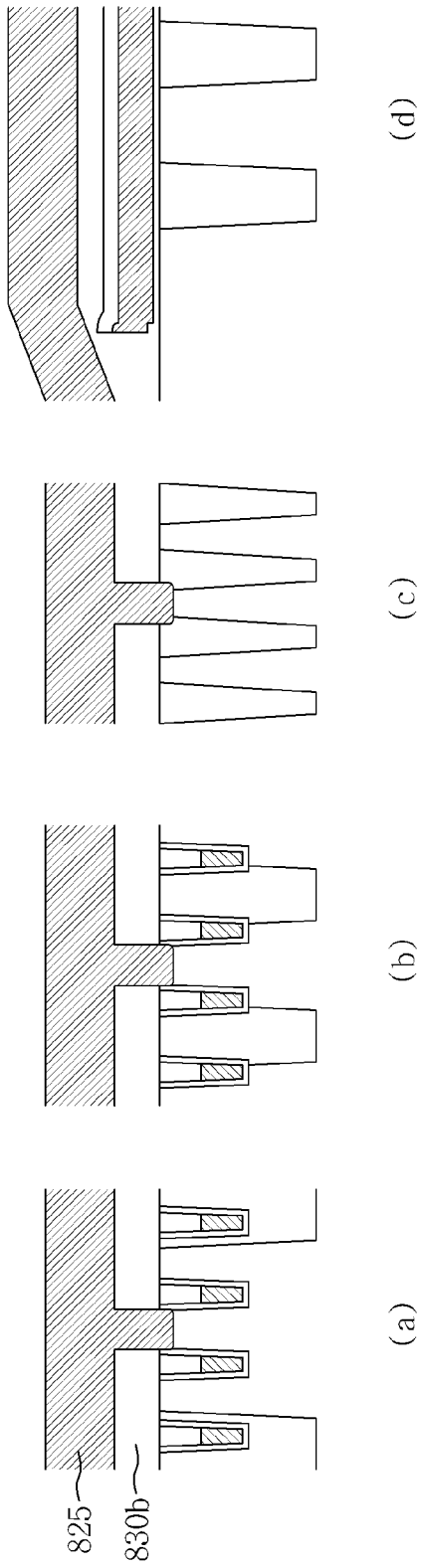

Referring to FIG. 11G, a second silicon layer 825 may be entirely formed to a thickness of about 1000 Å to fill the bit line contact hole 860h. In the drawing, a third thinned insulating layer 830b formed through the silicon treatment process and/or the cleaning process is illustrated.

Figure 11H:
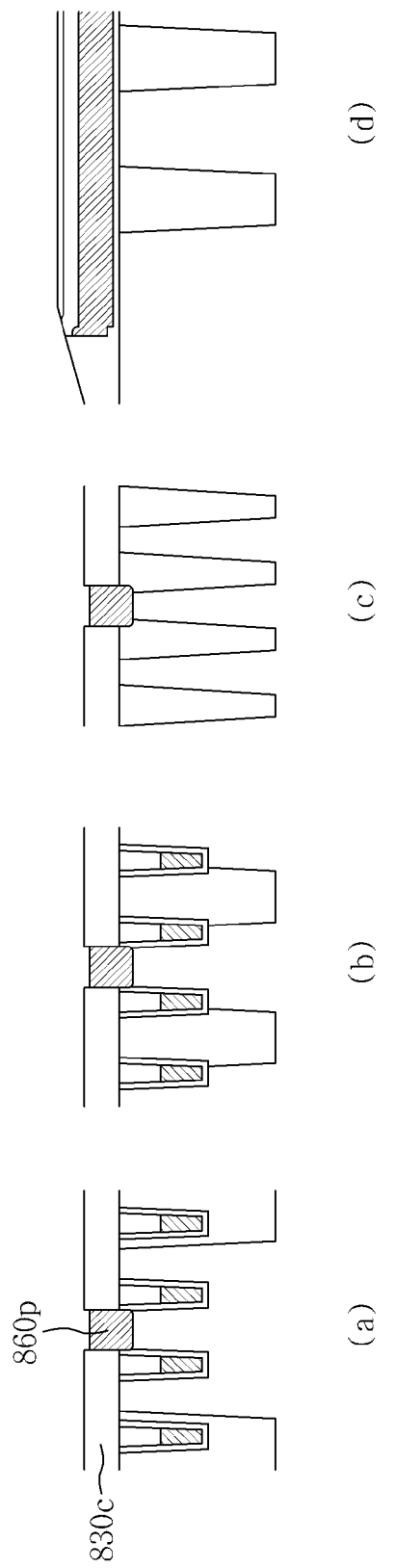

Referring to FIG. 11H, a bit line contact plug 860p may be formed by partially removing the second silicon layer 825 using an etch back process. As a result of the process, the third thinned insulating layer 830b may be formed into a third twice-thinned insulating layer 830c. A top surface of the bit line contact plug 860p may be situated at a level lower than that of a top surface of the third twice-thinned insulating layer 830c. Also, processes for wet etching or cleaning silicon oxide may be performed.

Figure 11I:
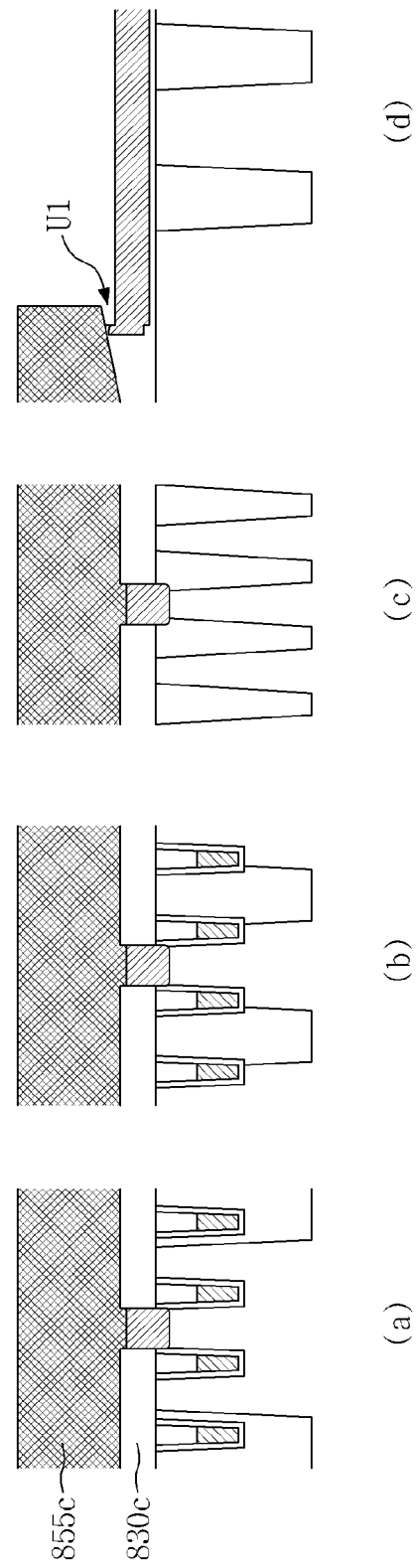

Referring to FIG. 11I, after forming a third photoresist pattern 855c exposing the third twice-thinned insulating layer 830c in the peripheral area PA, the third twice-thinned insulating layer 830c and the second peripheral insulating layer 820a may be removed in the peripheral area PA by a wet etching process using the third photoresist pattern 855c as a wet etching mask. As a result of the process, an undercut U1 may occur beneath the third photoresist pattern 855c in the core area or the peripheral area PA. Then, the third photoresist pattern 855c may be removed.

Figure 11J:
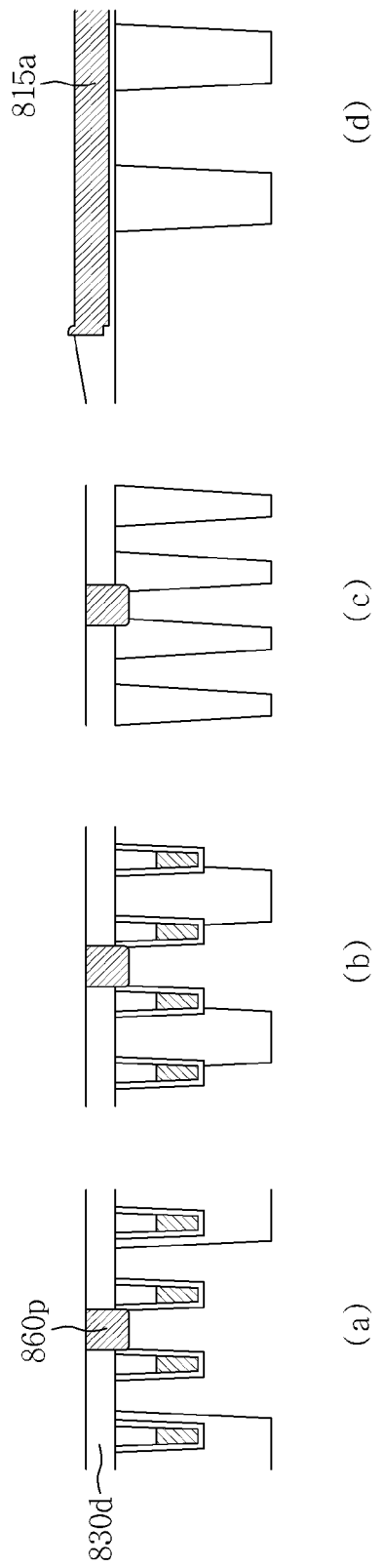

Referring to FIG. 11J, a third thrice-thinned insulating layer 830d may be formed by partially removing a top surface of the third twice-thinned insulating layer 830c. The removing process may be performed using a dry, wet, and/or cleaning etching process. In the embodiment, for example, the removing process may be a cleaning process. Specifically, the removing may occur by cleaning the top surfaces of the bit line contact plug 860p and the first peripheral silicon layer 815a. The cleaning process may use a diluted fluoric acid (HF) solution to remove native oxides remaining on the top surfaces of the bit line contact plug 860p and the first peripheral silicon layer 815a. In the process, the surfaces of the third thrice-thinned insulating layer 830d and the bit line contact plug 860p may become the same or similar to each other. Then, by performing the processes shown in FIGS. 4K, 4L, 5G and 6I, interconnection layers may be formed. In this way, any one of the semiconductor devices shown in FIGS. 2A to 3C may be fabricated.

Embodiment 9

Figure 12A:
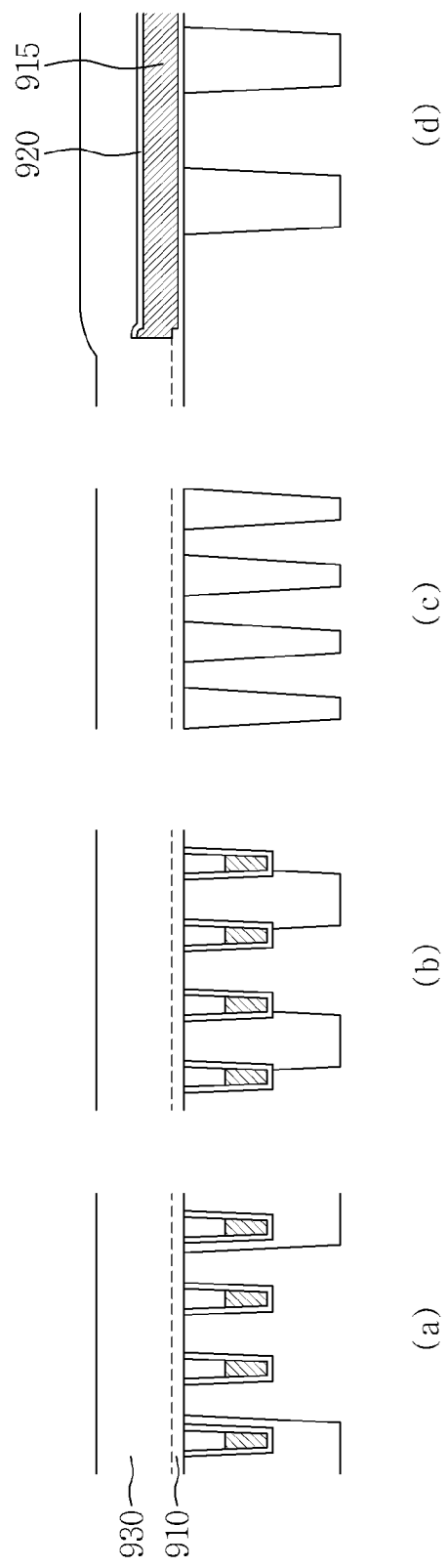
FIGS. 12A to 12G are each a sectional view and together illustrate an embodiment of a method of fabricating a semiconductor device in accordance with the inventive concepts, wherein regions (a), (b), (c) and (d) in each of the figures are regions along lines A-A', B-B', C-C', and D-D' in FIG. 1A, respectively.

Referring to FIG. 12A, by performing the processes shown in FIGS. 11A to 11C, a first insulating layer 910, a first peripheral silicon layer 915, a second peripheral insulating layer 920, and a third insulating layer 930 may be formed. The second peripheral insulating layer 920 may be formed to a thickness of about 50 Å. The third insulating layer 930 may be formed of silicon oxide, e.g., TEOS to a thickness of about 1000 Å. An interface between the first insulating layer 910 and the third insulating layer 930 will be omitted in drawings that follow FIG. 12A.

Figure 12B:
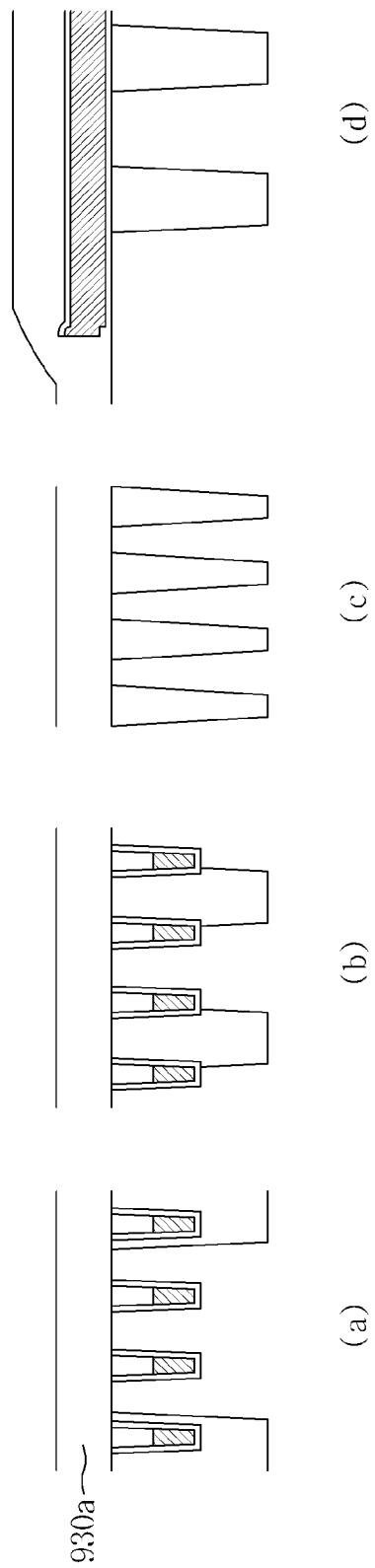

Referring to FIG. 12B, a third partially planarized insulating layer 930a may be formed by performing a CMP process. The third partially planarized insulating layer 930a may be thicker than the third partially planarized insulating layer 830a shown in FIG. 11E. For example, the third partially planarized insulating layer 930a may remain at a thickness of about 800 Å in the cell area CA, about 750 Å in the peripheral area PA, and about 600 Å in the core area.

Figure 12C:
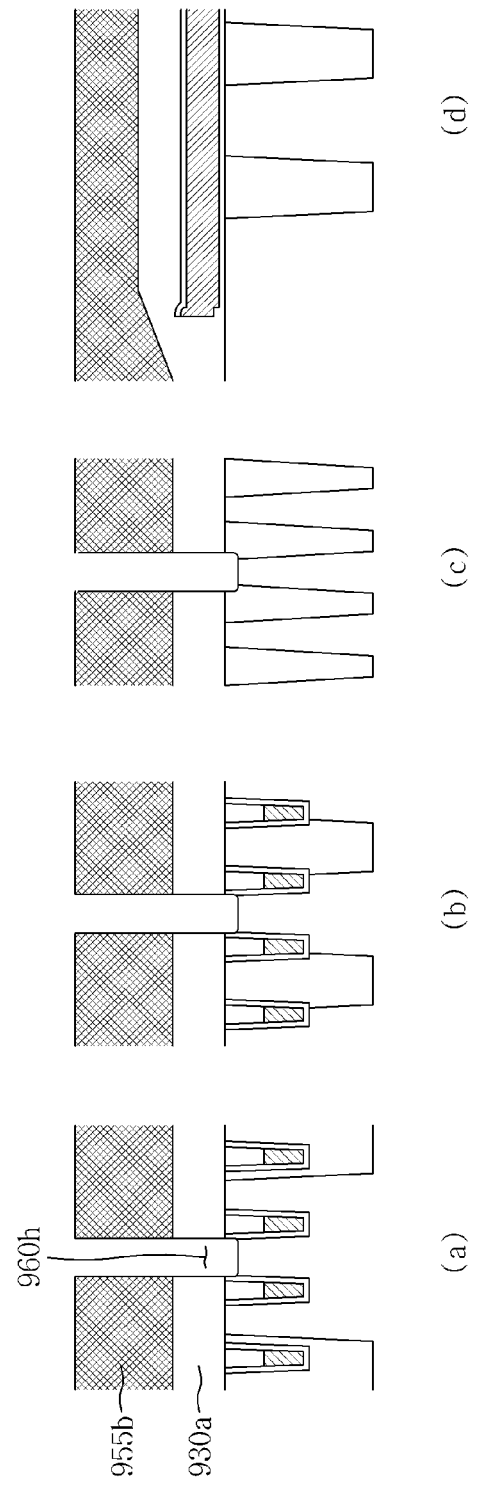

Referring to FIG. 12C, after forming a second photoresist pattern 955b, a bit line contact hole 960h may be formed by patterning the third partially planarized insulating layer 930a using the second photoresist pattern 955b as a patterning mask. In addition, as a result of the process, the third partially planarized insulating layer 930a may be hardly thinned or not at all. This shows that the inventive concepts may be selectively applied.

Figure 12D:
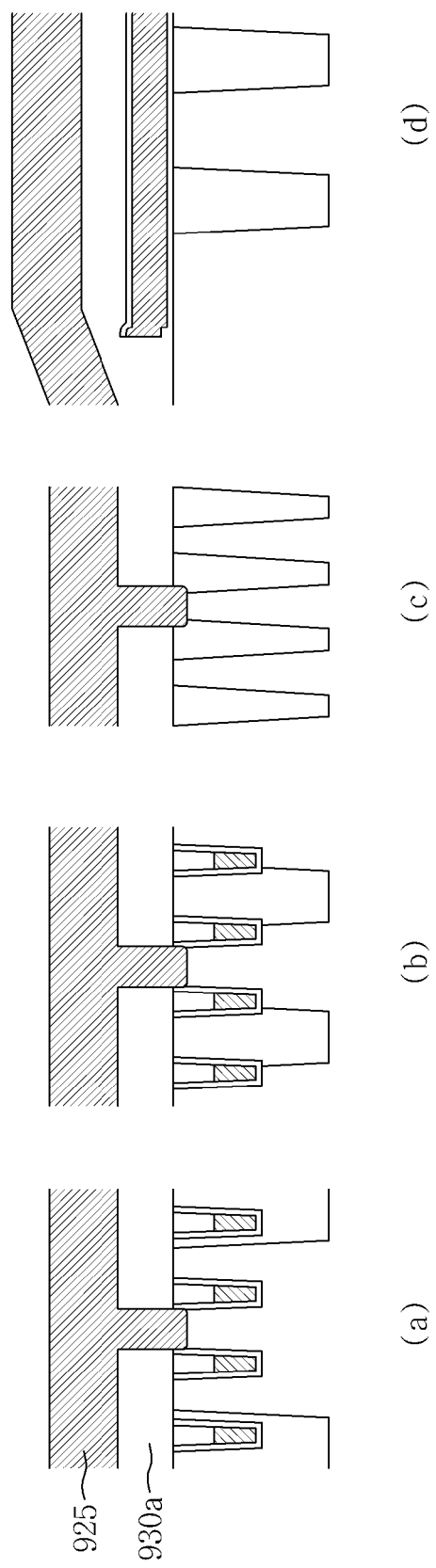

Referring to FIG. 12D, a second silicon layer 925 may be entirely formed to a thickness of 1000 Å.

Figure 12E:
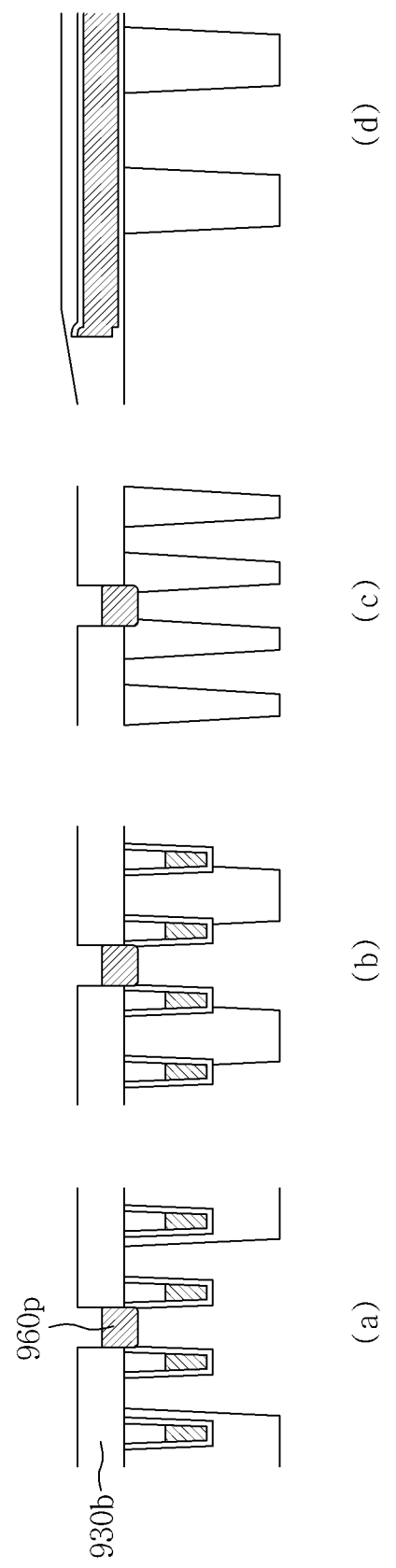

Referring to FIG. 12E, a bit line contact plug 960p may be formed. As a result of the process, the third partially planarized insulating layer 930a may be formed into a third thinned insulating layer 930b. That is, in the process, an etching process or a cleaning process to partially remove oxide materials may be performed. Furthermore, a top surface of the bit line contact plug 960p may be situated at a level lower than that of a top surface of the third thinned insulating layer 930b.

Figure 12F:
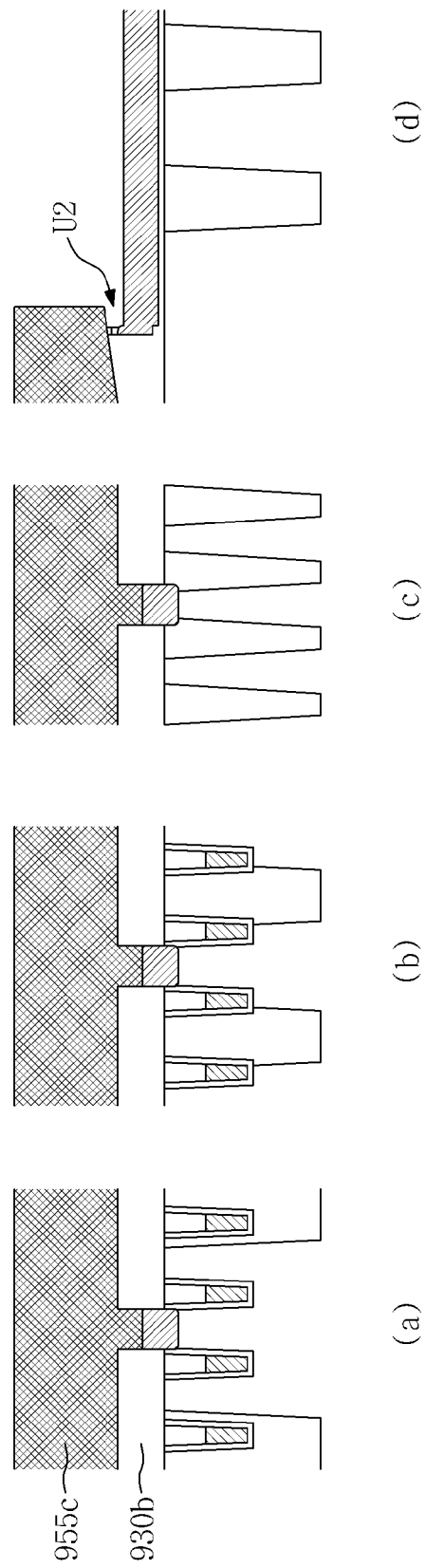

Referring to FIG. 12F, after forming a third photoresist pattern 955c, the third thinned insulating layer 930b and the second peripheral insulating layer 920 of the peripheral area PA may be removed using the third photoresist pattern 955c as an etching mask. As a result of the process, an undercut U2 may occur beneath the third photoresist pattern 955c in the core area or the peripheral area PA. Then, the third photoresist pattern 955c may be removed.

Figure 12G:
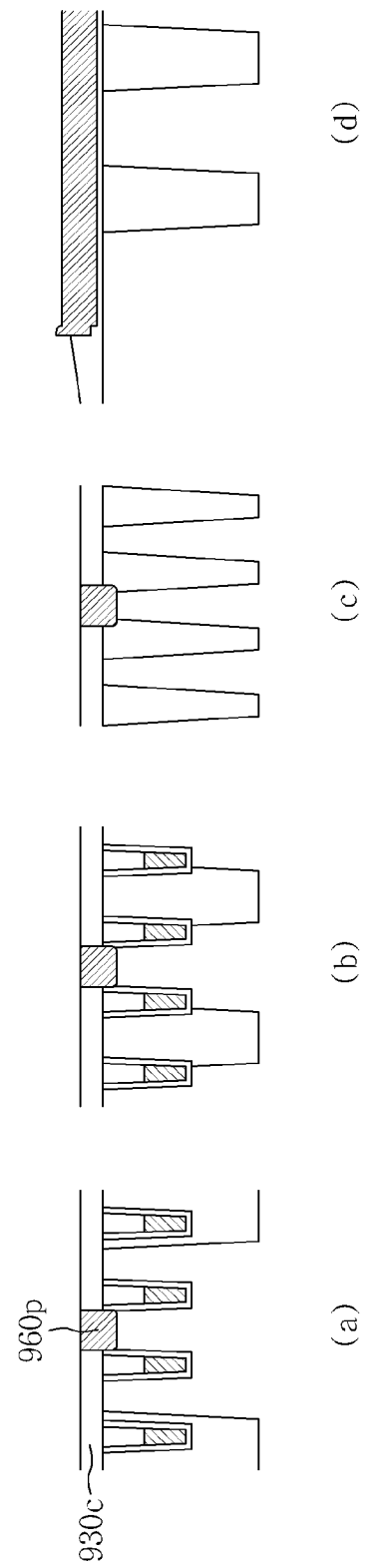

Referring to FIG. 12G, a third twice-thinned insulating layer 930c may be formed by partially removing a top surface of the third thinned insulating layer 930b. Levels of the top surfaces of the third twice thinned insulating layer 930c and the bit line contact plug 960p may become similar to each other, i.e., the top surfaces of the third twice thinned insulating layer 930c and the bit line contact plug 960p may become substantially coplanar. Then, by performing the processes shown in FIGS. 4K, 4L, 5G, and 6I, interconnection layers may be formed. In this ways, any one of the semiconductor devices shown in FIGS. 2A to 3C may be fabricated.

Embodiment 10

Figure 13A:
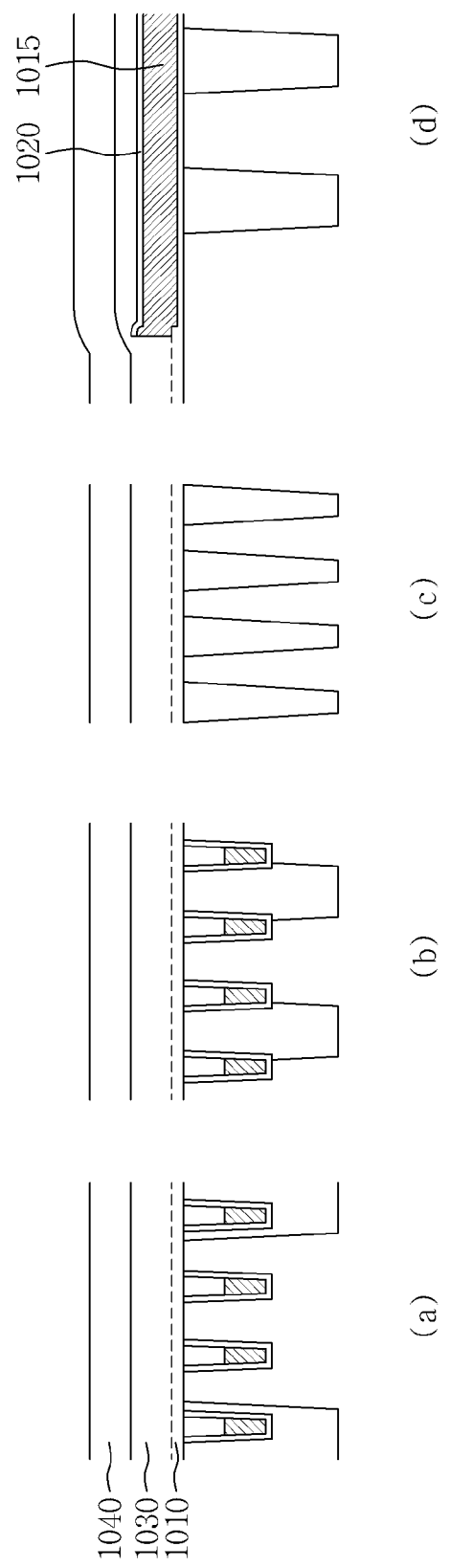
FIGS. 13A to 13F are each a sectional view and together illustrate an embodiment of a method of fabricating a semiconductor device in accordance with the inventive concepts, wherein regions (a), (b), (c) and (d) in each of the figures are regions along lines A-A', B-B', C-C', and D-D' in FIG. 1A, respectively.

Referring to FIG. 13A, by performing the processes shown in FIGS. 11A to 11C, and 12A, a first insulating layer 1010, a first peripheral silicon layer 1015, and a second peripheral insulating layer 1020 may be formed. Then, the third insulating layer 1030 and the fourth insulating layer 1040 may be formed. The third insulating layer 1030 may be formed of silicon oxide to a thickness of about 600 Å and the fourth insulating layer 1040 may be formed of silicon nitride to a thickness of about 600 Å. An interface between the first insulating layer 1010 and the third insulating layer 1030 is illustrated in broken lines. The interface between the first insulating layer 1010 and the third insulating layer 1030 will be omitted in drawings that follow FIG. 13A.

Figure 13B:
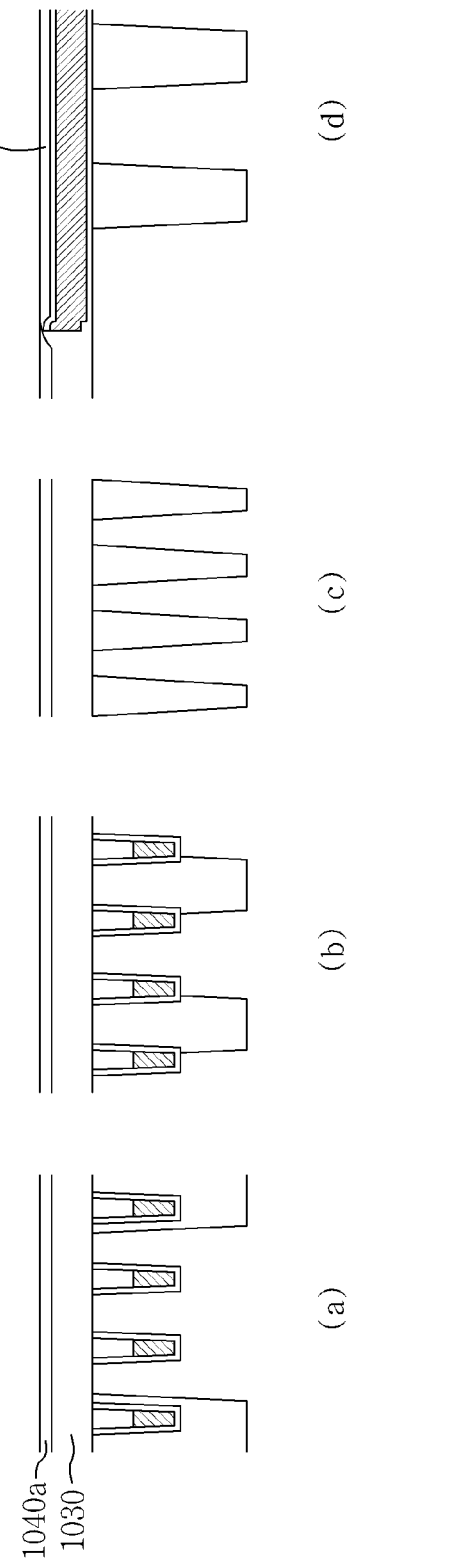

Referring to FIG. 13B, by performing a planarization process, e.g., a CMP process, a fourth planarized insulating layer 1040a may be formed in the cell area CA and a third upper portion-planarized insulating layer 1030a may formed in the peripheral area PA.

Figure 13C:
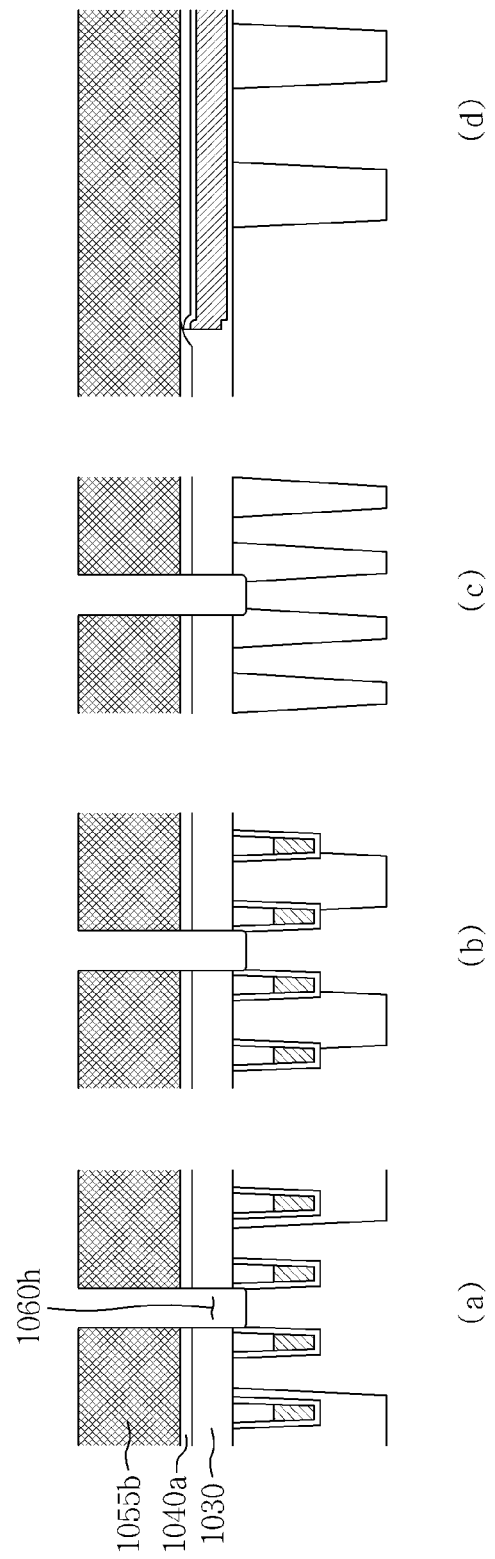

Referring to FIG. 13C, after forming a second photoresist pattern 1055b, a bit line contact hole 1060h may be formed by pattering the fourth planarized insulating layer 1040a and the third upper portion-planarized insulating layer 1030a using the second photoresist pattern 1055b as a patterning mask. Then the second photoresist pattern 1055b may be removed. Before or after removing the second photoresist pattern 1055b, a silicon treatment process may be performed. After removing the second photoresist pattern 1055b, an ozone treatment process and a cleaning process may be further performed.

Figure 13D:
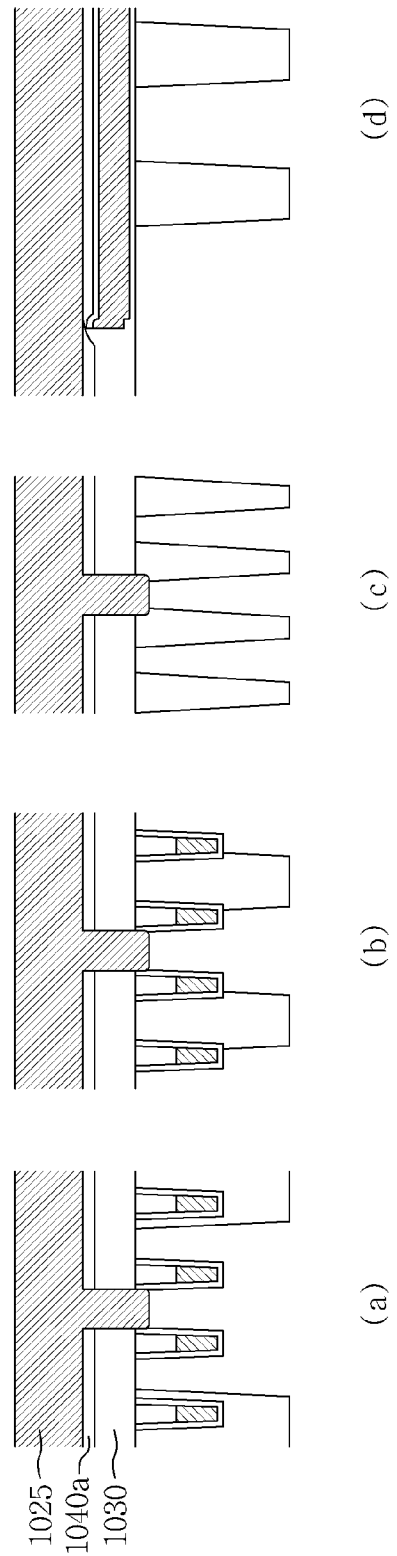

Referring to FIG. 13D, a second silicon layer 1025 may be formed to a thickness of about 1000 Å to fill the bit line contact hole 1060h.

Figure 13E:
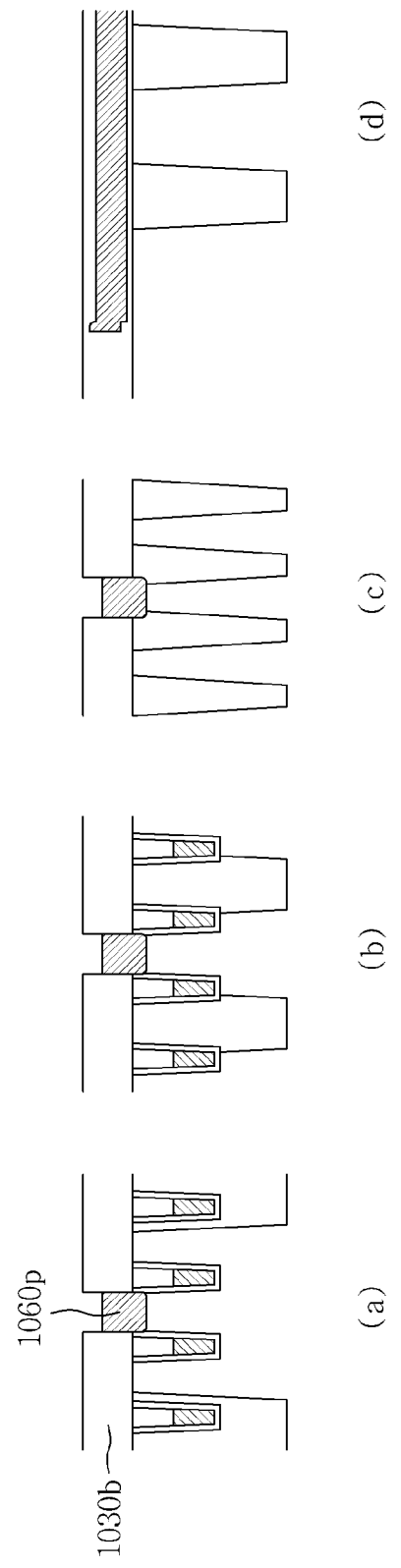

Referring to FIG. 13E, a bit line contact plug 1060p may be formed by removing the second silicon layer 1025 on the third upper portion-planarized insulating layer 1030a using an etch back process. As a result of the process, the fourth planarized insulating layer 1040a may be removed completely. Furthermore, the third upper portion-planarized insulating layer 1030a may be formed into third thinned insulating layer 1030b.

Figure 13F:
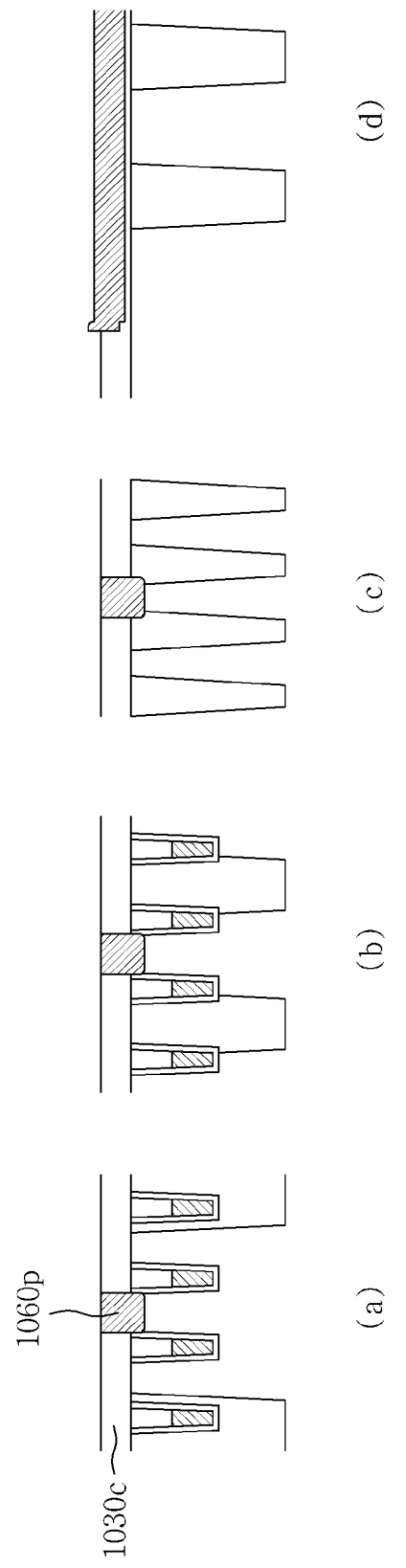

Referring to FIG. 13F, the third thinned insulating layer 1030b remaining in the peripheral area PA may be removed. As a result of the process, the level of a surface of the thinned insulating layer 1030c in the cell area CA may be similar to the level of a surface of the bit line contact plug 1060p. Then, by performing the processes shown in FIGS. 4K, 4L, 5G and 6I, interconnection layers may be formed. In this way, any one of the semiconductor devices shown in FIGS. 2A to 3C may be fabricated.

Embodiment 11

Figure 14A:
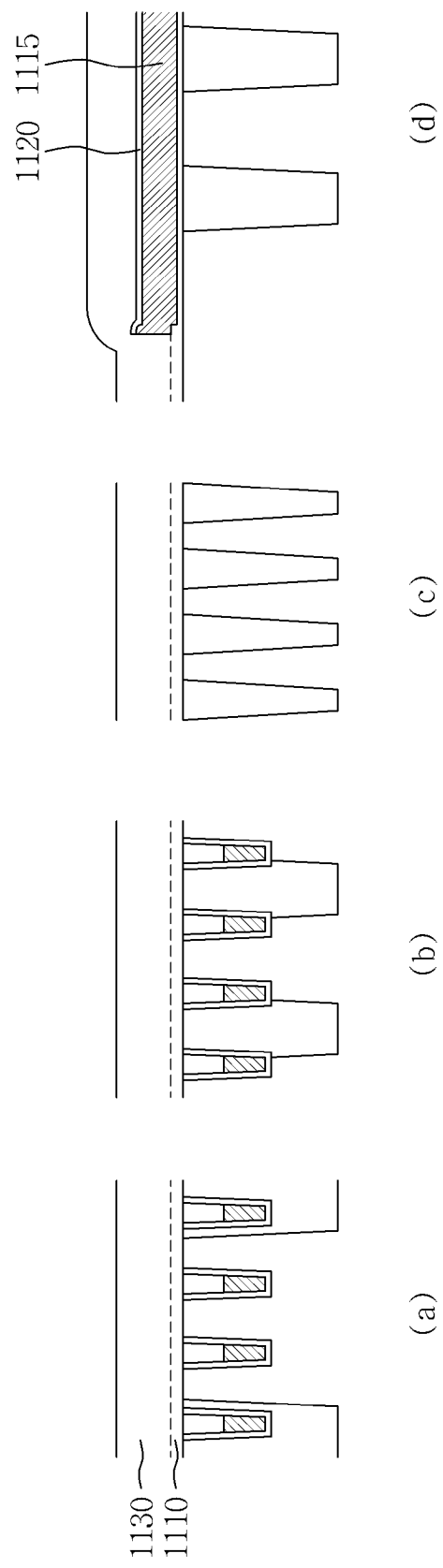
FIGS. 14A to 14D are each a sectional view and together illustrate an embodiment of a method of fabricating a semiconductor device in accordance with the inventive concepts, wherein regions (a), (b), (c) and (d) in each of the figures are regions along lines A-A', B-B', C-C', and D-D' in FIG. 1A, respectively.

Referring to FIG. 14A, by performing the processes referring to FIGS. 11A to 11C and 12A, a first insulating layer 1110, a first peripheral silicon layer 1115, and a second peripheral insulating layer 1120 may be formed. In succession, a third insulating layer 1130 may be entirely formed. The third insulating layer 1130 may be formed to a thickness of about 800 to 1200 Å and comprise an oxide, e.g., TEOS or a flowable chemical vapor deposition (F-CVD) oxide. An interface between the first insulating layer 1110 and the third insulating layer 1130 will be omitted in drawings that follow FIG. 14A.

Figure 14B:
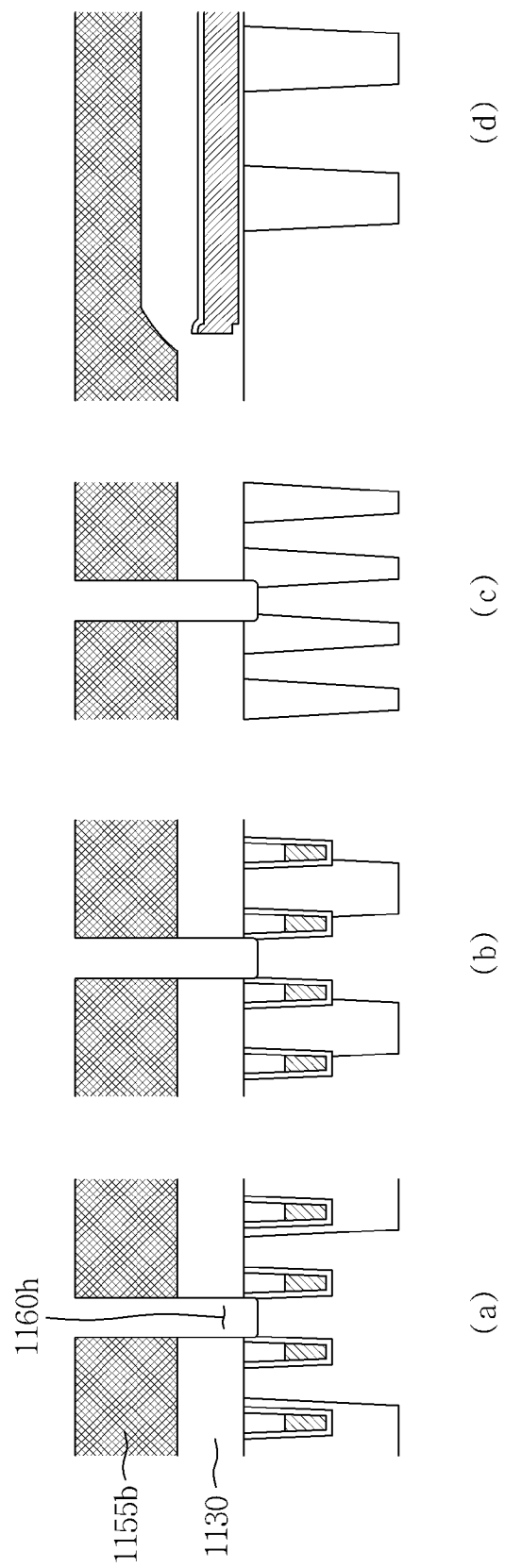

Referring to FIG. 14B, after forming a second photoresist pattern 1155b on the third insulating layer 1130, a bit line contact hole 1160h may be formed by patterning the third insulating layer 1130 using the second photoresist pattern 1155b as a patterning mask. Then, the second photoresist pattern 1055b may be removed.

Figure 14C:
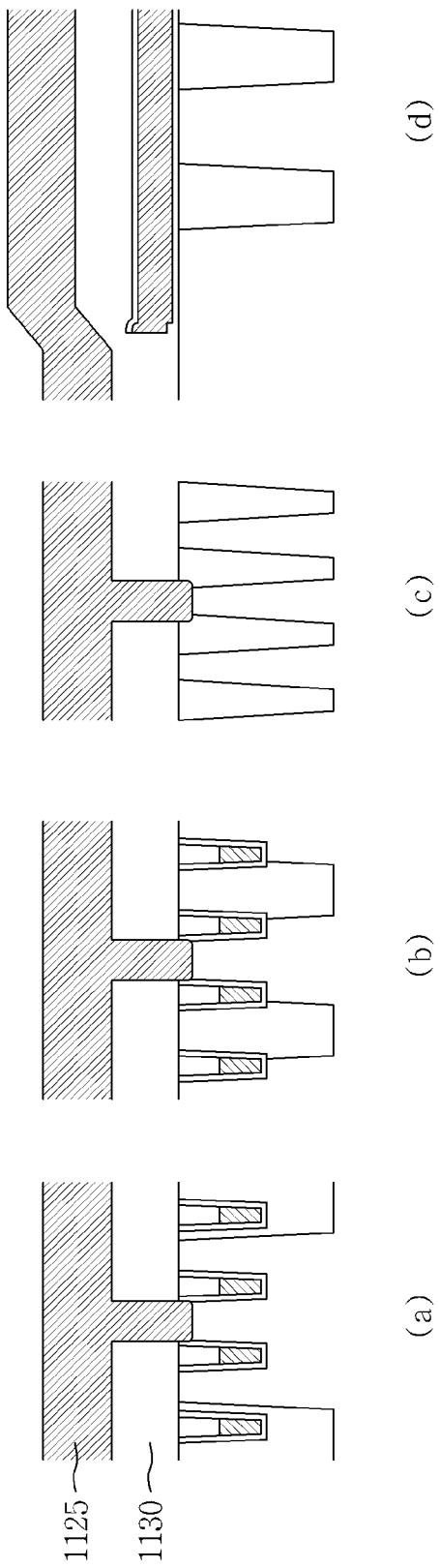

Referring to FIG. 14C, a second silicon layer 1125 may be entirely formed to a thickness of about 1000 Å to completely fill the bit line contact hole 1160h.

Figure 14D:
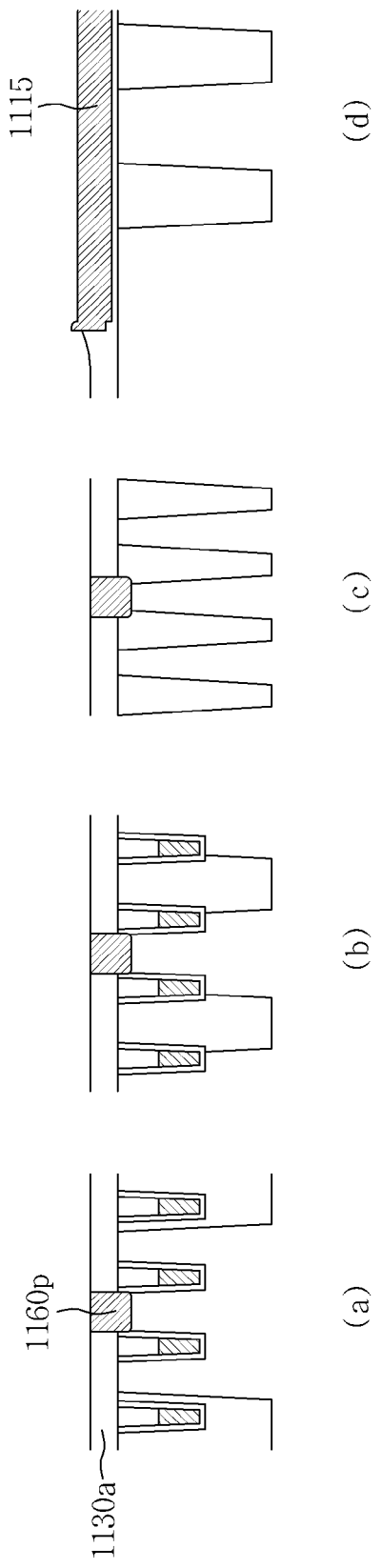

Referring to FIG. 14D, a bit line contact plug 1160p may be formed by partially or entirely removing the second silicon layer 1125, the third insulating layer 1130, and the second peripheral insulating layer 1020 using CMP or etch back processes. The third insulating layer 1130 may be formed into a third thinned insulating layer 1130a in the cell area CA, and the first silicon layer 1115 may be exposed in the peripheral area PA. The planarizing processes for removing the second silicon layer 1125, the third insulating layer 1130 and the second insulating layer 1120 may be performed sequentially or simultaneously. The results of the CMP process can vary according to characteristics of slurries. Accordingly, any of various processes may be combined to obtain results similar to those shown in the drawing. In addition, a cleaning process may be performed after the CMP process or the etch-back process. Then, by performing the processes referring FIGS. 4K, 4L, 5G and 6I, interconnection layers may be formed. In this way, any one of the semiconductor devices shown in FIGS. 2A to 3C may be fabricated.

Embodiment 12

Figure 15A:
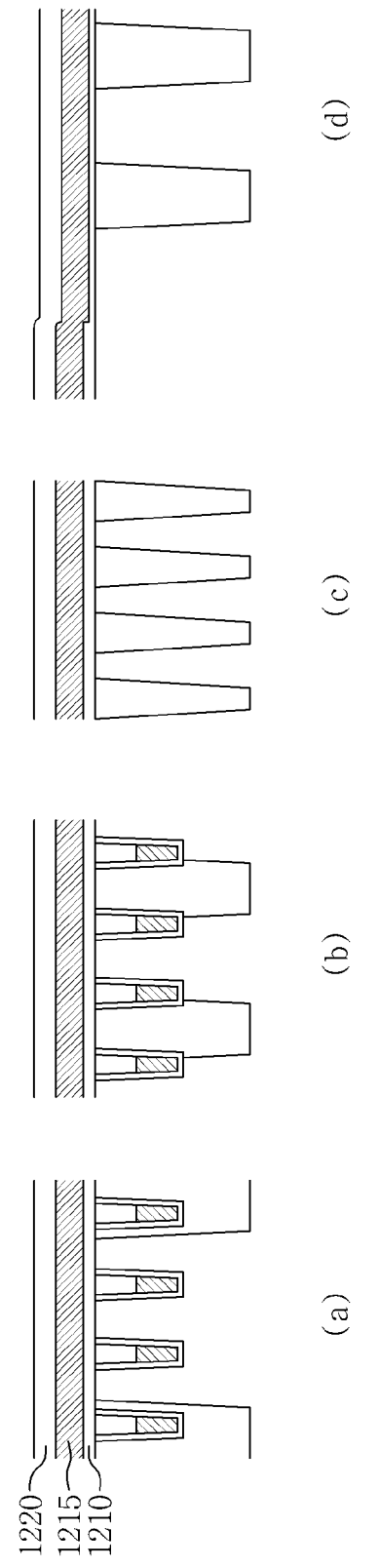

Referring to FIG. 15A, after forming a first insulating layer 1210 by performing the processes shown in FIG. 10A, a first silicon layer 1215 and a second insulating layer 1220 may be entirely formed. The first silicon layer 1215 may be formed to a thickness of about 400 Å. The second insulating layer 1220 may be formed of silicon oxide to a thickness of about 200 Å by performing an ALD process.

Figure 15B:
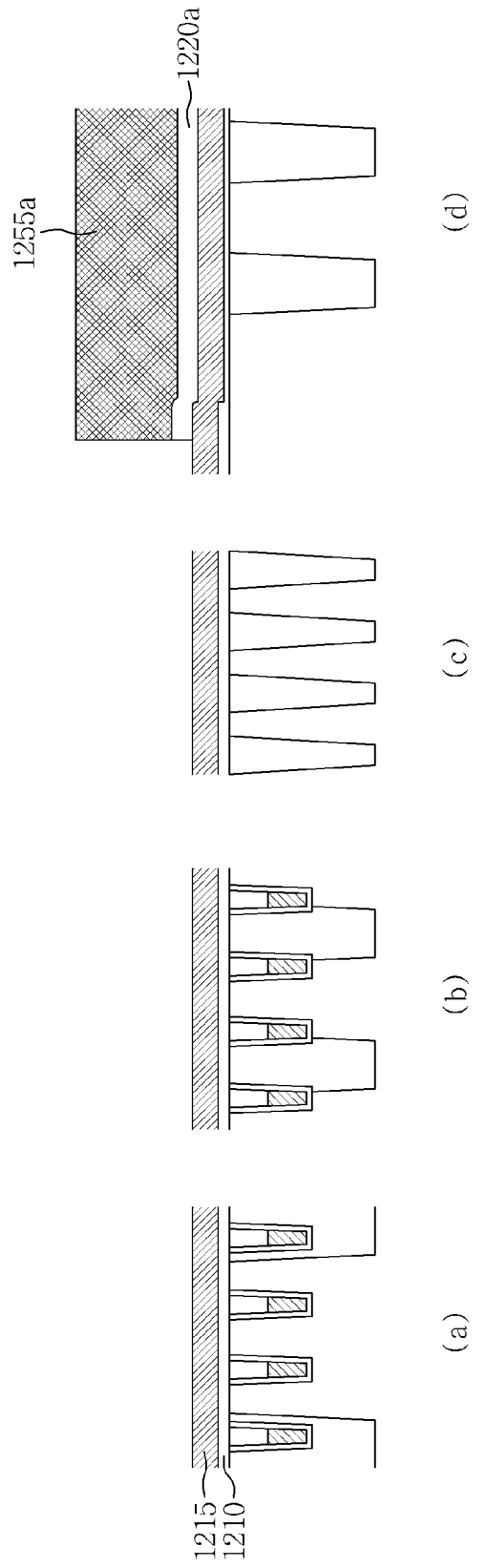

Referring to FIG. 15B, after forming a first photoresist pattern 1255a exposing the second insulating layer 1220 in the cell area CA, a second peripheral insulating layer 1220a may be formed by removing the exposed second insulating layer 1220 using the first photoresist pattern 1255a as a patterning mask. Then, by removing the first photoresist pattern 1255a, the first silicon layer 1215 may be exposed in the cell area CA and a second peripheral insulating layer 1220a may be exposed in the peripheral area PA.

Figure 15C:
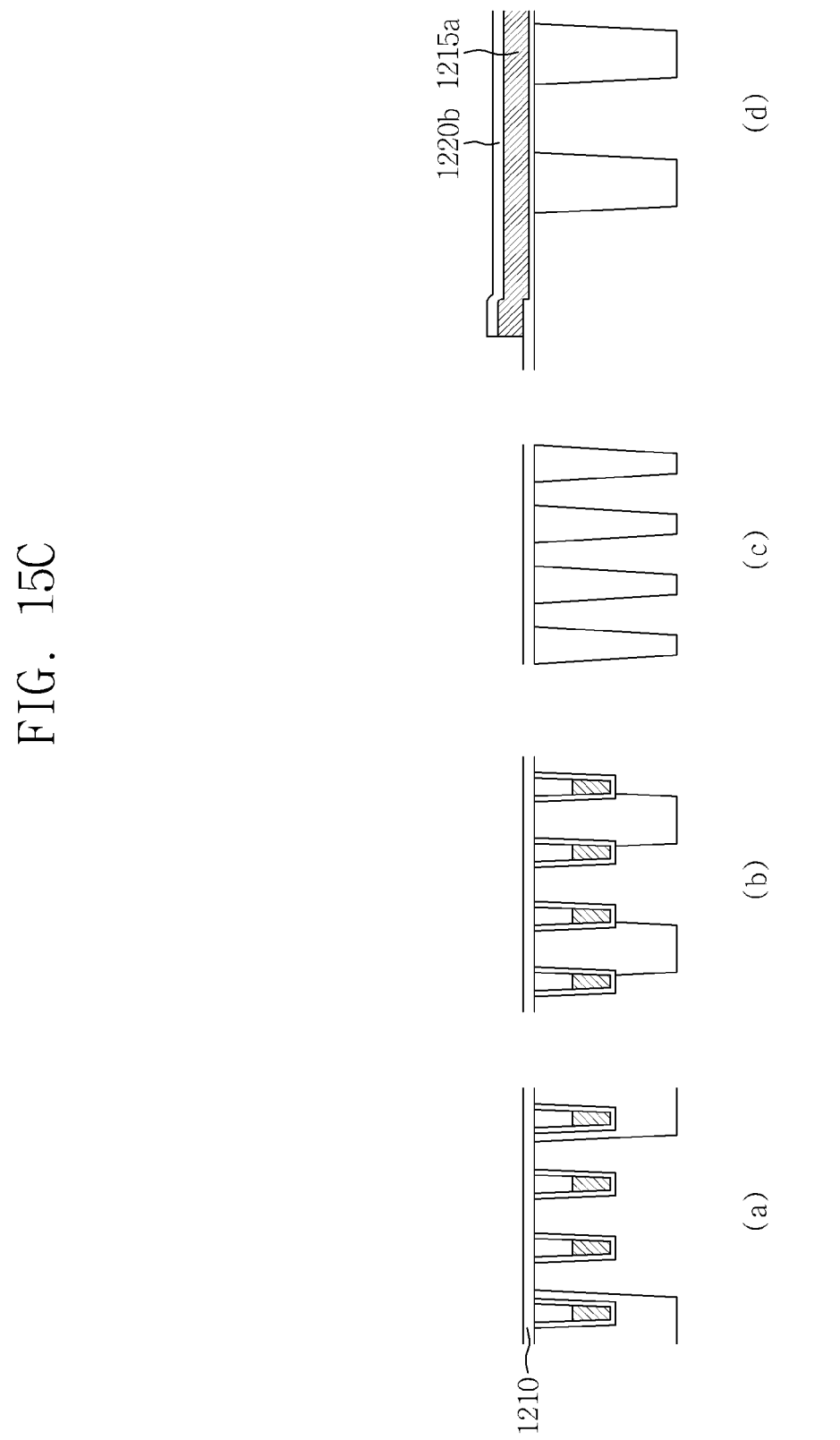

Referring to FIG. 15C, a first peripheral silicon layer 1215a may be formed by removing the exposed first silicon layer 1215 in the cell area CA using the second peripheral insulating layer 1220a as a patterning mask. The first insulating layer 1210 may be exposed in the cell area CA. The second peripheral insulating layer 1220a may be thinned during the removing process. That is, the second peripheral insulating layer 1220a may be formed into a second thinned peripheral insulating layer 1220b.

Figure 15D:
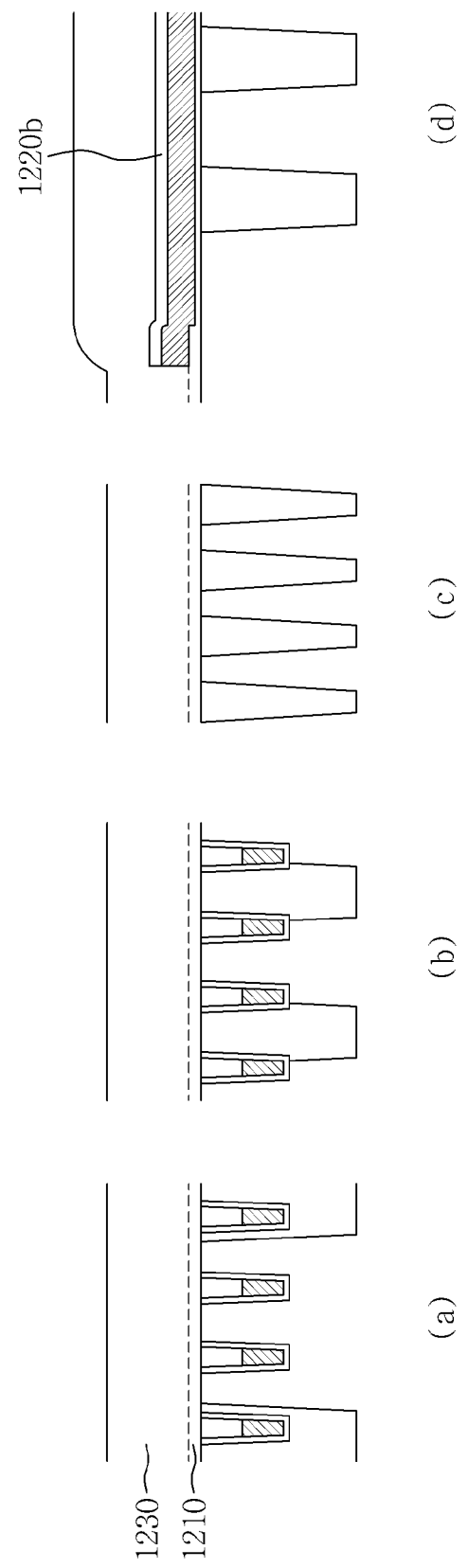

Referring to FIG. 15D, a third insulating layer 1230 may be entirely formed of silicon oxide to a thickness of about 1200 Å. In the drawing, an interface between the first insulating layer 1210 and the third insulating layer 1230 are shown as broken lines to indicate that it no longer exists. The broken lines will be omitted in the drawings that follow FIG. 15D.

Figure 15E:
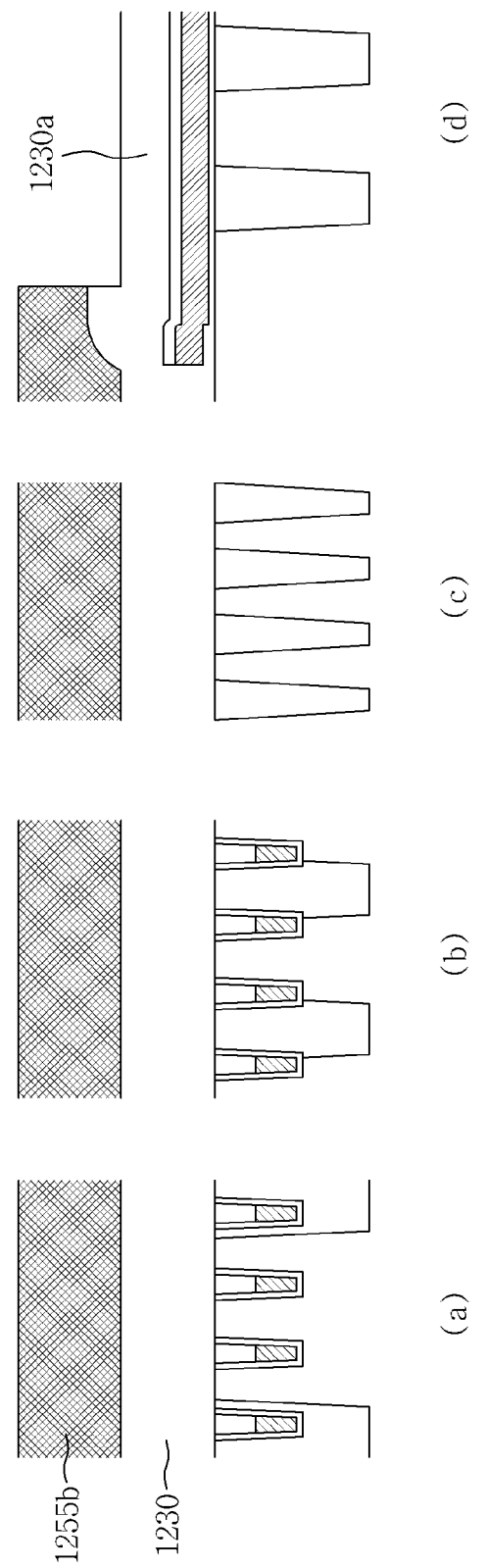

Referring to FIG. 15E, after forming a second photoresist pattern 1255b exposing the third insulating layer 1230 in the peripheral area PA, a third partially etched insulating layer 1230a may be formed by partially etching the exposed third insulating layer 1230 using the second photoresist pattern 1255b as a patterning mask. The surface levels of the third partially etched insulating layer 1230a may be similar in the cell area CA and the peripheral area PA. Then the second photoresist pattern 1255b may be removed.

Figure 15F:
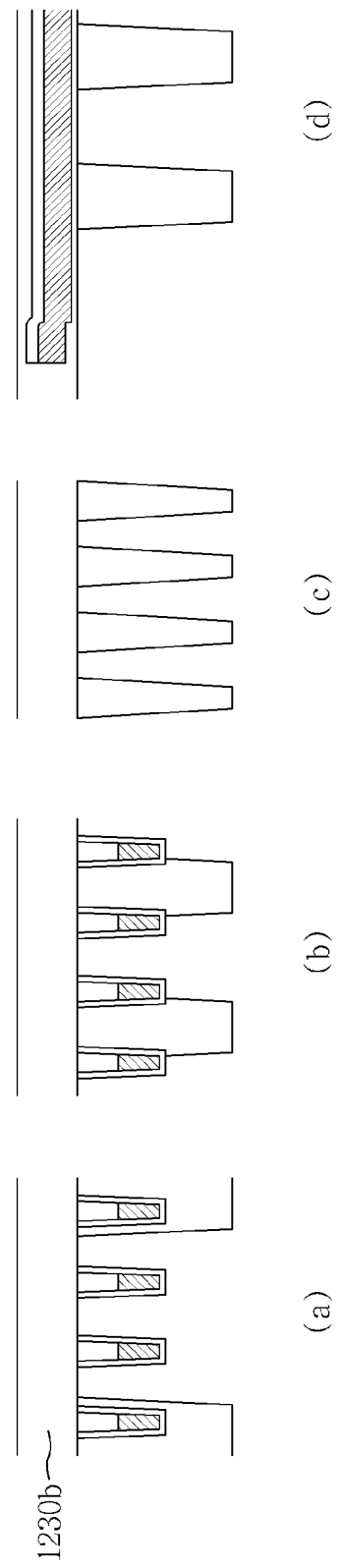

Referring to FIG. 15F, the third partially etched insulating layer 1230a may be formed into a third planarized insulating layer 1230b by a planarizing process, e.g., a CMP process.

Referring to FIG. 15G, after forming a third photoresist pattern 1255c, a bit line contact hole 1260h may be formed by patterning the third planarized insulating layer 1230b using the third photoresist pattern 1255c as a patterning mask. Then, the third photoresist pattern 1255c may be removed. A silicon treatment process may be performed before removing the third photoresist pattern 1255c. An ozone treatment process and a cleaning process may be performed after removing the third photoresist pattern 1255c.

Figure 15H:
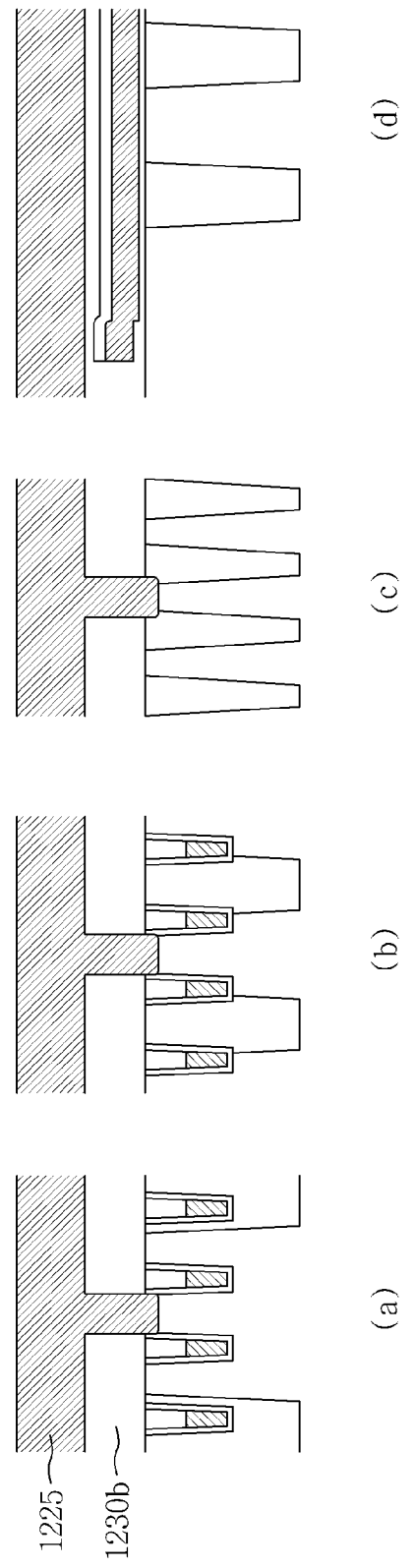

Referring to FIG. 15H, second silicon layer 1225 may be formed to a thickness of about 1000 Å to completely fill the bit line contact hole 1260h.

Figure 15I:
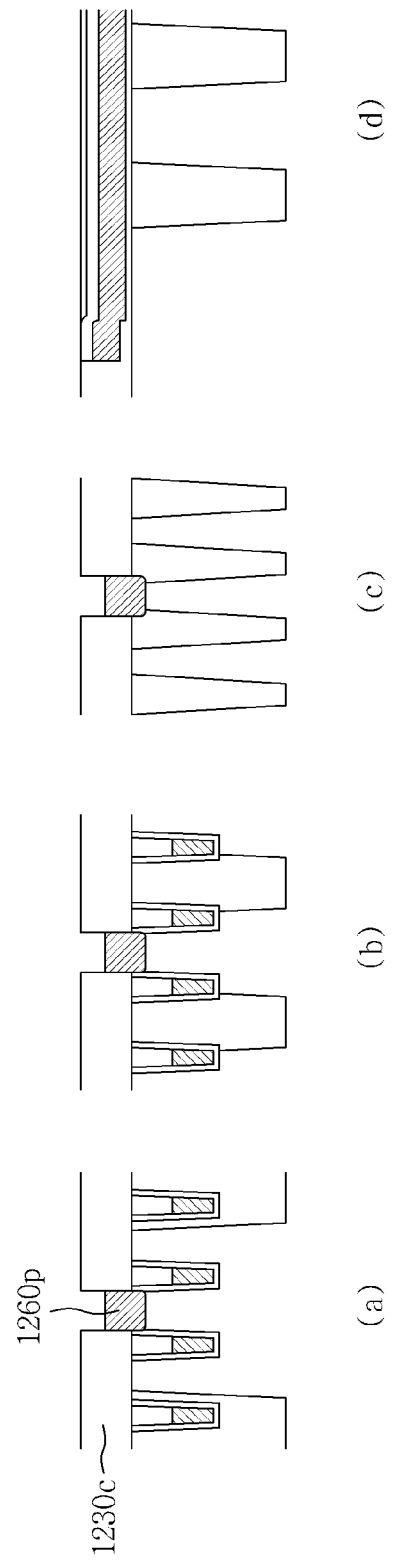

Referring to the FIG. 15I, a bit line contact plug 1260p may be formed by partially removing the second silicon layer 1225 using CMP or etch back processes. As a result of the process, the third planarized insulating layer 1230b may be formed into a third thinned insulating layer 1230c. A top surface of the bit line contact plug 1260p may be lower than a top surface of the third thinned insulating layer 1230c.

Figure 15J:
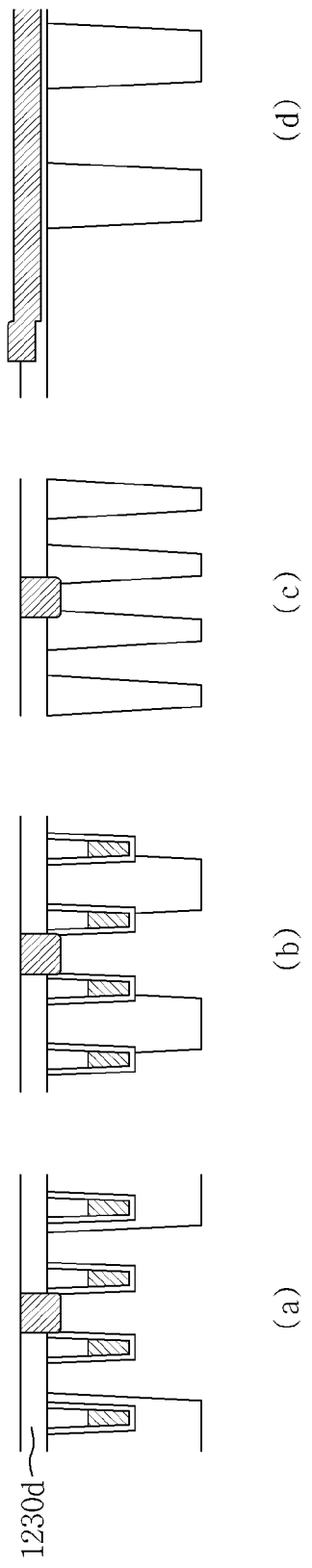

Referring to FIG. 15J, a third twice-thinned insulating layer 1230d may be formed by partially or entirely removing the second thinned insulating layer 1230c and the second peripheral insulating layer 1220b. Top surfaces of the third twice-thinned insulating layer 1230d and the bit line contact plug 1260p may be similar to each other. Then, by performing the processes shown in FIGS. 4K, 4L, 5G and 6I, interconnection layers may be formed. In this way, any one of the semiconductor devices shown in FIGS. 2A to 3C may be fabricated.

Embodiment 13

Figure 16A:
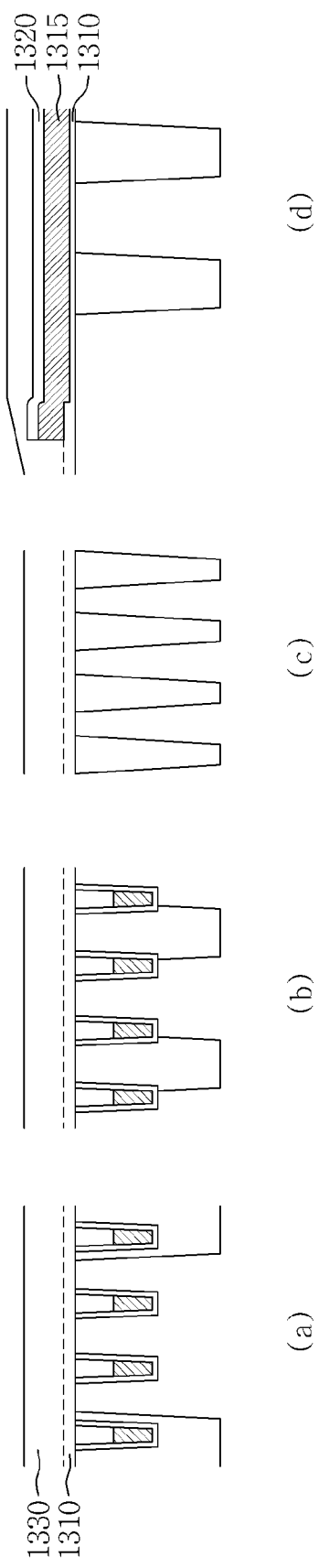
FIGS. 16A to 16F are each a sectional view and together illustrate an embodiment of a method of fabricating a semiconductor device in accordance with the inventive concepts, wherein regions (a), (b), (c) and (d) in each of the figures are regions along lines A-A', B-B', C-C', and D-D' in FIG. 1A, respectively.

Referring to FIG. 16A, by performing the processes shown in FIGS. 15A to 15D, a first insulating layer 1310, a first silicon layer 1315, and a second insulating layer 1320 may be formed. Then, a third insulating layer 1330 may be formed by performing a planarizing process, e.g., a CMP process. After performing the planarizing process, the third insulating layer 1330 may remain at a thickness of about 800 Å in the cell area CA and relatively thicker in the peripheral area PA. An interface between the first insulating layer 1310 and the third insulating layer 1330 is shown in broken lines to indicate that it no longer exists. The broken lines will be omitted in the drawings that follow FIG. 16A.

Figure 16B:
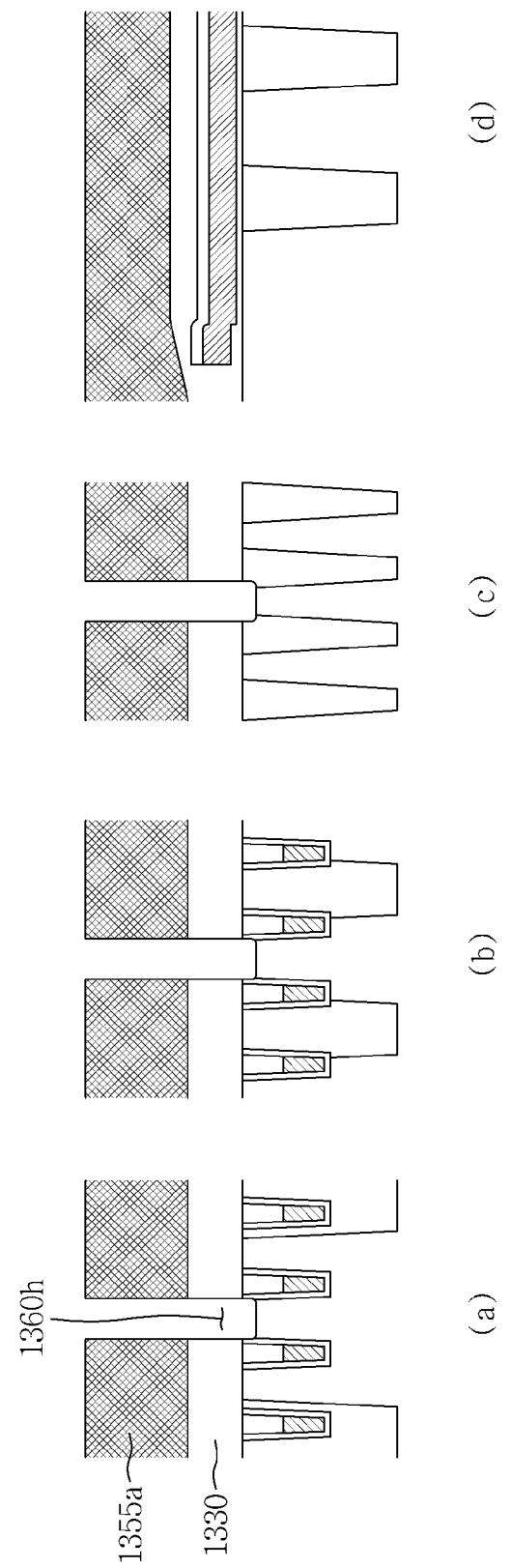

Referring to FIG. 16B, after forming a first photoresist pattern 1355a, a bit line contact hole 1360h may be formed by patterning the third insulating layer 1330 using the first photoresist pattern 1355a as a patterning mask. Then, the first photoresist pattern 1355a may be removed. A silicon treatment process may be performed before removing the first photoresist pattern 1355a.

Figure 16C:
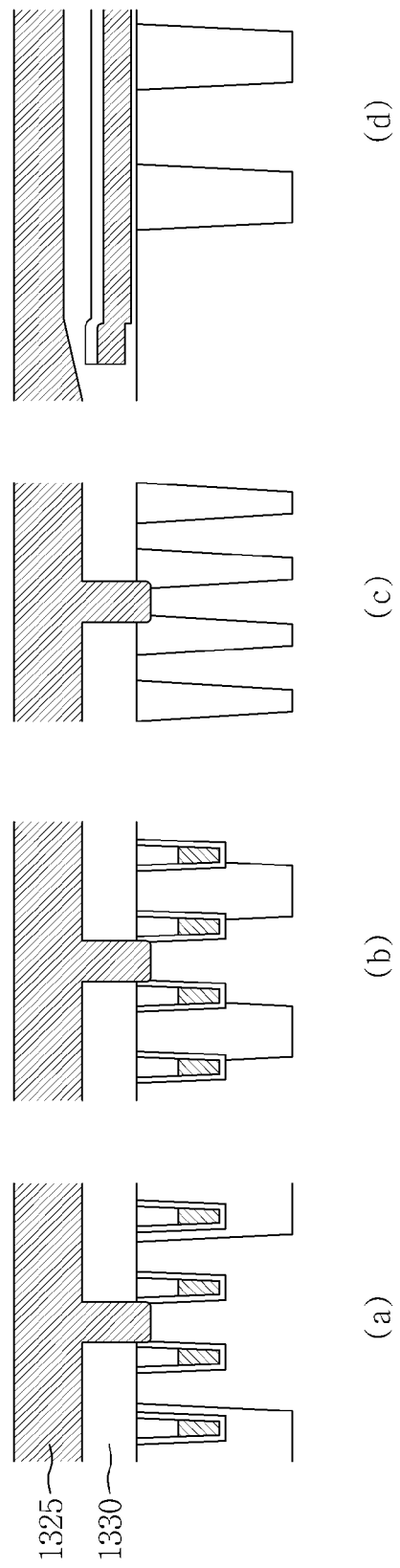

Referring to FIG. 16C, a second silicon layer 1325 may be formed to a thickness of about 1000 Å to completely fill the bit line contact hole 1360h.

Figure 16D:
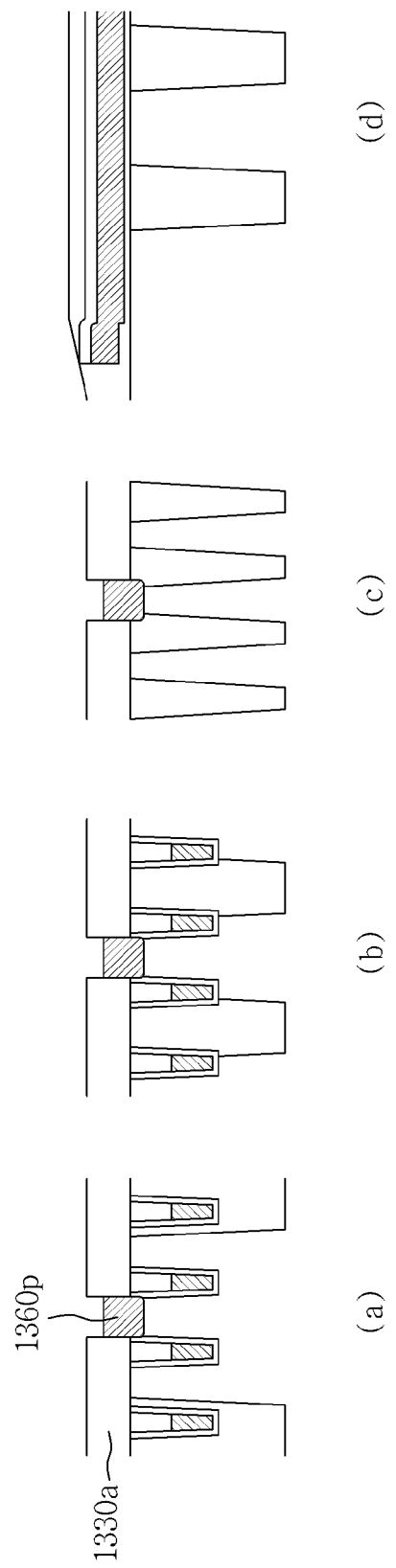

Referring to FIG. 16D, a bit line contact plug 1360p may be formed by removing the second silicon layer 1325 using an etch back process. The third insulating layer 1330 may be formed into a third thinned insulating layer 1330a. The level of the top surface of the bit line contact plug 1360p may be lower than that of the top surface of the third thinned insulating layer 1330a.

Figure 16E:
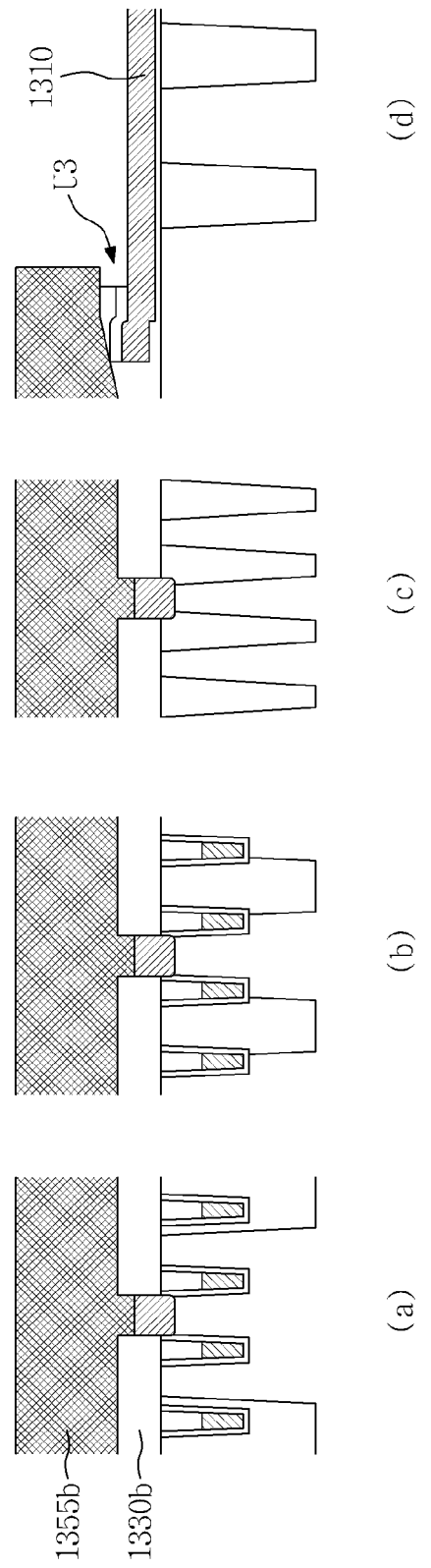

Referring to FIG. 16E, after forming a second photoresist pattern 1355b exposing the third thinned insulating layer 1330a in the peripheral area PA, the first silicon layer 1315 may be exposed by removing the exposed portion of the third thinned insulating layer 1330a. As a result of the process, an undercut U3 may occur beneath end portions of the second photoresist pattern 1355b in the core area or the peripheral area PA. The third thinned insulating layer 1330a may be formed into a third cell insulating layer 1330b in the cell area CA. Then, the second photoresist pattern 1355b may be removed.

Figure 16F:
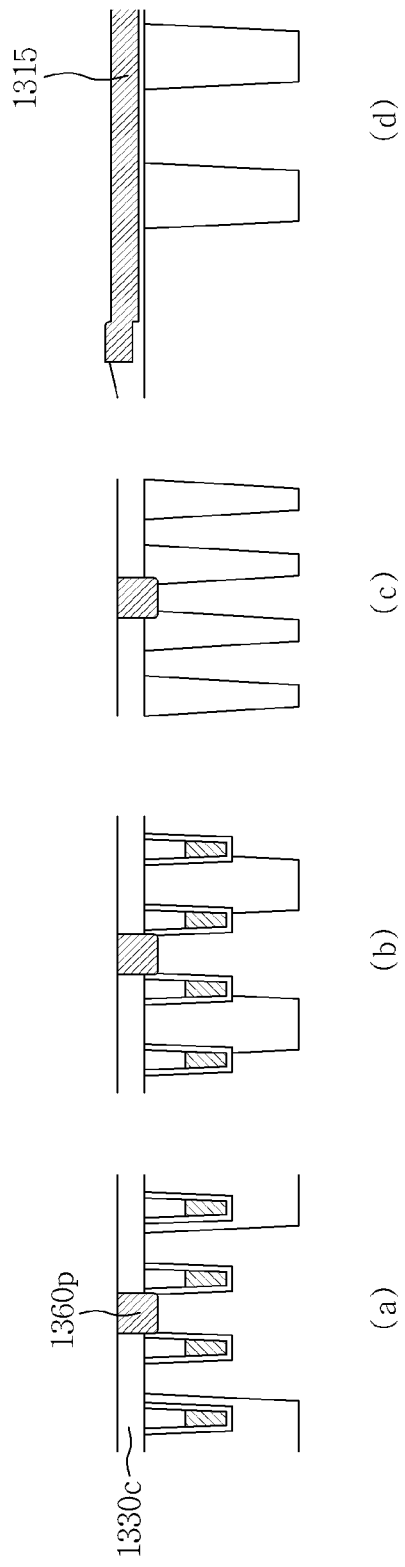

Referring to FIG. 16F, a top surface of the third cell insulating layer 1330b may be entirely removed to completely expose the top surface of the first silicon layer 1315 in the peripheral area PA. As a result of the process, the third cell insulating layer 1330b may be formed into a third thinned cell insulating layer 1330c. This process may also comprise a cleaning process. Then, by performing the processes shown in FIGS. 4K, 4L, 5G and 6I, interconnection layers may be formed. In this way, any one of the semiconductor devices shown in FIGS. 2A to 3C may be fabricated.

Embodiment 14

Figure 17A:
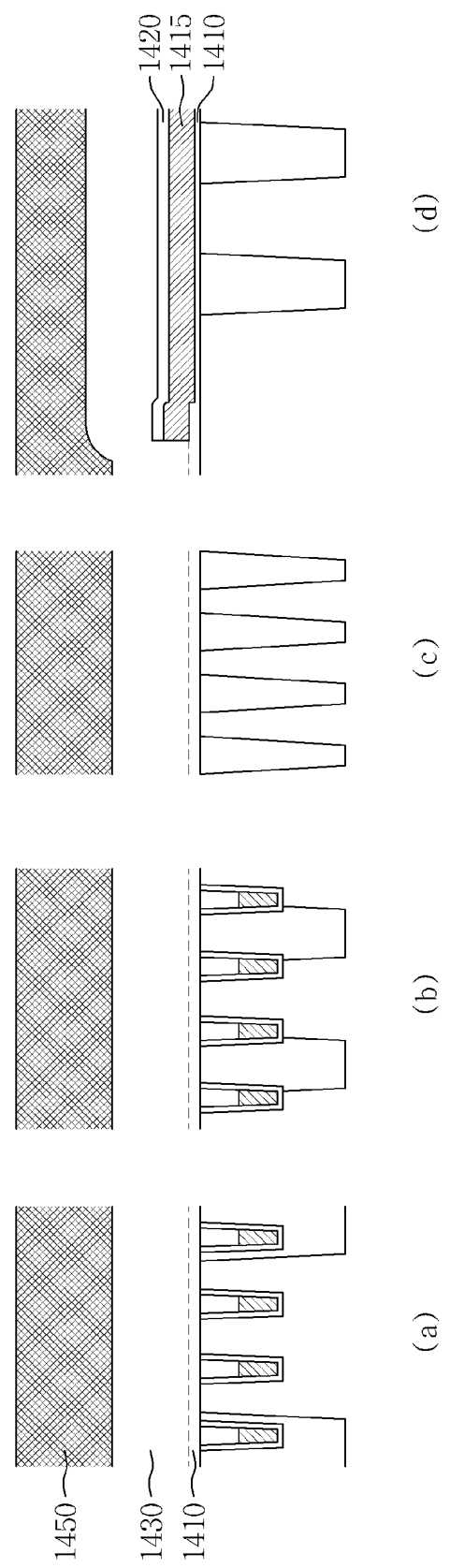
FIGS. 17A to 17F are each a sectional view and together illustrate an embodiment of a method of fabricating a semiconductor device in accordance with the inventive concepts, wherein regions (a), (b), (c) and (d) in each of the figures are regions along lines A-A', B-B', C-C', and D-D' in FIG. 1A, respectively.

Referring to FIG. 17A, after forming a first insulating layer 1410, a first silicon layer 1415, and a second insulating layer 1420, by performing the processes shown in FIGS. 15A to 15D, a third insulating layer 1430 and a planarizing material layer 1450 may be entirely formed. The third insulating layer 1430 may be formed of silicon oxide to a thickness of about 800 to 1000 Å. The planarizing material layer 1450 may be formed to a thickness of 1000 Å or more using a material having good planarizing characteristics. Good planarizing characteristics mean good flowability. In an example of this embodiment, the planarizing material layer 1450 includes an organic material, e.g., SOH. An interface between the first insulating layer 1410 and third insulating layer 1430 may be shown in broken lines to indicate that it no longer exists.

Figure 17B:
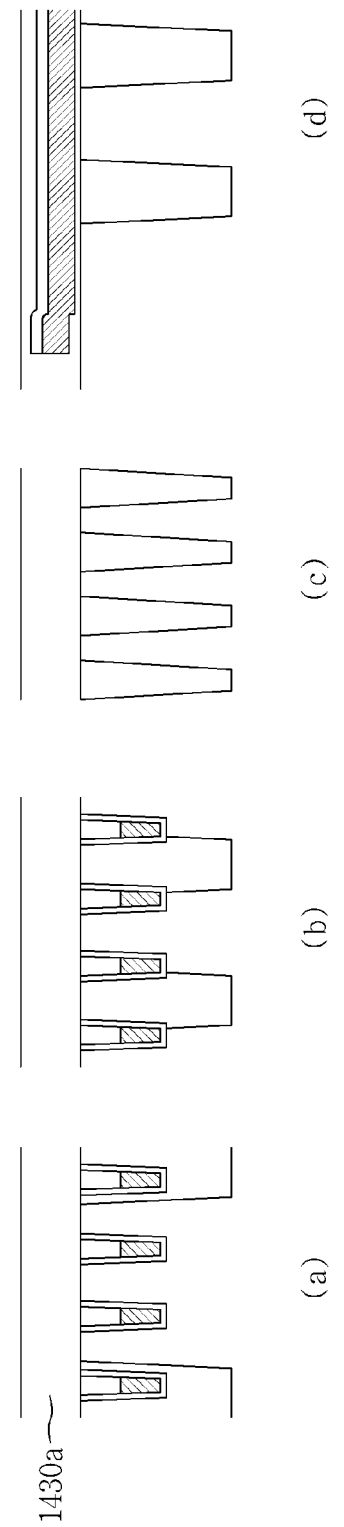

Referring to FIG. 17B, a third planarized insulating layer 1430a may be formed by performing an etch back process. In the process, removing rates of the planarizing material layer 1450 and the third insulating layer 1430 may be similar to each other. As a result of the process, the planarizing material layer 1450 may be completely removed and the third insulating layer 1430 may be partially removed and formed into the third planarized insulating layer 1430a.

Figure 17C:
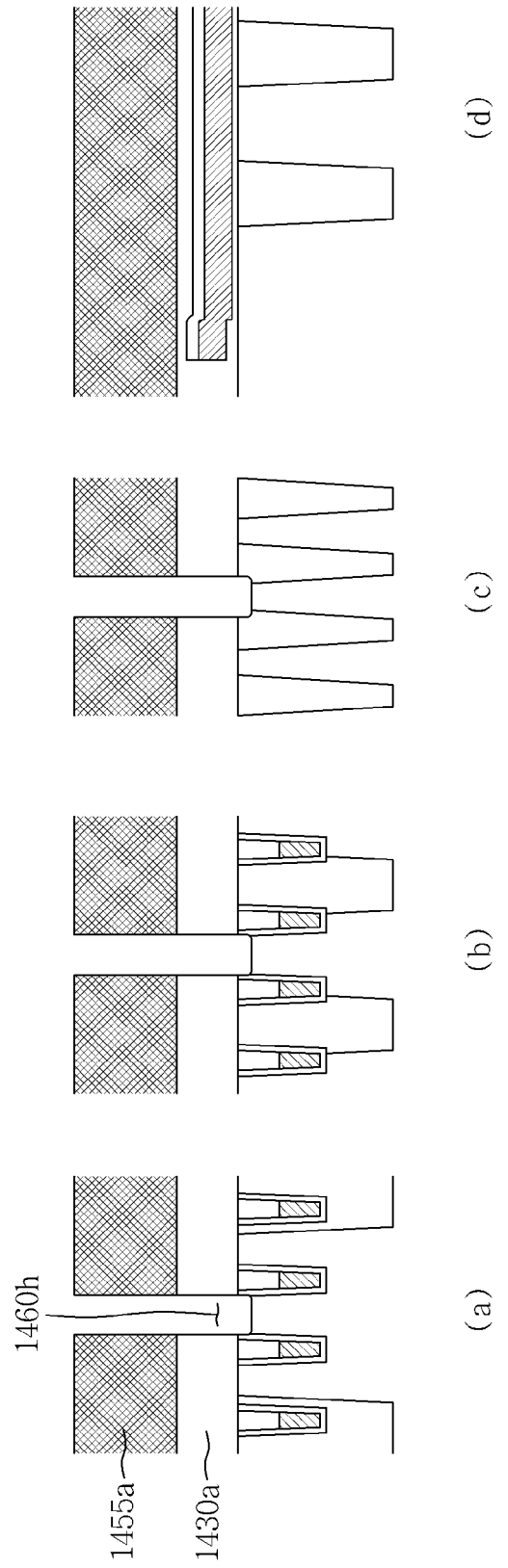

Referring to FIG. 17C, after forming a first photoresist pattern 1455a, a bit line contact hole 1460h may be formed by patterning the third planarized insulating layer 1430a using the first photoresist pattern 1455a as a patterning mask. Then, the first photoresist pattern 1455a may be removed. A silicon treatment process may be performed before or after removing the first photoresist pattern 1455a.

Figure 17D:
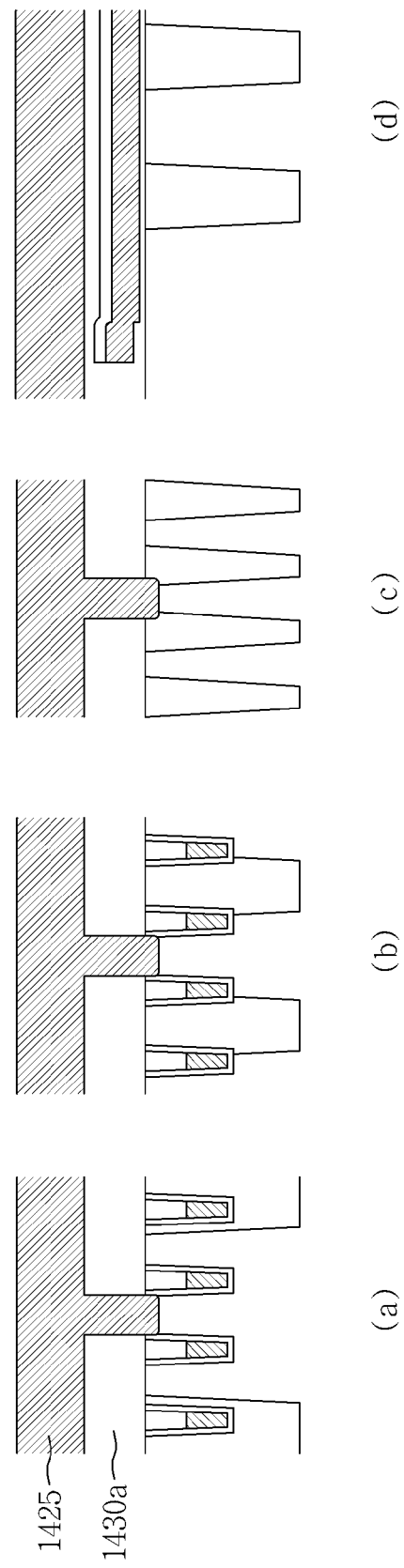

Referring to FIG. 17D, a second silicon layer 1425 may be formed to a thickness of about 1000 Å to fill the bit line contact hole 1460h.

Figure 17E:
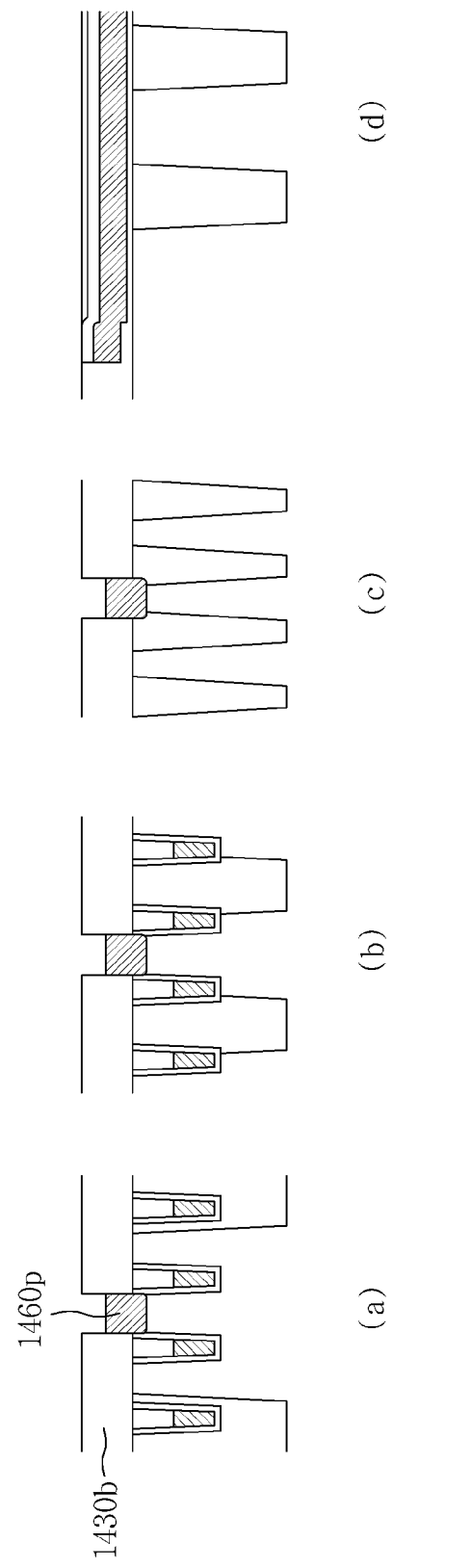

Referring to FIG. 17E, a bit line contact plug 1460p may be formed by entirely removing the second silicon layer 1425 using an etch back process. The third planarized insulating layer 1430a may be formed into a third thinned insulating layer 1430b. At this time, a top surface of the bit line contact plug 1460p may be situated at a level lower than that of a top surface of the third thinned insulating layer 1430b.

Figure 17F:
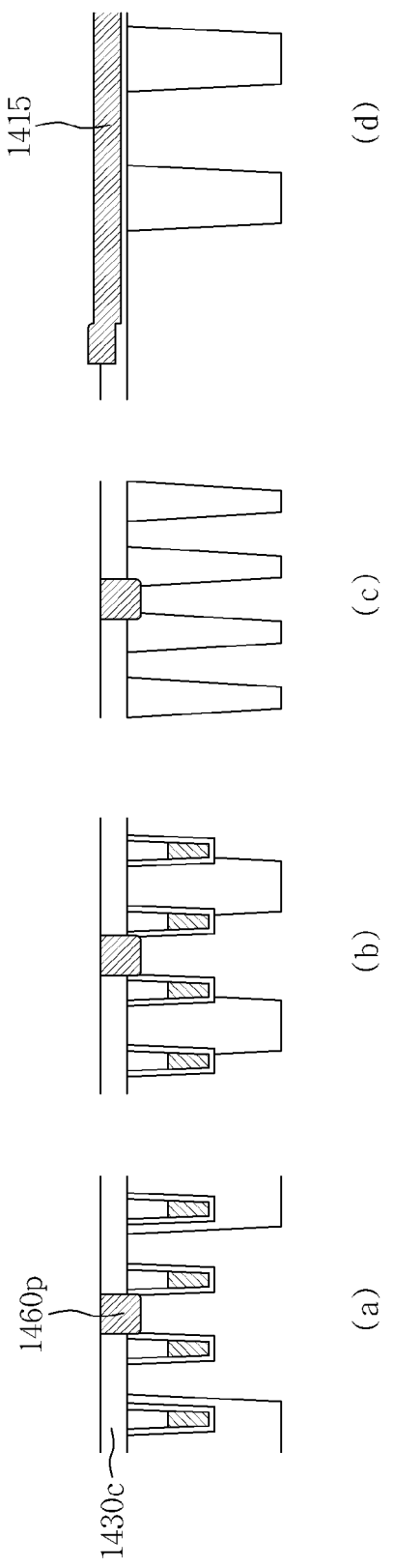

Referring to FIG. 17F, upper portions of the third thinned insulating layer 1430b may be removed to completely expose the top surface of the first silicon layer 1410 in the peripheral area PA. As a result of the process, the third thinned insulating layer 1430b may be formed into a third twice-thinned insulating layer 1430c. The surface levels of the bit line contact plug 1460p and the third thinned insulating layer 1430c may become similar to each other. The process may comprise a cleaning process. Then, by performing the processes shown in FIGS. 4K, 4L, 5G and 6I, interconnection layers may be formed. In this way, any one of the semiconductor devices shown in FIGS. 2A to 3C may be fabricated.

Embodiment 15

Figure 18A:
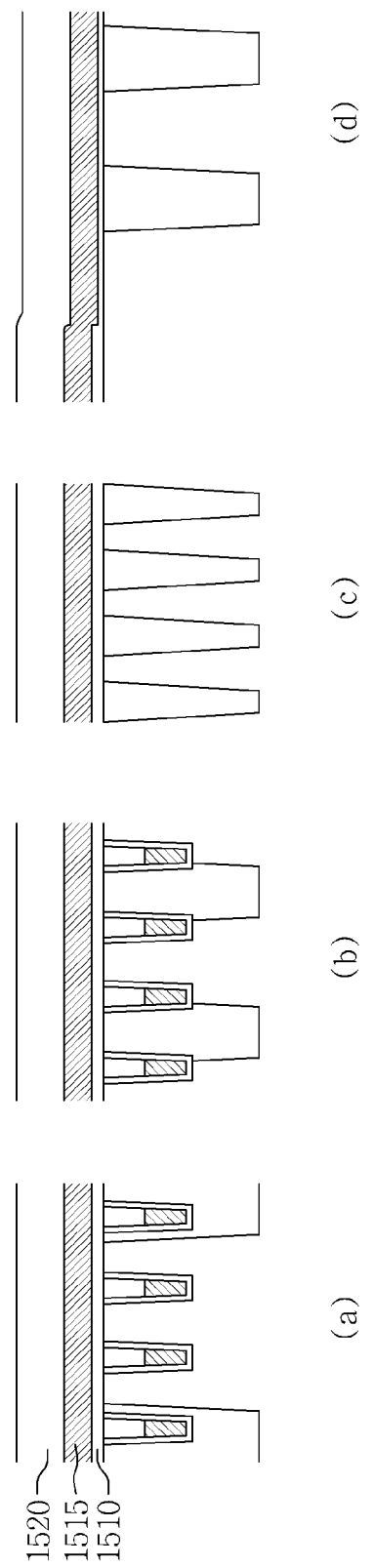
FIGS. 18A to 18J are each a sectional view and together illustrate an embodiment of a method of fabricating a semiconductor device in accordance with the inventive concepts, wherein regions (a), (b), (c) and (d) in each of the figures are regions along lines A-A', B-B', C-C', and D-D' in FIG. 1A, respectively.

Referring to FIG. 18A, a first insulating layer 1510a, a first silicon layer 1515, and a second insulating layer 1520 may be formed by performing processes described above. The first silicon layer 1515 may be formed to a thickness of about 400 Å. The second insulating layer 1520 may be formed of silicon oxide to a thickness of about 700 Å.

Figure 18B:
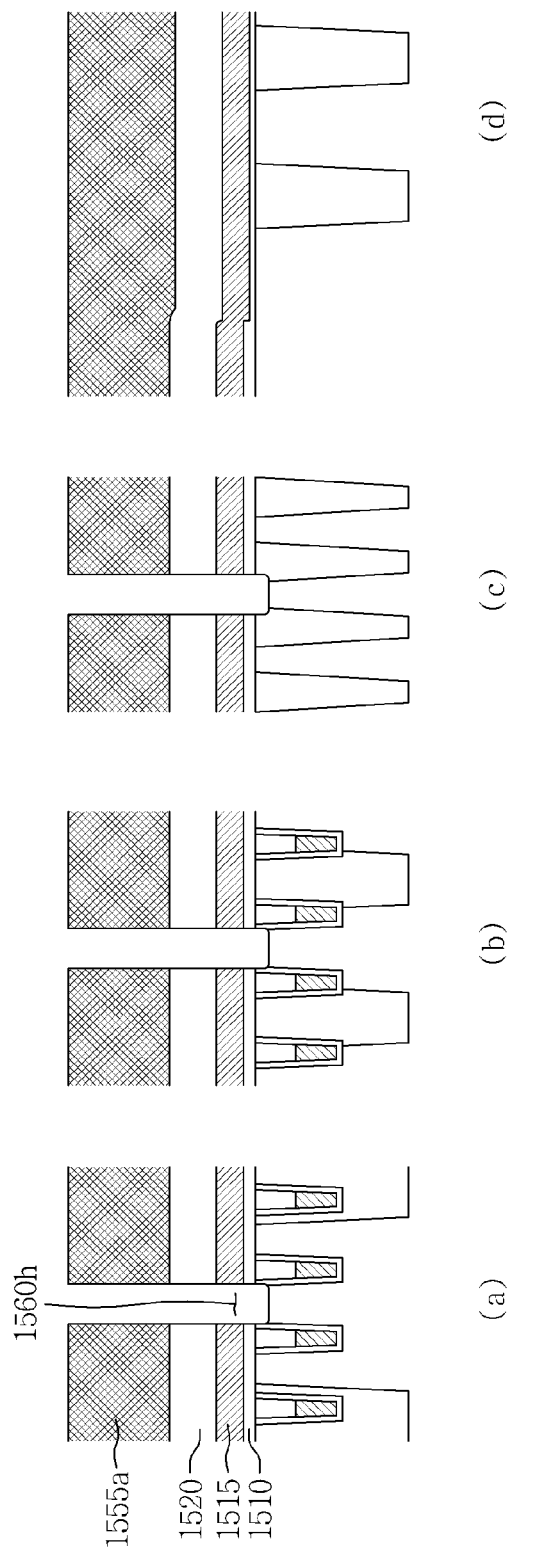

Referring to FIG. 18B, after forming a first photoresist pattern 1555a, a bit line contact hole 1560h may be formed by patterning the second insulating layer 1520, the first silicon layer 1515 and a first insulating layer 1510 using the first photoresist pattern 1555a as a patterning mask. Then, the first photoresist pattern 1555a may be removed. A silicon treatment process may be performed before removing the first photoresist pattern 1555a.

Figure 18C:
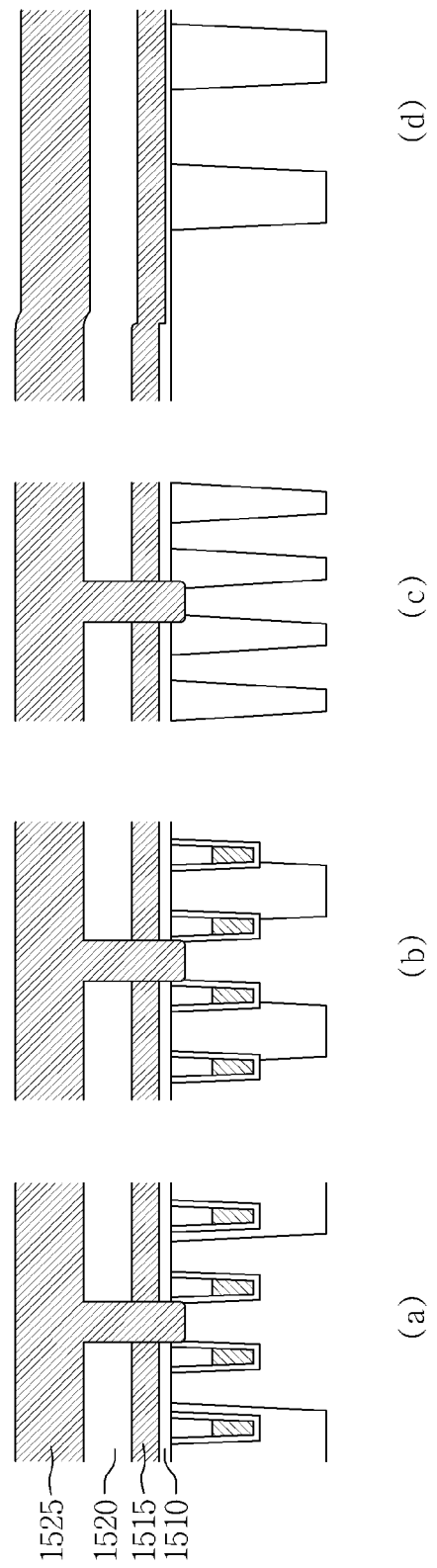

Referring to FIG. 18C, a second silicon layer 1525 may be entirely formed to a thickness of about 1000 Å to fill the bit line contact hole 1560h.

Figure 18D:
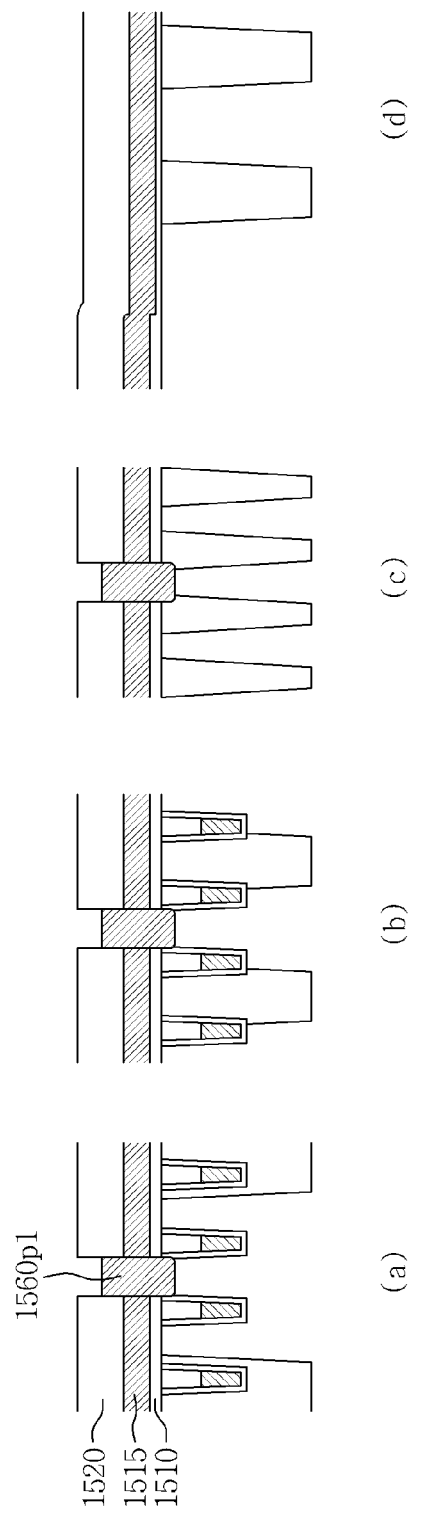

Referring to FIG. 18D, by removing the second silicon layer 1525 using an etch back method, the second insulating layer 1520 may be exposed and a first provisional bit line contact plug 1560p1 may be formed. A top surface of the first provisional bit line contact plug 1560p1 may be situated at a level lower than that of a top surface of the second insulating layer 1520.

Figure 18E:
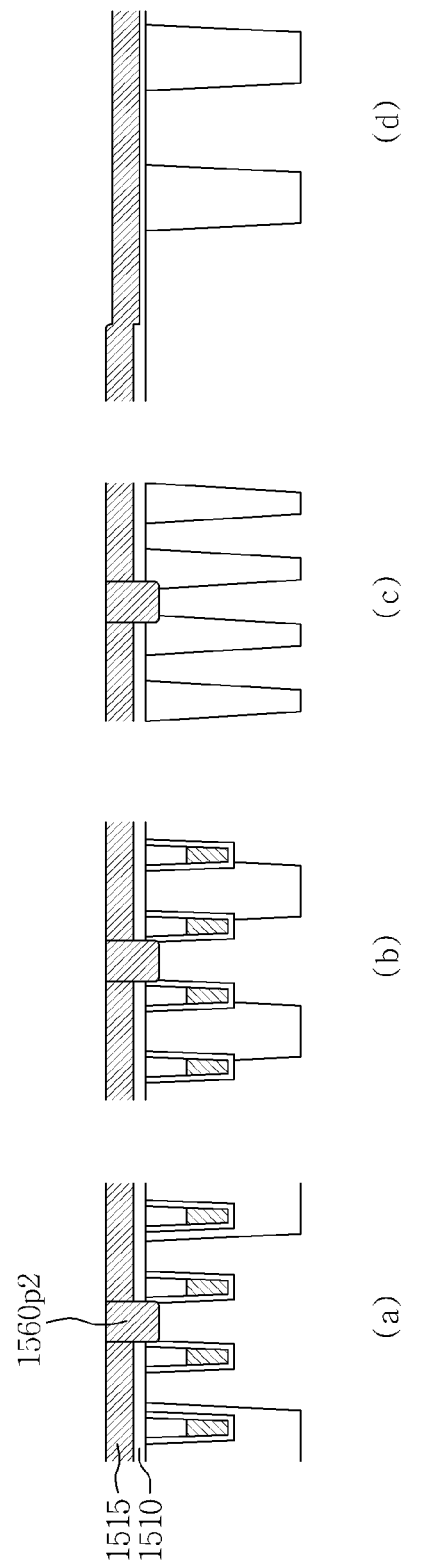

Referring to FIG. 18E, by removing the second insulating layer 1520 and partially removing the top surface of the first provisional bit line contact plug 1560p1 using an etch back process, the first silicon layer 1515 may be exposed and a second provisional bit line contact plug 1560p2 may be formed. As a result, the level of a top surface of the second provisional bit line contact plug 1560p2 may become similar to that of the top surface of the first silicon layer 1515.

Figure 18F:
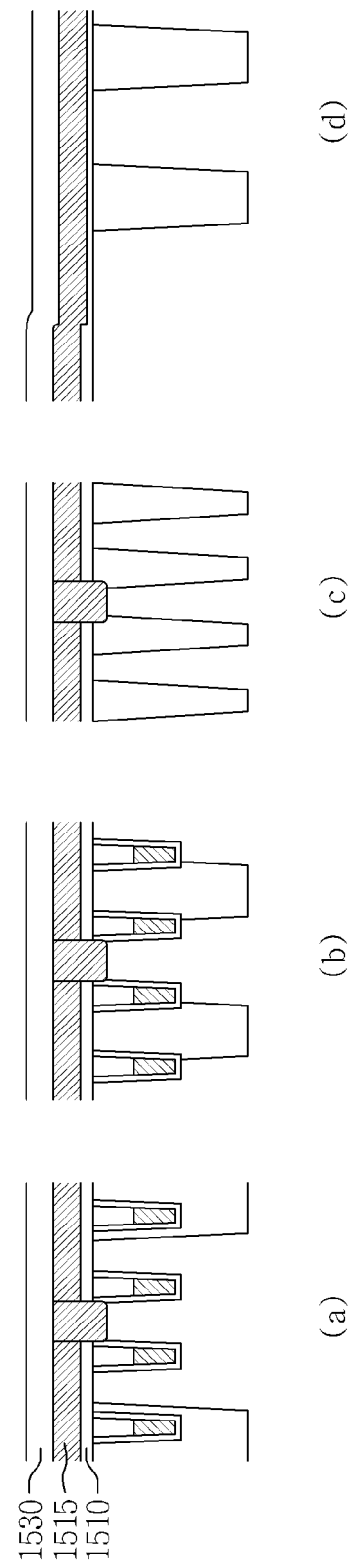

Referring to FIG. 18F, a third insulating layer 1530 may be entirely formed of silicon oxide to a thickness of about 400 Å.

Figure 18G:
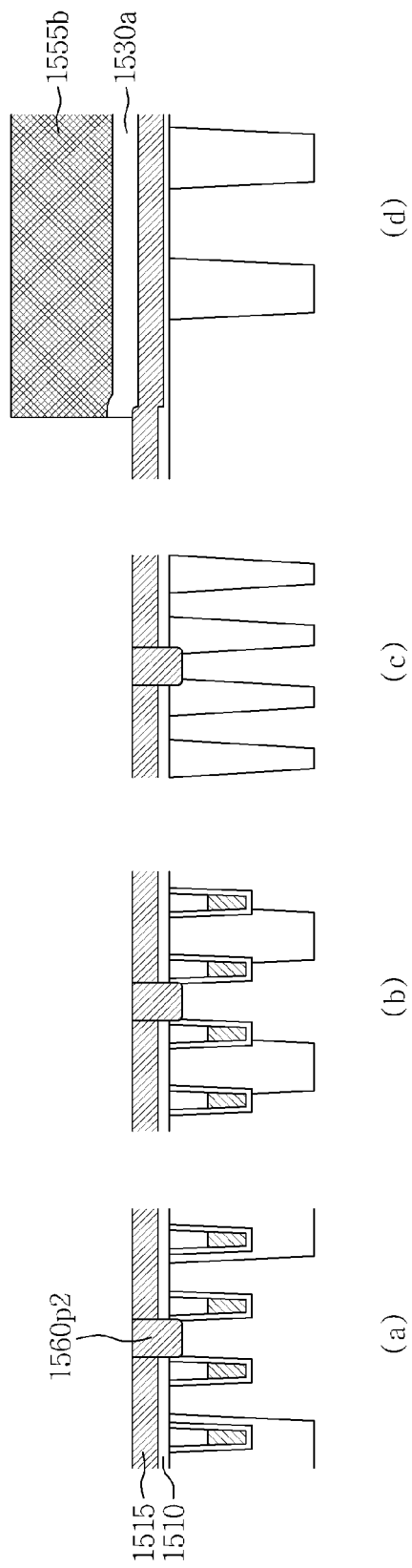

Referring to FIG. 18G, a second photoresist pattern 1555b exposing the third insulating layer 1530 in the cell area CA may be formed. Then the exposed third insulating layer 1530 may be removed. As a result of the process, the first silicon layer 1515 and the second provisional bit line contact plug 1560p2 may be exposed in the cell area CA, and a third peripheral insulating layer 1530a may be formed in the peripheral area PA. Then, the third peripheral insulating layer 1530a may be exposed in the peripheral area PA by removing the second photoresist pattern 1555b.

Figure 18H:
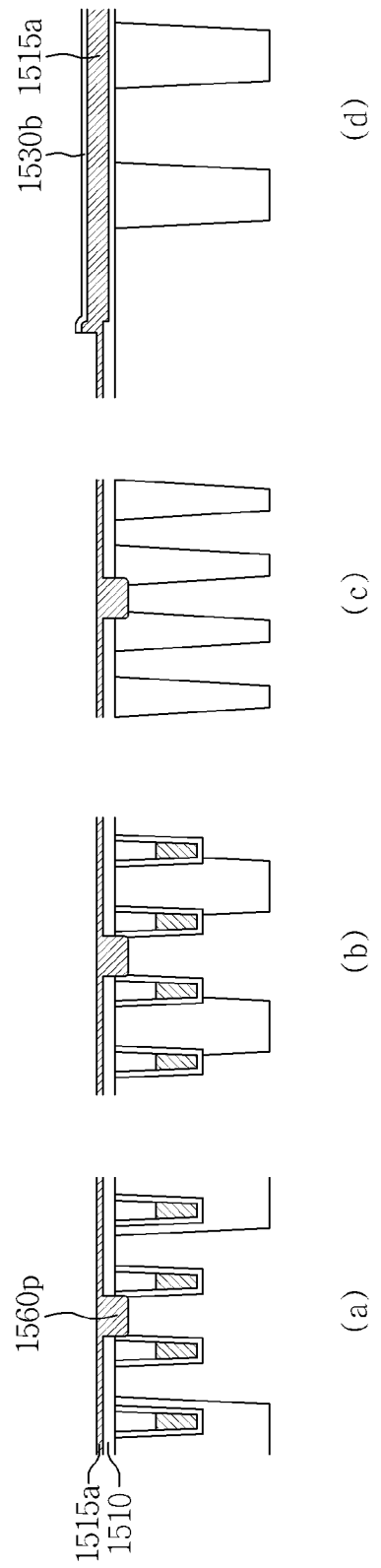
Figure 18I:
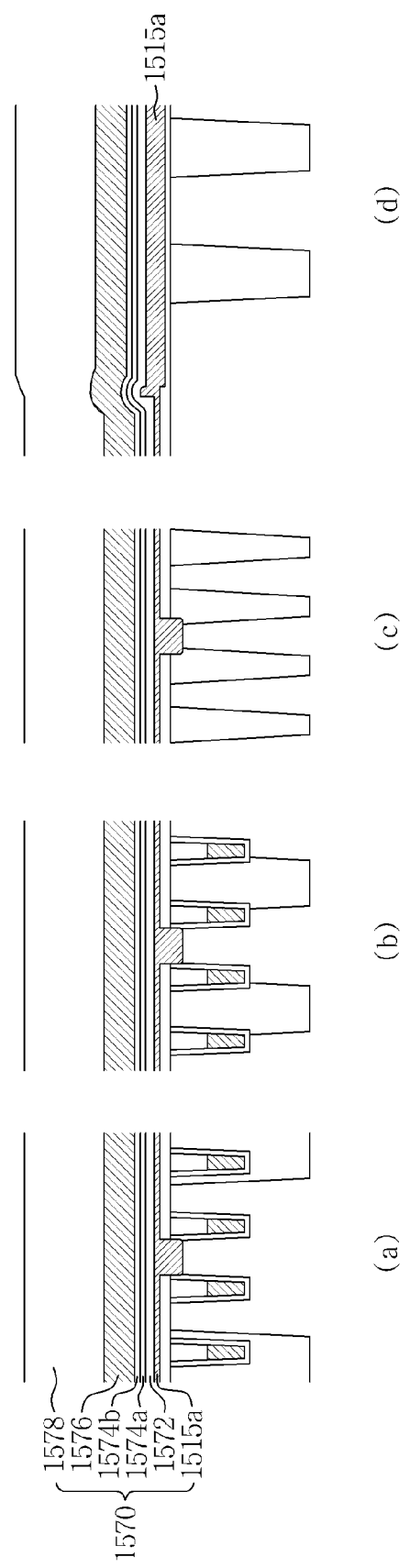
Figure 18J:
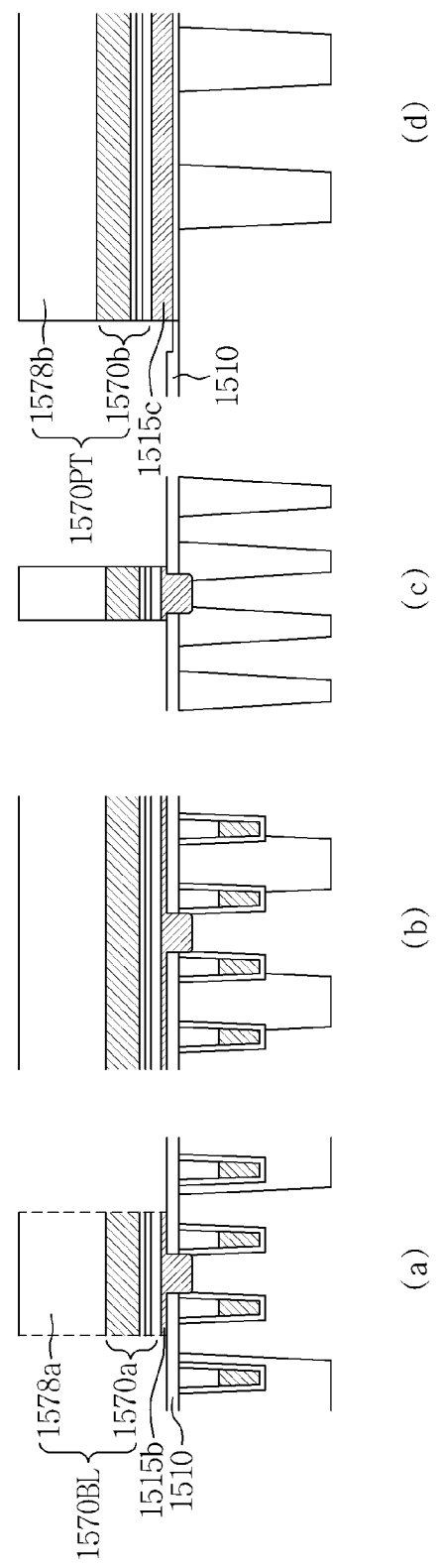

Referring to FIG. 18H, the first silicon layer 1515 and the second provisional bit line contact plug 1560p2 which are exposed by the third peripheral insulating layer 1530a in the cell area CA may be partially removed using the third insulating layer 1530a as a patterning mask. As a result of the process, a bit line contact plug 1560p may be formed. A first thinned silicon layer 1515a may remain in the cell area CA. A third thinned peripheral insulating layer 1530b may remain in the peripheral area PA. Then, a cleaning process may be performed. During the cleaning process, the third thinned peripheral insulating layer 1530b may be removed and the first silicon layer 1515a may be exposed in the peripheral area PA. Then, interconnection layers 1570BL may be formed as shown in FIGS. 18I and 18J, and the processes shown in FIGS. 4K, 4L, 5G and 6I may be performed. In this way, any one of the semiconductor devices shown in FIGS. 2A to 3C may be fabricated.

Embodiment 16

Figure 19A:
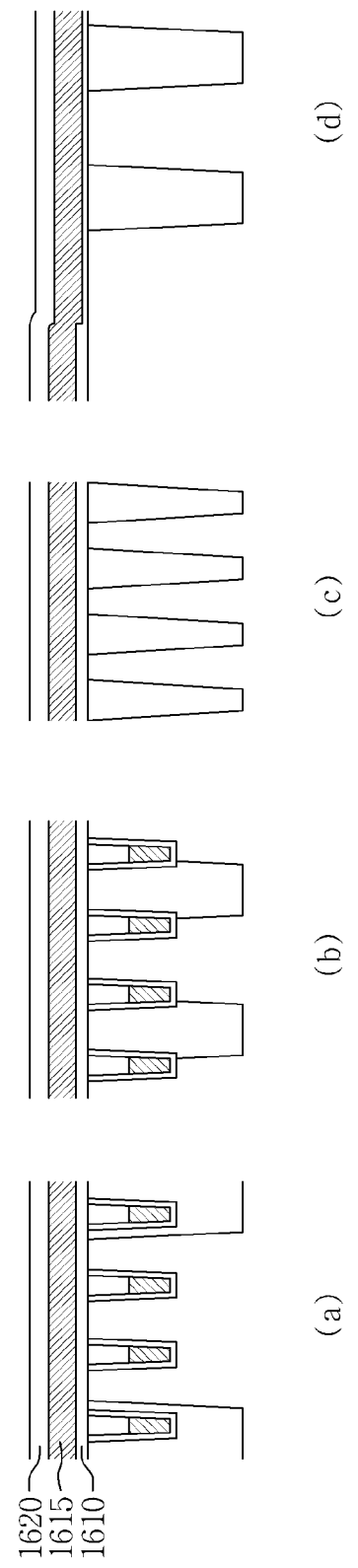
FIGS. 19A to 19H are each a sectional view and together illustrate an embodiment of a method of fabricating a semiconductor device in accordance with the inventive concepts, wherein regions (a), (b), (c) and (d) in each of the figures are regions along lines A-A', B-B', C-C', and D-D' in FIG. 1A, respectively.

Referring to FIG. 19A, a first insulating layer 1610, a first silicon layer 1615 and a second insulating layer 1620 may be formed by performing processes described above. The first silicon layer 1615 may be formed to a thickness of about 400 Å. The second insulating layer 1620 may be formed of silicon oxide to a thickness of about 200 Å by performing an ALD process.

Figure 19B:
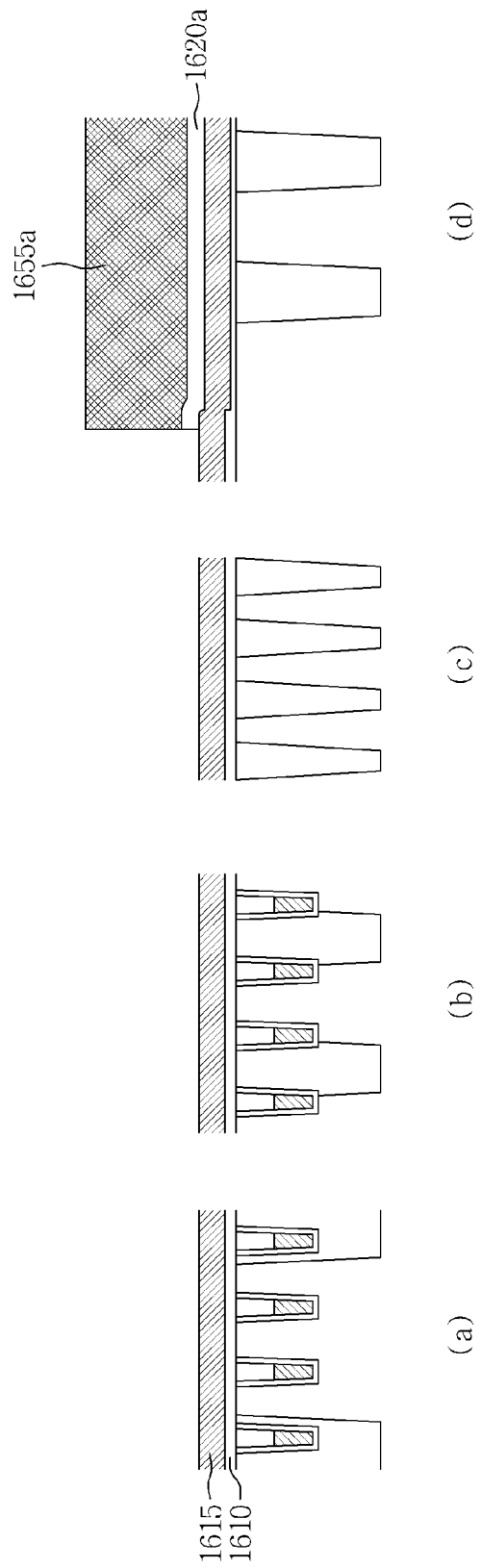

Referring to FIG. 19B, a first photoresist pattern 1655a exposing the second insulating layer 1620 in the cell area CA may be formed. Then, portions of the second insulating layer 1620 exposed by the first photoresist pattern 1655a are removed using the first photoresist pattern 1655a as an etching mask so that the only remaining portion of the second insulating layer 1620 is a second peripheral insulating layer 1620a in the peripheral area PA. Also, as a result of the process, the first silicon layer 1615 may be exposed in the cell area CA. Then, the second peripheral insulating layer 1620a may be exposed by removing the first photoresist pattern 1655a.

Figure 19C:
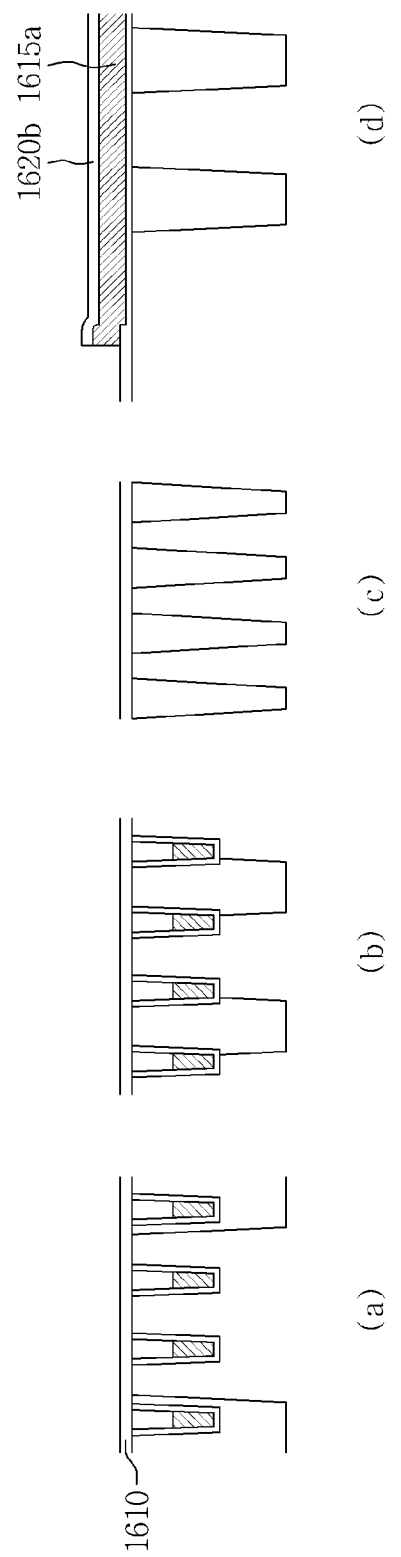

Referring to FIG. 19C, a first peripheral silicon layer 1615a may be formed by removing the first silicon layer 1615 exposed in the cell area CA using the second peripheral insulating layer 1620a as a patterning mask. In the process, the second peripheral insulating layer 1620a may be used as a patterning mask and formed into a first thinned insulating layer 1620b. The first insulating layer 1610 may be exposed in the cell area CA.

Figure 19D:
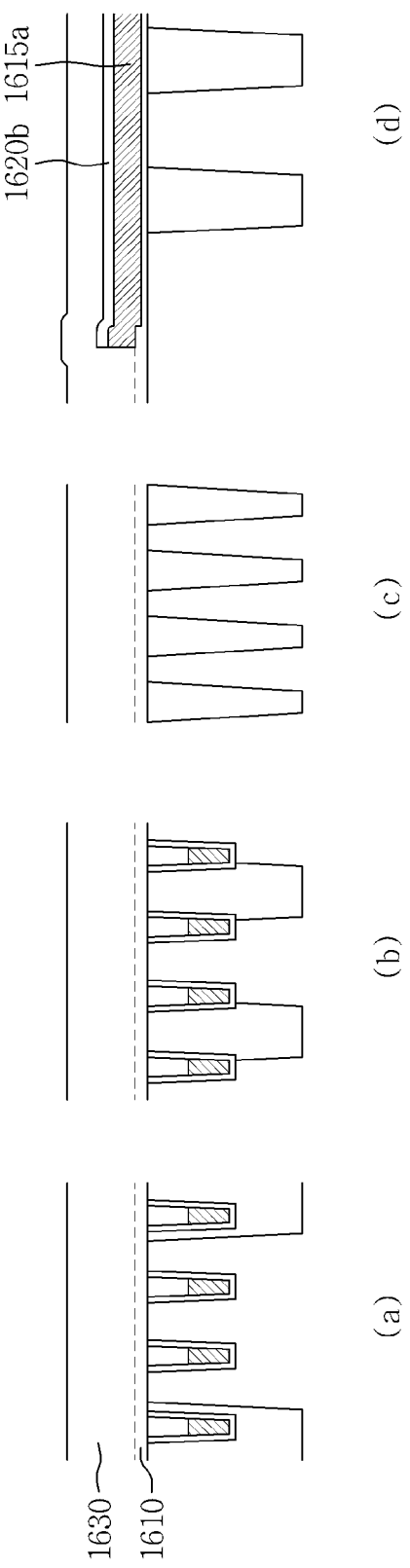

Referring to FIG. 19D, a third insulating layer 1630 may be formed of silicon oxide to a thickness of about 1000 Å. For example, the third insulating layer 1630 may comprise silicon oxide having a good flowability or planarizing characteristics. An interface between the first insulating layer 1610 and the third insulating layer 1630 may be illustrated using broken lines to indicate that it no longer exists. The broken lines will be omitted in the drawings that follow FIG. 19D.

Figure 19E:
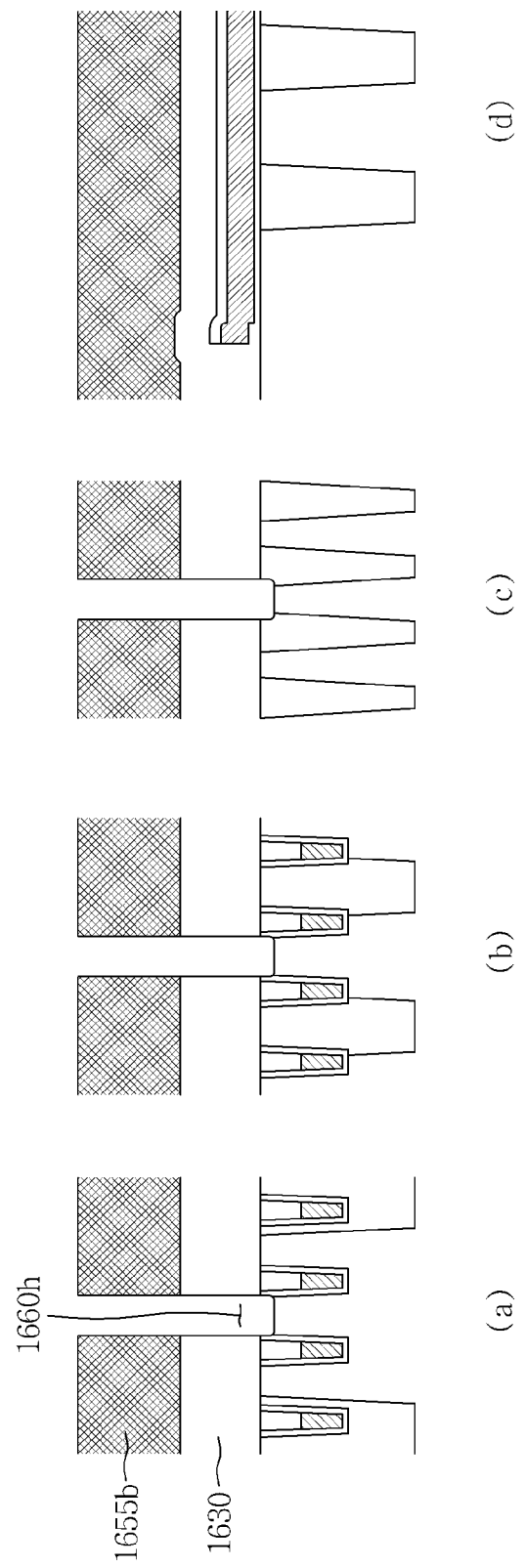

Referring to FIG. 19E, after forming a second photoresist pattern 1655b, a bit line contact hole 1660h may be formed by patterning the third insulating layer 1630 using the second photoresist pattern 1655b as a patterning mask. Then, the second photoresist pattern 1655b may be removed. A silicon treatment process may be performed before or after removing the second photoresist pattern 1655b. An ozone treatment process and/or a cleaning process may be performed after removing the second photoresist pattern 1655b.

Figure 19F:
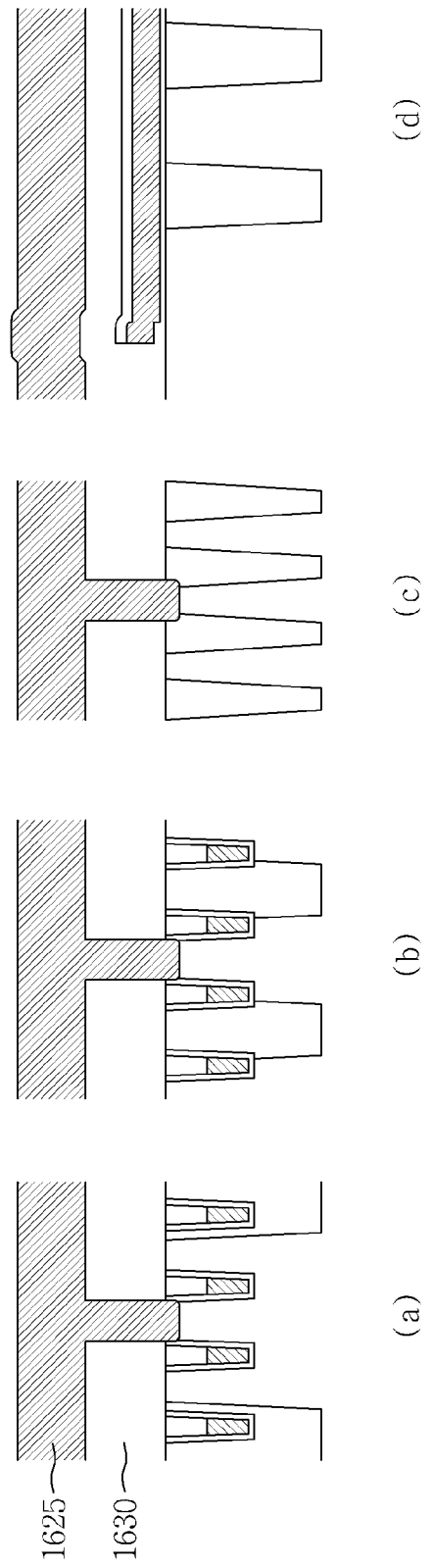

Referring to FIG. 19F, a second silicon layer 1625 may be formed to a thickness of about 1000 Å to completely fill the bit line contact hole 1660h.

Figure 19G:
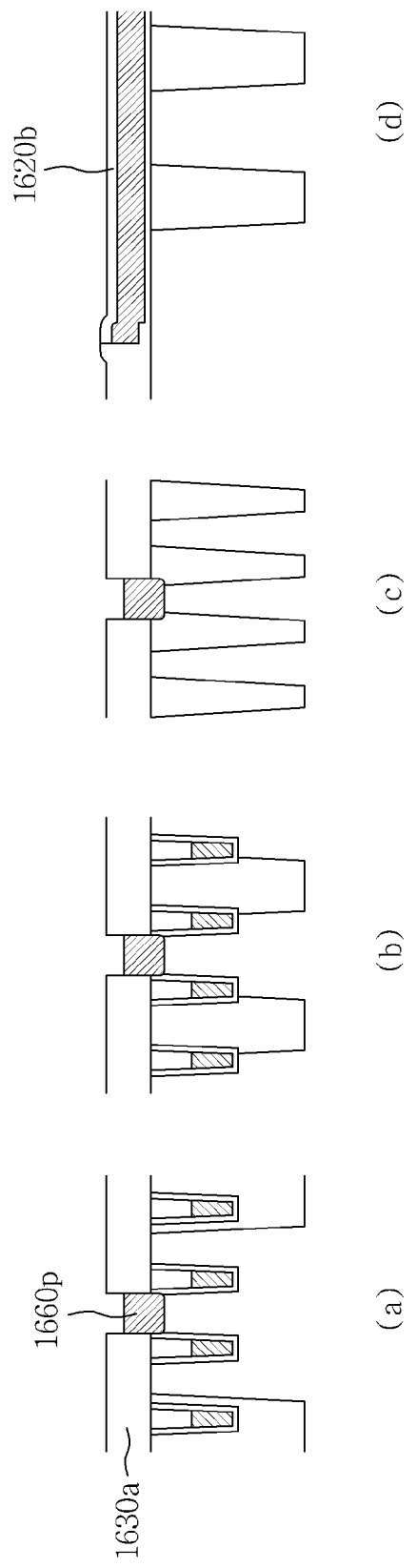

Referring to FIG. 19G, a bit line contact plug 1660p may be formed by removing the second silicon layer 1625 on the third insulating layer 1630. In the process, a third thinned insulating layer 1630a may be formed by partially removing upper portions of the third insulating layer 1630. The second thinned insulating layer 1620b may be exposed in the peripheral area PA. A top surface of the bit line contact plug 1660p may be situated at a level lower than that of a top surface of the third thinned insulating layer 1630a.

Figure 19H:
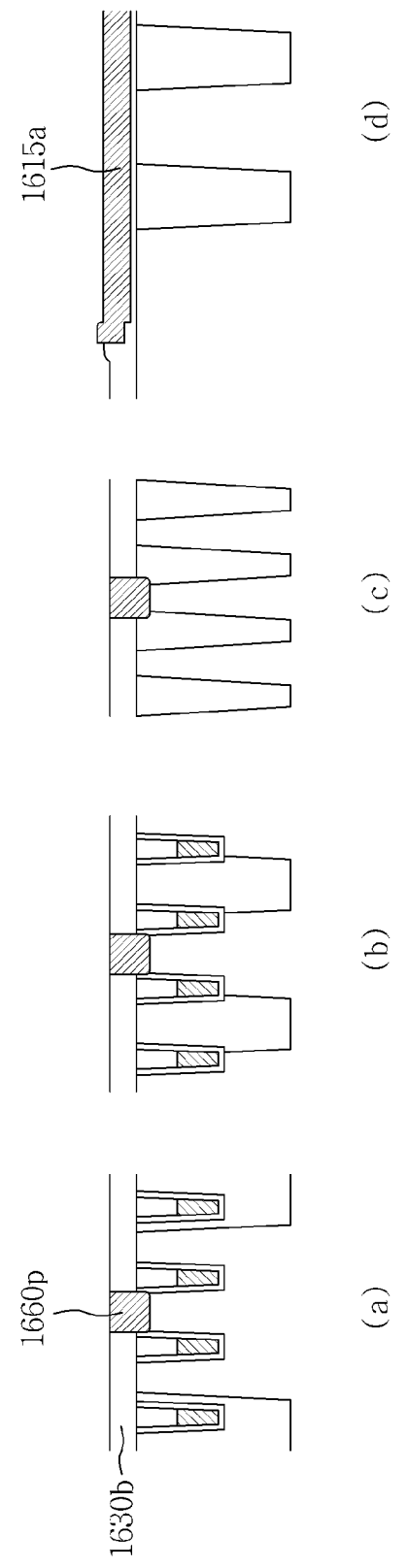

Referring to FIG. 19H, the third thinned insulating layer 1630a and the second thinned insulating layer 1620b may be partially or completely removed. As a result of the process, the third twice-thinned insulating layer 1630b may be formed in the cell area CA and the first peripheral silicon layer 1615a may be exposed in the peripheral area PA. The process may also comprise a cleaning process. Then, by performing the processes shown in FIGS. 4K, 4L, 5G and 6I, interconnection layers may be formed. In this way, any one of the semiconductor devices shown in FIGS. 2A to 3C may be fabricated.

Embodiment 17

Figure 20A:
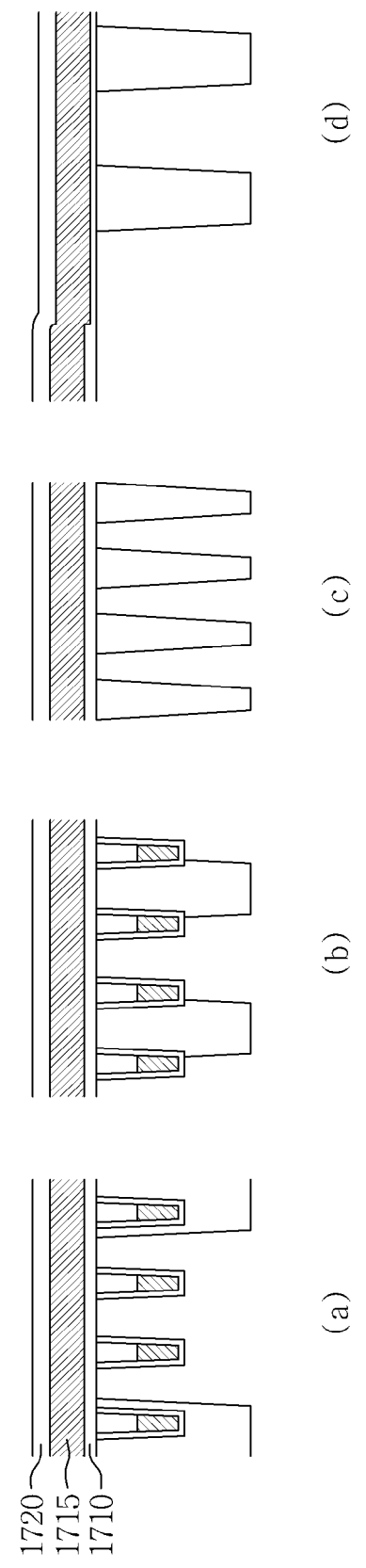
FIGS. 20A 20K are each a sectional view and together illustrate an embodiment of a method of fabricating a semiconductor device in accordance with the inventive concepts, wherein regions (a), (b), (c) and (d) in each of the figures are regions along lines A-A', B-B', C-C', and D-D' in FIG. 1A, respectively.

Referring to FIG. 20A, a first insulating layer 1710, a first silicon layer 1715, and a second insulating layer 1720 may be formed by performing processes described above. The first silicon layer 1715 may be formed to a thickness of about 500 Å. The second insulating layer 1720 may be formed of an LD oxide (e.g., LD-TEOS) to a thickness of about 150 Å by using a low deposition rate (LDR) process. The LD oxide may have a better etching resistance than conventional deposition methods because the LD oxide may be relatively denser than the conventional oxide or oxide made by high deposition rate processes.

Figure 20B:
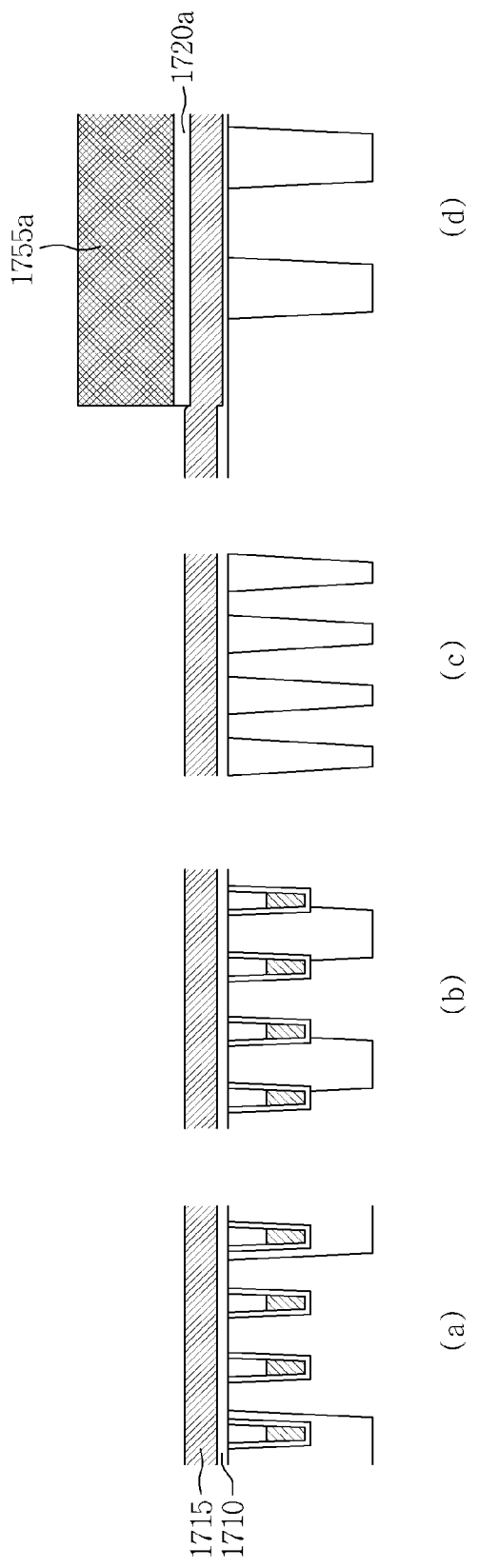

Referring to FIG. 20B, after forming a first photoresist pattern 1755a exposing the second insulating layer 1720 in the cell area CA, the exposed portion of the second insulating layer 1720 may be removed using the first photoresist pattern 1755a as a patterning mask. As a result of the process, the second insulating layer 1720 may be formed into a second peripheral insulating layer 1720a in the peripheral area PA, and the first silicon layer 1715 may be exposed in the cell area CA. Then, the first photoresist pattern 1755a may be removed.

Figure 20C:
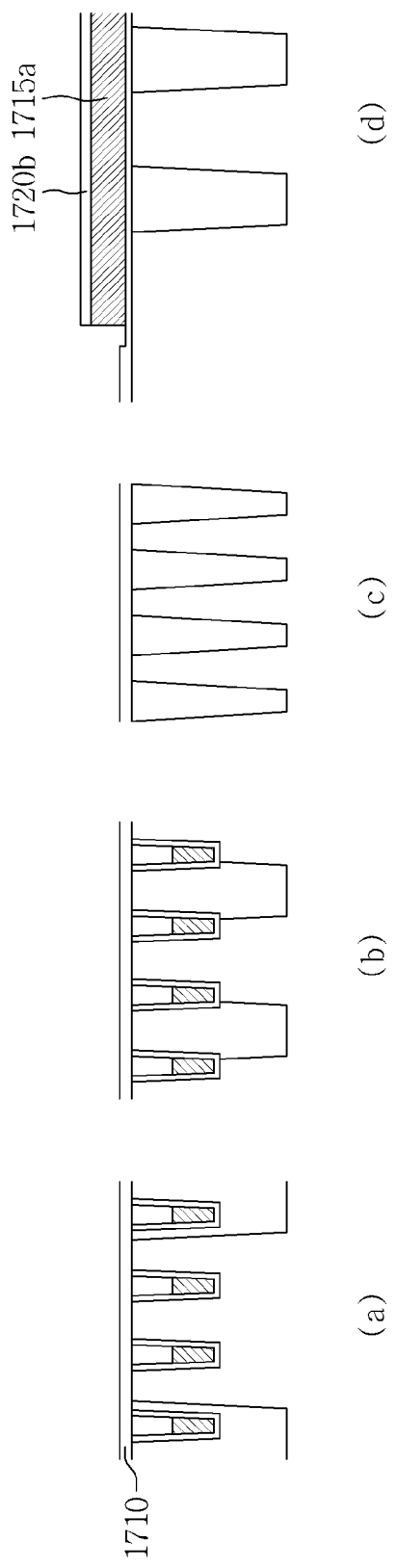

Referring to FIG. 20C, the first silicon layer 1715 exposed in the cell area CA may be removed using the second peripheral insulating layer 1720a as a patterning mask. As results of the process, the first silicon layer 1715 may be formed into the first peripheral silicon layer 1715a in the peripheral area PA and the first insulating layer 1710 may be exposed in the cell area CA. The second peripheral insulating layer 1720a may be formed into a second thinned peripheral insulating layer 1720b in the peripheral area PA. Also, the second thinned peripheral insulating layer 1720b may be formed to a thickness of about 100 Å.

Figure 20D:
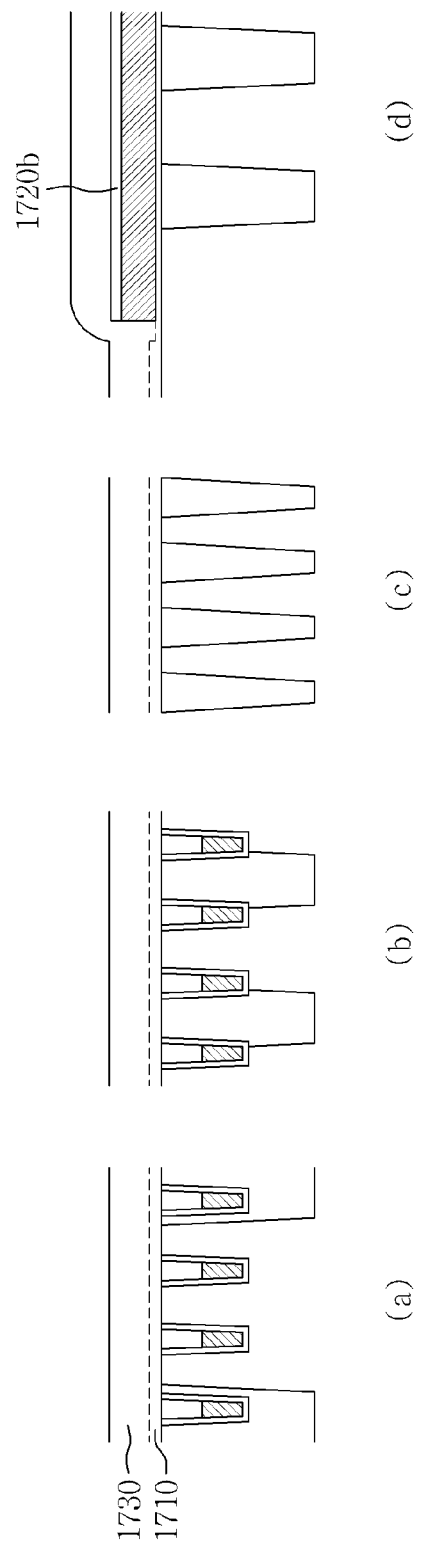

Referring to FIG. 20D, a third insulating layer 1730 may be formed of silicon oxide, e.g., LP-TEOS, to a thickness of about 600 Å. The LP-TEOS may be formed by a high deposition rate (HDR) process. Accordingly, the LP-TEOS may be softer and have a lower etch resistance than LD-TEOS. Obtaining etch selectivity is one of the reasons for using the LP-TEOS or LD-TEOS. Furthermore, LD-TEOS may be substituted for silicon oxide formed by ALD. An interface between the first insulating layer 1710 and the third insulating layer 1730 may be shown in broken lines to indicate that it no longer exists. The broken lines will be omitted in drawings that follow FIG. 20D.

Figure 20E:
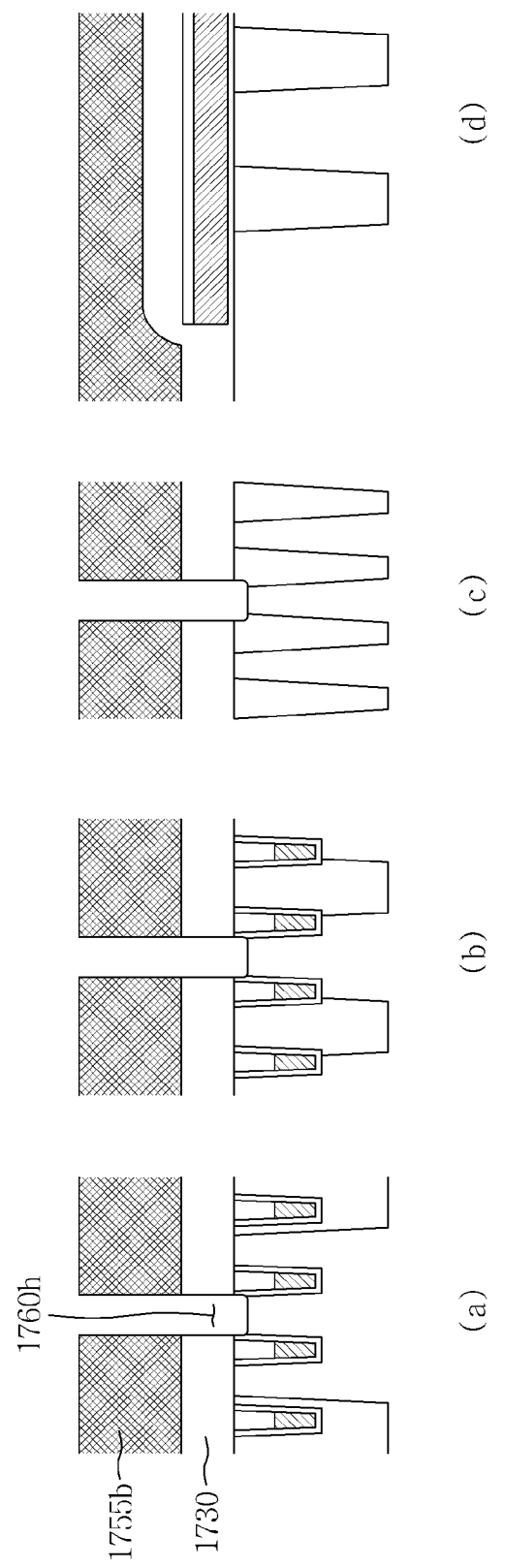

Referring to FIG. 20E, after forming a second photoresist pattern 1755b, a bit line contact hole 1760h may be formed by removing the third insulating layer 1730 using the second photoresist pattern 1755b as a patterning mask. Then, the second photoresist pattern 1755b may be removed. A silicon treatment process may be performed before or after removing the second photoresist pattern 1755b.

Figure 20F:
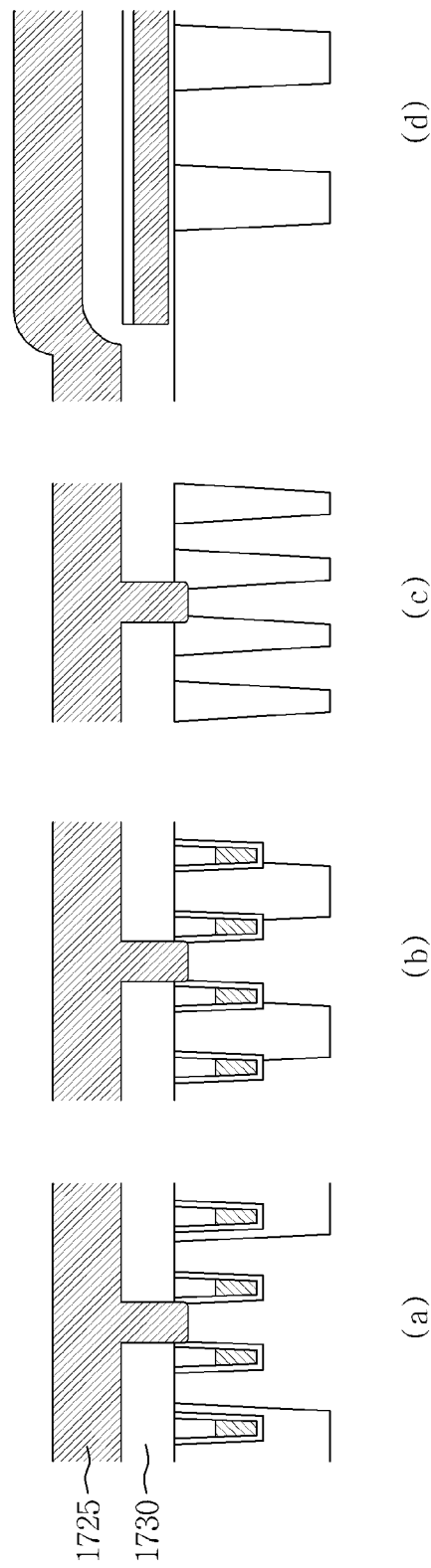

Referring to FIG. 20F, a second silicon layer 1725 may be formed to a thickness of about 1000 Å to fill the bit line contact hole 1760h.

Figure 20G:
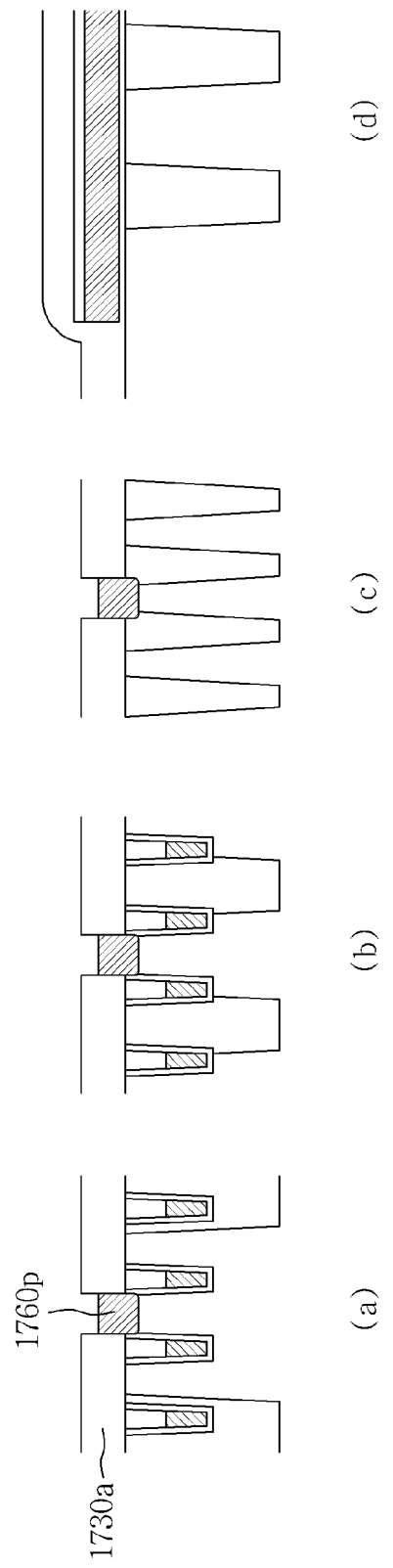

Referring to FIG. 20G, a bit line contact plug 1760p may be formed by removing the second silicon layer 1725 using an etch back process. In the process, the third insulating layer 1730 may be formed into a third thinned insulating layer 1730a by partially removing upper portions of the third insulating layer 1730. A top surface of the bit line contact plug 1760p may be situated at a level lower than that of the surface of the third thinned insulating layer 1730a.

Figure 20H:
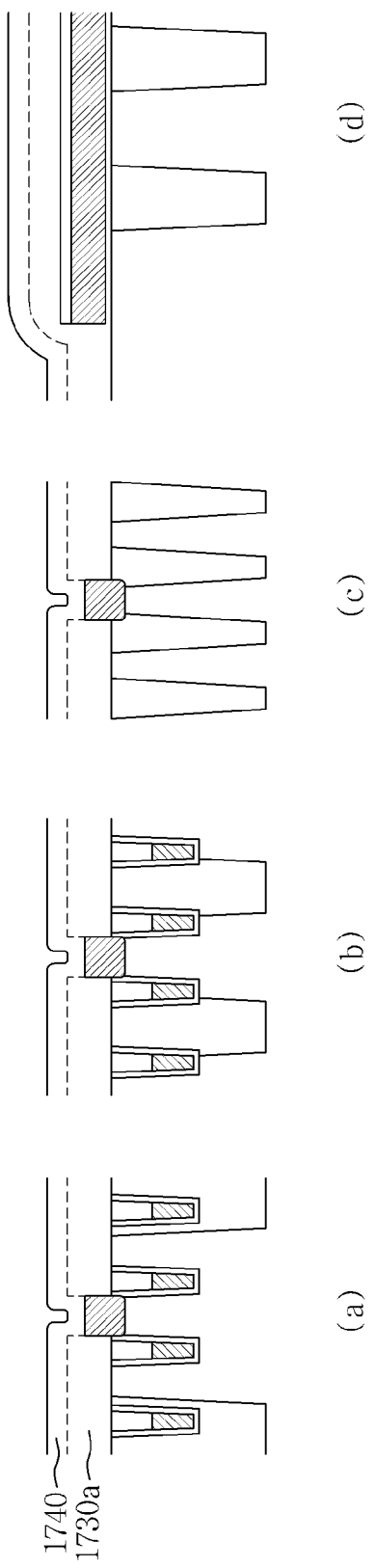

Referring to FIG. 20H, a fourth insulating layer 1740 may be entirely formed on the third thinned insulating layer 1730a. The fourth insulating layer 1740 may be formed of silicon oxide, e.g., LP-TEOS, to a thickness of about 250 Å. The bit line contact plug 1760p may be covered by the fourth insulating layer 1740. An interface between the third thinned insulating layer 1730a and the fourth insulating layer 1740 may be shown in broken lines to indicate that it no longer exists. The broken lines are omitted in drawings that follow FIG. 20H.

Figure 20I:
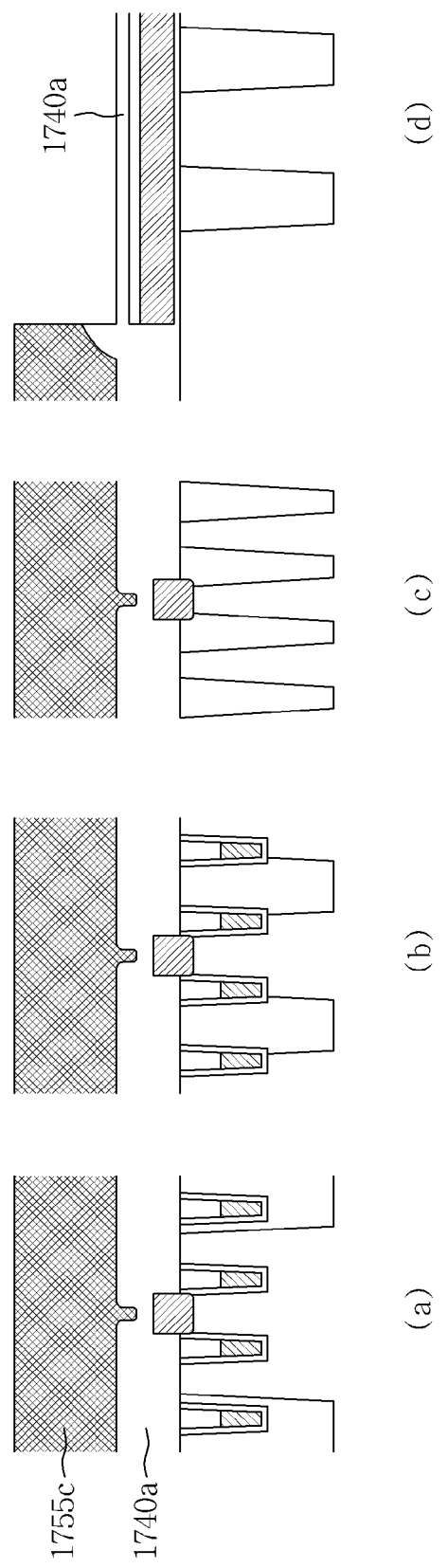

Referring to FIG. 20I, after forming a third photoresist pattern 1755c exposing the fourth insulating layer 1740 in the peripheral area PA, a fourth partially thinned insulating layer 1740a may be formed by partially removing exposed portions of the fourth insulating layer 1740. The fourth partially thinned insulating layer 1740a may remain at a thickness of about 150 Å in the peripheral area PA and about 700 Å in the cell area CA. Then, the third photoresist pattern 1755c may be removed.

Figure 20J:
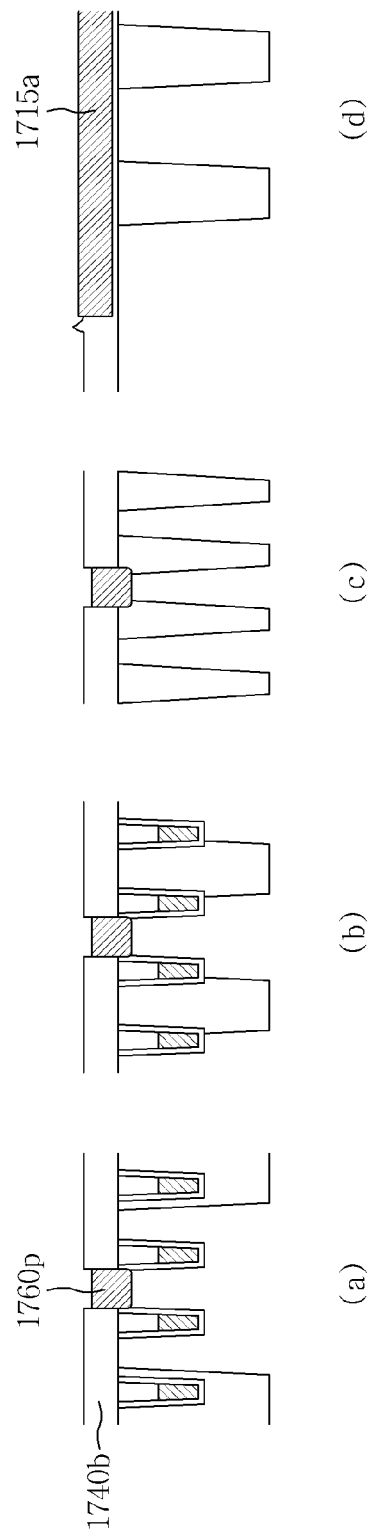

Referring to FIG. 20J, a fourth twice-thinned insulating layer 1740b may be formed by further removing the fourth partially thinned insulating layer 1740a using an etch back method. The fourth twice-thinned insulating layer 1740b may not remain in the peripheral area PA. The etch back process may comprise a wet etching process. In the process, the fourth twice-thinned insulating layer 1740b may be formed by removing the fourth partially thinned insulating layer 1740a in the cell area CA to a thickness of about 300 Å, for example. Also, as a result of the process, the bit line contact plug 1760p and the first silicon layer 1715 may be exposed.

Figure 20K:
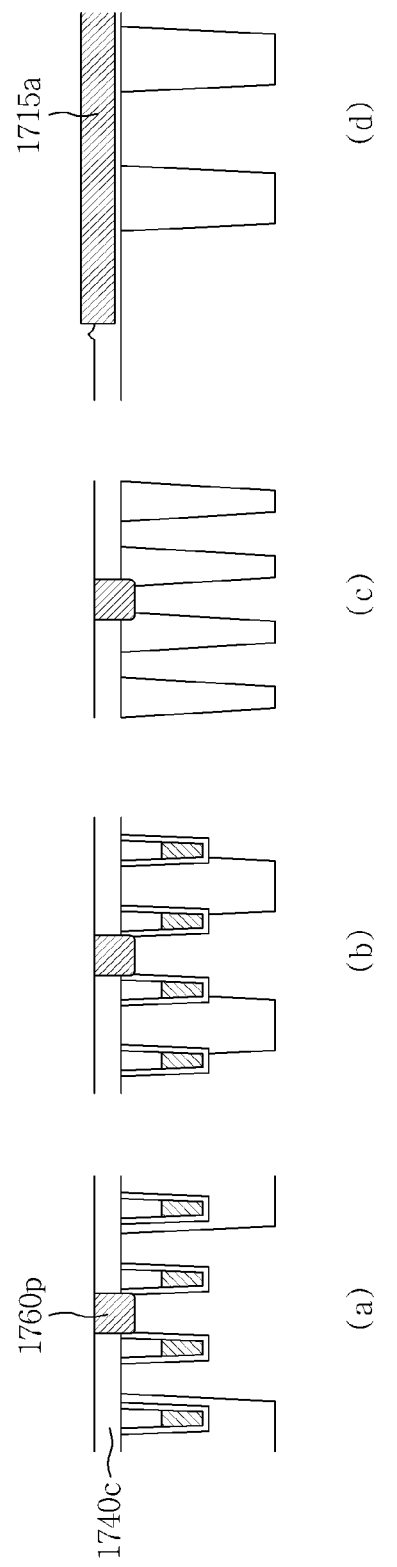

Referring to FIG. 20K, a fourth thrice-thinned insulating layer 1740c may be formed by annealing and cleaning the fourth twice-thinned insulating layer 1740b. In the process, the fourth thrice-thinned insulating layer 1740c may be formed by thinning the fourth twice-thinned insulating layer 1740b to a thickness of about 200 Å. For example, the annealing process may be performed at a temperature of about 900 to 1000° C. for 1 minute or less. Specifically, the annealing process may be performed at a temperature of about 935° C. for 30 seconds. Then, by performing the processes shown in FIGS. 4K, 4L, 5G and 6I, interconnection layers may be formed. In this way, any one of the semiconductor devices shown in FIGS. 2A to 3C may be fabricated.

Embodiment 18

Figure 21A:
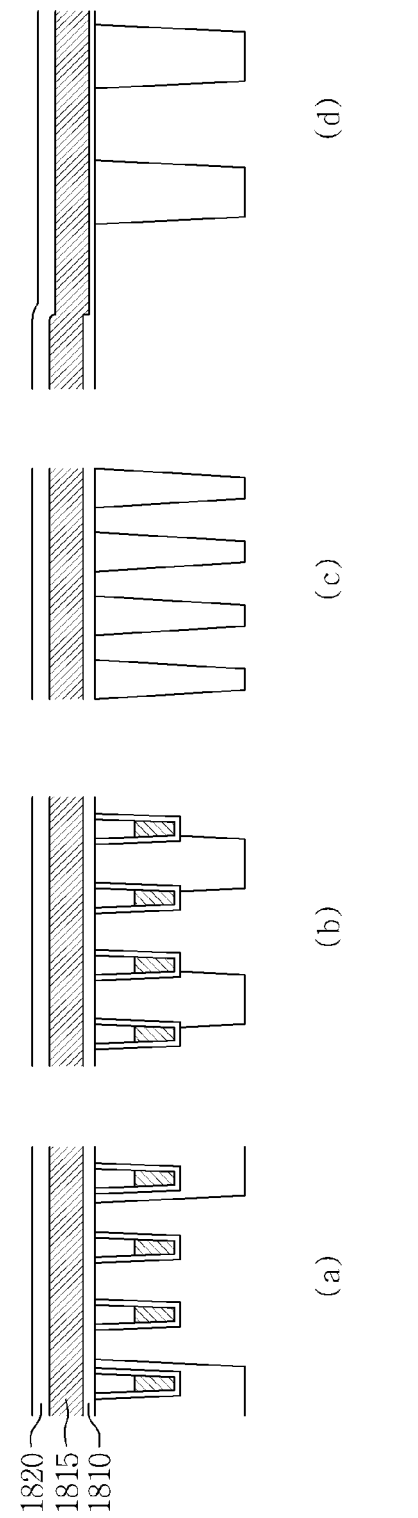
FIGS. 21A 21K are each a sectional view and together illustrate an embodiment of a method of fabricating a semiconductor device in accordance with the inventive concepts, wherein regions (a), (b), (c) and (d) in each of the figures are regions along lines A-A', B-B', C-C', and D-D' in FIG. 1A, respectively.

Referring to FIG. 21A, a first insulating layer 1810, a first silicon layer 1815, and a second insulating layer 1820 may be formed by performing processes described above. The first silicon layer 1815 may be formed to a thickness of about 500 Å. The second insulating layer 1820 may be formed of silicon oxide to a thickness of about 150 Å using an LD-TEOS deposition process. As described above, LD-TEOS is relatively dense. Thus, the LD-TEOS has a high etch selectivity.

Figure 21B:
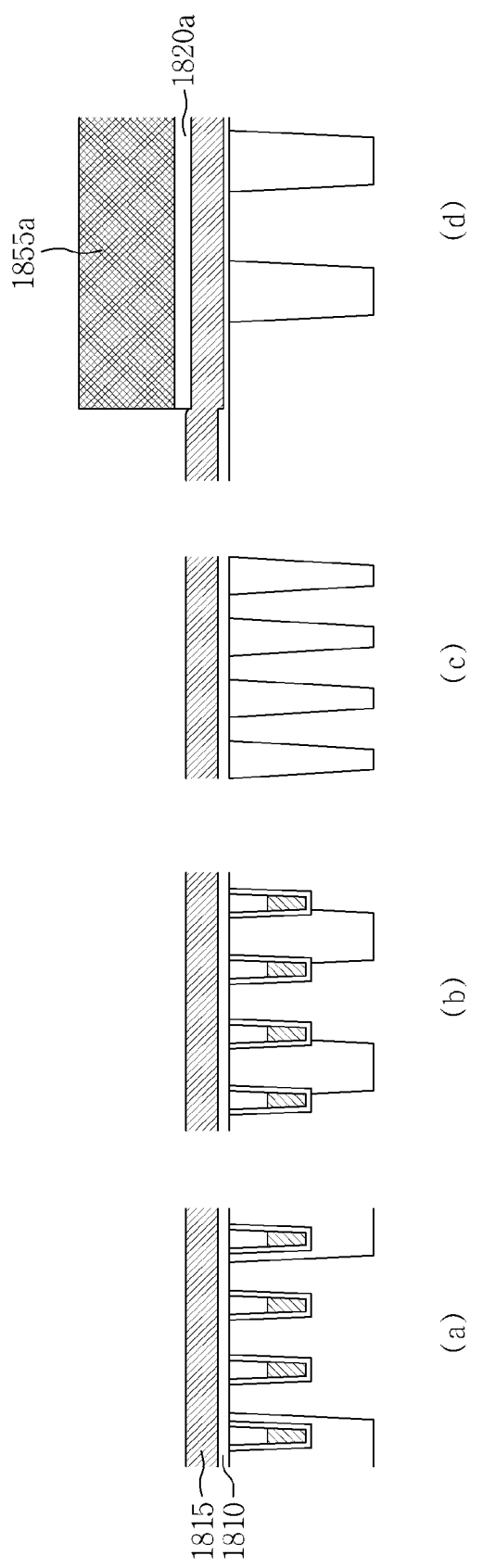

Referring to FIG. 21B, after forming a first photoresist pattern 1855a exposing the second insulating layer 1820 in the cell area CA, exposed portions of the second insulating layer 1820 may be removed using the first photoresist pattern 1855a as an etching mask. As a result of the process, the second insulating layer 1820 may be formed into a second peripheral insulating layer 1820a in the peripheral area PA, and the first silicon layer 1815 may be exposed in the cell area CA. Then, the first photoresist pattern 1855a may be removed to expose the second peripheral insulating layer 1820a.

Figure 21C:
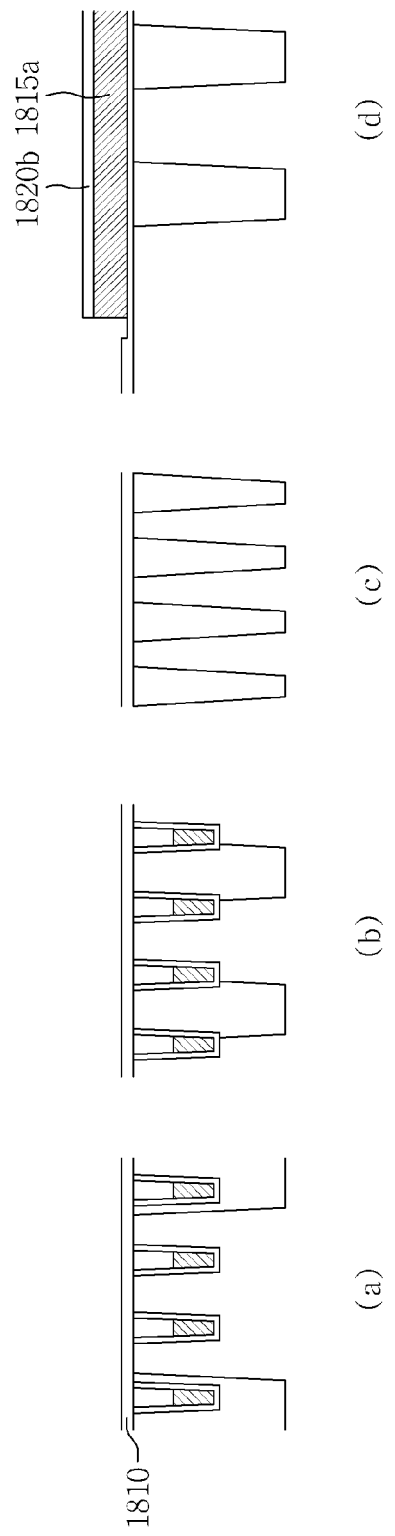

Referring to FIG. 21C, the exposed portion of the first silicon layer 1815 may be removed using the second peripheral insulating layer 1820a as a pattering mask. As a result of the process, the first silicon layer 1815 may be formed into a first peripheral silicon layer 1815a, the first insulating layer 1810 is exposed in the cell area, and the second peripheral layer 1820a may be formed into a second thinned peripheral insulating layer 1820b. The second thinned peripheral insulating layer 1820b may be formed to a thickness of about 100 Å.

Figure 21D:
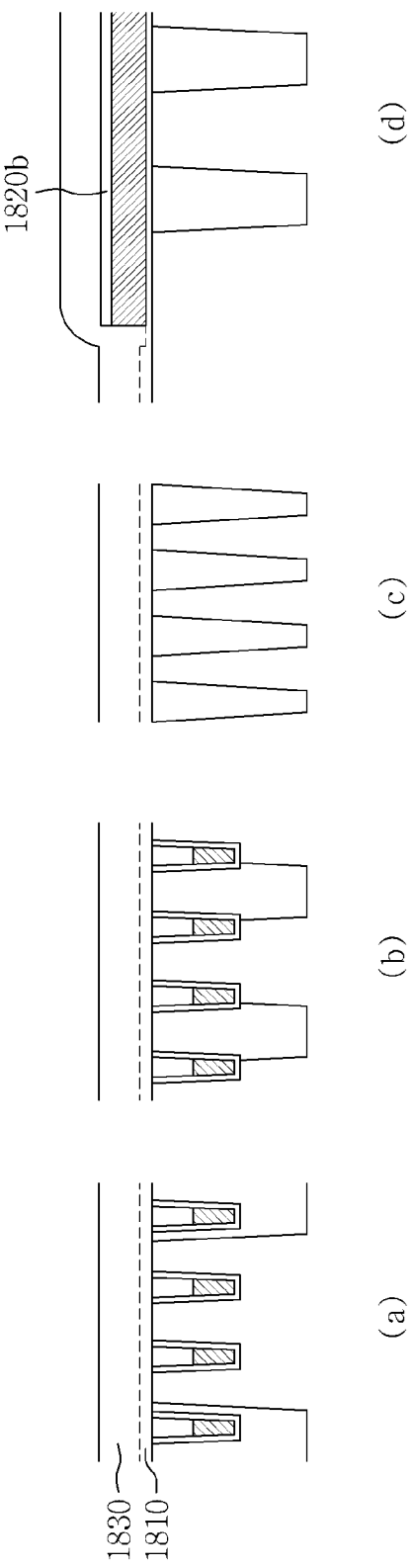

Referring to FIG. 21D, a third insulating layer 1830 may be entirely formed of silicon oxide, e.g., LD-TEOS, to a thickness of about 600 Å. An interface between the first insulating layer 1810 and the third insulating layer 1830 is illustrated using broken lines to indicate that it no longer exists. The broken line will be omitted in the drawings that follow FIG. 21D.

Figure 21E:
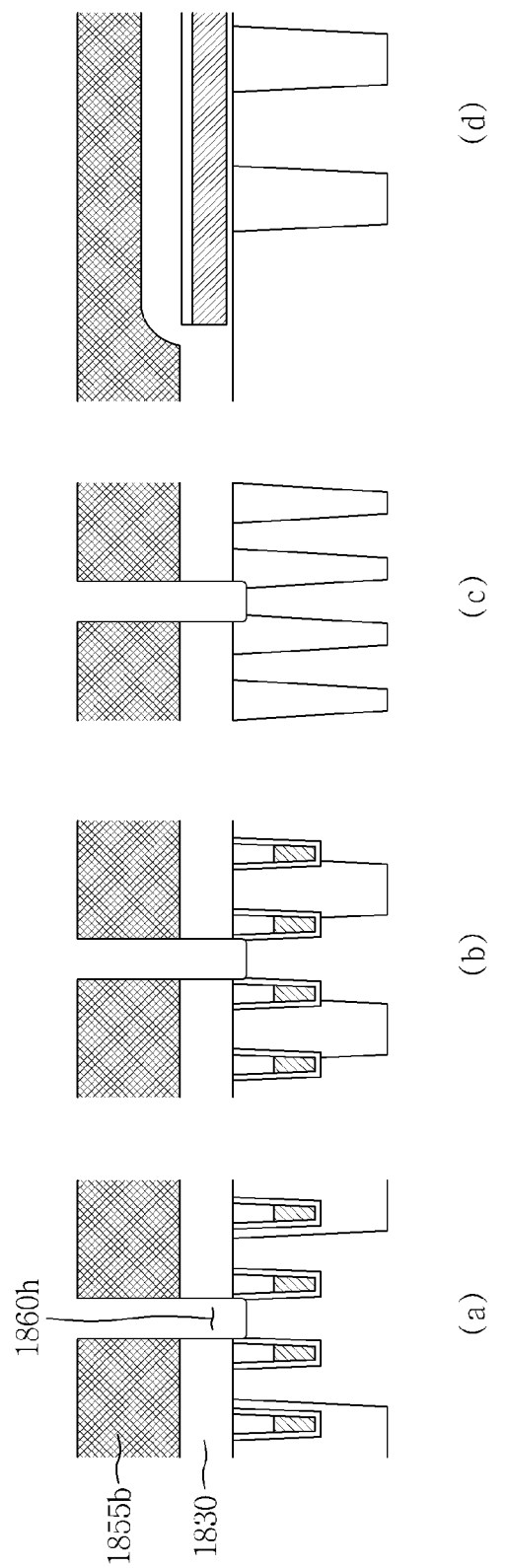

Referring to FIG. 21E, after forming a second photoresist pattern 1855b, a bit line contact hole 1860h may be formed by patterning the third insulating layer 1830 using the second photoresist pattern 1855b as a patterning mask. Then, the second photoresist pattern 1855b may be removed. A silicon treatment process may be performed before the second photoresist pattern 1855b is removed.

Figure 21F:
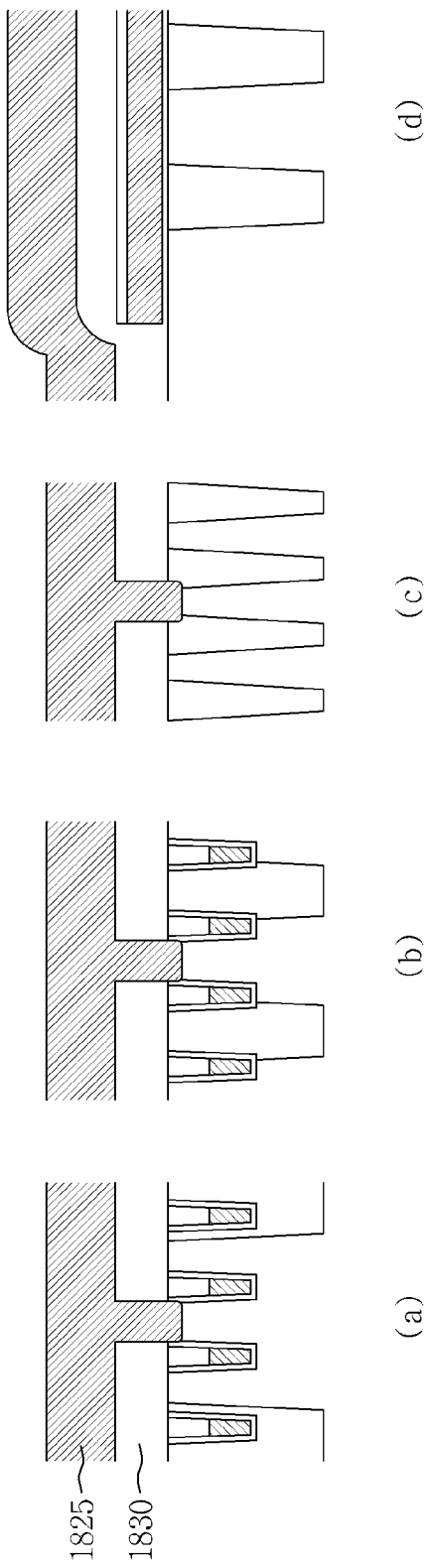

Referring to the FIG. 21F, a second silicon layer 1825 may be entirely formed to a thickness of about 1000 Å to fill the bit line contact hole 1860h.

Figure 21G:
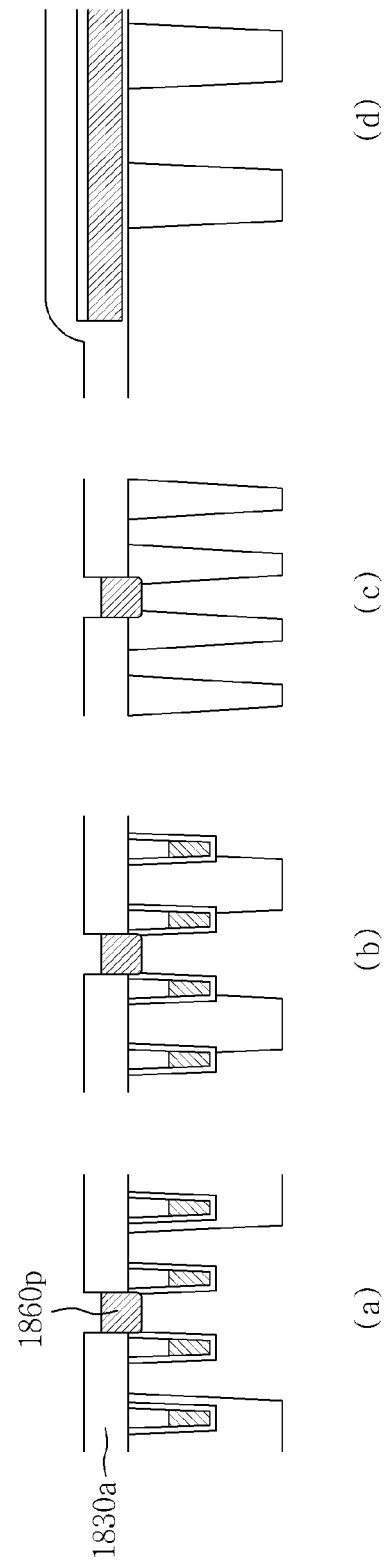

Referring to FIG. 21G, a bit line contact plug 1860p may be formed by removing the second silicon layer 1825 using an etch back method. In the process, the third insulating layer 1830 may be formed into a third thinned insulating layer 1830a by removing upper portions of the third insulating layer 1830. A top surface of the bit line contact plug 1860p may be situated at a level lower than that of a top surface of the third thinned insulating layer 1830a.

Figure 21H:
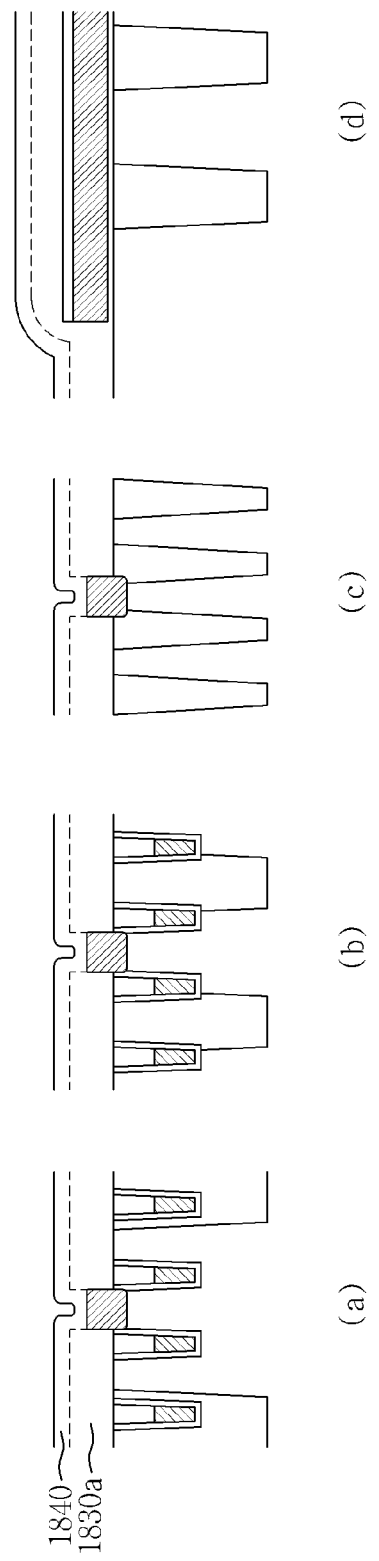

Referring to FIG. 21H, a fourth insulating layer 1840 may be formed of LD-TEOS on the third thinned insulating layer 1830a to a thickness of about 200 Å. The bit line contact plug 1860p may be covered by the fourth insulating layer 1840. An interface between the third thinned insulating layer 1830a and the fourth insulating layer 1840 is illustrated in broken lines to indicate that it no longer exists. The broken lines will be omitted in the drawings that follow FIG. 21H.

Figure 21I:
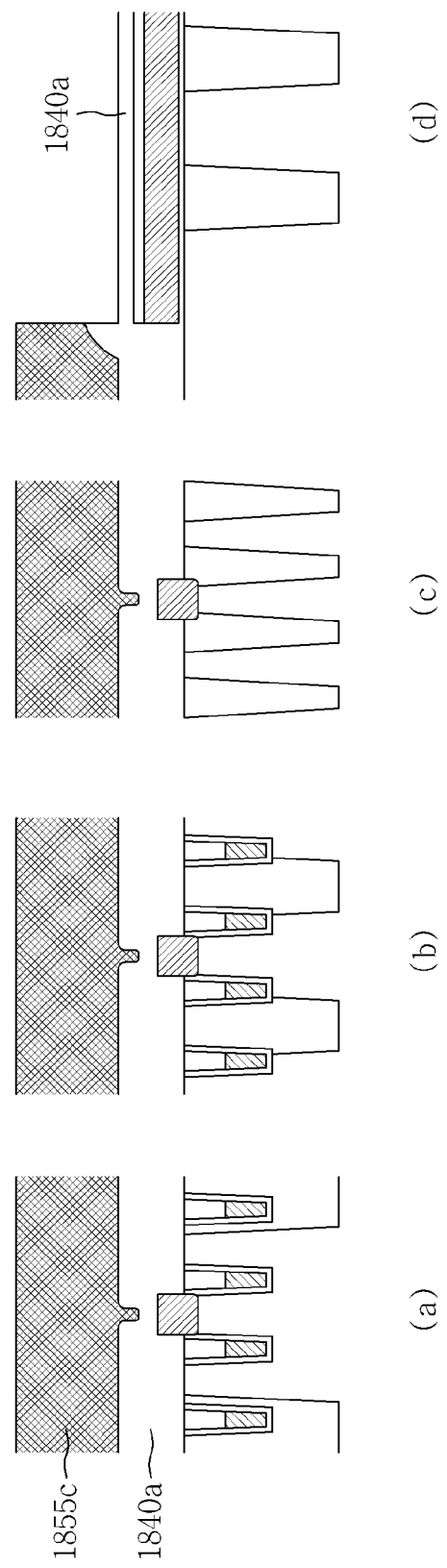

Referring to FIG. 21I, after forming a third photoresist pattern 1855c exposing the fourth insulating layer 1840 in the peripheral area PA, a fourth partially thinned insulating layer 1840a may be formed by partially removing the exposed portion of the fourth insulating layer 1840 using the third photoresist pattern 1855c as an etching mask. The thinned portion of the fourth partially thinned insulating layer 1840a may remain at a thickness of about 150 Å in the peripheral area PA and about 700 Å in the cell area CA. Then, the third photoresist pattern 1855c may be removed.

Figure 21J:
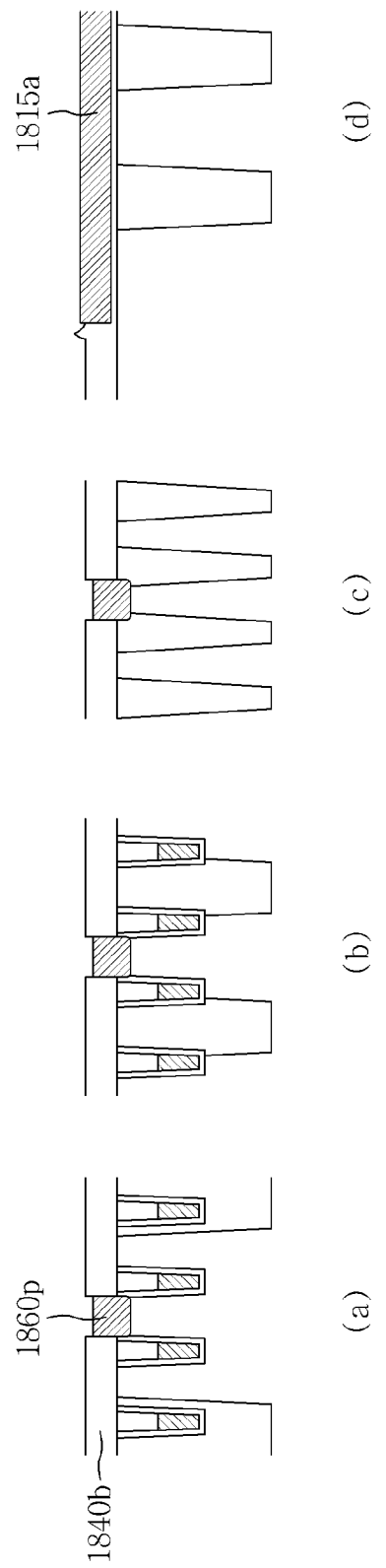

Referring to FIG. 21J, a fourth twice-thinned insulating layer 1840b may be formed by partially removing upper portions of the fourth partially thinned insulating layer 1840a using an etch back process. The fourth twice-thinned insulating layer 1840b may be not formed in the peripheral area PA. In other words, the first peripheral silicon layer 1815a may be exposed in the peripheral area PA. The etch back process may comprise a wet etching process. As a result of the process, the fourth twice-thinned insulating layer 1840b may be thinner than the fourth partially thinned insulating layer 1840a with a thickness of about 250 Å, for example. Also, the bit line contact plug 1860p may be exposed.

Figure 21K:
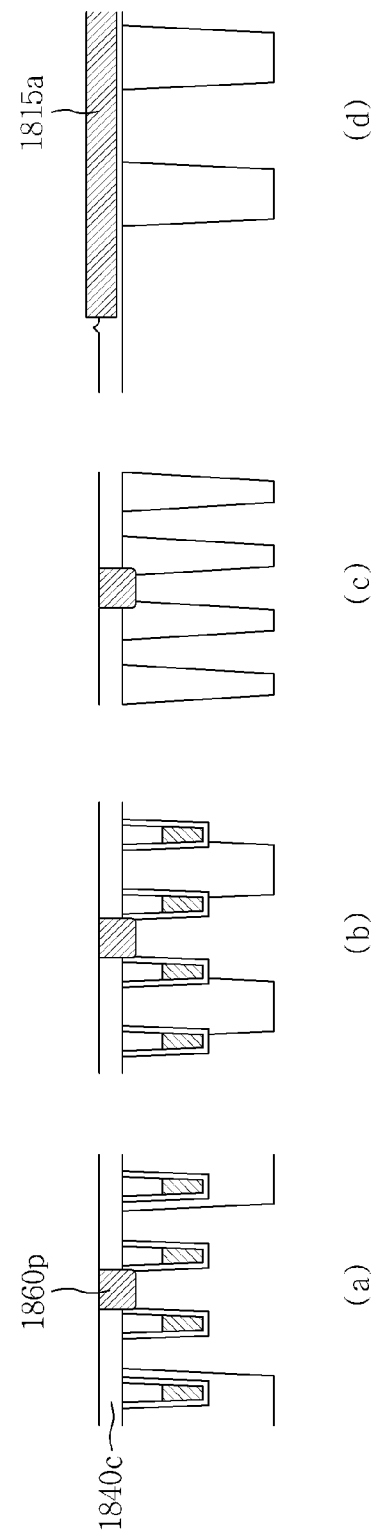

Referring to FIG. 21K, by performing a cleaning process, the fourth twice-thinned insulating layer 1840b may be formed into a fourth thrice-thinned insulating layer 1840c. As a result of the process, the fourth thrice-thinned insulating layer 1840c may be thinner than the fourth twice-thinned insulating layer 1840b with a thickness of about 150. The cleaning process may be similar to that described with reference to FIG. 20K. Then, by performing the processes shown in FIGS. 4K, 4L, 5G and 6I, interconnection layers may be formed. In this way, any one of the semiconductor devices shown in FIGS. 2A to 3C may be fabricated.

Embodiment 19

Figure 22A:
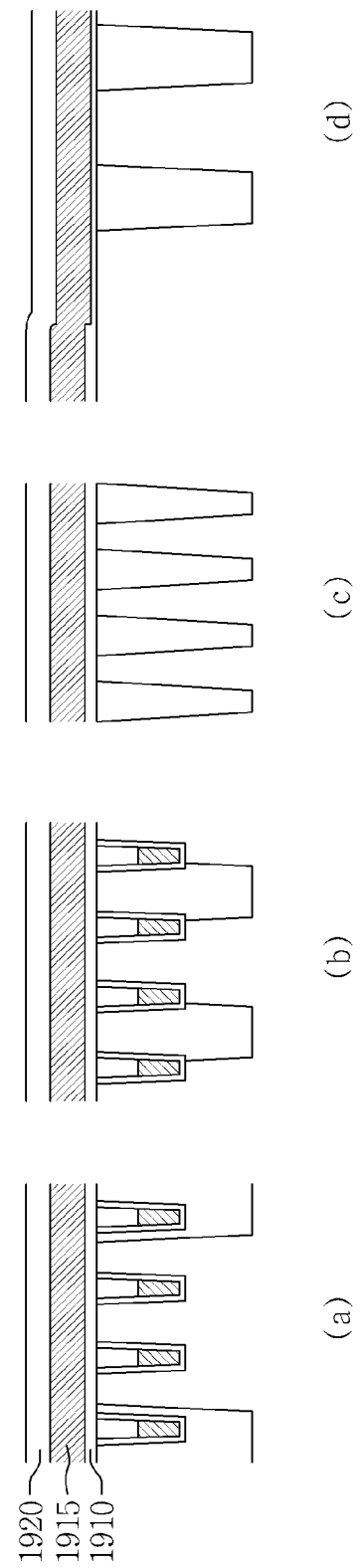
FIGS. 22A 22K are each a sectional view and together illustrate an embodiment of a method of fabricating a semiconductor device in accordance with the inventive concepts, wherein regions (a), (b), (c) and (d) in each of the figures are regions along lines A-A', B-B', C-C', and D-D' in FIG. 1A, respectively.

Referring to FIG. 22A, a first insulating layer 1910, a first silicon layer 1915, and a second insulating layer 1920 may be formed by processes described above. The first silicon layer 1915 may be formed to a thickness of about 500 Å. The second insulating layer 1920 may be formed of silicon oxide, e.g., LP-TEOS, to a thickness of about 350 Å.

Figure 22B:
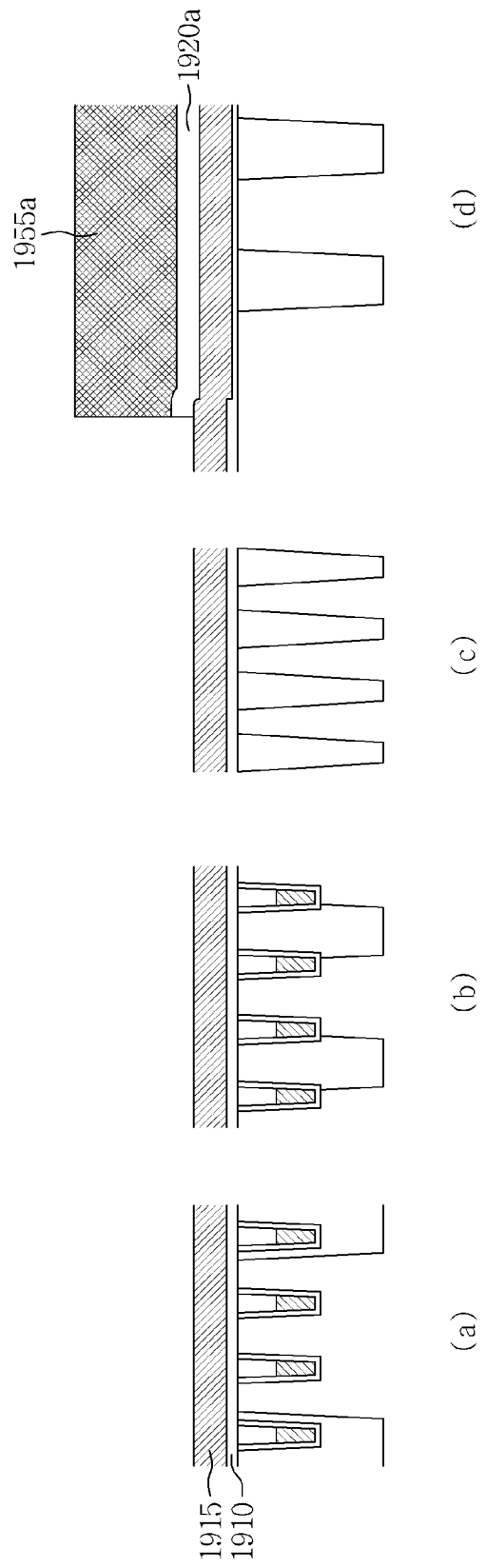

Referring to FIG. 22B, after forming a first photoresist pattern 1955a exposing the second insulating layer 1920 in the cell area CA, a second peripheral insulating layer 1920a may be formed only in the peripheral area PA by removing exposed portions of the second insulating layer 1920 using the first photoresist pattern 1955a as an etching mask. As a result of the processes, the first silicon layer 1915 may be exposed in the cell area CA. Then, the second peripheral insulating layer 1920a may be exposed in the peripheral area PA by removing the first photoresist pattern 1955a.

Figure 22C:
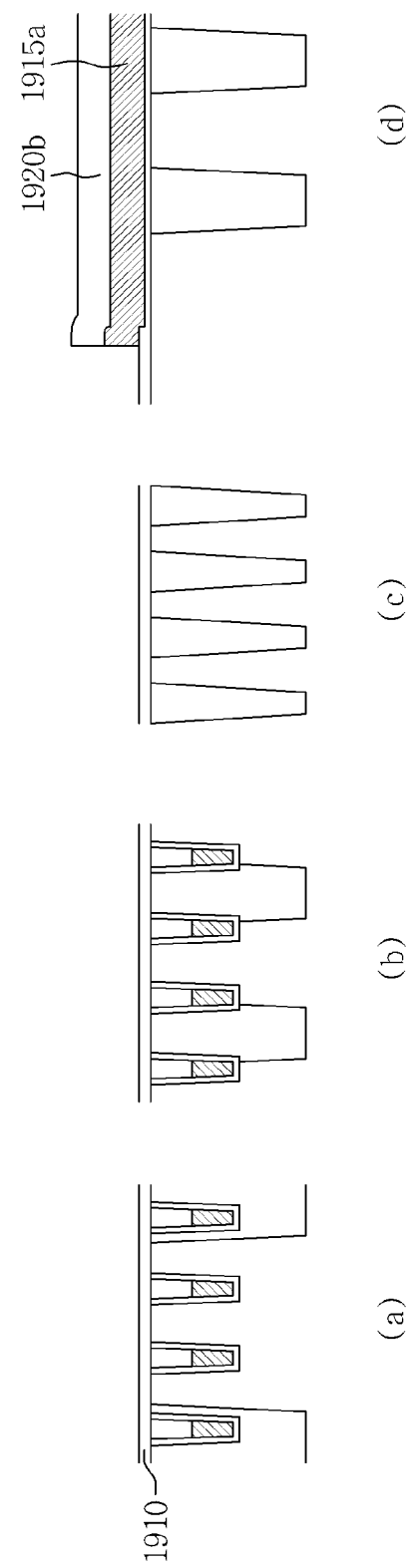

Referring to FIG. 22C, the exposed portion of the first silicon layer 1915 in the cell area CA may be removed using the second peripheral insulating layer 1920a as a patterning mask. As a result of the process, the first silicon layer 1915 may be formed into a first peripheral silicon layer 1915a in the peripheral area PA, and the first insulating layer 1910 may be exposed in the cell area CA. The second peripheral insulating layer 1920a may be formed into a second thinned peripheral insulating layer 1920b. Also, the second thinned peripheral insulating layer 1920b may be formed to a thickness of about 300 Å.

Figure 22D:
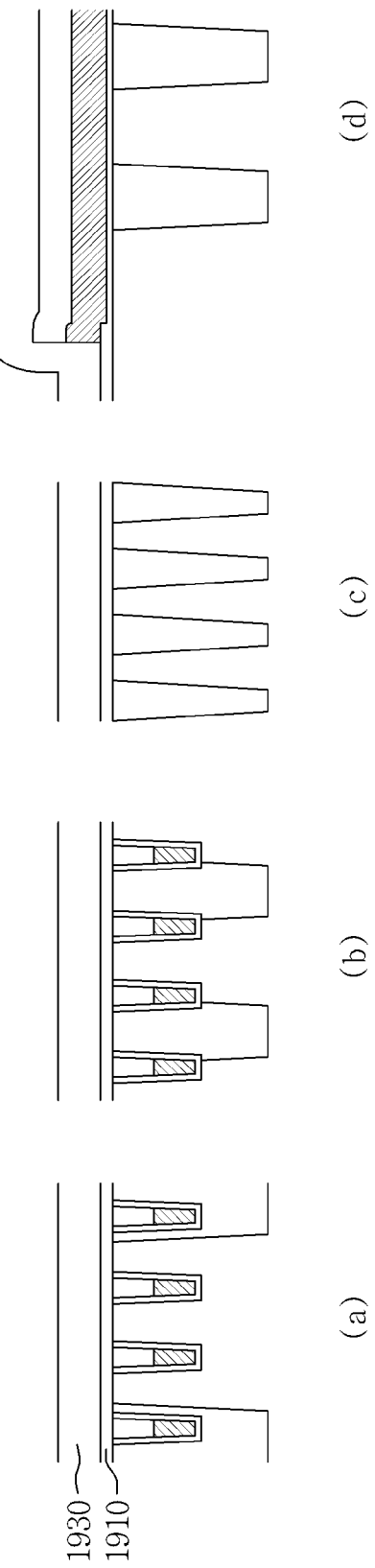

Referring to FIG. 22D, a third insulating layer 1930 may be entirely formed of silicon oxide, e.g., LD-TEOS, to a thickness of about 550 Å. An interface between the first insulating layer 1910 and the third insulating layer 1930 is illustrated in solid lines not only indicating that the interface is discernable but also that the two layers have an etch selectivity.

Figure 22E:
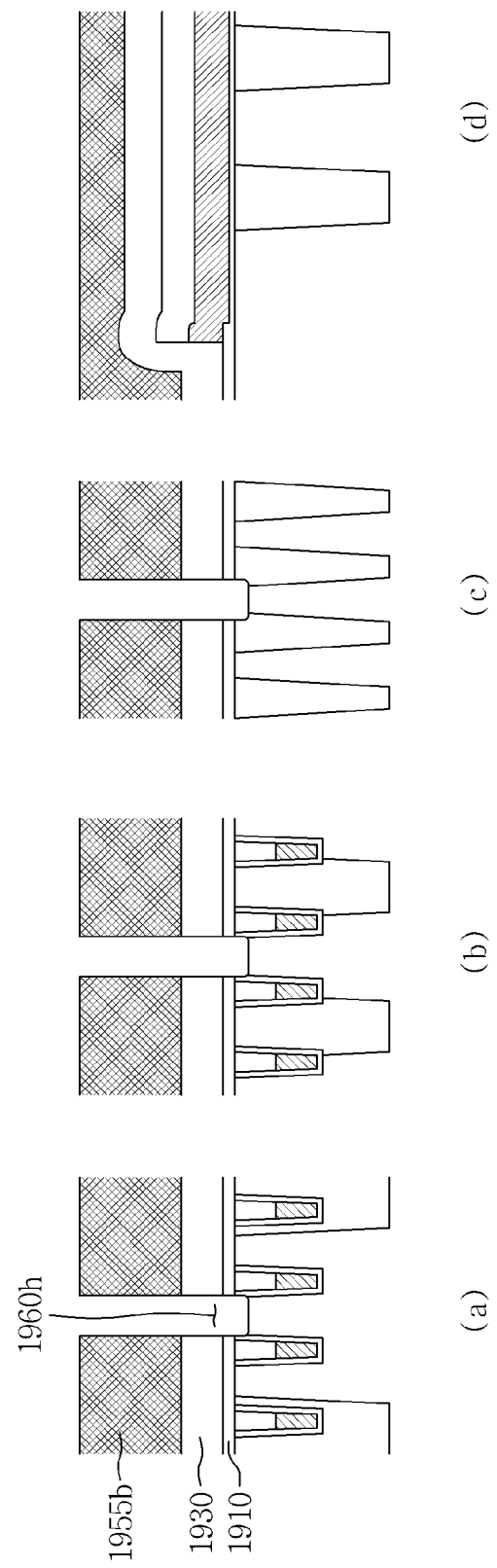

Referring to FIG. 22E, after forming a second photoresist pattern 1955b, a bit line contact hole 1960h may be formed by patterning the third insulating layer 1930 using the second photoresist pattern 1955b as a patterning mask. Then the second photoresist pattern 1955b may be removed. A silicon treatment process may be performed before or after removing the second photoresist pattern 1955b.

Figure 22F:
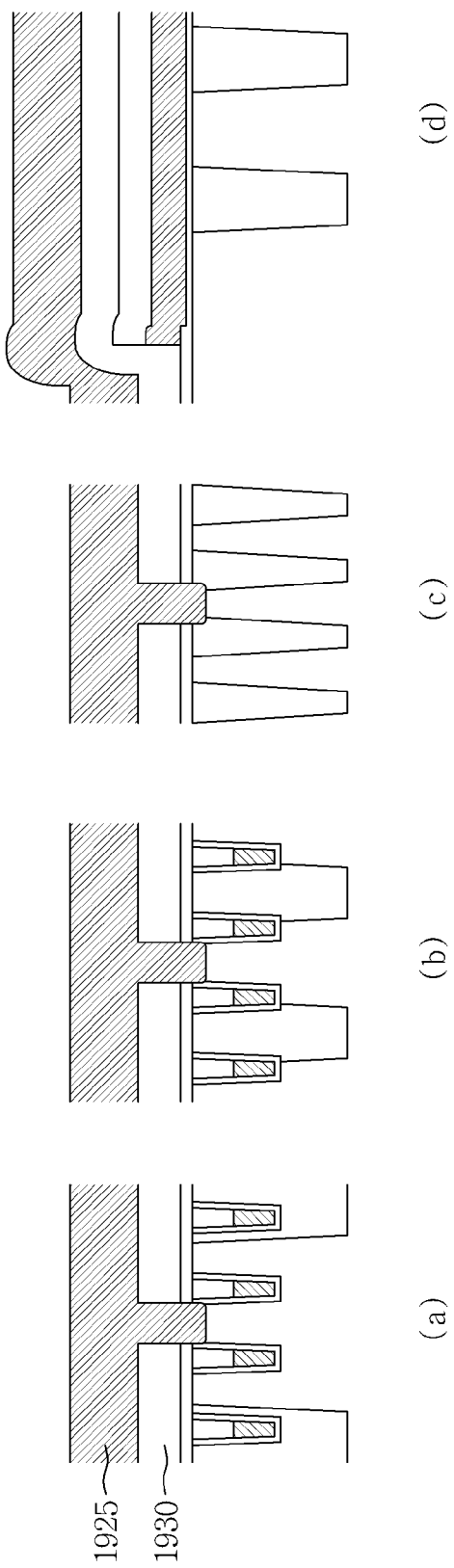

Referring to FIG. 22F, a second silicon layer 1925 may be entirely formed to a thickness of about 1000 Å to fill the bit line contact hole 1960h.

Figure 22G:
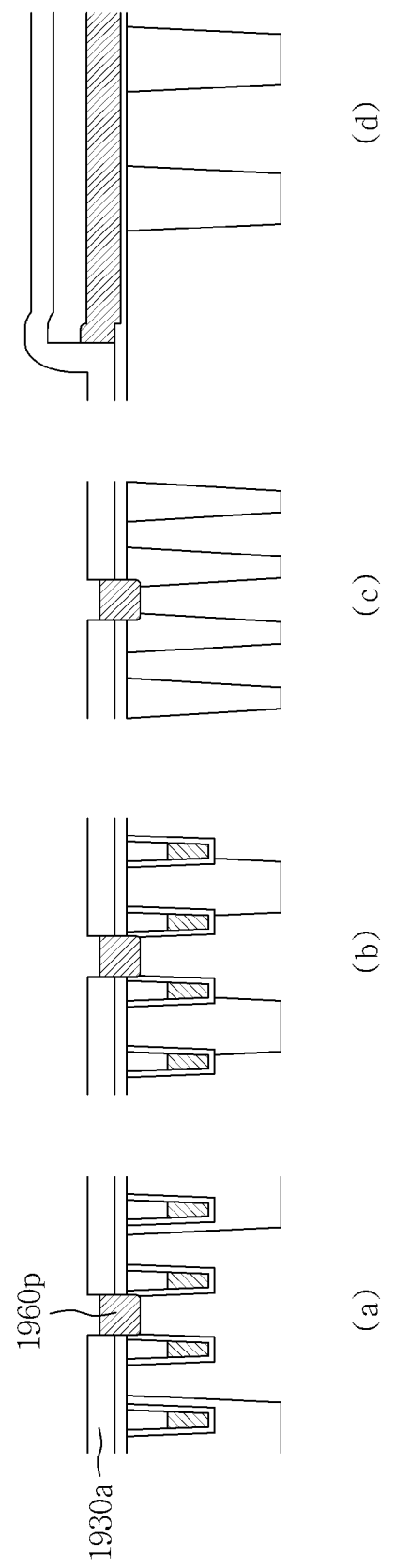

Referring to FIG. 22G, a bit line contact plug 1960p may be formed by removing the second silicon layer 1925 on the third insulating layer 1930 using an etch back process. As a result of the process, the third insulating layer 1930 may be formed into a third thinned insulating layer 1930a. The level of a top surface of the bit line contact plug 1960p may be lower than that of a top surface of the third thinned insulating layer 1930a. Also, the third thinned insulating layer 1930a may be formed to a thickness of about 400 Å in the cell area CA and remain at a thickness of about 700 Å in the peripheral area PA.

Figure 22H:
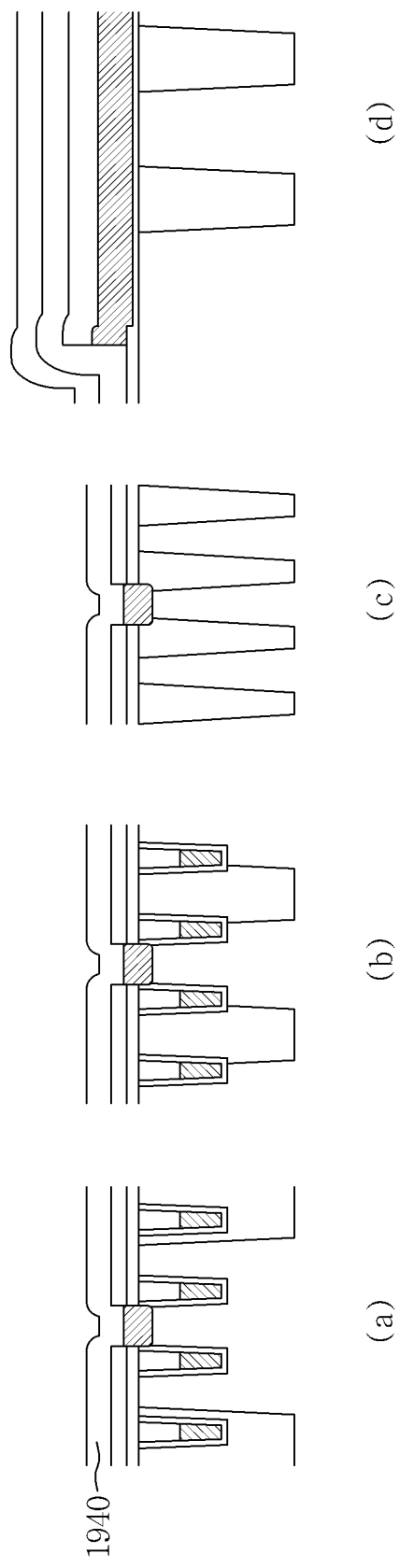

Referring to FIG. 22H, a fourth insulating layer 1940 may be formed of silicon oxide, e.g., LP-TEOS, to a thickness of about 300 Å. The bit line contact plug 1860p may be covered with the fourth insulating layer 1940.

Figure 22I:
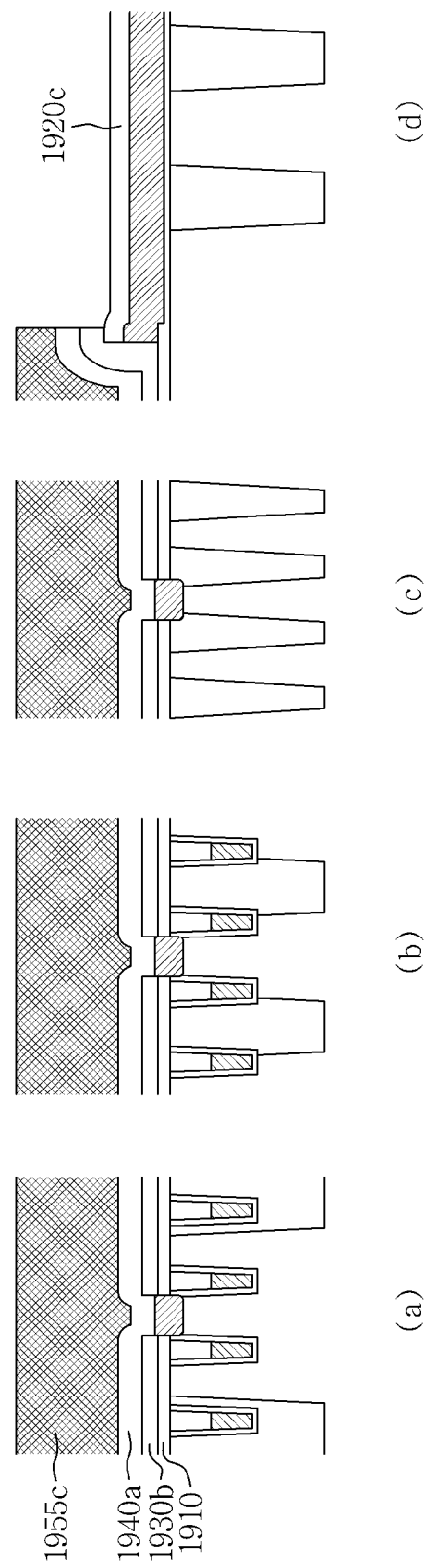

Referring to FIG. 22I, after forming a third photoresist pattern 1955c exposing portions of the fourth insulating layer 1940 in the peripheral area PA, the exposed portions of the fourth insulating layer 1940 and the third thinned insulating layer 1930a may be completely removed and the second peripheral insulating layer 1920b may be partially removed. As a result of the process, a third thinned cell insulating layer 1930b and a fourth cell insulating layer 1940a may be formed in the cell area CA, and a second partially thinned insulating layer 1920c may be formed in the peripheral area PA. The second partially thinned insulating layer 1920c may be formed to a thickness of about 200 Å. Then, the third photoresist pattern 1955c may be removed.

Figure 22J:
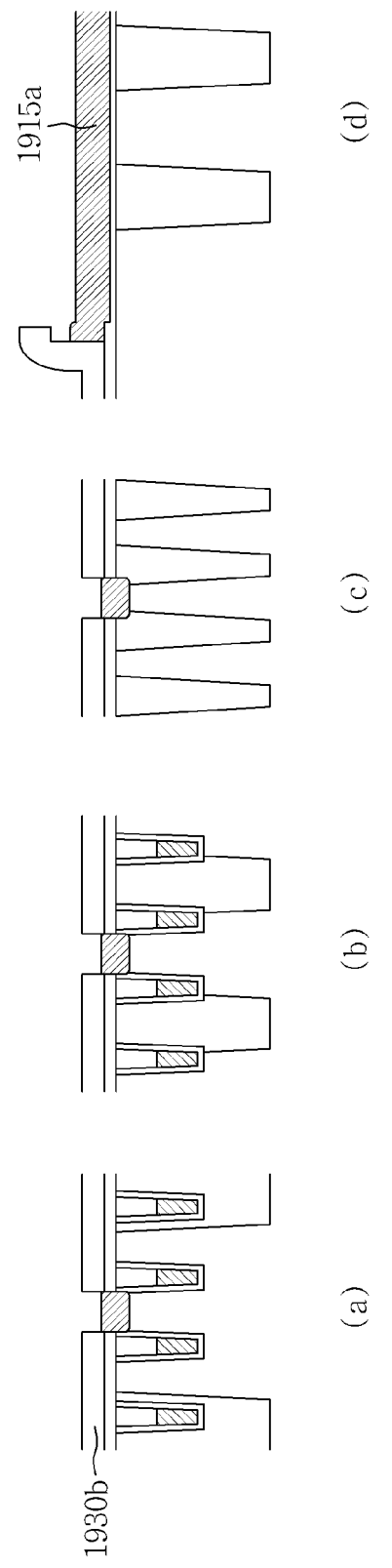

Referring to FIG. 22J, the fourth cell insulating layer 1940a and the second partially thinned insulating layer 1920c may be removed using a wet etching process. The fourth cell insulating layer 1940a and the second partially thinned insulating layer 1920c may comprise LP-TEOS and the third thinned cell insulating layer 1930b may comprise LD-TEOS. Accordingly, the fourth cell insulating layer 1940a and the second partially thinned insulating layer 1920c may be selectively removed. In the process, a removing process to entirely remove a thickness of about 400 Å of LP-TEOS may be performed. The third twice-thinned insulating layer 1930b may remain at a thickness of about 200 Å in the cell area CA.

Figure 22K:
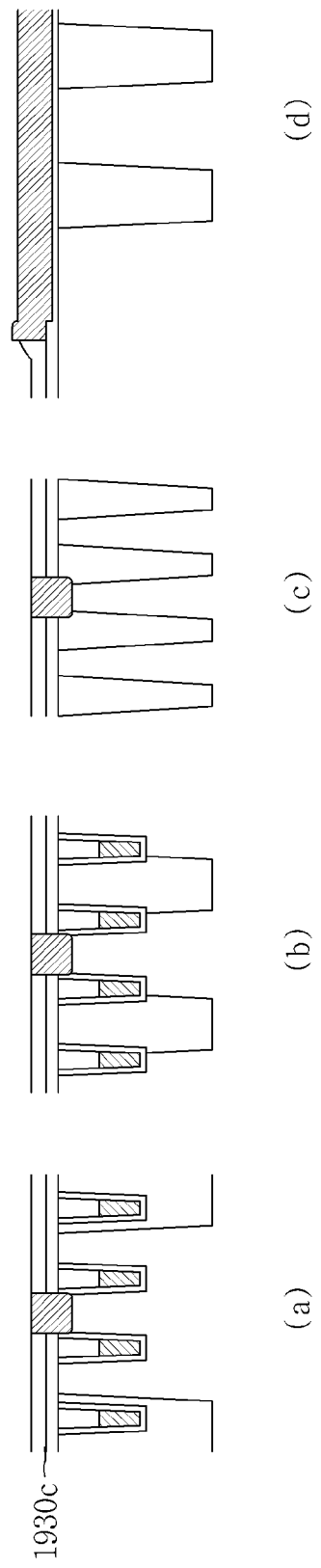

Referring to FIG. 22K, a third thrice-thinned insulating layer 1930c may be formed by performing a cleaning process. The protruding insulating layers remaining in the peripheral area PA or core area may be mostly removed because the protruding shape is less etch-resistant than other shapes. The third twice-thinned insulating layer 1930c may remain at a thickness of about 150 Å. The process may comprise wet cleaning processes using SC-1 and/or diluted HF solution. Then, by performing the processes shown in FIGS. 4K, 4L, 5G and 6I, interconnection layers may be formed. In this way, any one of the semiconductor devices shown in FIGS. 2A to 3C may be fabricated.

Embodiment 20

Figure 23A:
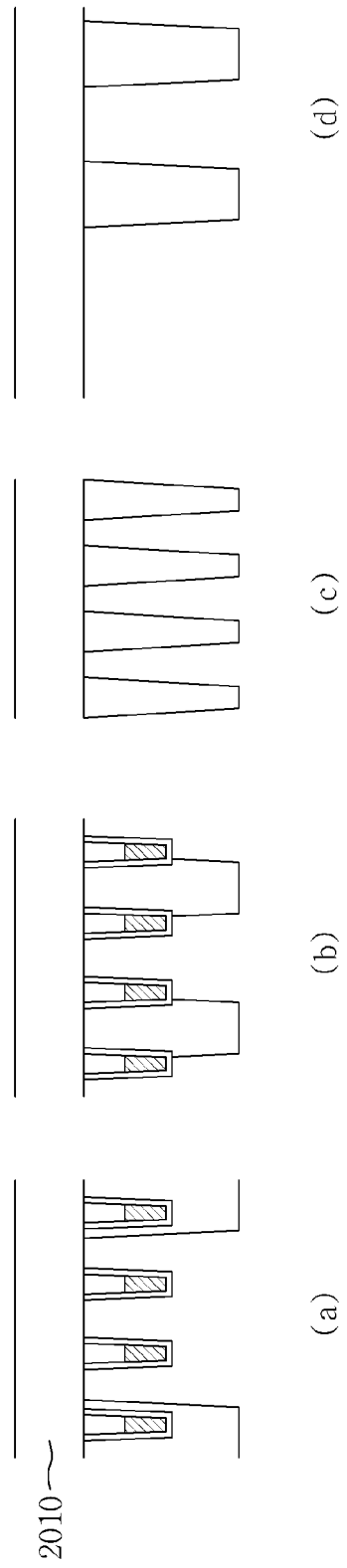
FIGS. 23A 23K are each a sectional view and together illustrate an embodiment of a method of fabricating a semiconductor device in accordance with the inventive concepts, wherein regions (a), (b), (c) and (d) in each of the figures are regions along lines A-A', B-B', C-C', and D-D' in FIG. 1A, respectively.

Referring to FIG. 23A, after performing a process similar to that shown in FIG. 4A, a first insulating layer 2010 may be formed of silicon oxide, e.g., LP-TEOS, to a thickness of about 1000 Å.

Figure 23B:
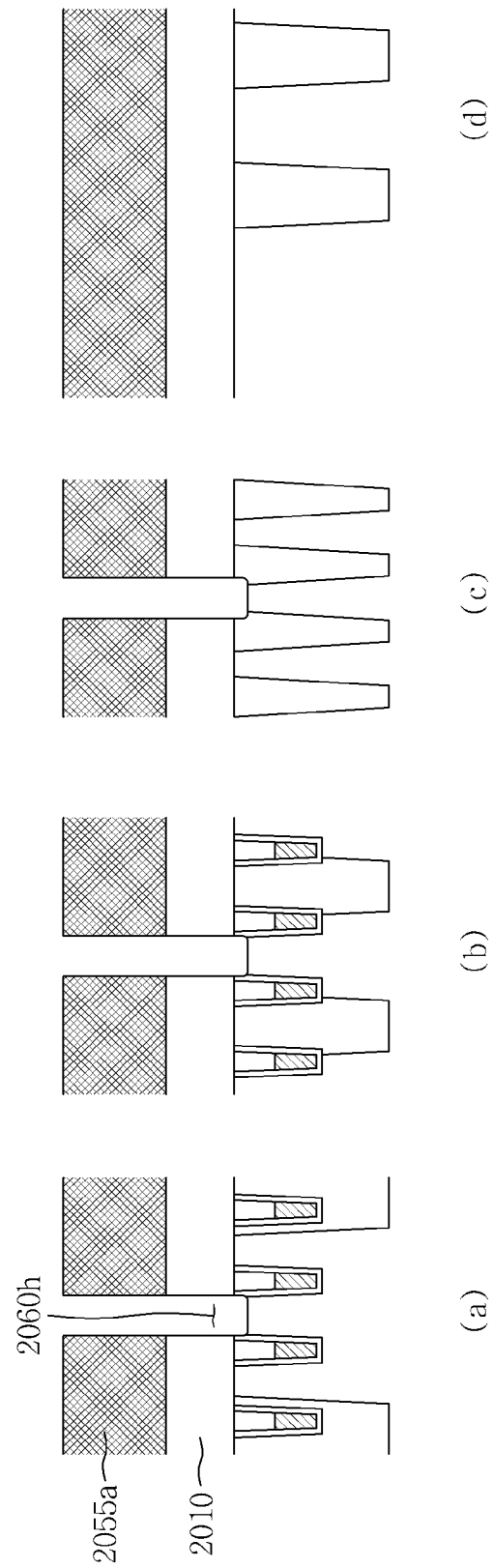

Referring to FIG. 23B, after forming a first photoresist pattern 2055a, a bit line contact hole 2060h may be formed by patterning the first insulating layer 2010 using the first photoresist pattern 2055a as a patterning mask. The first photoresist pattern 2055a may be removed.

Figure 23C:
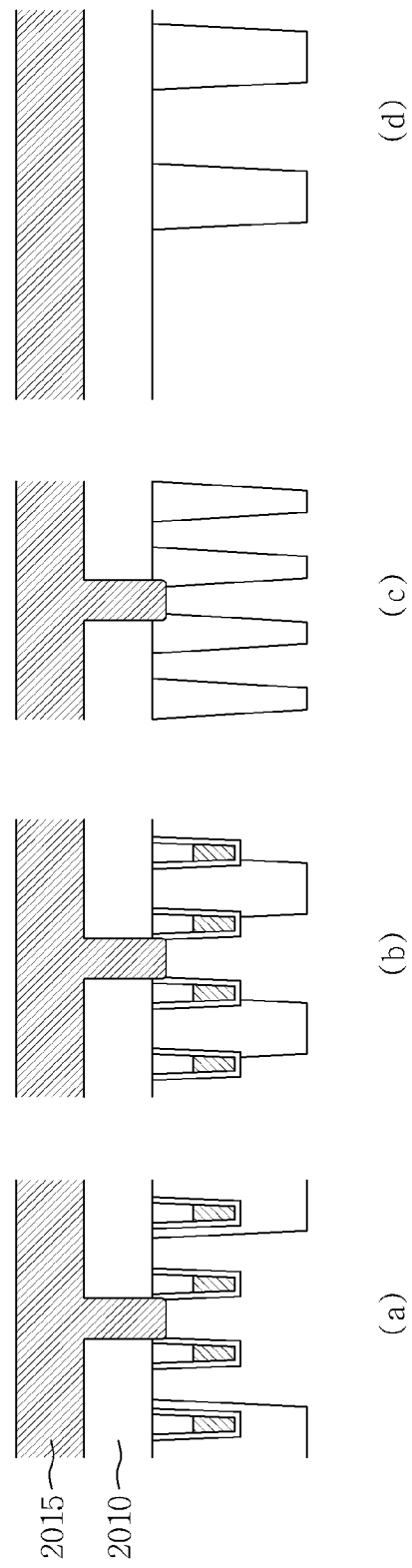

Referring to FIG. 23C, a first silicon layer 2015 may be entirely formed to a thickness of about 1000 Å to fill the bit line contact hole 2060h.

Figure 23D:
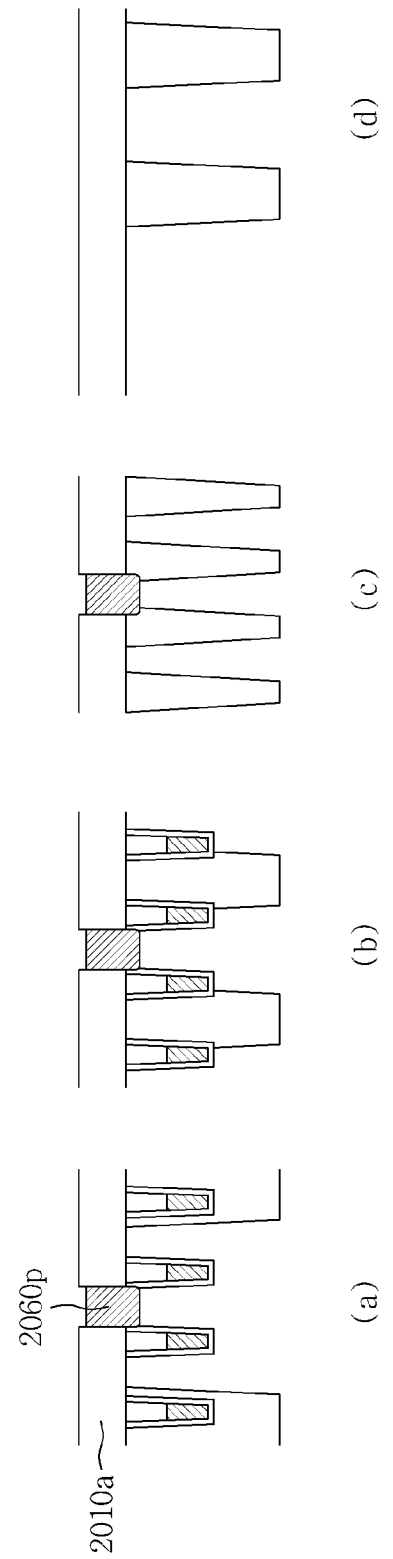

Referring to FIG. 23D, a bit line contact plug 2060p may be formed by removing the first silicon layer 2015 on the first insulating layer 2010. As a result of the process, the first insulating layer 2010 may be formed into a first thinned insulating layer 2010a. A difference between the level of the top surfaces of the bit line contact plug 2060p and the first thinned insulating layer 2010a may vary in accordance with the inventive concepts.

Figure 23E:
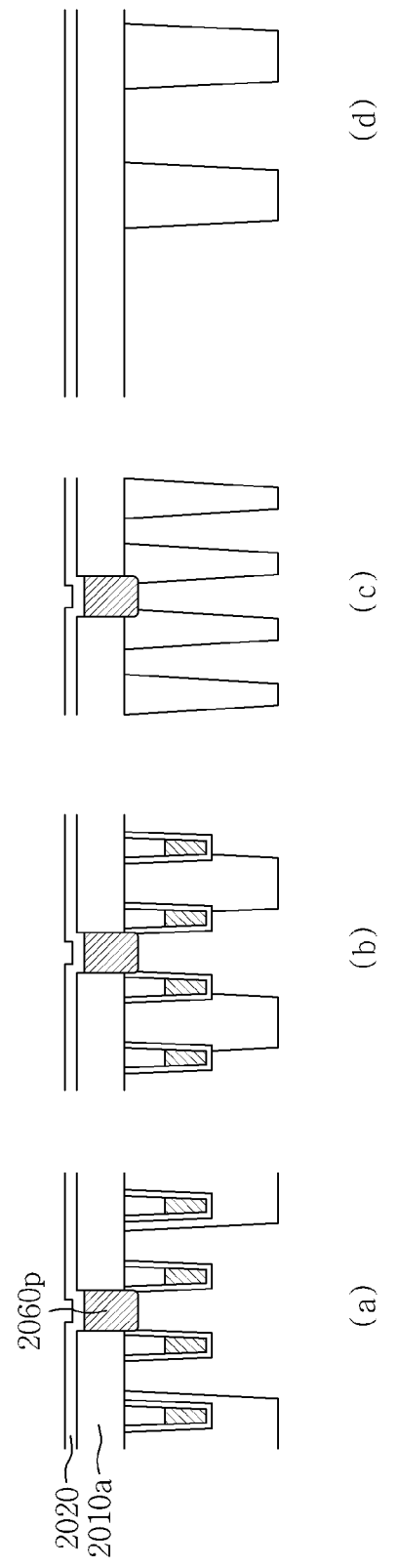

Referring to FIG. 23E, a second insulating layer 2020 comprising silicon nitride may be entirely formed to a thickness of about 100 Å.

Figure 23F:
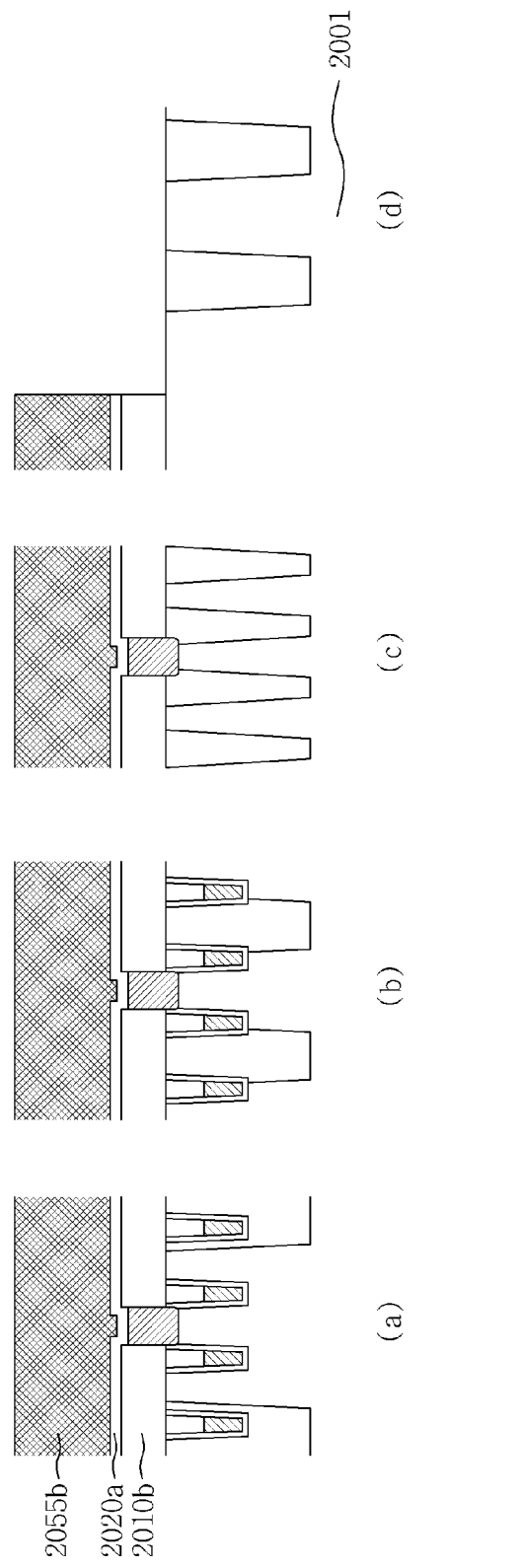

Referring to FIG. 23F, after forming a second photoresist pattern 2055b exposing the peripheral area PA, a second cell insulating layer 2020a and a first cell insulating layer 2010b may be formed by removing exposed portions of the second insulating layer 2020 and the first insulating layer 2010a in the peripheral area PA. As a result of the process, a surface of a semiconductor substrate 2001 may be exposed in the peripheral area PA. Then, the second photoresist pattern 2055b may be removed.

Figure 23G:
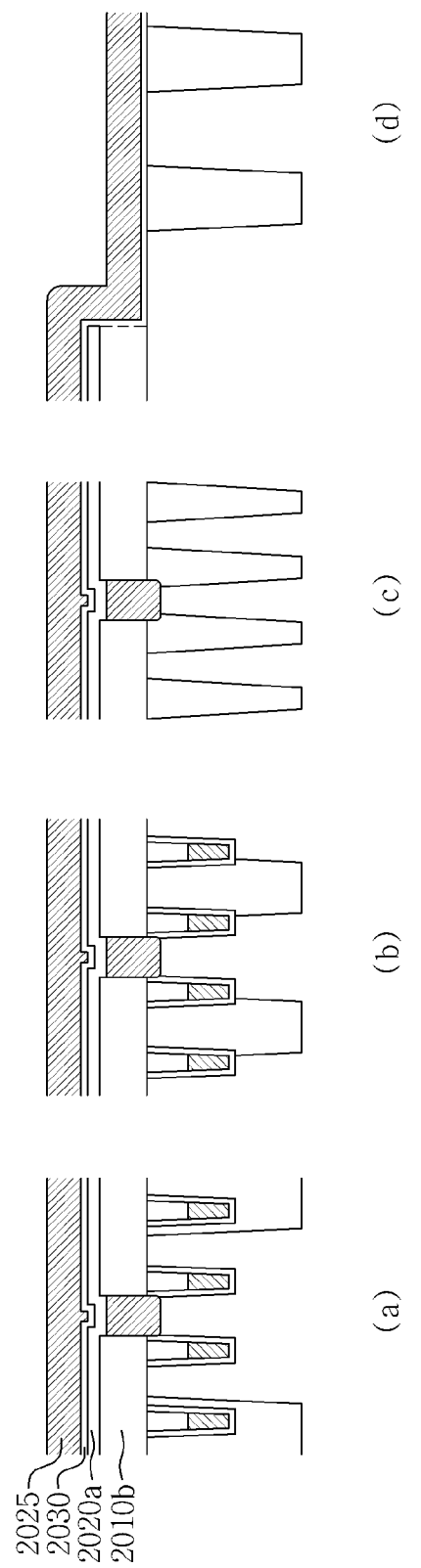

Referring to FIG. 23G, a third insulating layer 2030 and a second silicon layer 2025 may be entirely formed. The third insulating layer 2030 may be used as a gate insulating layer of a peripheral transistor. The third insulating layer 2030 may include thermal silicon oxide. In the example embodiment, the third insulating layer 2030 may be formed to a thickness of about 50 Å. The second silicon layer 2025 may be used as a gate electrode of a peripheral transistor and formed to a thickness of about 400 Å. An interface between the second silicon layer 2010b and the third insulating layer 2030 is illustrated in broken lines to indicate that it no longer exists. That is, the first cell insulating layer 2010b and the third insulating layer 2030 may be of the same material.

Figure 23H:
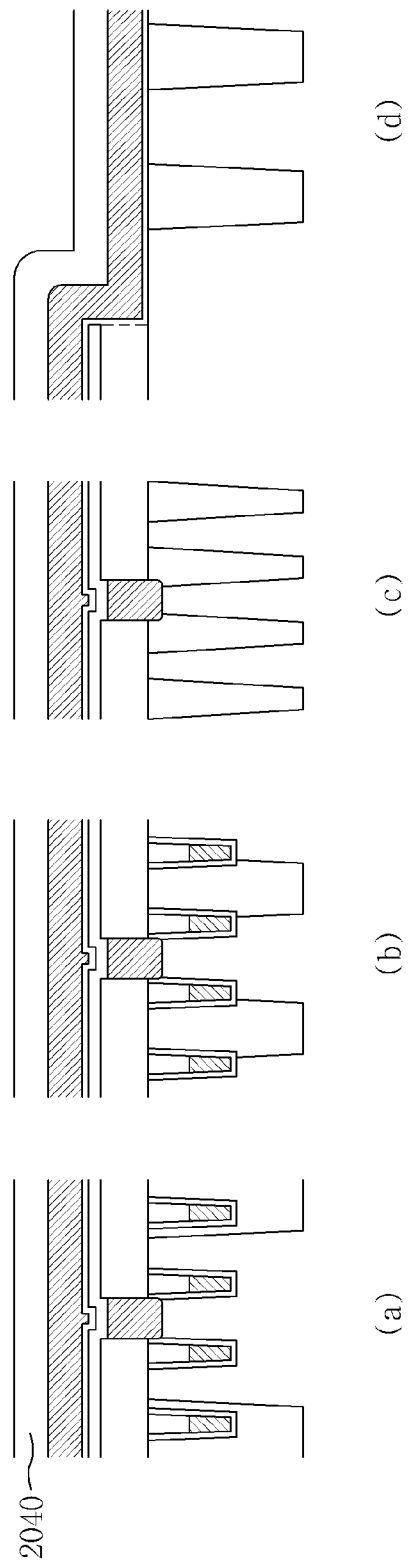

Referring to FIG. 23H, a fourth insulating layer 2040 of silicon nitride may be entirely formed to a thickness of about 500 Å.

Figure 23I:
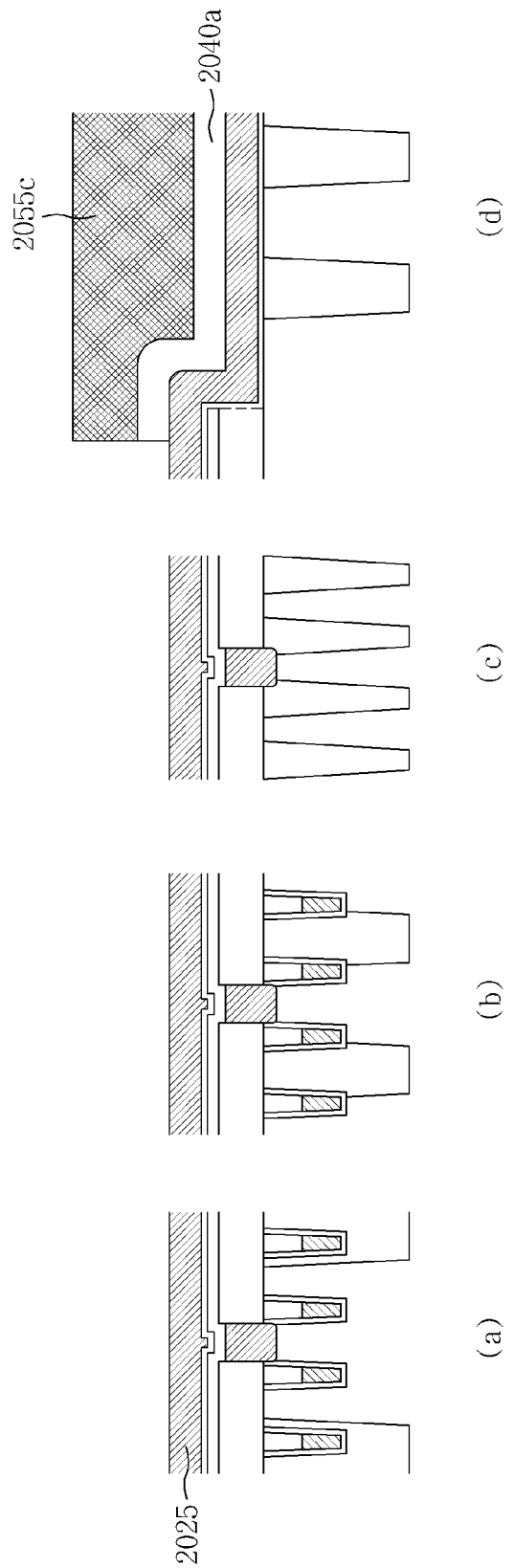

Referring to FIG. 23I, after forming a third photoresist pattern 2055c exposing the fourth insulating layer 2040 in the cell area CA, a fourth peripheral insulating layer 2040a may be formed only in the peripheral area PA by removing exposed portions of the fourth insulating layer 2040 in the cell area CA. The second silicon layer 2025 may be exposed at portions where the fourth insulating layer 2040 is removed. Then, the third photoresist pattern 2055c may be removed.

Figure 23J:
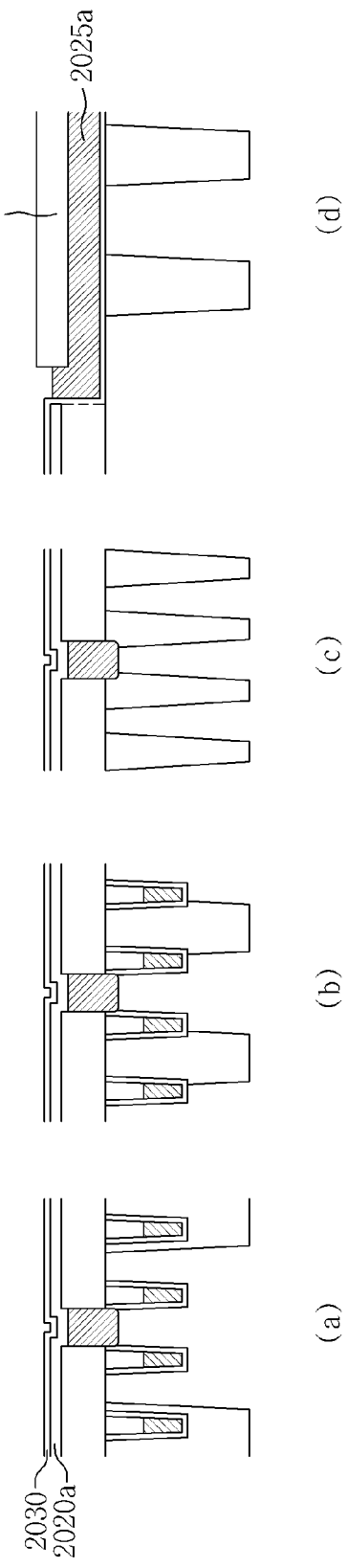

Referring to FIG. 23J, the fourth peripheral insulating layer 2040a and the exposed second silicon layer 2025 may be planarized using a CMP process. As a result of the process, the fourth planarized insulating layer 2040b may remain only in the peripheral area PA. A second peripheral silicon layer 2025a may be formed only in the peripheral area PA by removing the exposed portion of the second silicon layer 2025 in the cell area CA. The third insulating layer 2030 may be exposed in the cell area CA. In addition, although not shown, the second cell insulating layer 2020a may be exposed.

Figure 23K:
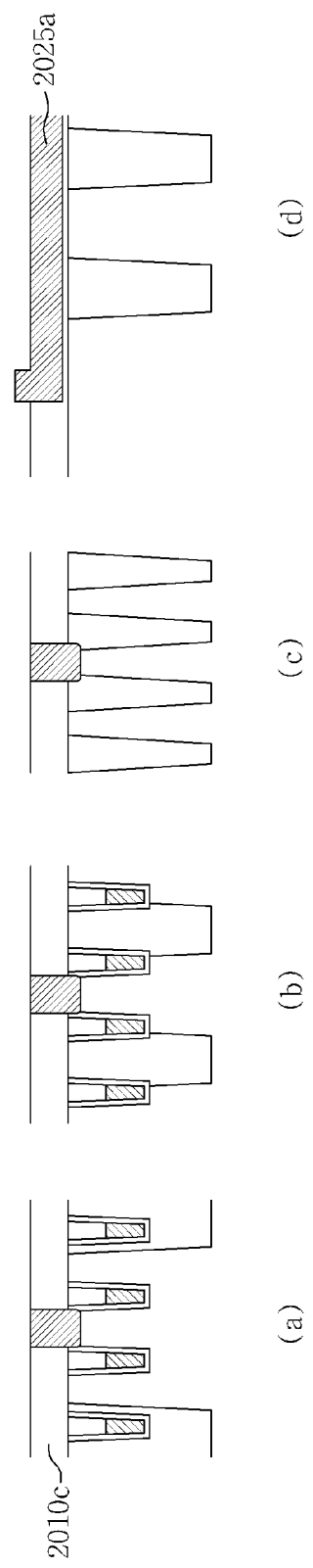

Referring to FIG. 23K, the fourth planarized insulating layer 2040b, the third insulating layer 2030, and the second cell insulating layer 2020a may be removed. As a result of the process, a first thinned insulating layer 2010c may be exposed in the cell area CA, and the second peripheral silicon layer 2025a may be exposed in the peripheral area PA. Then, by performing the processes shown in FIGS. 4K, 4L, 5G and 6I, interconnection layers may be formed. In this way, any one of the semiconductor devices shown in FIGS. 2A to 3C may be fabricated.

Embodiment 21

Figure 24A:
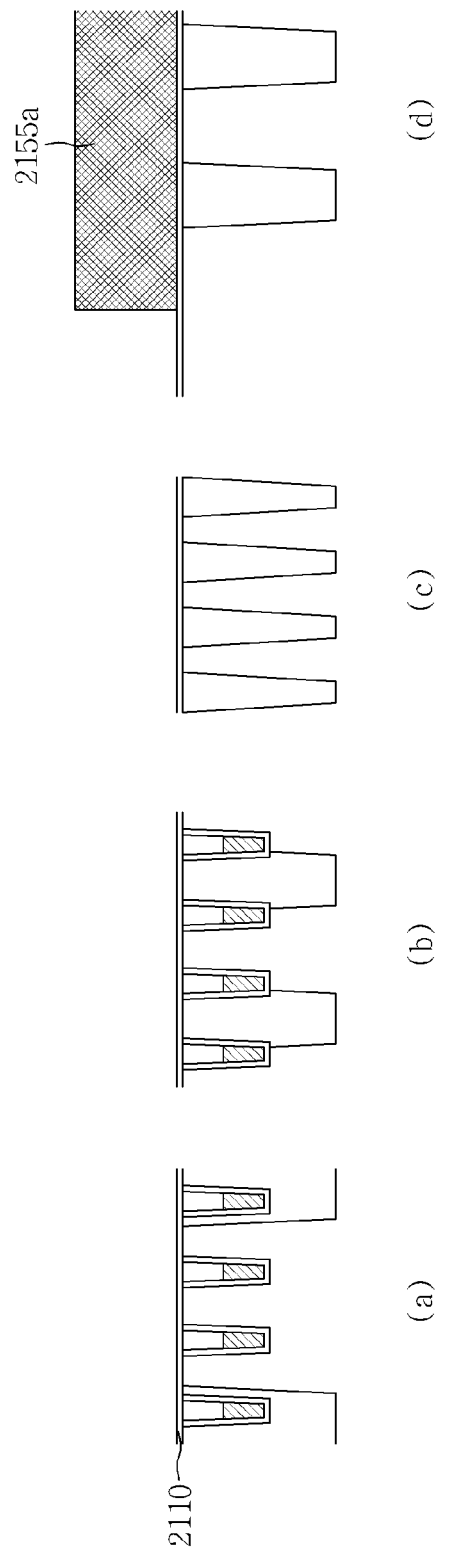
FIGS. 24A 24I are each a sectional view and together illustrate an embodiment of a method of fabricating a semiconductor device in accordance with the inventive concepts, wherein regions (a), (b), (c) and (d) in each of the figures are regions along lines A-A', B-B', C-C', and D-D' in FIG. 1A, respectively.

Referring to FIG. 24A, after performing the process shown in FIG. 4A, a first insulating layer 2110 may be entirely formed and a first photoresist pattern 2155a exposing the first insulating layer 2110 in the cell area CA and covering the peripheral area PA may be formed. The first insulating layer 2110 comprising silicon oxide or another insulator may be formed to a thickness to be used as a gate insulating layer of a peripheral transistor. For example, the first insulating layer 2110 may be formed to a thickness of 50 to 100 Å.

Figure 24B:
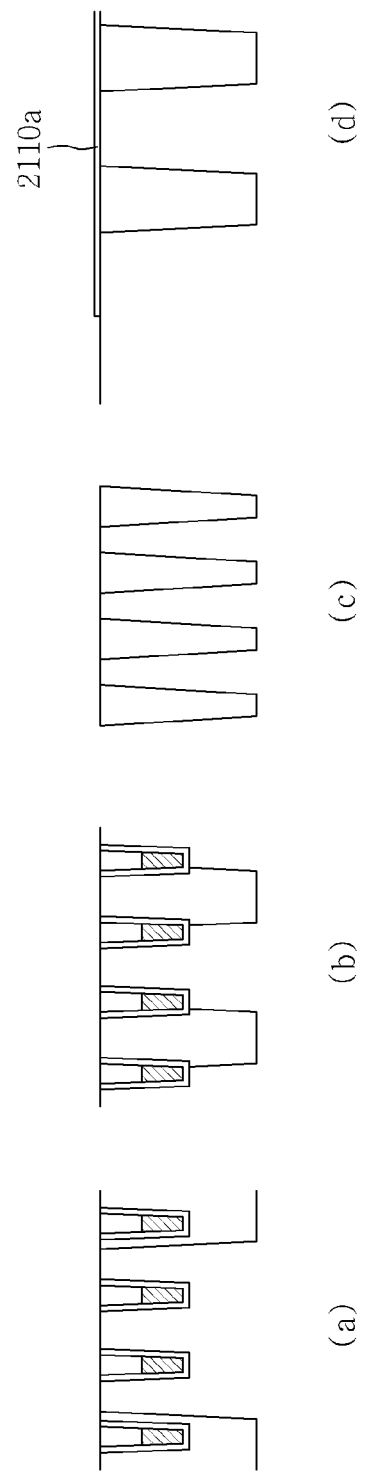

Referring to FIG. 24B, a first peripheral insulating layer 2110a may be formed by removing the exposed portion of the first insulating layer 2110 in the cell area CA using the first photoresist pattern 2155a as an etching mask. This process may comprise a wet cleaning process using diluted HF solution. Then, the first photoresist pattern 2155a may be removed.

Figure 24C:
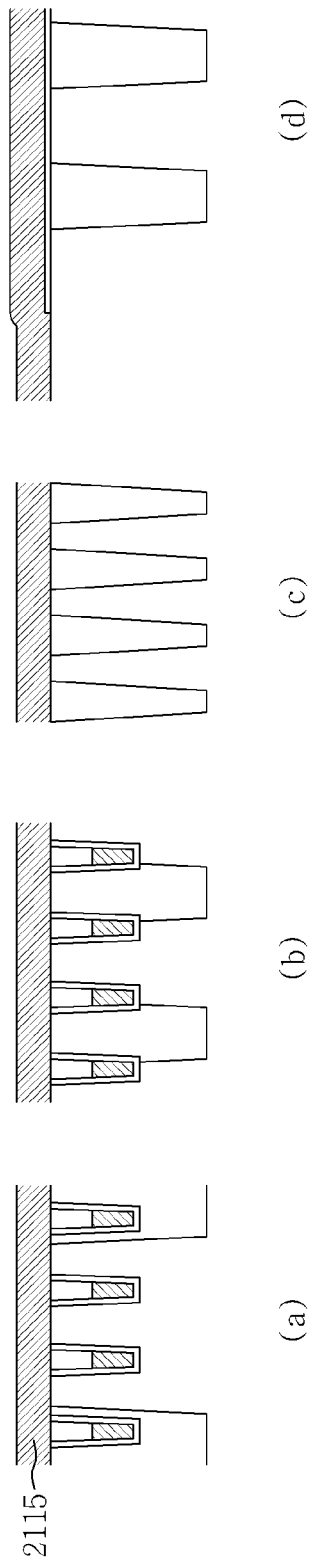

Referring to FIG. 24C, a first silicon layer 2115 may be entirely formed to a thickness of about 300 Å. Furthermore, upper portions of the first silicon layer 2115 may include carbon.

Figure 24D:
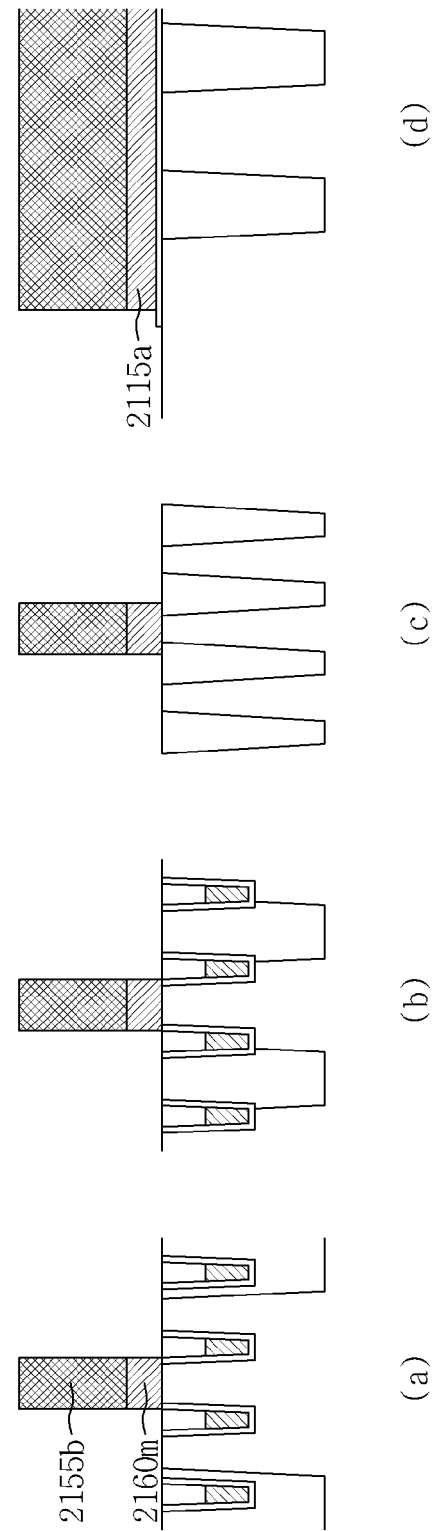

Referring to FIG. 24D, after forming a second photoresist pattern 2155b, by patterning the first silicon layer 2115 using the second photoresist pattern 2155b as a patterning mask, a mesa pattern 2160m may be formed in the cell area CA and a first peripheral silicon layer 2115a may be formed in the peripheral area PA. The mesa pattern 2160m will be formed into a bit line contact plug in the cell area CA, and the first peripheral silicon layer 2115a will be formed into a gate electrode of a peripheral transistor in the peripheral area PA. In other words, the second photoresist pattern 2155b may be used as a patterning mask for patterning the bit line contact plug in the cell area CA and the gate electrode of the peripheral transistor in the peripheral area PA. Then, the second photoresist pattern 2155b may be removed.

Figure 24E:
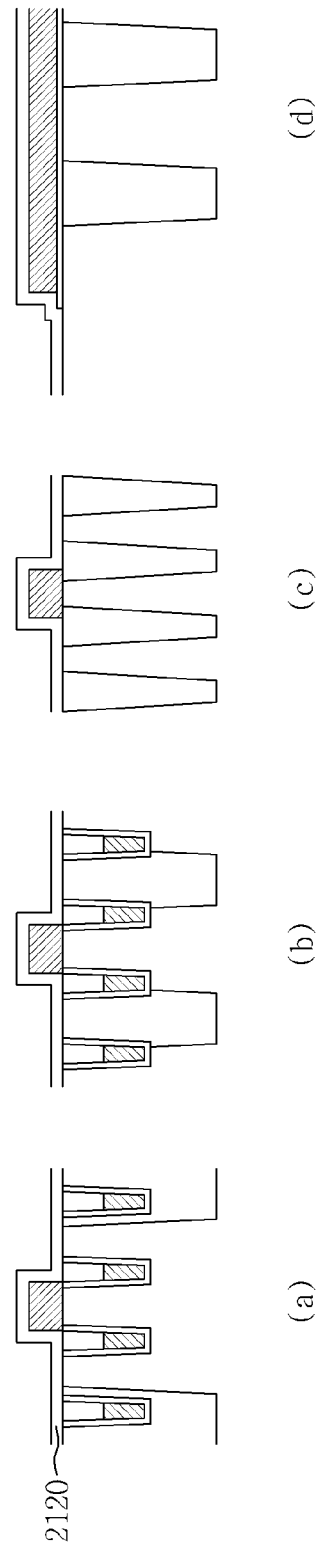

Referring to FIG. 24E, a second insulating layer 2120 of silicon nitride may be entirely conformably formed to a thickness of about 100 Å.

Figure 24F:
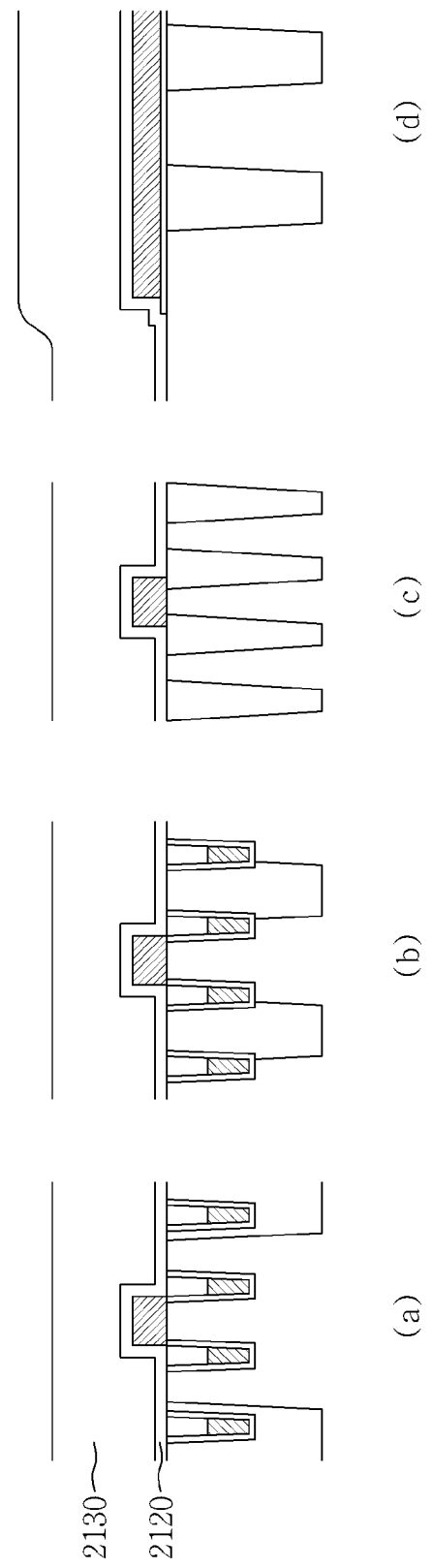

Referring to FIG. 24F, a third insulating layer 2130 comprising silicon oxide may be entirely formed thicker than the second insulating layer 2120. For example, the third insulating layer 2130 may comprise an oxide having relatively better flowability, e.g., an F-CVD oxide, silicate oxide, or TOSZ.

Figure 24G:
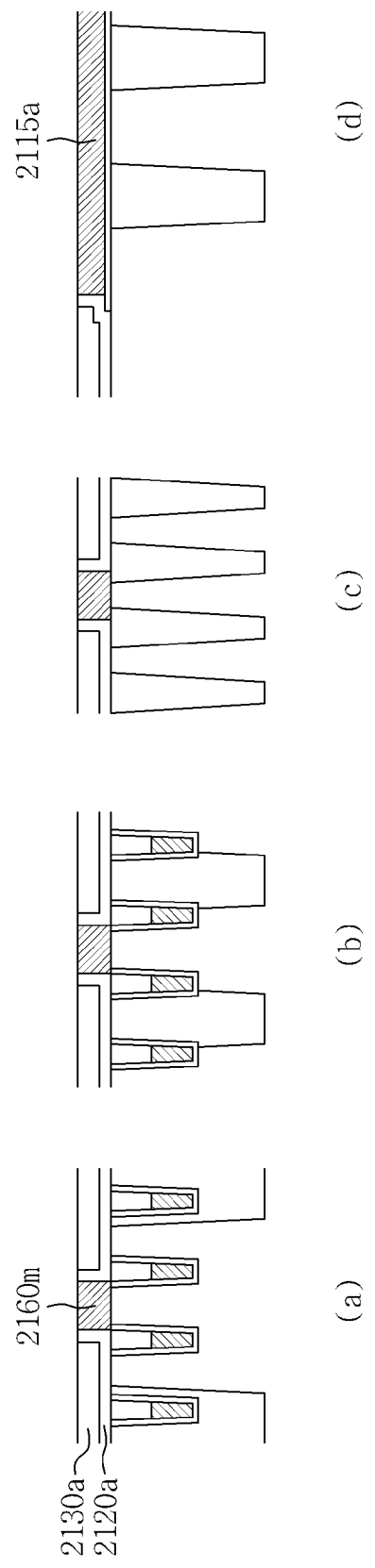

Referring to FIG. 24G, top surfaces of the mesa pattern 2160$m$ and the first peripheral silicon layer 2115$a$ may be exposed by performing a planarizing process, e.g., CMP. In the process, the second insulating layer 2120 may be used as a CMP stopper. The second insulating layer 2120 may be formed into a second partially removed insulating layer 2120$a$ to expose the top surfaces of the mesa pattern 2160$m$ and the first peripheral silicon layer 2115$a$. The third insulating layer 2130 may be formed into a third planarized insulating layer 2130$a$. The mesa pattern 2160$m$ may be the bit line contact plugs in other embodiments.

Figure 24H:
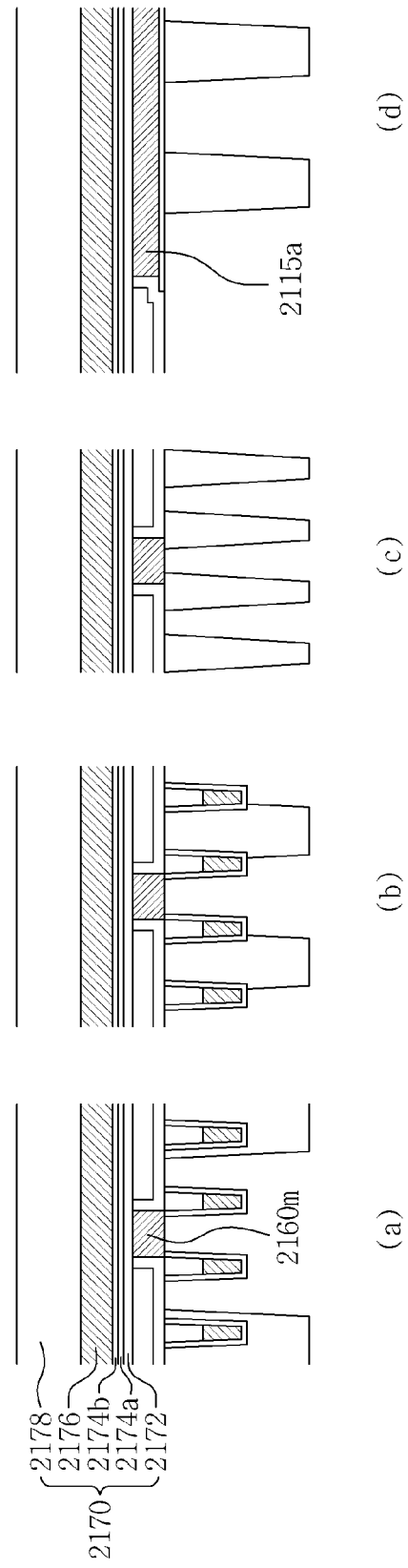

Referring to FIG. 24H, an interconnection layer 2170 may be formed. The interconnection layer 2170 may include a lower metal layer 2172, a barrier layer 2174$a$, an upper metal layer 2174$b$, an interconnection electrode layer 2176 and an interconnection capping layer 2178. The lower metal layer 2172 may be formed into a metal silicide layer by performing a silicidation process on the mesa pattern 2160$m$ and the first peripheral silicon layer 2115$a$ in the cell area CA. That is, the lower metal layer 2172 may be a metal layer to form a metal silicide layer. The lower metal layer 2172 may be formed to a thickness of about 80 Å. The barrier layer 2174$a$ may comprise titanium nitride TiN. The upper metal layer 2174$b$ may be a metal silicide layer or a metal layer to be formed into a metal silicide layer. The barrier layer 2174$a$ and the upper metal layer 2174$b$ may be formed to a thickness of about 100 Å. In other embodiments, the upper metal layer 2174$b$ may be omitted. That is, the upper metal layer 2174$b$ is formed merely as an example of this embodiment. The interconnection electrode layer 2176 may be formed into a bit line in the cell area CA and a gate metal electrode corresponding to an upper electrode of a peripheral transistor in the peripheral area PA. The interconnection electrode layer 2176 may be of at least one of tungsten (W), copper (Cu), cobalt (Co), nickel (Ni), ruthenium (Ru), iridium (Ir). However, the interconnection electrode layer 2176 may also be of some other metal. The interconnection electrode layer 2176 may be formed to a thickness of about 500 Å. The interconnection capping layer 2178 may be formed of silicon nitride to a thickness of about 1300 Å. Accordingly, it will be understood that the foregoing thicknesses are merely exemplary.

Figure 24I:
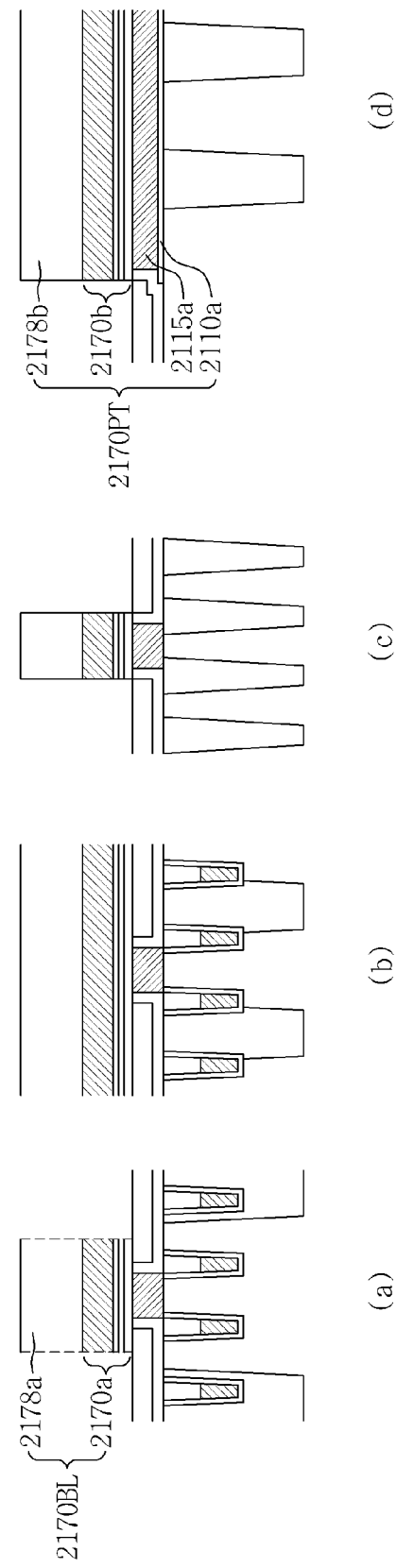

Referring to FIG. 24I, by performing a patterning process, a bit line pattern 2170BL may be formed in the cell area CA and a peripheral transistor pattern 2170PT may be formed in the peripheral area PA. The broken lines indicate an obliqueness of the bit line pattern 2170BL as shown in FIG. 1A. The patterning may comprise a photolithography process and an etching process. Then, a wrapping layer is formed. In this way, any one of the semiconductor devices shown in FIGS. 2A to 3C may be fabricated. In succession, after forming an interlayer dielectric layer covering the bit line pattern 2170BL and the peripheral transistor pattern 2170PT, a storage contact may be formed.

Figure 25A:
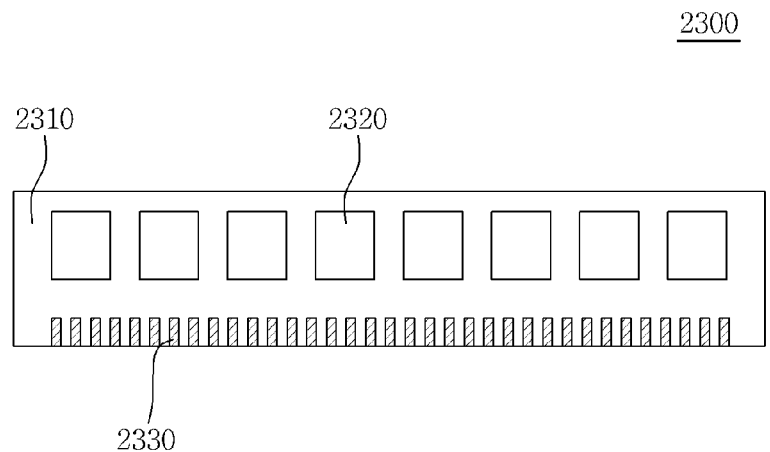
FIG. 25A is a schematic diagram of an example a semiconductor module including a semiconductor device in accordance with the inventive concepts.

FIG. 25A illustrates an example of a semiconductor module 2300 in accordance with the inventive concepts. The semiconductor module 2300 includes a module board 2310, a plurality of semiconductor devices 2320 or semiconductor packages (at least one of which comprises an embodiment of a semiconductor device in accordance with the inventive concepts) disposed on the module board 2310, and module contact terminals 2330 formed in parallel on one edge of the module board 2310 and electrically connected to the semiconductor devices 2320. The module board 2310 may be a printed circuit board (PCB). Both surfaces of the module board 2310 may be used. That is, the semiconductor devices 2320 may be disposed on front and rear surfaces of the module board 2310. Hence, although FIG. 25A illustrates the semiconductor devices 2320 disposed on the front surface of the module board 2310, this if for illustrative purposes only.

In addition, a separate semiconductor device may be further provided to control the semiconductor devices 2320. Therefore, the single semiconductor module 2300 is not necessarily limited to the number of semiconductor devices 2320 shown in FIG. 25A. Also, the module contact terminals 2330 may be formed of a metal and have oxidation resistance. The module contact terminals 2330 may be arranged according to any of various standards. For this reason, the number of the module contact terminals 2330 has no particular significance.

Figure 25B:
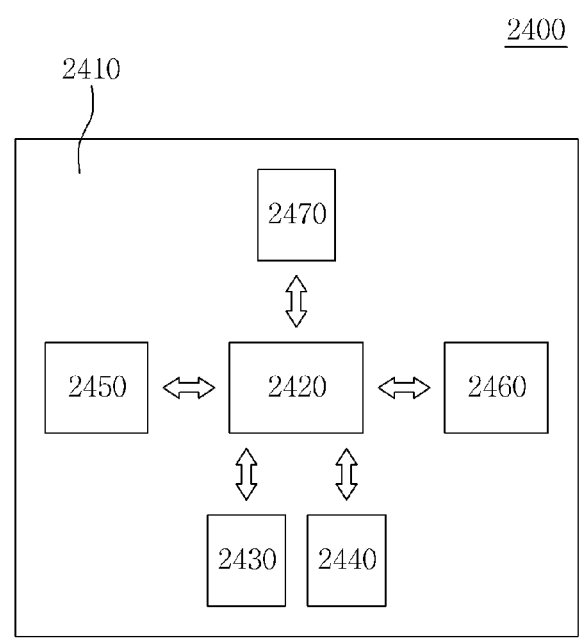
FIG. 25B is a block diagram of an example of an electronic circuit board including a semiconductor device in accordance the inventive concepts.

FIG. 25B illustrates an example of an electronic circuit board 2400 in accordance with the inventive concepts. Referring to FIG. 25B, the electronic circuit board 2400 includes a microprocessor 2420, a main storage circuit 2430 and a supplementary storage circuit 2440 in communication with the microprocessor 2420, an input signal processing circuit 2450 for sending a command to the microprocessor 2420, an output signal processing circuit 2460 for receiving a command from the microprocessor 2420, and a communicating signal processing circuit 2470 for sending/receiving an electric signal to/from another circuit board, disposed on a circuit board 2410. The arrows show paths along which electric signals are transmitted. The microprocessor 2420 can receive and process various electric signals, output the processed results, and control other components of the electronic circuit board 2400. The microprocessor 2420 may be, for example, a central processing unit (CPU) and/or a main control unit (MCU). The main storage circuit 2430 can temporarily store data that is frequently required by the microprocessor 2420 or data before and after processing. Since the main storage circuit 2430 needs a rapid response speed, the main storage circuit 2430 may be constituted by a semiconductor memory. More specifically, the main storage circuit 2430 may be a semiconductor memory, such as a cache memory, or may be constituted by a static random access memory (SRAM), a dynamic random access memory (DRAM), a resistive random access memory (RRAM), and their applied semiconductor memories, for example, a utilized RAM, a ferro-electric RAM, a fast cycle RAM, a phase changeable RAM, and other semiconductor memories. In addition, the main storage circuit 2430 may include a volatile or non-volatile RAM. In this example, the main storage circuit 2430 includes at least one semiconductor device or semiconductor module 2300 in accordance with the inventive concepts. The supplementary storage circuit 2440 may be a large capacity storage device, which may be a non-volatile semiconductor memory such as a flash memory, a hard disc drive using a magnetic field, or a compact disc drive using light. The supplementary storage circuit 2440 may be used when a large capacity of data is to be stored, not requiring a rapid response speed. The supplementary storage circuit 2440 may include a random or non-random non-volatile storage device. The supplementary storage circuit 2440 may include at least one semiconductor device or a semiconductor module 2300 in accordance with the inventive concepts. The input signal processing circuit 2450 may convert an external command into an electric signal, or transmit the electric signal transmitted from the exterior to the microprocessor 2420. The command transmitted from the exterior or the electric signal may be an operation command, an electric signal to be processed, or data to be stored. The input signal processing circuit 2450 may be a terminal signal processing circuit for processing a signal transmitted from, for example, a keyboard, a mouse, a touch pad, an image recognition device or various sensors, an image signal processing circuit for processing an image signal input from a scanner or a camera, or various sensors or input signal interfaces. The input signal processing circuit 2450 may include at least one semiconductor device or semiconductor module 2300 in accordance with the inventive concepts. The output signal processing circuit 2460 may be a component for transmitting an electric signal processed through the microprocessor 2420 to the exterior. For example, the output signal processing circuit 2460 may be a graphic card, an image processor, an optical converter, a beam panel card, interface circuits having various functions, or the like. The output signal processing circuit 2460 may include at least one semiconductor device or semiconductor module 2300 in accordance with the inventive concepts. The communicating signal processing circuit 2470 is a component for directly sending/receiving an electric signal to/from another electronic system or another circuit board, not through the input signal processing circuit 2450 or the output signal processing circuit 2460. For example, the communication circuit 2470 may be a modem, a LAN card, or various interface circuits of a personal computer system. The communication circuit 2470 may include at least one semiconductor device or semiconductor module in accordance with the inventive concepts.

Figure 25C:
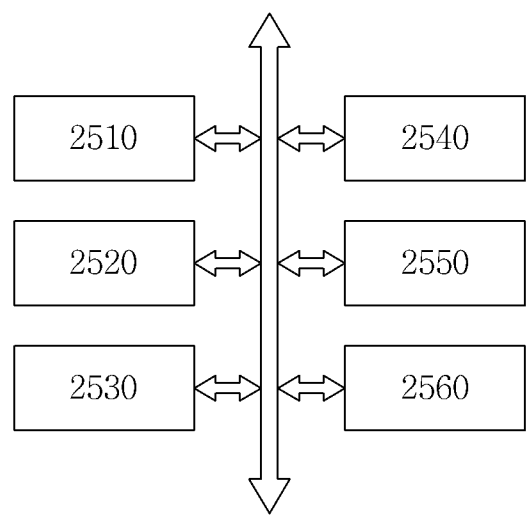
FIG. 25C a block diagram of an example of an electronic system including a semiconductor device in accordance with the inventive concepts.

FIG. 25C illustrates an electronic system 2500 including a semiconductor device or a semiconductor module in accordance with the inventive concepts. Referring to FIG. 25C, the electronic system 2500 includes a control unit 2510, an input unit 2520, an output unit 2530, and a storage unit 2540, and may further include a communication unit 2550 and an operation unit 2560. The control unit 2510 can generally control the electronic system 2500 and the respective units. The control unit 2510 may be a CPU or a central control unit, and may include the electronic circuit board 2400. In addition, the control unit 2510 may include at least one semiconductor device or semiconductor module 2300 in accordance with the inventive concepts. The input unit 2520 can send an electric command signal to the control unit 2510. The input unit 2520 may be a keyboard, a key pad, a mouse, a touch pad, an image recognition device such as a scanner, or various input sensors. The input unit 2520 may include a semiconductor device or a semiconductor module 2300 in accordance with the inventive concepts. The output unit 2530 can receive an electric command signal from the control unit 2510 and output the results processed by the electronic system 2500. The output unit 2530 may be a monitor, a printer, a beam projector, or various mechanical devices. The output unit 2530 may include at least one semiconductor device or semiconductor module 2300 in accordance with the inventive concepts. The storage unit 2540 may be a component for temporarily or permanently storing an electric signal to be processed or already processed by the controller 2510. The storage unit 2540 may be physically or electrically connected or coupled to the control unit 2510. The storage unit 2540 may be a semiconductor memory, a magnetic storage device such as a hard disc, an optical storage device such as a compact disc, or other servers having data storage functions. In addition, the storage unit 2540 may include at least one semiconductor device or semiconductor module 2300 in accordance with the inventive concepts. The communication unit 2550 can receive an electric command signal from the control unit 2510 and send/receive an electric signal to/from another electronic system. The communication unit 2550 may be a wired sending/receiving device such as a modem or a LAN card, a wireless sending/receiving device such as a WIBRO interface, an infrared port, etc. In addition, the communication unit 2550 may include at least one semiconductor device or semiconductor module 2300 in accordance with the inventive concepts. The operation unit 2560 may be physically or mechanically operated according to a command of the control unit 2510. For example, the operation unit 2560 may be a mechanically operated component such as a plotter, an indicator, an up/down operator, etc. The electronic system may be a computer, a network server, a network printer or scanner, a wireless controller, a mobile communication terminal, an exchanger, or another electronic system operated by programs.

According to the inventive concepts, capacitance between a bit line and a cell active region can be reduced by increasing a distance between the bit line and the cell active region. Thus, a semiconductor device in accordance with the inventive concepts can consume lower electric power flowing along the bit line and become faster than conventional electric devices. Consequently, electronic performances of a semiconductor module, an electronic circuit board and an electronic system having the semiconductor devices of the inventive concepts can be improved.

Finally, embodiments of the inventive concept have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. For example, the sequence of steps in the embodiments of the methods according to the inventive concepts may vary from those described. That is, in some cases steps that are described as being carried out simultaneously may be carried out sequentially instead and vice versa. Thus, the true spirit and scope of the inventive concept is not limited by the embodiments described above but by the following claims. Therefore, unless otherwise specified in the claims, the order in which various trenches, layers, elements, etc. are described as being formed, or the fact that trenches, layers, elements, etc. are referred to together in connection with being formed, is not limitative.

What is claimed is:

1. A semiconductor device comprising:
   a substrate;
   a word line in the substrate;
   a bit line contact plug on the semiconductor substrate;
   a bit line barrier layer on the bit line contact plug;
   a bit line electrode on the bit line barrier layer;
   a peripheral transistor insulating layer on the substrate;
   a peripheral transistor lower gate electrode on the peripheral transistor insulating layer;
   a peripheral transistor upper gate electrode on the peripheral transistor lower gate electrode; and
   a peripheral transistor capping layer on the peripheral transistor upper gate electrode,
   wherein the bit line electrode and the peripheral transistor upper gate electrode are at a same level, and
   the peripheral transistor upper gate electrode extends over the peripheral transistor lower gate electrode such that the peripheral transistor upper gate electrode and the peripheral transistor lower gate electrode are vertically apposed, and the peripheral transistor upper gate electrode and the peripheral transistor lower gate electrode are vertically aligned with each other.

2. The semiconductor device according to claim 1,
   wherein the substrate has a cell region and a peripheral region,
   the word line, the bit line contact plug, the bit line barrier layer, and the bit line electrode are disposed at the cell region, and the peripheral transistor insulating layer, the peripheral transistor lower gate electrode, and the peripheral transistor upper gate electrode are disposed at the peripheral region.

3. The semiconductor device according to claim 1, wherein a top surface of the bit line contact plug and a top surface of the peripheral transistor lower gate electrode are at a same level.

4. The semiconductor device according to claim 3, wherein the bit line contact plug and the peripheral transistor lower gate electrode include a same material.

5. The semiconductor device according to claim 1, wherein the bit line contact plug has a bottom surface lower than a top surface of the substrate.

6. The semiconductor device according to claim 1, further comprising:
a peripheral transistor barrier layer between the peripheral transistor lower gate electrode and the peripheral transistor upper gate electrode.

7. The semiconductor device according to claim 6, further comprising:
a peripheral transistor lower metal silicide layer between the peripheral transistor lower gate electrode and the peripheral transistor barrier layer.

8. The semiconductor device according to claim 1, wherein the bit line barrier layer and the peripheral transistor barrier layer are at a same level.

9. The semiconductor device according to claim 8, wherein the bit line barrier layer and the peripheral transistor barrier layer include a same material.

10. The semiconductor device according to claim 1, further comprising:
a peripheral transistor side wrapping layer on a sidewall of the peripheral transistor upper gate electrode; and
a peripheral transistor upper wrapping layer on the peripheral transistor upper gate electrode.

11. The semiconductor device according to claim 10, further comprising:
a bit line capping layer on the bit line gate electrode.

12. The semiconductor device according to claim 11, further comprising:
a bit line side wrapping layer on the sidewall of the bit line gate electrode;
and a bit line upper wrapping layer on the bit line capping layer.

13. The semiconductor device according to claim 12, further comprising:
an interlayer dielectric layer covering the bit line upper wrapping layer and the peripheral transistor upper wrapping layer.

14. A semiconductor device comprising:
a substrate;
a word line in the substrate;
a bit line contact plug on the semiconductor substrate;
a bit line electrode on the bit line contact plug;
a bit line capping layer on the bit line electrode;
a peripheral transistor insulating layer on the substrate;
a peripheral transistor lower electrode on the peripheral transistor insulating layer;
a peripheral transistor barrier layer on the peripheral transistor lower electrode;
a peripheral transistor upper electrode on the peripheral transistor barrier layer;
a peripheral transistor capping layer on the peripheral transistor upper electrode; and
a peripheral transistor wrapping layer on a sidewall of the peripheral transistor upper electrode and on a top surface of the peripheral capping layer, and
wherein the bit line electrode and the peripheral transistor upper electrode are at a same level.

15. The semiconductor device according to claim 14, wherein the bit line contact plug and the peripheral transistor lower electrode are at a same level.

16. The semiconductor device according to claim 14, wherein the bit line contact plug and the peripheral transistor lower electrode include doped silicon.

17. The semiconductor device according to claim 14, wherein the bit line electrode and the peripheral transistor upper electrode include metals.

18. The semiconductor device according to claim 14, wherein the peripheral transistor barrier layer includes a metal silicide layer.

19. A semiconductor device comprising:
a substrate having a cell region and a peripheral region;
a word line in the substrate of the cell region;
a bit line contact plug at the cell region of the substrate;
a bit line on the bit line contact plug, wherein the bit line including:
a bit line electrode on the bit line contact plug,
a bit line capping layer on the bit line electrode, and
a bit line wrapping layer on a sidewall and a top surface of the bit line capping layer; and
a peripheral transistor at the peripheral region of the substrate, wherein the peripheral transistor includes:
a peripheral transistor insulating layer on the substrate,
a peripheral transistor electrode on the peripheral transistor insulating layer,
a peripheral transistor capping layer on the peripheral transistor electrode, and
a peripheral transistor wrapping layer on a sidewall and a top surface of the peripheral transistor capping layer.

20. The semiconductor device according to claim 19, wherein a top surface of the substrate below the peripheral transistor insulating layer is horizontally planar.

* * * * *